US012652951B2

(12) United States Patent
Jeong et al.

(10) Patent No.: US 12,652,951 B2
(45) Date of Patent: Jun. 9, 2026

(54) LIGHT-EMITTING DEVICE INCLUDING HETEROCYCLIC COMPOUND AND ELECTRONIC APPARATUS INCLUDING LIGHT-EMITTING DEVICE

(71) Applicant: Samsung Display Co., Ltd., Yongin-si (KR)

(72) Inventors: Eunjae Jeong, Yongin-si (KR); Minji Kim, Yongin-si (KR); Hyunbin Park, Yongin-si (KR); Jeongmin Lee, Yongin-si (KR); Jiyong Choi, Yongin-si (KR); Sanghyun Han, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 854 days.

(21) Appl. No.: 18/077,128

(22) Filed: Dec. 7, 2022

(65) Prior Publication Data

US 2023/0180595 A1 Jun. 8, 2023

(30) Foreign Application Priority Data

Dec. 8, 2021 (KR) ........................ 10-2021-0175203

(51) Int. Cl.

| | |
|---|---|
| ***H10K 85/60*** | (2023.01) |
| ***H10K 59/38*** | (2023.01) |
| ***H10K 85/40*** | (2023.01) |

(52) U.S. Cl.

CPC ............. *H10K 85/40* (2023.02); *H10K 59/38* (2023.02); *H10K 85/60* (2023.02); *H10K 85/615* (2023.02)

(58) Field of Classification Search

None

See application file for complete search history.

(56) References Cited

U.S. PATENT DOCUMENTS

| | | | |
|---|---|---|---|
| 4,720,432 | A | 1/1988 | VanSlyke et al. |
| 5,061,569 | A | 10/1991 | VanSlyke et al. |
| 6,242,115 | B1 | 6/2001 | Thomson et al. |
| 7,598,667 | B2 | 10/2009 | Kawamura et al. |
| 9,947,874 | B2 | 4/2018 | Pflumm et al. |
| 11,001,752 | B2 | 5/2021 | Cha et al. |
| 11,208,368 | B2 | 12/2021 | Cha et al. |
| 2008/0241591 | A1 | 10/2008 | Kawamura et al. |
| 2020/0152884 | A1 | 5/2020 | Hwang et al. |

FOREIGN PATENT DOCUMENTS

| | | | | |
|---|---|---|---|---|
| JP | 1994-314594 | A | 11/1994 | |
| JP | 1996-291115 | A | 11/1996 | |
| JP | 1999-144873 | A | 5/1999 | |
| JP | 2000-302756 | A | 10/2000 | |
| JP | 2000-309566 | A | 11/2000 | |
| JP | 2004171986 | A * | 6/2004 | ............. H05B 33/22 |
| JP | 2004-253298 | A | 9/2004 | |
| JP | 2006-151979 | A | 6/2006 | |
| KR | 10-2006-0009349 | A | 1/2006 | |
| KR | 10-2013-0099098 | A | 9/2013 | |
| KR | 10-2016-0100698 | A | 8/2016 | |
| KR | 10-2016-0143559 | A | 12/2016 | |

OTHER PUBLICATIONS

Machine translation of JP-2004171986-A, translation generated Jan. 2026, 35 pages. (Year: 2026).*

Korean Notice of Allowance for Patent Application No. 10-2021-0175203, dated Sep. 19, 2025, 3 pages.

* cited by examiner

*Primary Examiner* — Robert S Loewe

(74) *Attorney, Agent, or Firm* — Womble Bond Dickinson (US) LLP

(57) ABSTRACT

A light-emitting device is provided and including a heterocyclic compound represented by Formula 1, and an electronic apparatus including the light-emitting device:

Formula 1

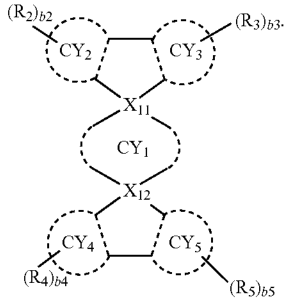

Formula 1 may be understood by referring to the description of Formula 1 provided herein.

20 Claims, 3 Drawing Sheets

LIGHT-EMITTING DEVICE INCLUDING HETEROCYCLIC COMPOUND AND ELECTRONIC APPARATUS INCLUDING LIGHT-EMITTING DEVICE

CROSS-REFERENCE TO RELATED APPLICATION

This application claims priority to and the benefit of Korean Patent Application No. 10-2021-0175203, filed on Dec. 8, 2021, in the Korean Intellectual Property Office, the content of which is incorporated herein by reference in its entirety.

BACKGROUND

1. Field

One or more embodiments relate to a light-emitting device including a heterocyclic compound, and an electronic apparatus including the light-emitting device.

2. Description of the Related Art

Light-emitting devices are self-emissive devices that have wide viewing angles, high contrast ratios, short response times, and/or excellent or suitable characteristics in terms of brightness, driving voltage, and/or response speed.

Light-emitting devices may include a first electrode on a substrate, and a hole transport region, an emission layer, an electron transport region, and a second electrode, sequentially stacked on the first electrode. Holes provided from the first electrode may move toward the emission layer through the hole transport region, and electrons provided from the second electrode may move toward the emission layer through the electron transport region. Carriers, such as holes and electrons, recombine in the emission layer to produce excitons. These excitons transition from an excited state to a ground state to thereby generate light.

SUMMARY

Aspects according to one or more embodiments of the present disclosure are directed toward a novel heterocyclic compound, a light-emitting device including the heterocyclic compound, and an electronic apparatus including the light-emitting device.

Additional aspects will be set forth in part in the description which follows and, in part, will be apparent from the description, or may be learned by practice of the presented embodiments of the disclosure.

According to one or more embodiments, a light-emitting device may include: a first electrode;

a second electrode facing the first electrode;

an interlayer between the first electrode and the second electrode, the interlayer including an emission layer; and a heterocyclic compound represented by Formula 1:

Formula 1

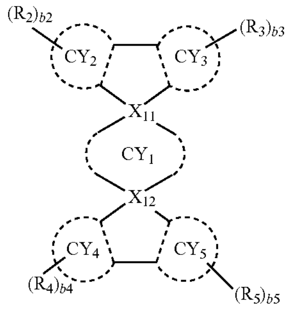

Formula 2

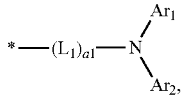

wherein, in Formulae 1 and 2, $X_{11}$ and $X_{12}$ may each independently be C or Si, ring $CY_1$ may be a 5-membered to 10-membered saturated cyclic group unsubstituted or substituted with $R_{10a}$, ring $CY_2$ to ring $CY_5$ may each independently be a $C_3$-$C_{60}$ carbocyclic group or a $C_1$-$C_{60}$ heterocyclic group, $L_1$ may be a single bond, a $C_5$-$C_{30}$ carbocyclic group unsubstituted or substituted with at least one $R_{10a}$, or a $C_1$-$C_{30}$ heterocyclic group unsubstituted or substituted with at least one $R_{10a}$, a1 may be an integer from 0 to 3, $R_2$ to $R_5$, $Ar_1$, and $Ar_2$ may each independently be a group represented by Formula 2, hydrogen, deuterium, —F, —Cl, —Br, —I, a hydroxyl group, a cyano group, a nitro group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, a $C_6$-$C_{60}$ aryloxy group unsubstituted or substituted with at least one $R_{10a}$, a $C_6$-$C_{60}$ arylthio group unsubstituted or substituted with at least one $R_{10a}$, a $C_7$-$C_{60}$ aryl alkyl group unsubstituted or substituted with at least one $R_{10a}$, a $C_2$-$C_{60}$ heteroaryl alkyl group unsubstituted or substituted with at least one $R_{10a}$, —$Si(Q_1)(Q_2)(Q_3)$, —$N(Q_1)(Q_2)$, —$B(Q_1)(Q_2)$, —$C(=O)(Q_1)$, —$S(=O)_2(Q_1)$, or —$P(=O)(Q_1)(Q_2)$, wherein at least one selected from $R_2$ to $R_5$ may be a group represented by Formula 2, each of $Ar_1$ and $Ar_2$ may not be a group represented by Formula 2, b2 to b5 may each independently be an integer from 0 to 10,

* indicates a binding site to Formula 1, and $R_{10a}$ may be:

deuterium, —F, —Cl, —Br, —I, a hydroxyl group, a cyano group, or a nitro group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each unsubstituted or substituted with deuterium, —F, —Cl, —Br, —I, a hydroxyl group, a cyano group, a nitro group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ aryl alkyl group, a $C_2$-$C_{60}$ heteroaryl alkyl group, —Si($Q_{11}$)($Q_{12}$)($Q_{13}$), —N($Q_{11}$)($Q_{12}$), —B($Q_{11}$)($Q_{12}$), —C(=O)($Q_{11}$), —S(=O)$_2$($Q_{11}$), —P(=O)($Q_{11}$)($Q_{12}$), or any combination thereof;

a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ aryl alkyl group, or a $C_2$-$C_{60}$ heteroaryl alkyl group, each unsubstituted or substituted with deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ aryl alkyl group, a $C_2$-$C_{60}$ heteroaryl alkyl group, —Si($Q_{21}$)($Q_{22}$)($Q_{23}$), —N($Q_{21}$)($Q_{22}$), —B($Q_{21}$)($Q_{22}$), —C(=O)($Q_{21}$), —S(=O)$_2$($Q_{21}$), —P(=O)($Q_{21}$)($Q_{22}$), or any combination thereof; or —Si($Q_{31}$)($Q_{32}$)($Q_{33}$), —N($Q_{31}$)($Q_{32}$), —B($Q_{31}$)($Q_{32}$), —C(=O)($Q_{31}$), —S(=O)$_2$($Q_{31}$), or —P(=O)($Q_{31}$)($Q_{32}$), and wherein $Q_1$ to $Q_3$, $Q_{11}$ to $Q_{13}$, $Q_{21}$ to $Q_{23}$, and $Q_{31}$ to $Q_{33}$ may each independently be: hydrogen; deuterium; —F; —Cl; —Br; —I; a hydroxyl group; a cyano group; a nitro group; a $C_1$-$C_{60}$ alkyl group; a $C_2$-$C_{60}$ alkenyl group; a $C_2$-$C_{60}$ alkynyl group; a $C_1$-$C_{60}$ alkoxy group; a $C_3$-$C_{60}$ carbocyclic group or a $C_1$-$C_{60}$ heterocyclic group, each unsubstituted or substituted with deuterium, —F, a cyano group, a $C_1$-$C_{60}$ alkyl group, a $C_1$-$C_{60}$ alkoxy group, a phenyl group, a biphenyl group, or any combination thereof; a $C_7$-$C_{60}$ aryl alkyl group; or a $C_2$-$C_{60}$ heteroaryl alkyl group.

According to one or more embodiments, an electronic apparatus may include the light-emitting device.

BRIEF DESCRIPTION OF THE DRAWINGS

The above and other aspects, features, and enhancements of certain embodiments of the disclosure will be more apparent from the following description taken in conjunction with the accompanying drawings, in which.

DETAILED DESCRIPTION

Figure 1:
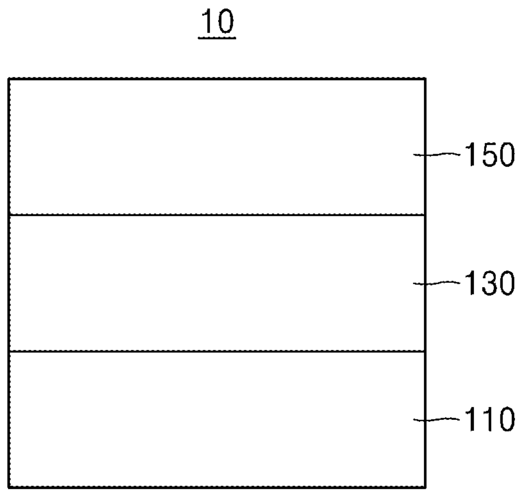
FIG. 1 is a schematic cross-sectional view of a light-emitting device according to an embodiment.

Reference will now be made in more detail to embodiments, examples of which are illustrated in the accompanying drawings, wherein like reference numerals refer to like elements throughout, and duplicative descriptions thereof may not be provided. In this regard, the present embodiments may have different forms and should not be construed as being limited to the descriptions set forth herein. Accordingly, the embodiments are merely described below, by referring to the drawings, to explain aspects of the present description. As used herein, the term "and/or" includes any and all combinations of one or more of the associated listed items. Throughout the disclosure, the expression "at least one of a, b and c" or "at least one selected from a, b, and c" indicates only a, only b, only c, both (e.g., simultaneously) a and b, both (e.g., simultaneously) a and c, both (e.g., simultaneously) b and c, all of a, b, and c, or variations thereof.

A light-emitting device may include: a first electrode; a second electrode facing the first electrode; an interlayer between the first electrode and the second electrode and including an emission layer; and a heterocyclic compound represented by Formula 1:

Formula 1

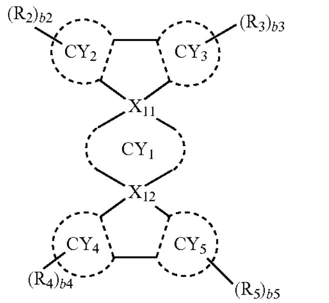

Formula 2

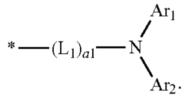

In Formula 1, $X_{11}$ and $X_{12}$ may each independently be C or Si.

In an embodiment, in Formula 1, $X_{11}$ and $X_{12}$ may each be C.

In Formula 1, ring $CY_1$ may be a 5-membered to 10-membered saturated cyclic group unsubstituted or substituted with $R_{10a}$.

In an embodiment, in Formula 1, ring $CY_1$ may be a cyclopentyl group, a cyclohexyl group, a cycloheptyl group, a cyclooctyl group, a cyclononyl group, or a cyclodecyl group, each unsubstituted or substituted with $R_{10a}$.

In one or more embodiments, in Formula 1, ring $CY_1$ may be a cyclohexyl group unsubstituted or substituted with $R_{10a}$.

In one or more embodiments, the heterocyclic compound represented by Formula 1 may be represented by Formula 1-1:

Formula 1-1

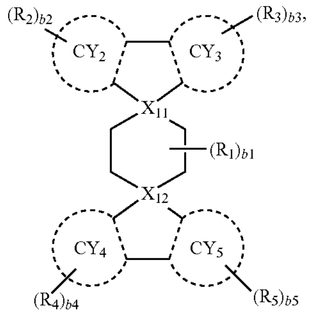

wherein, in Formula 1-1, $X_{11}$, $X_{12}$, $R_2$ to $R_5$, and b2 to b5 may respectively be understood by referring to the descriptions of $X_{11}$, $X_{12}$, $R_2$ to $R_5$, and b2 to b5 provided herein in connection with Formula 1, $R_1$ may be understood by referring to the description of $R_{10a}$ provided herein, and b1 may be an integer from 0 to 4.

In one or more embodiments, the heterocyclic compound represented by Formula 1 may be represented by Formula 1-2:

Formula 1-2

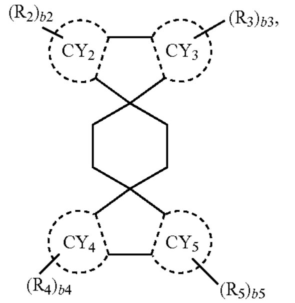

wherein, in Formula 1-2, $R_2$ to $R_5$, and b2 to b5 may respectively be understood by referring to the descriptions of $R_2$ to $R_5$, and b2 to b5 provided herein in connection with Formula 1.

In Formula 1, ring $CY_2$ to ring $CY_5$ may each be a $C_3$-$C_{60}$ carbocyclic group or a $C_1$-$C_{60}$ heterocyclic group.

In an embodiment, ring $CY_2$ to ring $CY_5$ may each independently be a benzene group, a naphthalene group, an anthracenyl group, a carbazole group, a dibenzofuran group, a fluorene group, a dibenzothiophene group, or a dibenzosilole group.

In one or more embodiments, ring $CY_2$ to ring $CY_5$ may be identical to one another.

In one or more embodiments, ring $CY_2$ to ring $CY_5$ may each be a benzene group.

In Formula 2, $L_1$ may be a single bond, a $C_5$-$C_{30}$ carbocyclic group unsubstituted or substituted with $R_{10a}$, or a $C_1$-$C_{30}$ heterocyclic group unsubstituted or substituted with $R_{10a}$.

In an embodiment, in Formula 2, $L_1$ may be a single bond; or a benzene group, a naphthalene group, an anthracene group, a dibenzofuran group, a dibenzothiophene group, a carbazole group, a fluorene group, or a dibenzosilole group, each unsubstituted or substituted with $R_{10a}$.

In one or more embodiments, in Formula 2, $L_1$ may be a single bond; or a benzene group unsubstituted or substituted with $R_{10a}$.

In Formula 2, a1 may be an integer from 0 to 3. a1 may be the number of $L_1$(s). In an embodiment, when a1 is an integer of 2 or greater, two or more $L_1$(s) may be identical to or different from each other.

In an embodiment, in Formula 2, a1 may be 0 or 1.

In Formulae 1 and 2, $R_2$ to $R_5$, $Ar_1$, and $Ar_2$ may each independently be a group represented by Formula 2, hydrogen, deuterium, —F, —Cl, —Br, —I, a hydroxyl group, a cyano group, a nitro group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, a $C_6$-$C_{60}$ aryloxy group unsubstituted or substituted with at least one $R_{10a}$, a $C_6$-$C_{60}$ arylthio group unsubstituted or substituted with at least one $R_{10a}$, a $C_7$-$C_{60}$ aryl alkyl group unsubstituted or substituted with at least one $R_{10a}$, a $C_2$-$C_{60}$ heteroaryl alkyl group unsubstituted or substituted with at least one $R_{10a}$, $—Si(Q_1)(Q_2)(Q_3)$, $—N(Q_1)(Q_2)$, $—B(Q_1)(Q_2)$, $—C(=O)(Q_1)$, $—S(=O)_2(Q_1)$, or $—P(=O)(Q_1)(Q_2)$, at least one selected from $R_2$ to $R_5$ may be a group represented by Formula 2, and each of $Ar_1$ and $Ar_2$ may not be a group represented by Formula 2.

In an embodiment, $R_2$ to $R_5$ may each independently be a group represented by Formula 2, hydrogen, deuterium, —F, —Cl, —Br, —I, a hydroxyl group, a cyano group, a nitro group, a $C_1$-$C_{20}$ alkyl group, or a $C_1$-$C_{20}$ alkoxy group;

a $C_1$-$C_{20}$ alkyl group or a $C_1$-$C_{20}$ alkoxy group, each substituted with deuterium, —F, —Cl, —Br, —I, $—CD_3$, $—CD_2H$, $—CDH_2$, $—CF_3$, $—CF_2H$, $—CFH_2$, a hydroxyl group, a cyano group, a nitro group, a $C_1$-$C_{20}$ alkyl group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a biphenyl group, a terphenyl group, a naphthyl group, a pyridinyl group, a pyrimidinyl group, or any combination thereof;

a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a biphenyl group, a terphenyl group, a $C_1$-$C_{20}$ alkylphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an indenyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, a benzosilolyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a dibenzosilolyl group, a benzofluorenyl group, a benzocarbazolyl group, a naphthobenzofuranyl group, a naphthobenzothiophenyl group, a naphthobenzosilolyl group, a dibenzofluorenyl group, a dibenzocarbazolyl group, a dinaphthofuranyl group, a dinaphthothiophenyl group, a dinaphthosilolyl group, an indenocarbazolyl group, an indolocarbazolyl group, a benzofuranocarbazolyl group, a benzothienocarbazolyl group, a benzosilolocarbazolyl group, an imidazopyridinyl group, an imidazopyrimidinyl group, an azafluorenyl group, an azacarbazolyl group, an azadibenzofuranyl group, an azadibenzothiophenyl group, or an azadibenzosilolyl group, each unsubstituted or substituted with deuterium, —F, —Cl, —Br, —I, $—CD_3$, $—CD_2H$, $—CDH_2$, $—CF_3$, $—CF_2H$, $—CFH_2$, a hydroxyl group, a cyano group, a nitro group, a $C_1$-$C_{20}$ alkyl group, a $C_1$-$C_{20}$ alkoxy group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a biphenyl group, a terphenyl group, a $C_1$-$C_{20}$ alkylphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an indenyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, a benzosilolyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a dibenzosilolyl group, a benzofluorenyl group, a benzocarbazolyl group, a naphthobenzofuranyl group, a naphthobenzothiophenyl group, a naphthobenzosilolyl group, a dibenzofluorenyl group, a dibenzocarbazolyl group, a dinaphthofuranyl group, a dinaphthothiophenyl group, a dinaphthosilolyl group, an indenocarbazolyl group, an indolocarbazolyl group, a benzofuranocarbazolyl group, a benzothienocarbazolyl group, a benzosilolocarbazolyl group, an imidazopyridinyl group, an imidazopyrimidinyl group, —$Si(Q_{31})(Q_{32})(Q_{33})$, —$N(Q_{31})(Q_{32})$, —$B(Q_{31})(Q_{32})$, —$P(Q_{31})(Q_{32})$, —$C(=O)(Q_{31})$, —$S(=O)_2(Q_{31})$, —$P(=O)(Q_{31})(Q_{32})$, or any combination thereof; or —$Si(Q_1)(Q_2)(Q_3)$, —$N(Q_1)(Q_2)$, —$B(Q_1)(Q_2)$, —$C(=O)(Q_1)$, —$S(=O)_2(Q_1)$, or —$P(=O)(Q_1)(Q_2)$, wherein $Q_1$ to $Q_3$ and $Q_{31}$ to $Q_{33}$ may each independently be:

—$CH_3$, —$CD_3$, —$CD_2H$, —$CDH_2$, —$CH_2CH_3$, —$CH_2CD_3$, —$CH_2CD_2H$, —$CH_2CDH_2$, —$CHDCH_3$, —$CHDCD_2H$, —$CHDCDH_2$, —$CHDCD_3$, —$CD_2CD_3$, —$CD_2CD_2H$, or —$CD_2CDH_2$; or an n-propyl group, an iso-propyl group, an n-butyl group, an isobutyl group, a sec-butyl group, a tert-butyl group, an n-pentyl group, an isopentyl group, a sec-pentyl group, a tert-pentyl group, a phenyl group, a naphthyl group, a pyridinyl group, a pyrimidinyl group, a pyridazinyl group, a pyrazinyl group, or a triazinyl group, each unsubstituted or substituted with deuterium, a $C_1$-$C_{20}$ alkyl group, a phenyl group, a biphenyl group, a pyridinyl group, a pyrimidinyl group, a pyridazinyl group, a pyrazinyl group, a triazinyl group, or any combination thereof.

In one or more embodiments, $R_2$ to $R_5$ may each independently be a group represented by Formula 2, hydrogen, deuterium, —F, a cyano group, a $C_1$-$C_{20}$ alkyl group, or a $C_1$-$C_{20}$ alkoxy group;

a $C_1$-$C_{20}$ alkyl group or a $C_1$-$C_{20}$ alkoxy group, each substituted with deuterium, —F, —$CD_3$, —$CD_2H$, —$CDH_2$, —$CF_3$, —$CF_2H$, —$CFH_2$, a cyano group, or any combination thereof;

a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a biphenyl group, a terphenyl group, a $C_1$-$C_{20}$ alkyl phenyl group, a naphthyl group, a fluorenyl group, a phenanthrenyl group, an anthracenyl group, a thiophenyl group, a furanyl group, an indenyl group, an isoindolyl group, an indolyl group, a carbazolyl group, a benzofuranyl group, a benzothiophenyl group, a benzosilolyl group, a dibenzofuranyl group, a dibenzothiophenyl group, a dibenzosilolyl group, a benzofluorenyl group, a benzocarbazolyl group, a naphthobenzofuranyl group, a naphthobenzothiophenyl group, a naphthobenzosilolyl group, a dibenzofluorenyl group, a dibenzocarbazolyl group, a dinaphthofuranyl group, a dinaphthothiophenyl group, a dinaphthosilolyl group, an indenocarbazolyl group, an indolocarbazolyl group, a benzofuranocarbazolyl group, a benzothienocarbazolyl group, or a benzosilolocarbazolyl group, each unsubstituted or substituted with deuterium, —F, —$CD_3$, —$CD_2H$, —$CDH_2$, —$CF_3$, —$CF_2H$, —$CFH_2$, a cyano group, a $C_1$-$C_{20}$ alkyl group, a $C_1$-$C_{20}$ alkoxy group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a biphenyl group, a terphenyl group, a $C_1$-$C_{20}$ alkyl phenyl group, a naphthyl group, a fluorenyl group, a phenanthrenyl group, an anthracenyl group, a thiophenyl group, a furanyl group, an indenyl group, an isoindolyl group, an indolyl group, a carbazolyl group, a benzofuranyl group, a benzothiophenyl group, a benzosilolyl group, a dibenzofuranyl group, a dibenzothiophenyl group, a dibenzosilolyl group, a benzofluorenyl group, a benzocarbazolyl group, a naphthobenzofuranyl group, a naphthobenzothiophenyl group, a naphthobenzosilolyl group, a dibenzofluorenyl group, a dibenzocarbazolyl group, a dinaphthofuranyl group, a dinaphthothiophenyl group, a dinaphthosilolyl group, an indenocarbazolyl group, an indolocarbazolyl group, a benzofuranocarbazolyl group, a benzothienocarbazolyl group, a benzosilolocarbazolyl group, or any combination thereof.

In one or more embodiments, $R_2$ to $R_5$ may each independently be: a group represented by Formula 2, hydrogen, deuterium, —F, or a cyano group; or a cyclohexyl group, an adamantanyl group, a norbornanyl group, a phenyl group, a naphthyl group, a fluorenyl group, an anthracenyl group, a carbazolyl group, a dibenzofuranyl group, a dibenzothiophenyl group, or a dibenzosilolyl group, each unsubstituted or substituted with deuterium, —F, a cyano group, a $C_1$-$C_{20}$ alkyl group, a $C_1$-$C_{20}$ alkoxy group, a cyclohexyl group, an adamantanyl group, a norbornanyl group, a phenyl group, a naphthyl group, a fluorenyl group, an anthracenyl group, a carbazolyl group, a dibenzofuranyl group, a dibenzothiophenyl group, a dibenzosilolyl group, or any combination thereof.

In an embodiment, $R_5$ may be a group represented by Formula 2.

b2 to b5 may each independently be an integer from 0 to 10. b2 to b5 may respectively indicate the number of $R_2$ to $R_5$. For example, when b2 is an integer of 2 or greater, at least two $R_2$(s) may be identical to or different from each other, when b3 is an integer of 2 or greater, at least two $R_3$(s) may be identical to or different from each other, when b4 is an integer of 2 or greater, at least two $R_4$(s) may be identical to or different from each other, and when b5 is an integer of 2 or greater, at least two $R_5$(s) may be identical to or different from each other.

In an embodiment, b2 to b5 may each independently be an integer from 0 to 4.

In an embodiment, $Ar_1$ and $Ar_2$ may each independently be: hydrogen, deuterium, —F, —Cl, —Br, —I, a hydroxyl group, a cyano group, a nitro group, a $C_1$-$C_{20}$ alkyl group, or a $C_1$-$C_{20}$ alkoxy group;

a $C_1$-$C_{20}$ alkyl group or a $C_1$-$C_{20}$ alkoxy group, each substituted with deuterium, —F, —Cl, —Br, —I, $—CD_3$, $—CD_2H$, $—CDH_2$, $—CF_3$, $—CF_2H$, $—CFH_2$, a hydroxyl group, a cyano group, a nitro group, a $C_1$-$C_{20}$ alkyl group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a biphenyl group, a terphenyl group, a naphthyl group, a pyridinyl group, a pyrimidinyl group, or any combination thereof;

a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a biphenyl group, a terphenyl group, a $C_1$-$C_{20}$ alkylphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an indenyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, a benzosilolyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a dibenzosilolyl group, a benzofluorenyl group, a benzocarbazolyl group, a naphthobenzofuranyl group, a naphthobenzothiophenyl group, a naphthobenzosilolyl group, a dibenzofluorenyl group, a dibenzocarbazolyl group, a dinaphthofuranyl group, a dinaphthothiophenyl group, a dinaphthosilolyl group, an indenocarbazolyl group, an indolocarbazolyl group, a benzofuranocarbazolyl group, a benzothienocarbazolyl group, a benzosilolocarbazolyl group, an imidazopyridinyl group, an imidazopyrimidinyl group, an azafluorenyl group, an azacarbazolyl group, an azadibenzofuranyl group, an azadibenzothiophenyl group, or an azadibenzosilolyl group, each unsubstituted or substituted with deuterium, —F, —Cl, —Br, —I, $—CD_3$, $—CD_2H$, $—CDH_2$, $—CF_3$, $—CF_2H$, $—CFH_2$, a hydroxyl group, a cyano group, a nitro group, a $C_1$-$C_{20}$ alkyl group, a $C_1$-$C_{20}$ alkoxy group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a biphenyl group, a terphenyl group, a $C_1$-$C_{20}$ alkylphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an indenyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, a benzosilolyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a dibenzosilolyl group, a benzofluorenyl group, a benzocarbazolyl group, a naphthobenzofuranyl group, a naphthobenzothiophenyl group, a naphthobenzosilolyl group, a dibenzofluorenyl group, a dibenzocarbazolyl group, a dinaphthofuranyl group, a dinaphthothiophenyl group, a dinaphthosilolyl group, an indenocarbazolyl group, an indolocarbazolyl group, a benzofuranocarbazolyl group, a benzothienocarbazolyl group, a benzosilolocarbazolyl group, an imidazopyridinyl group, an imidazopyrimidinyl group, $—Si(Q_{31})(Q_{32})(Q_{33})$, $—N(Q_{31})(Q_{32})$, $—B(Q_{31})(Q_{32})$, $—P(Q_{31})(Q_{32})$, $—C(=O)(Q_{31})$, $—S(=O)_2(Q_{31})$, $—P(=O)(Q_{31})(Q_{32})$, or any combination thereof; or $—Si(Q_1)(Q_2)(Q_3)$, $—N(Q_1)(Q_2)$, $—B(Q_1)(Q_2)$, $—C(=O)(Q_1)$, $—S(=O)_2(Q_1)$, or $—P(=O)(Q_1)(Q_2)$, wherein $Q_1$ to $Q_3$ and $Q_{31}$ to $Q_{33}$ may each independently be:

$—CH_3$, $—CD_3$, $—CD_2H$, $—CDH_2$, $—CH_2CH_3$, $—CH_2CD_3$, $—CH_2CD_2H$, $—CH_2CDH_2$, $—CHDCH_3$, $—CHDCD_2H$, $—CHDCDH_2$, $—CHDCD_3$, $—CD_2CD_3$, $—CD_2CD_2H$, or $—CD_2CDH_2$; or an n-propyl group, an iso-propyl group, an n-butyl group, an isobutyl group, a sec-butyl group, a tert-butyl group, an n-pentyl group, an isopentyl group, a sec-pentyl group, a tert-pentyl group, a phenyl group, a naphthyl group, a pyridinyl group, a pyrimidinyl group, a pyridazinyl group, a pyrazinyl group, or a triazinyl group, each unsubstituted or substituted with deuterium, a $C_1$-$C_{20}$ alkyl group, a phenyl group, a biphenyl group, a pyridinyl group, a pyrimidinyl group, a pyridazinyl group, a pyrazinyl group, a triazinyl group, or any combination thereof.

In one or more embodiments, $Ar_1$ and $Ar_2$ may each independently be: hydrogen, deuterium, —F, a cyano group, a $C_1$-$C_{20}$ alkyl group, or a $C_1$-$C_{20}$ alkoxy group;

a $C_1$-$C_{20}$ alkyl group or a $C_1$-$C_{20}$ alkoxy group, each substituted with deuterium, —F, $—CD_3$, $—CD_2H$, $—CDH_2$, $—CF_3$, $—CF_2H$, $—CFH_2$, a cyano group, or any combination thereof;

a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a biphenyl group, a terphenyl group, a $C_1$-$C_{20}$ alkyl phenyl group, a naphthyl group, a fluorenyl group, a phenanthrenyl group, an anthracenyl group, a thiophenyl group, a furanyl group, an indenyl group, an isoindolyl group, an indolyl group, a carbazolyl group, a benzofuranyl group, a benzothiophenyl group, a benzosilolyl group, a dibenzofuranyl group, a dibenzothiophenyl group, a dibenzosilolyl group, a benzofluorenyl group, a benzocarbazolyl group, a naphthobenzofuranyl group, a naphthobenzothiophenyl group, a naphthobenzosilolyl group, a dibenzofluorenyl group, a dibenzocarbazolyl group, a dinaphthofuranyl group, a dinaphthothiophenyl group, a dinaphthosilolyl group, an indenocarbazolyl group, an indolocarbazolyl group, a benzofuranocarbazolyl group, a benzothienocarbazolyl group, or a benzosilolocarbazolyl group, each unsubstituted or substituted with deuterium, —F, —$CD_3$, —$CD_2H$, —$CDH_2$, —$CF_3$, —$CF_2H$, —$CFH_2$, a cyano group, a $C_1$-$C_{20}$ alkyl group, a $C_1$-$C_{20}$ alkoxy group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a biphenyl group, a terphenyl group, a $C_1$-$C_{20}$ alkyl phenyl group, a naphthyl group, a fluorenyl group, a phenanthrenyl group, an anthracenyl group, a thiophenyl group, a furanyl group, an indenyl group, an isoindolyl group, an indolyl group, a carbazolyl group, a benzofuranyl group, a benzothiophenyl group, a benzosilolyl group, a dibenzofuranyl group, a dibenzothiophenyl group, a dibenzosilolyl group, a benzofluorenyl group, a benzocarbazolyl group, a naphthobenzofuranyl group, a naphthobenzothiophenyl group, a naphthobenzosilolyl group, a dibenzofluorenyl group, a dibenzocarbazolyl group, a dinaphthofuranyl group, a dinaphthothiophenyl group, a dinaphthosilolyl group, an indenocarbazolyl group, an indolocarbazolyl group, a benzofuranocarbazolyl group, a benzothienocarbazolyl group, a benzosilolocarbazolyl group, or any combination thereof.

In one or more embodiments, $Ar_1$ and $Ar_2$ may each independently be: hydrogen, deuterium, —F, or a cyano group; or a cyclohexyl group, an adamantanyl group, a norbornanyl group, a phenyl group, a naphthyl group, a fluorenyl group, an anthracenyl group, a carbazolyl group, a dibenzofuranyl group, a dibenzothiophenyl group, or a dibenzosilolyl group, each unsubstituted or substituted with deuterium, —F, a cyano group, a $C_1$-$C_{20}$ alkyl group, a $C_1$-$C_{20}$ alkoxy group, a cyclohexyl group, an adamantanyl group, a norbornanyl group, a phenyl group, a naphthyl group, a fluorenyl group, an anthracenyl group, a carbazolyl group, a dibenzofuranyl group, a dibenzothiophenyl group, a dibenzosilolyl group, or any combination thereof.

In some embodiments, a group represented by

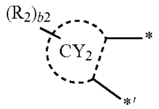

in Formula 1 may be a group represented by one of Formulae CY2-1 to CY2-5:

CY2-1

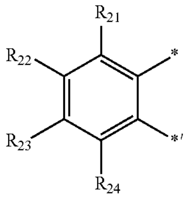

-continued

CY2-2

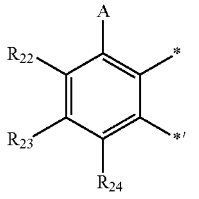

CY2-3

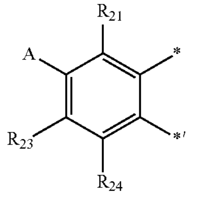

CY2-4

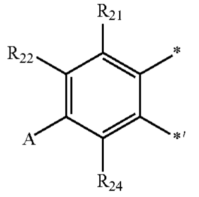

CY2-5

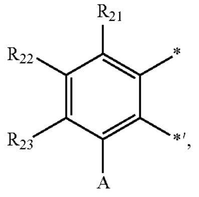

wherein, in Formulae CY2-1 to CY2-5,

A may be a group represented by Formula 2, $R_{21}$ to $R_{24}$ may each independently be understood by referring to the description of $R_2$ provided herein, each of $R_{21}$ to $R_{24}$ may not be a group represented by Formula 2 (e.g., each of $R_{21}$ to $R_{24}$ may not be a group represented by Formula 2), * indicates a binding site to ring $CY_3$ in Formula 1, and *' indicates a binding site to ring $CY_1$ in Formula 1.

In one or more embodiments, a group represented by

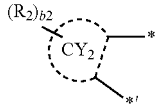

in Formula 1 may be a group represented by Formula CY2-1.

In some embodiments, a group represented by

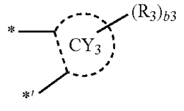

in Formula 1 may be a group represented by one of Formulae CY3-1 to CY3-5:

CY3-1

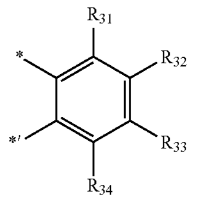

CY3-2

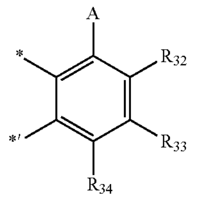

CY3-3

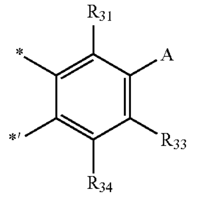

CY3-4

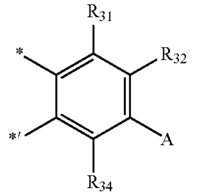

CY3-5

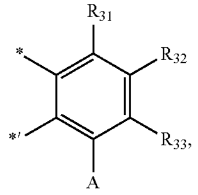

wherein, in Formulae CY3-1 to CY3-5,

A may be a group represented by Formula 2, $R_{31}$ to $R_{34}$ may each independently be understood by referring to the description of $R_3$ provided herein, each of $R_{31}$ to $R_{34}$ may not be a group represented by Formula 2 (e.g., each of $R_{31}$ to $R_{34}$ may not be a group represented by Formula 2), * indicates a binding site to ring $CY_2$ in Formula 1, and *' indicates a binding site to ring $CY_1$ in Formula 1.

In one or more embodiments, a group represented by

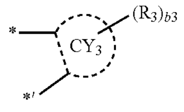

in Formula 1 may be a group represented by Formula CY3-1.

In some embodiments, a group represented by

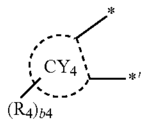

in Formula 1 may be a group represented by one of Formulae CY4-1 to CY4-5:

CY4-1

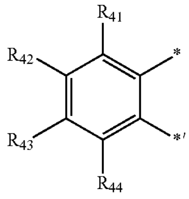

CY4-2

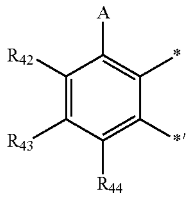

CY4-3

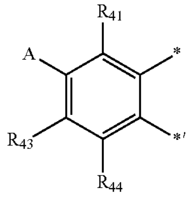

CY4-4

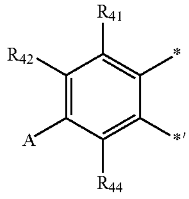

CY4-5

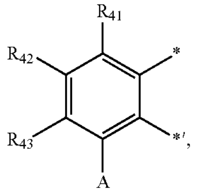

wherein, in Formulae CY4-1 to CY4-5,

A may be a group represented by Formula 2, $R_{41}$ to $R_{44}$ may each independently be understood by referring to the description of $R_4$ provided herein, each of $R_{41}$ to $R_{44}$ may not be a group represented by Formula 2 (e.g., each of $R_{41}$ to $R_{44}$ may not be a group represented by Formula 2), * indicates a binding site to ring $CY_1$ in Formula 1, and *' indicates a binding site to ring $CY_5$ in Formula 1.

In one or more embodiments, a group represented by

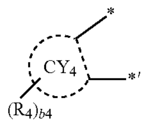

in Formula 1 may be a group represented by Formula CY4-1.

In some embodiments, a group represented by

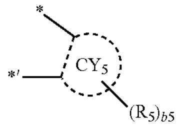

in Formula 1 may be a group represented by one of Formulae CY5-1 to CY5-4:

CY5-1

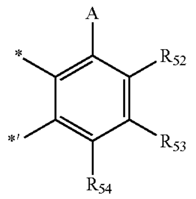

CY5-2

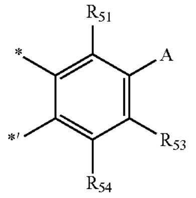

CY5-3

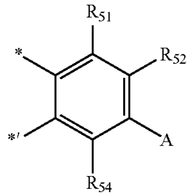

CY5-4

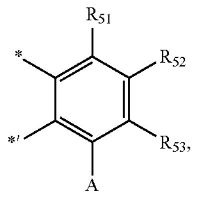

wherein, in Formulae CY5-1 to CY5-4,

A may be a group represented by Formula 2, $R_{51}$ to $R_{54}$ may each independently be understood by referring to the description of $R_5$ provided herein, each of $R_{51}$ to $R_{54}$ may not be a group represented by Formula 2 (e.g., each of $R_{51}$ to $R_{54}$ may not be a group represented by Formula 2), * indicates a binding site to ring $CY_1$ in Formula 1, and *' indicates a binding site to ring $CY_4$ in Formula 1.

The heterocyclic compound represented by Formula 1 may be, for example, one of Compounds 1 to 147.

1

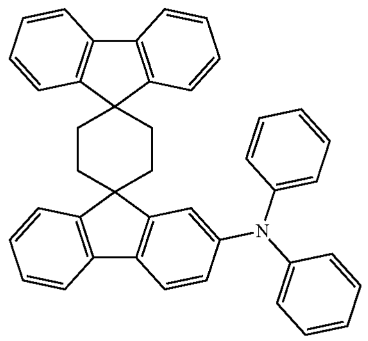

2

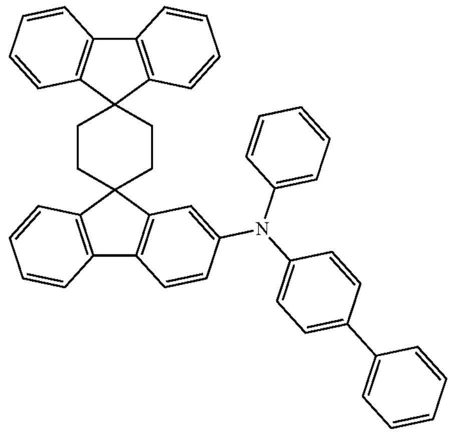

3

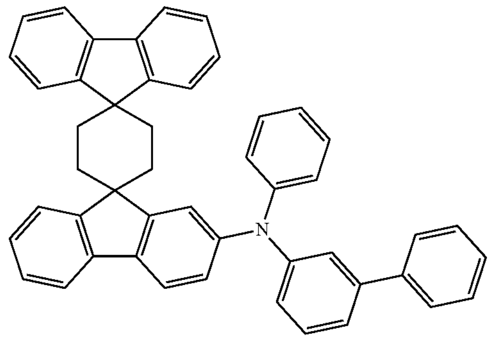

4

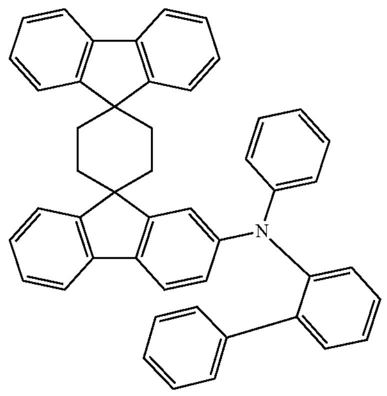

-continued
5
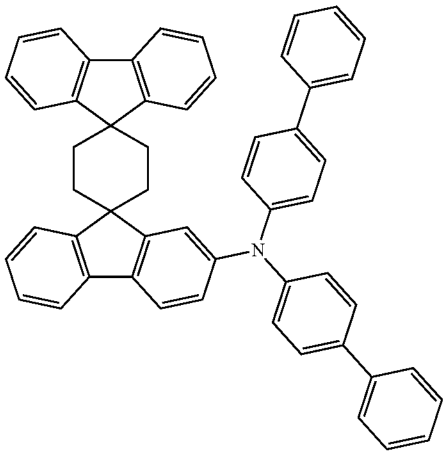
6
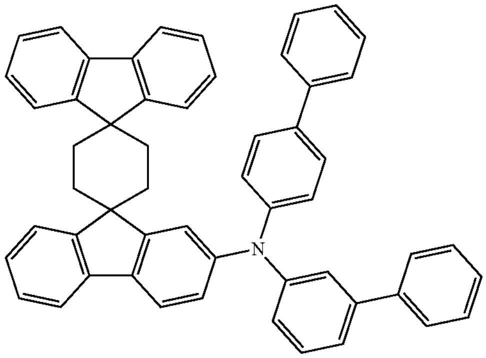
7
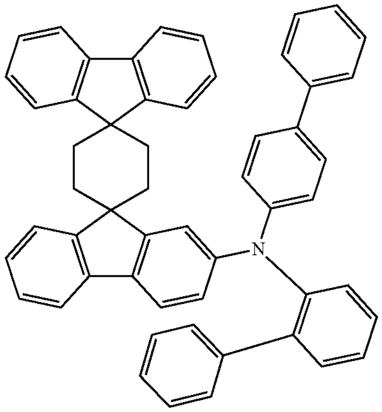
8
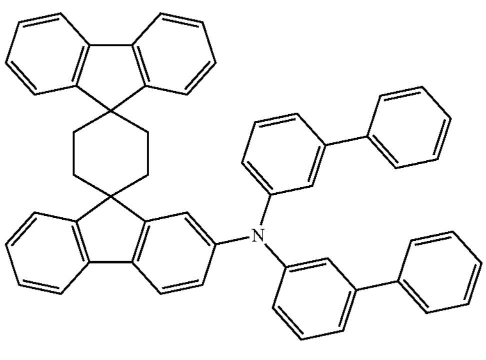
-continued
9
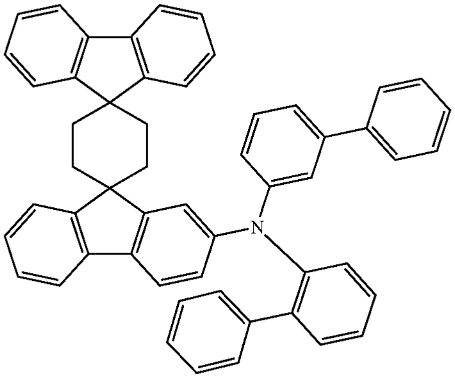
10
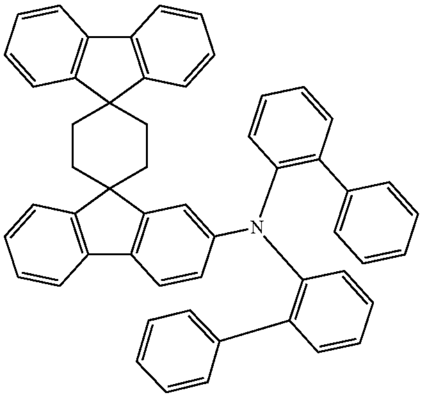
11
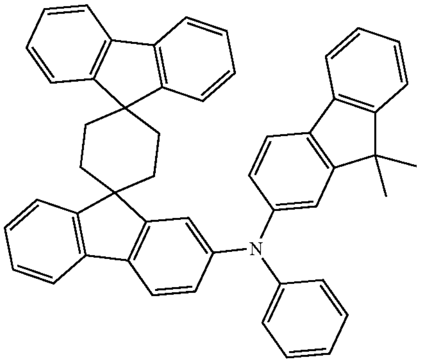
12
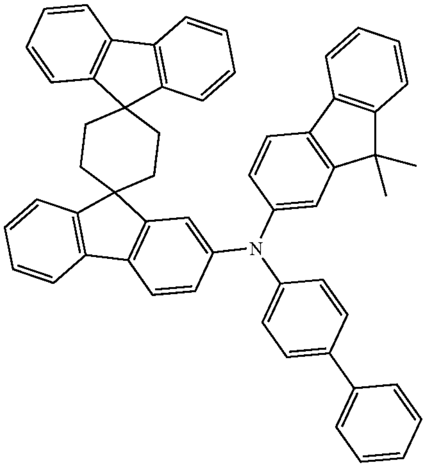

-continued
13
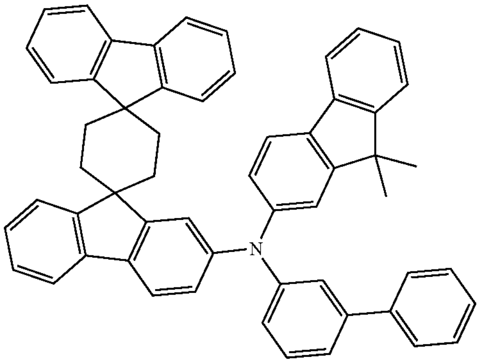
14
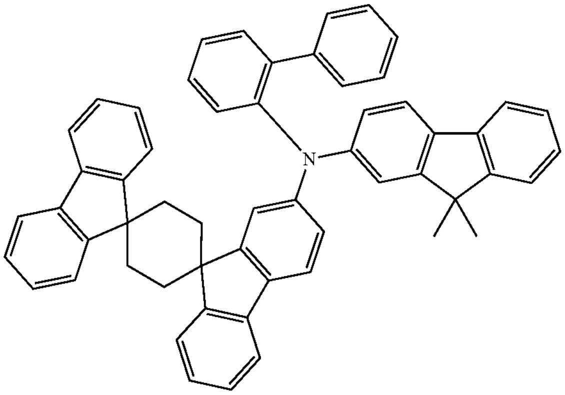
15
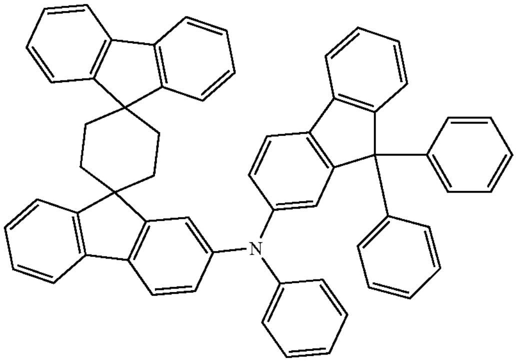
16
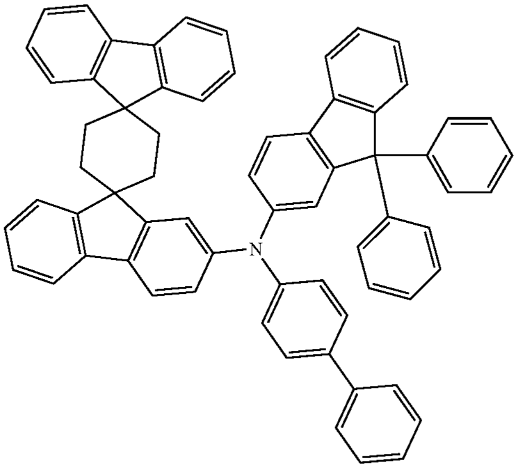
-continued
17
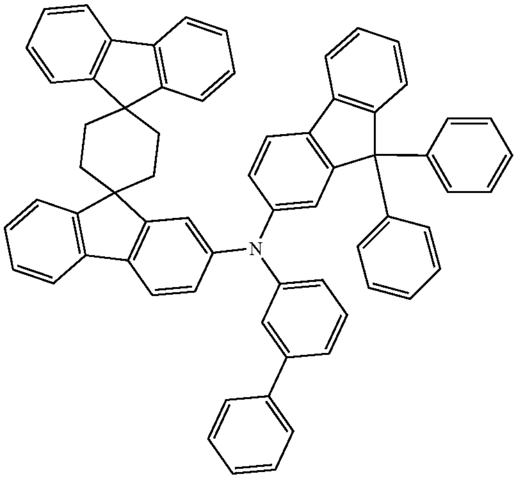
18
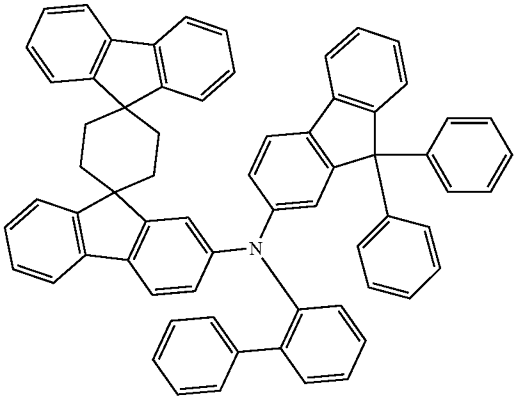
19
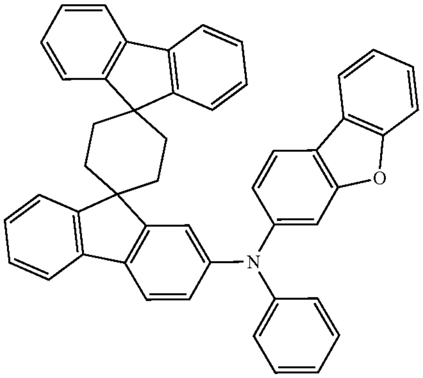

-continued
20
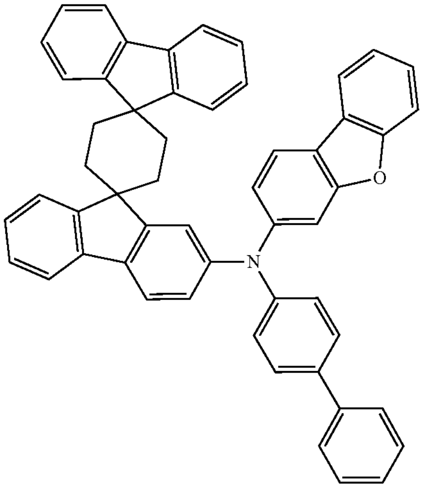
21
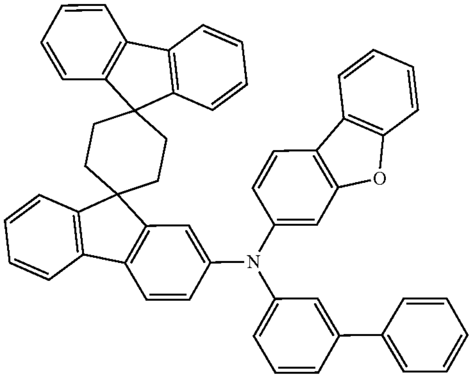
22
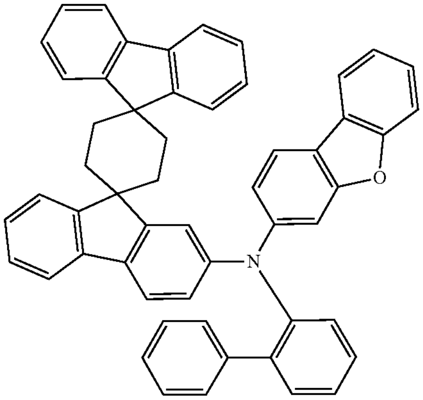
23
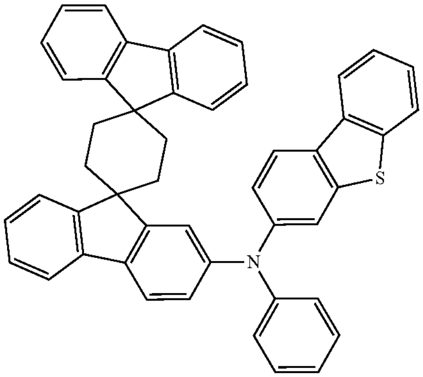
-continued
24
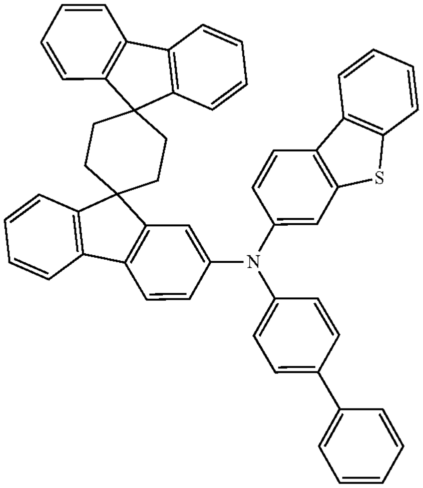
25
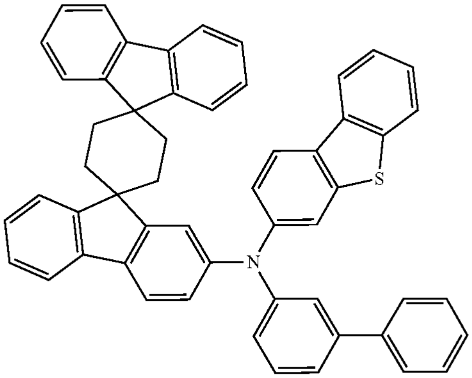
26
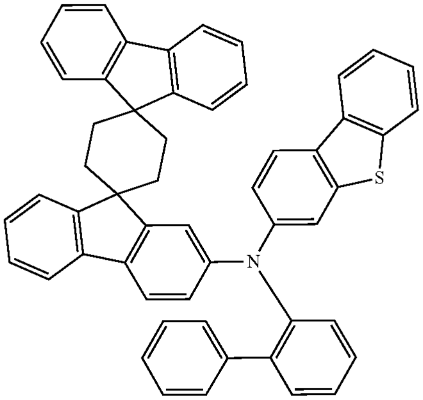

-continued
27
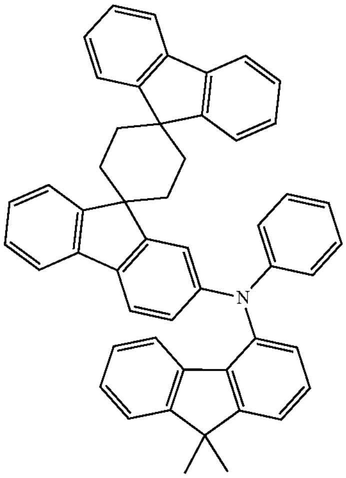
28
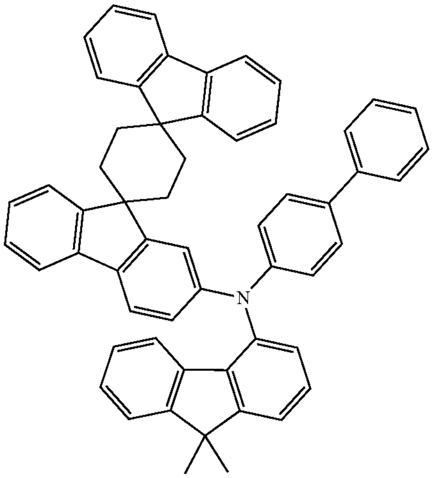
29
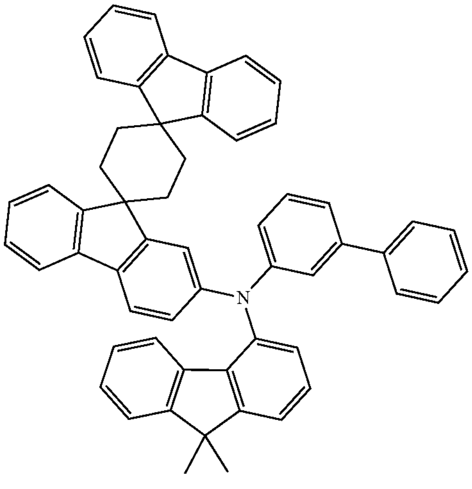
-continued
30
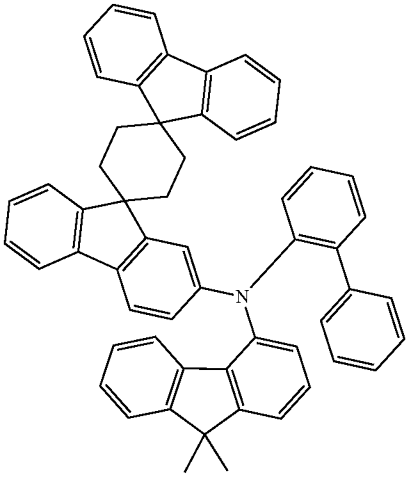
31
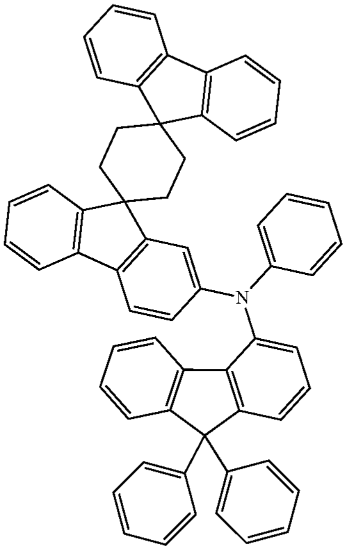
32
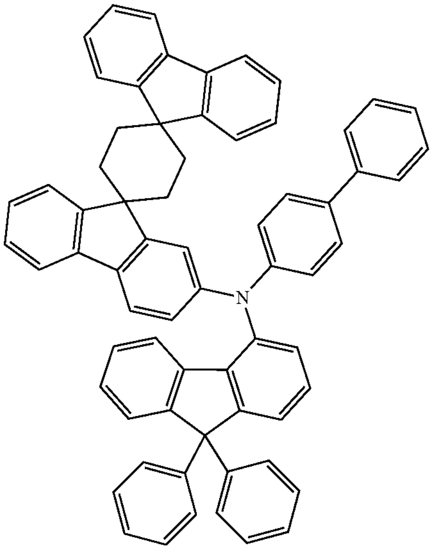

-continued
33
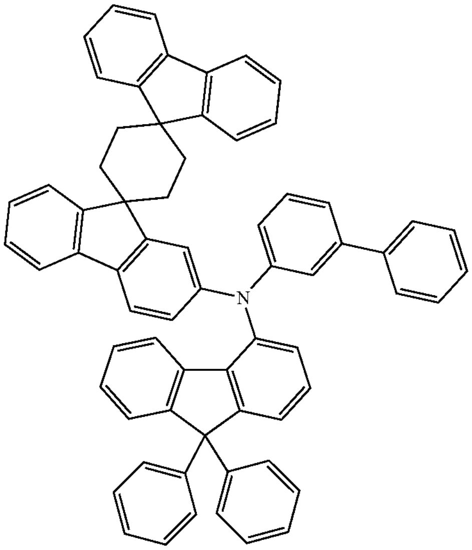
34
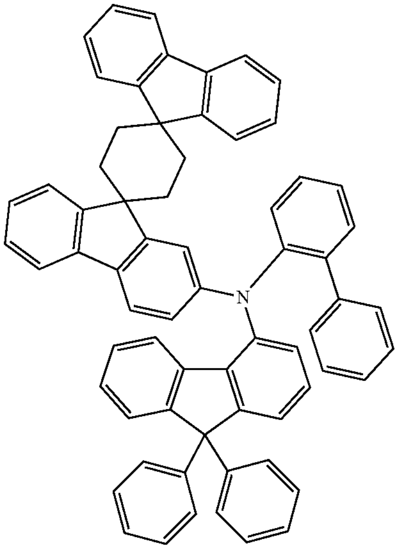
35
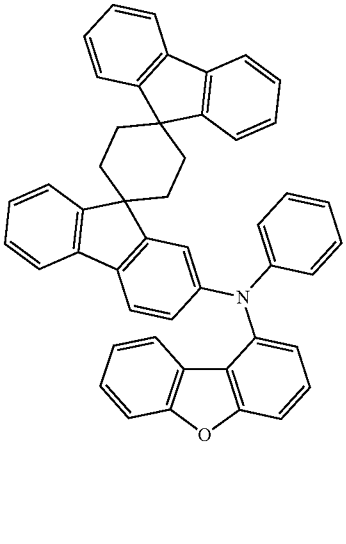
-continued
36
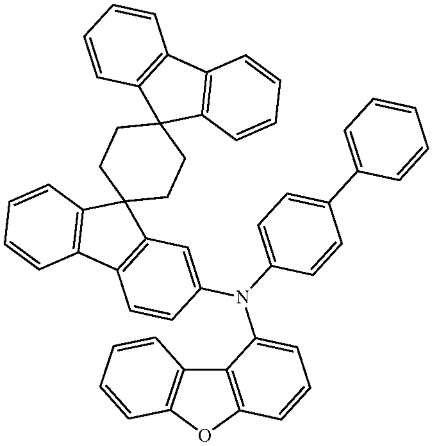
37
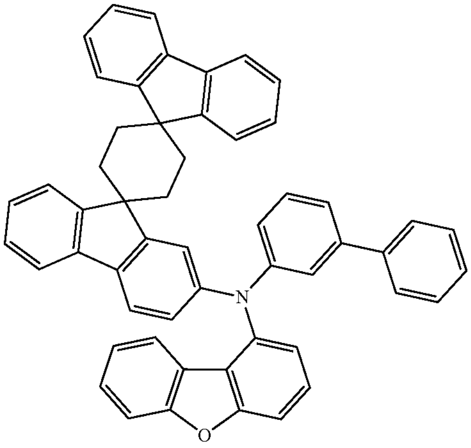
38
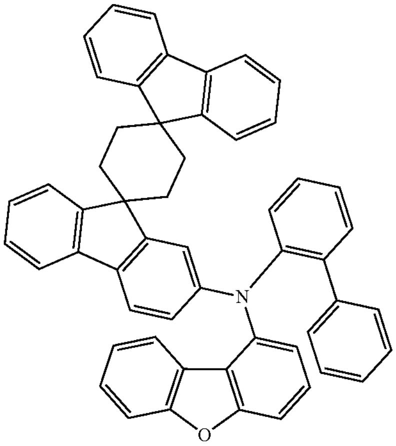

-continued
39
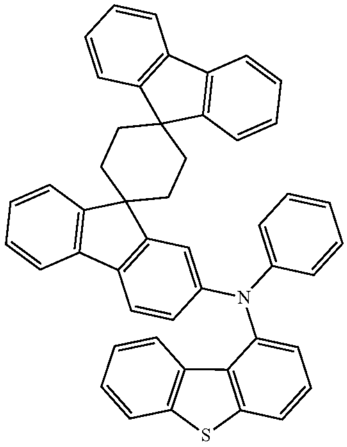
40
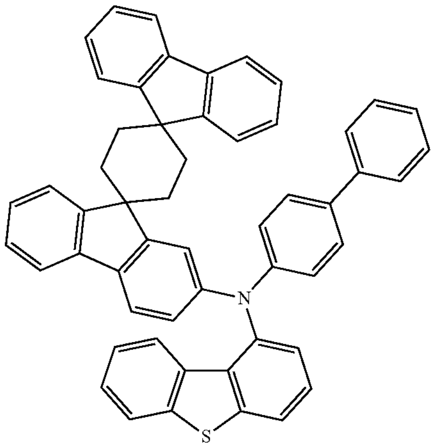
41
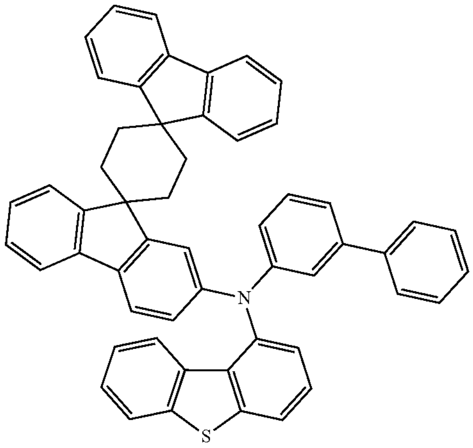
-continued
42
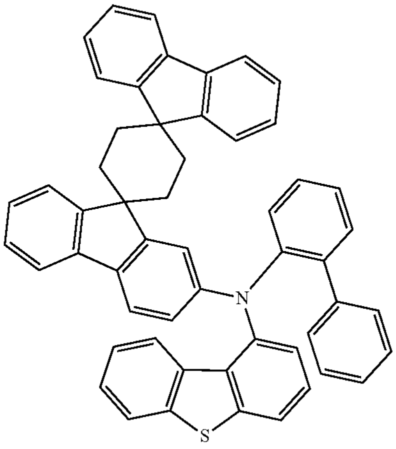
43
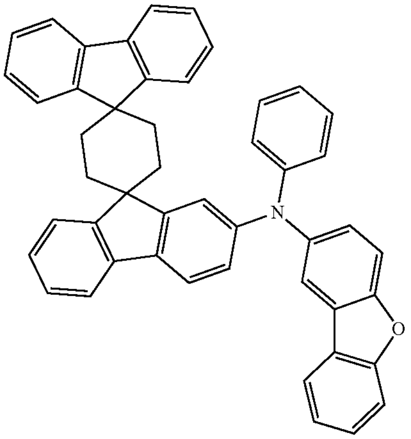
44
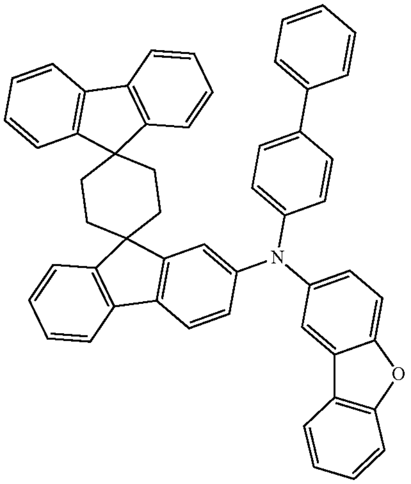

-continued
45
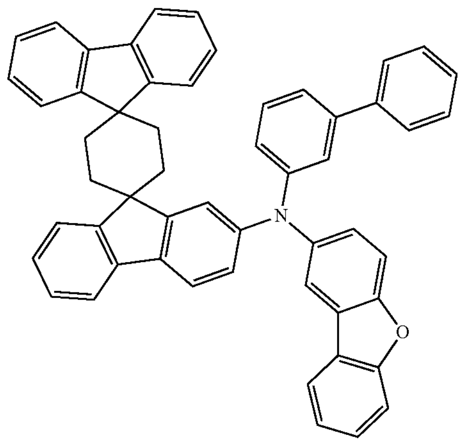
46
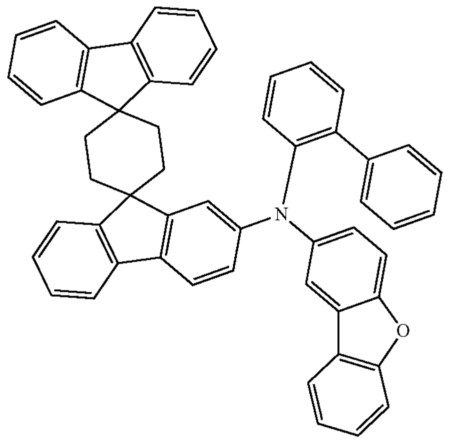
47
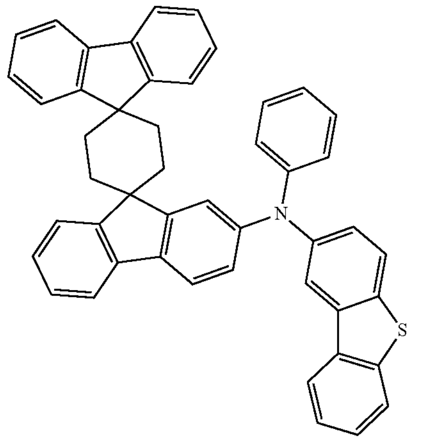
-continued
48
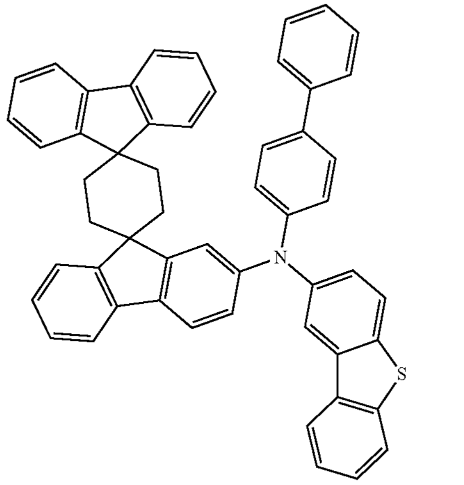
49
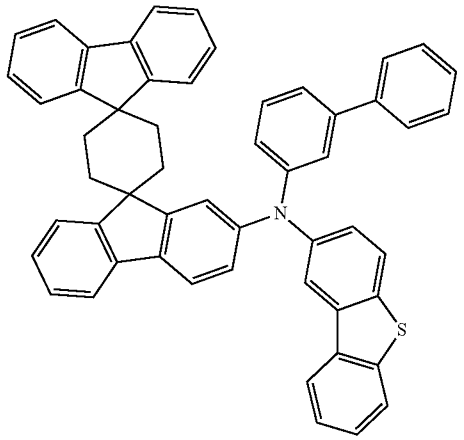
50
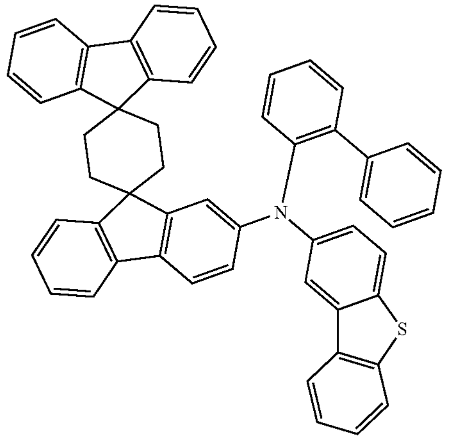

-continued
51
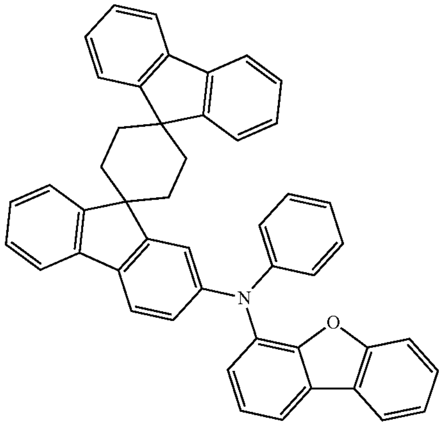
52
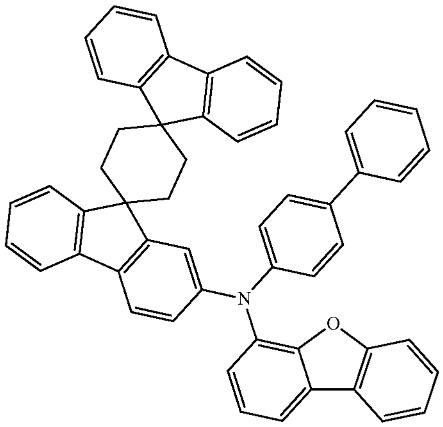
53
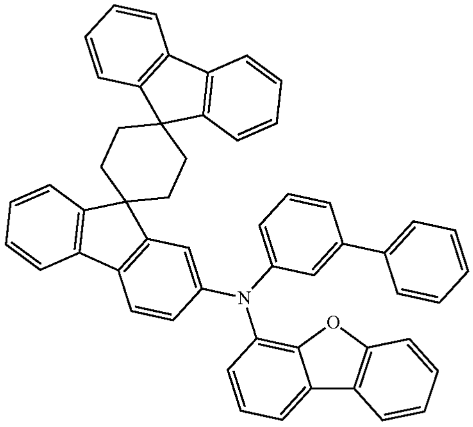
-continued
54
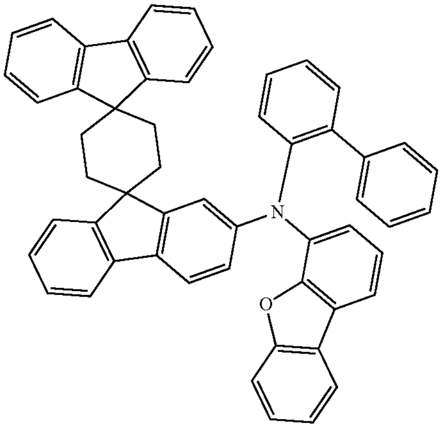
55
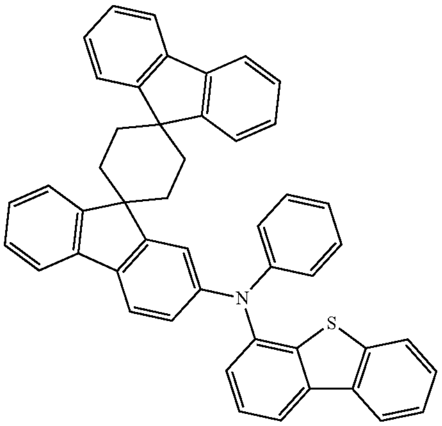
56
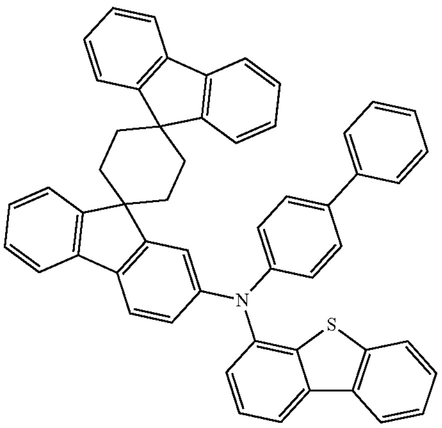

-continued
57
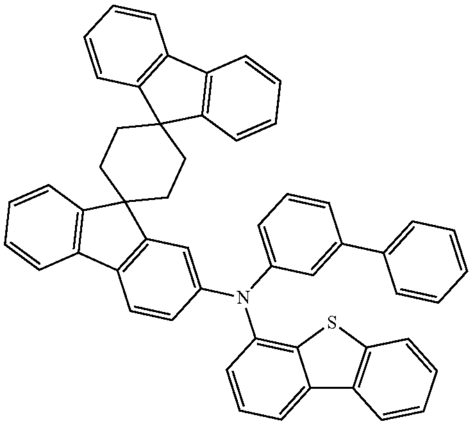
58
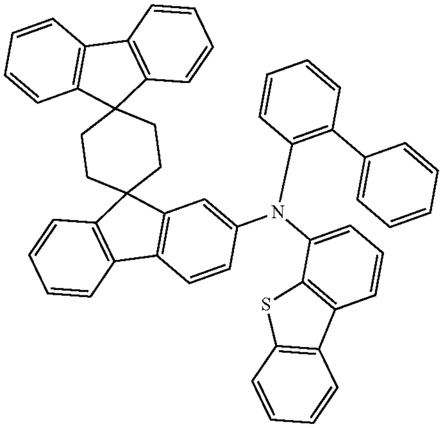
59
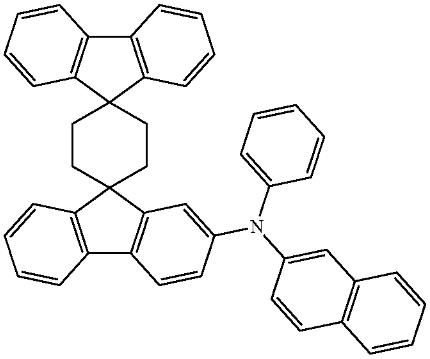
60
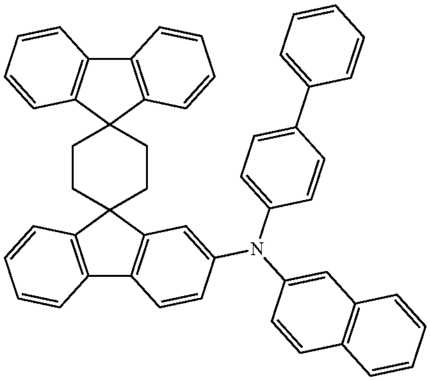
-continued
61
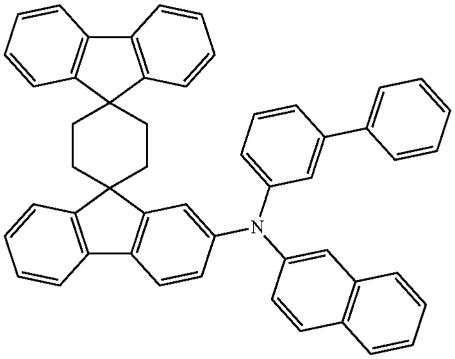
62
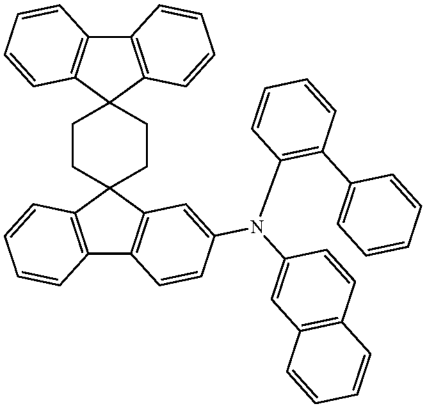
63
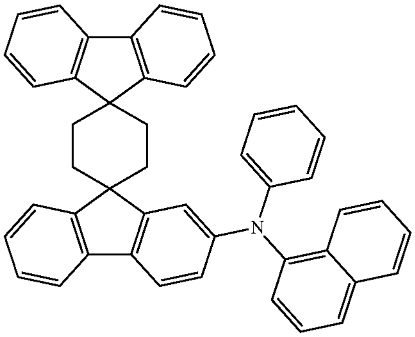
64
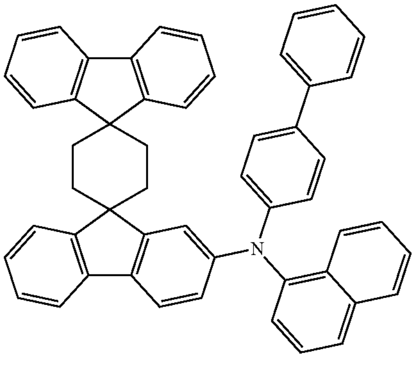

-continued
65
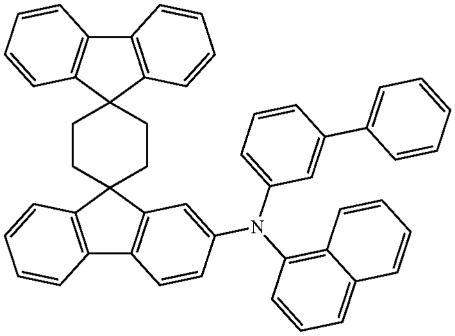
66
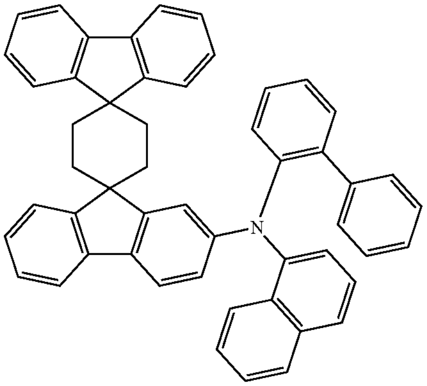
67
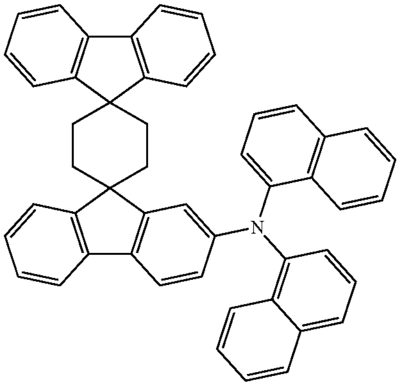
68
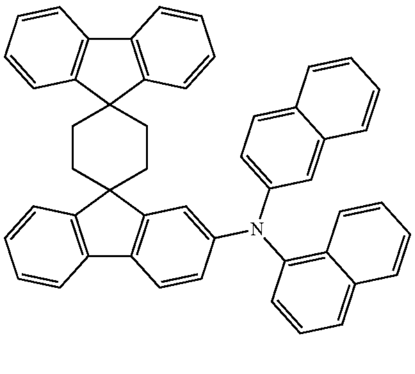
-continued
69
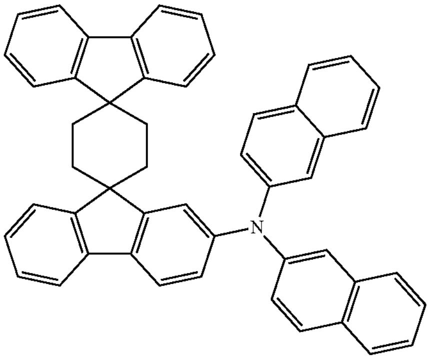
70
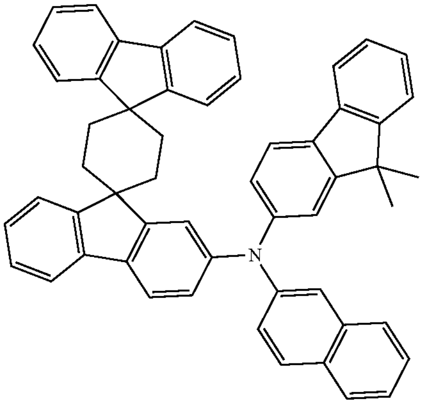
71
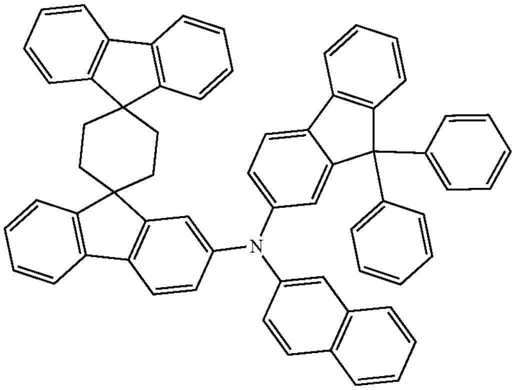
72
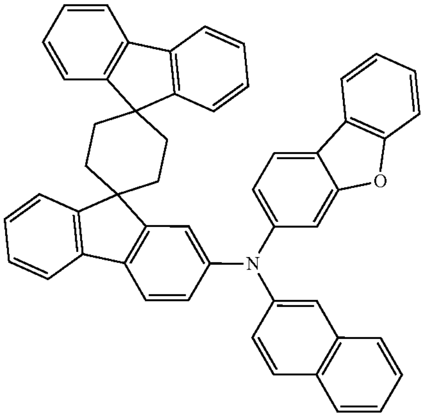

-continued
73
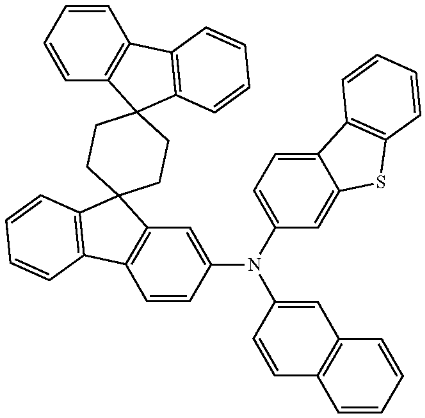
74
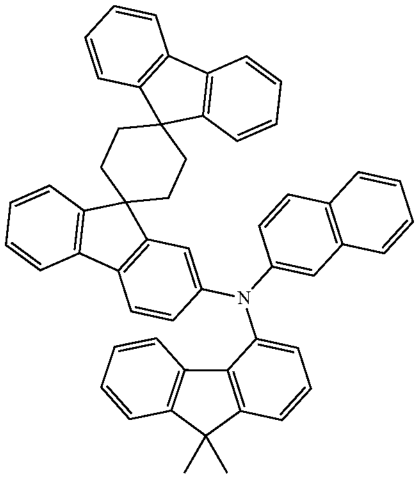
75
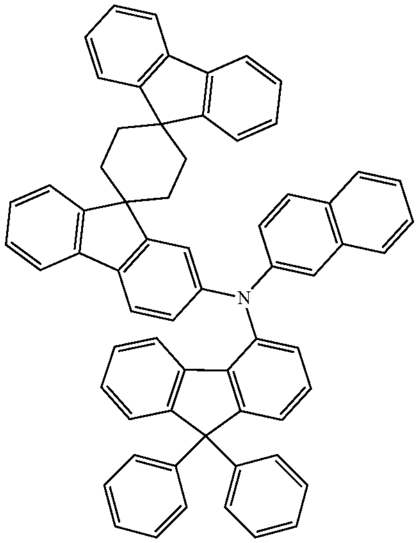
-continued
76
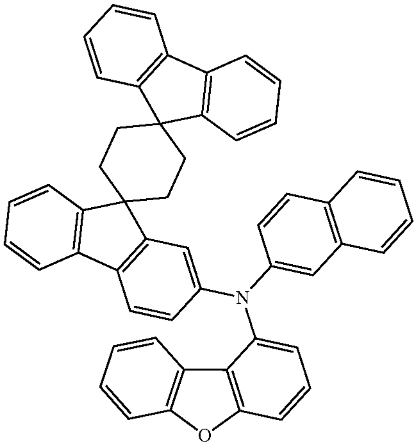
77
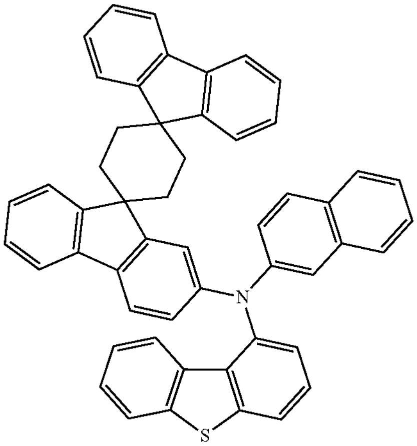
78
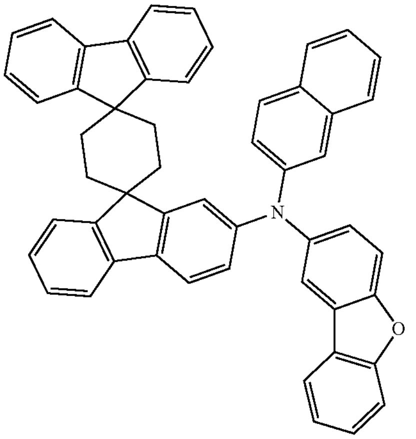

-continued
79
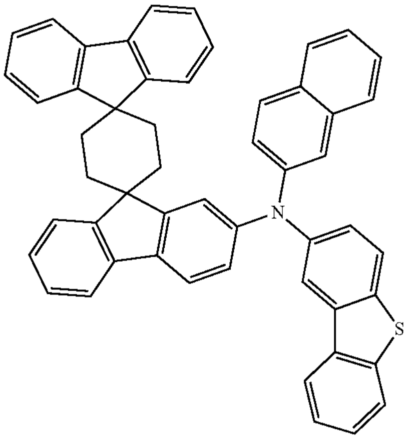
80
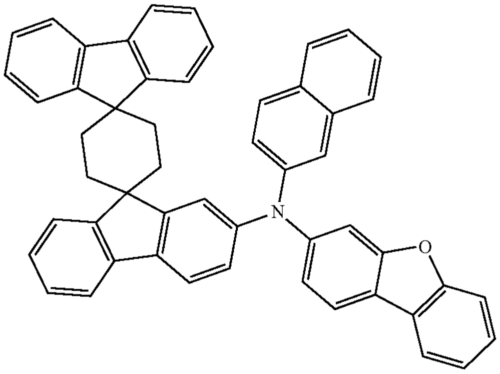
81
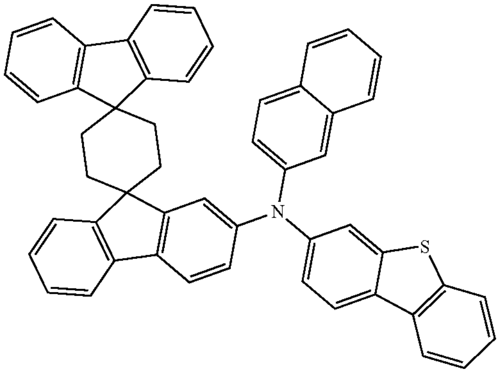
82
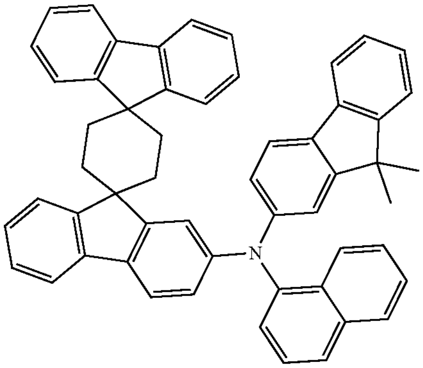
-continued
83
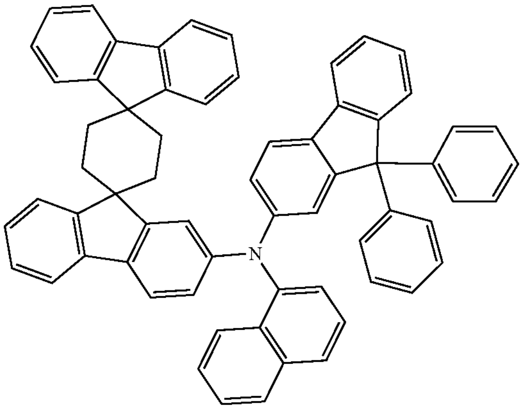
84
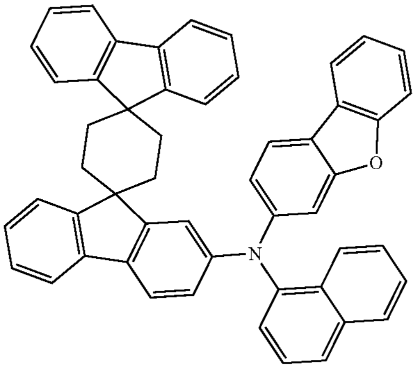
85
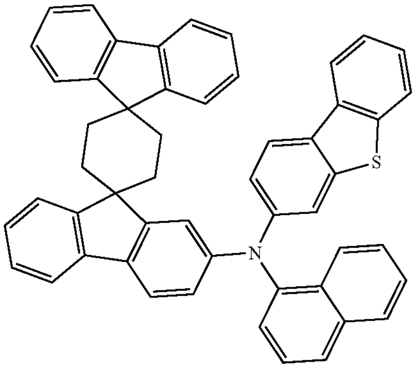
86
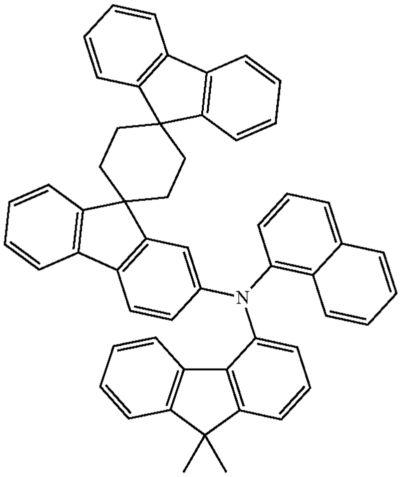

-continued
87
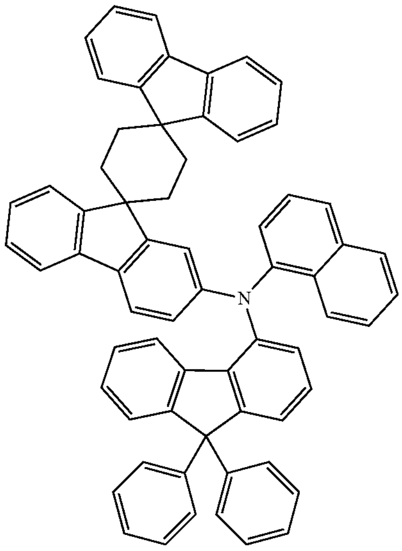
88
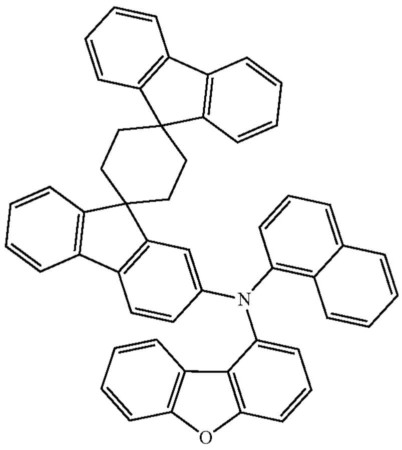
89
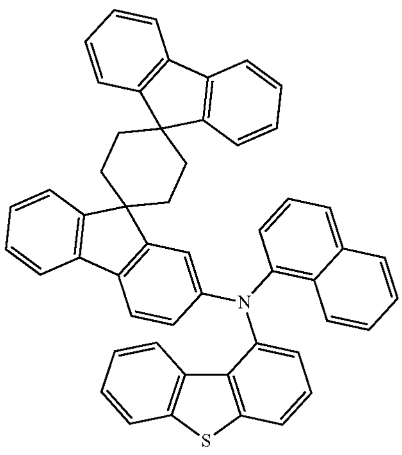
-continued
90
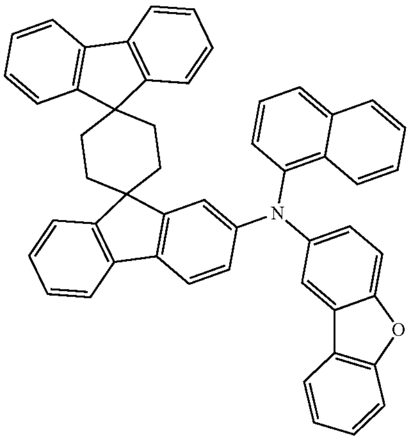
91
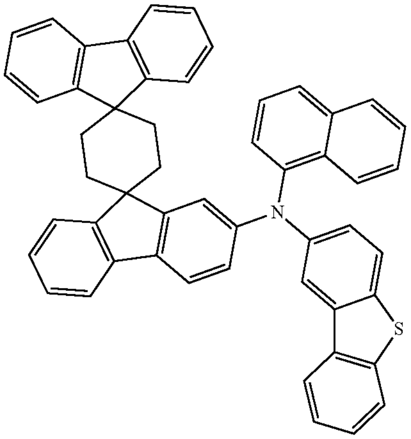
92
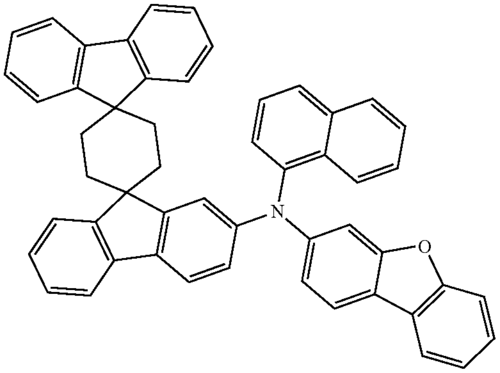
93
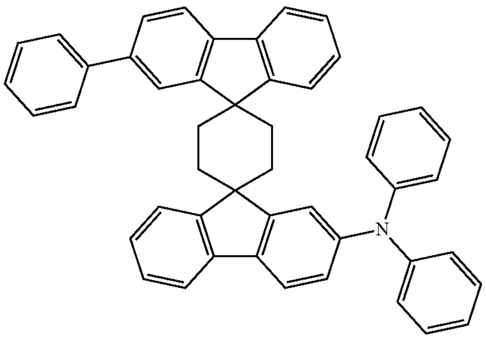

-continued
94
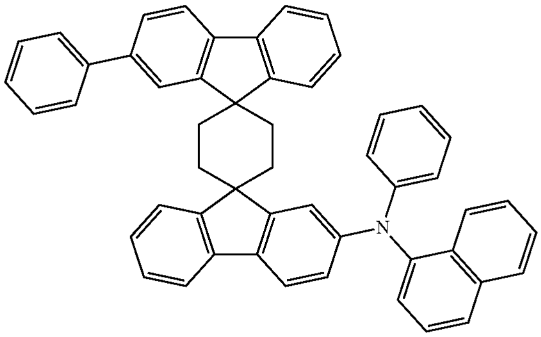
95
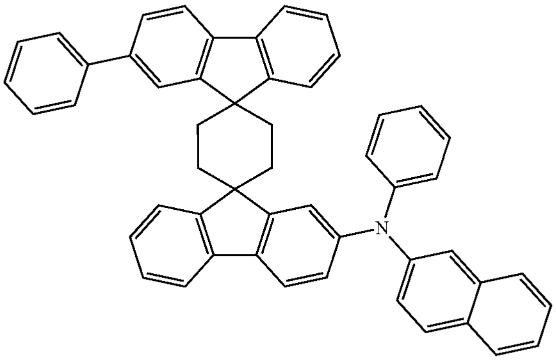
96
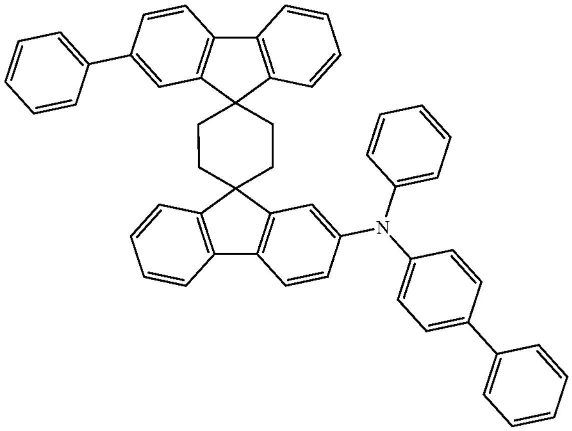
97
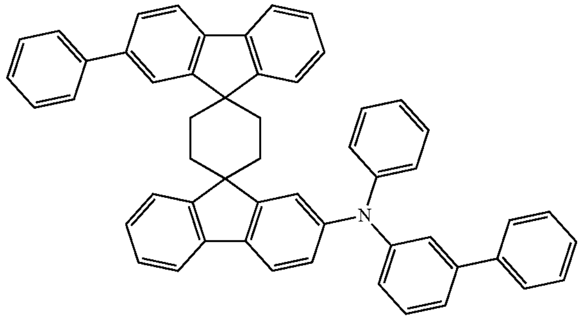
-continued
98
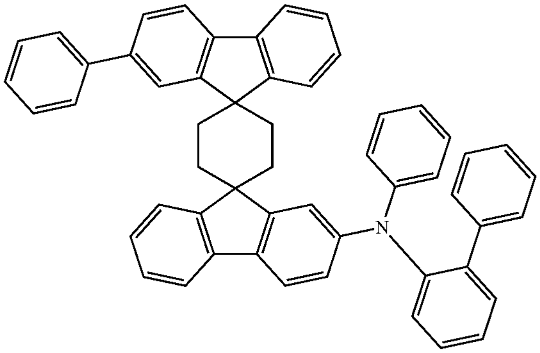
99
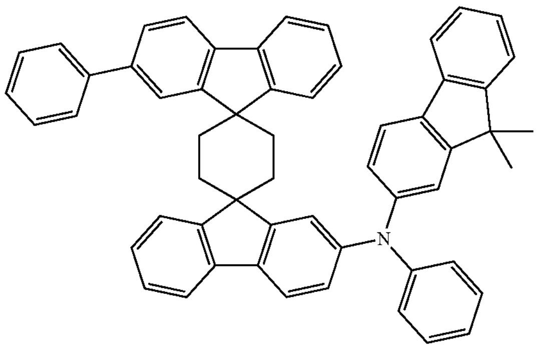
100
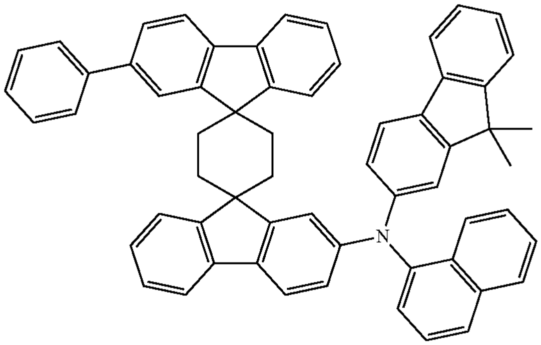
101
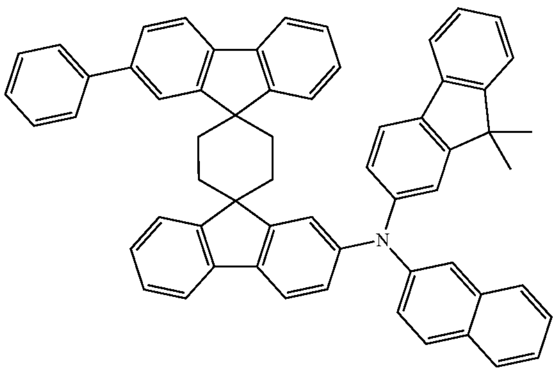

-continued
102
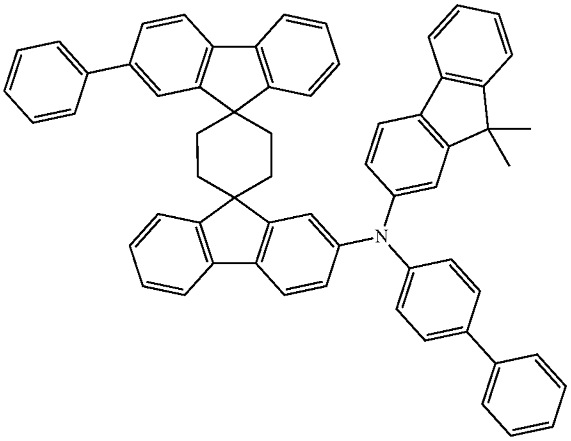
103
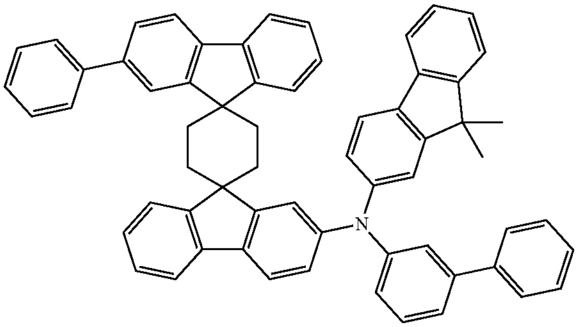
104
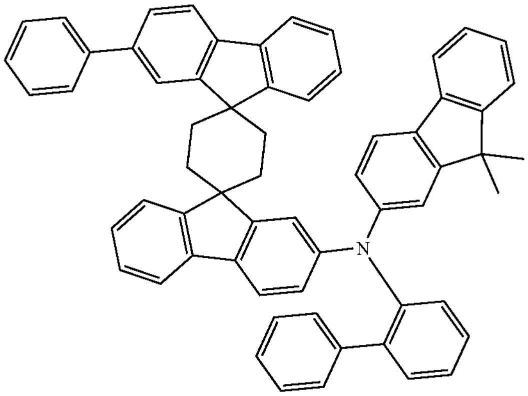
105
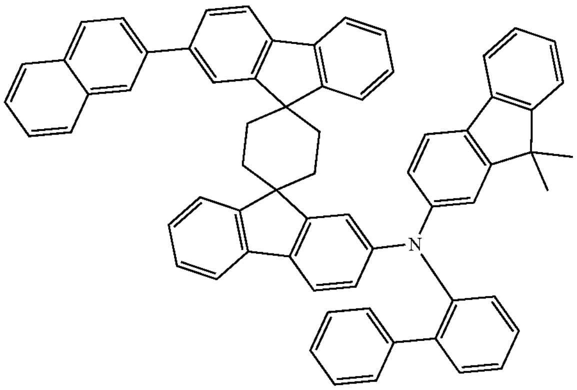
-continued
106
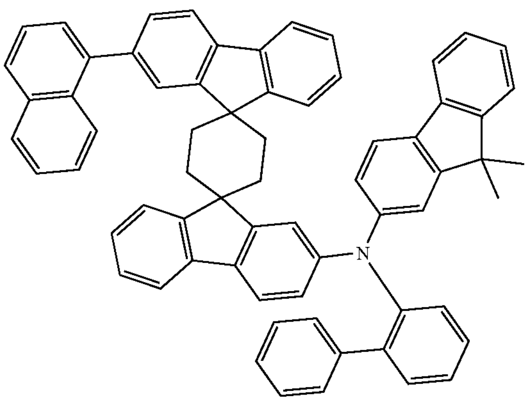
107
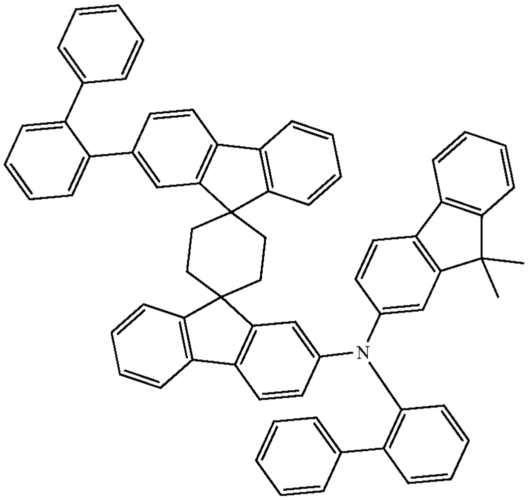
108
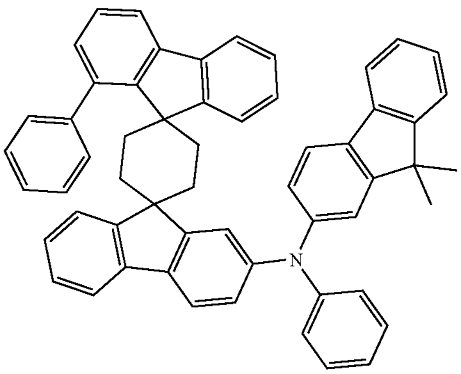

-continued
109
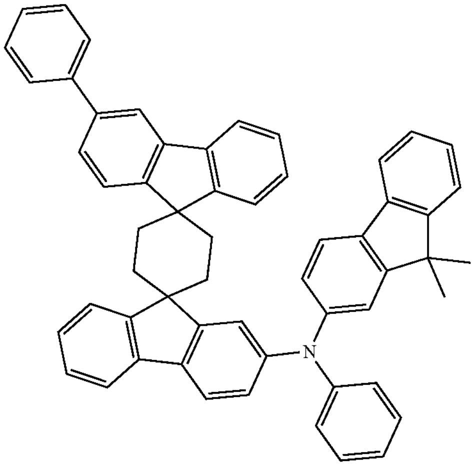
110
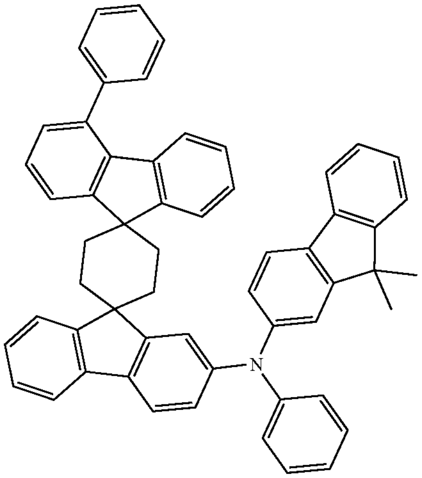
111
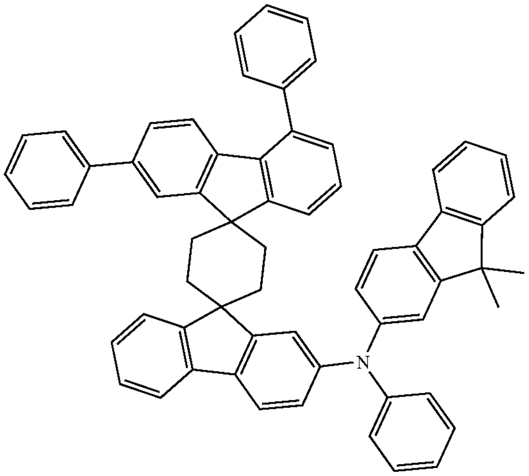
-continued
112
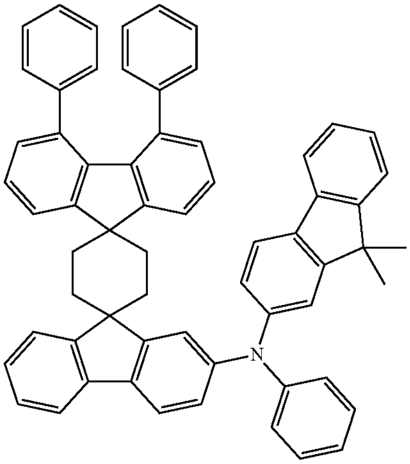
113
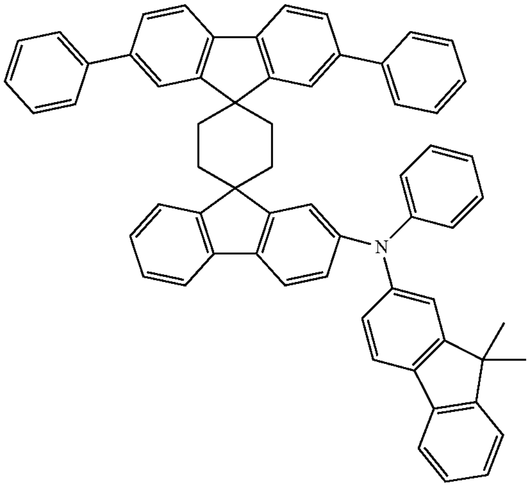
114
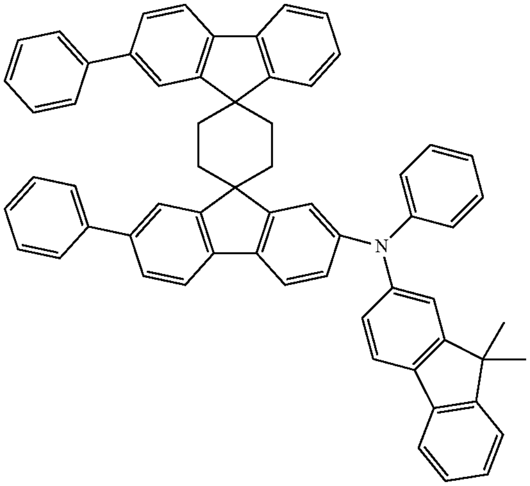

-continued
115
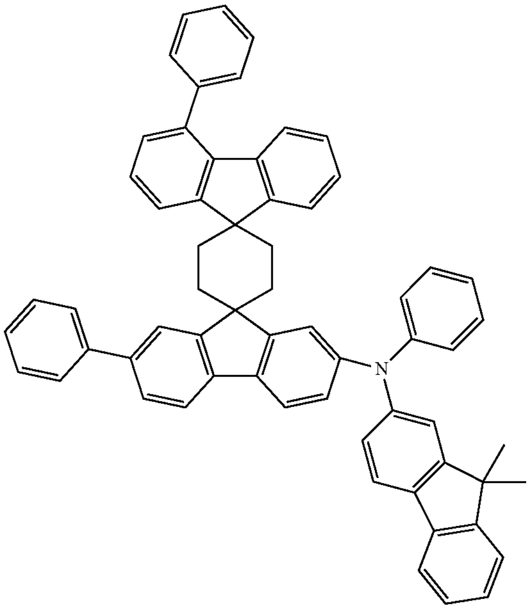
116
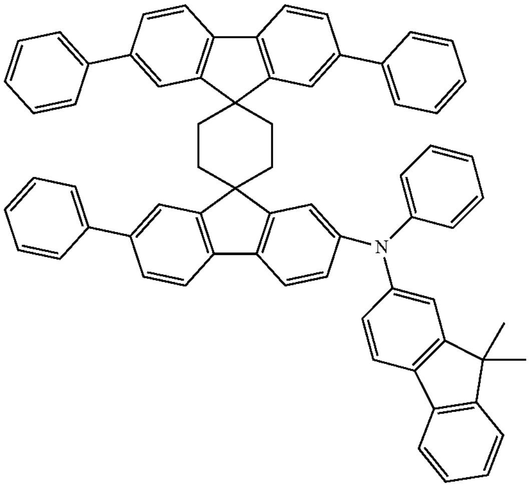
117
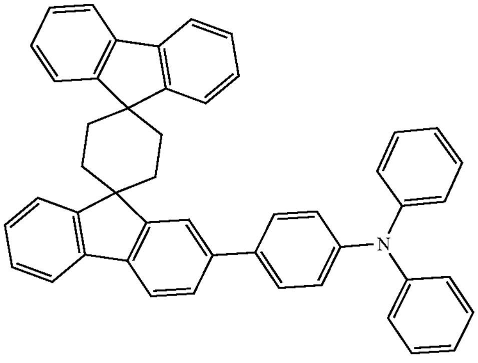
-continued
118
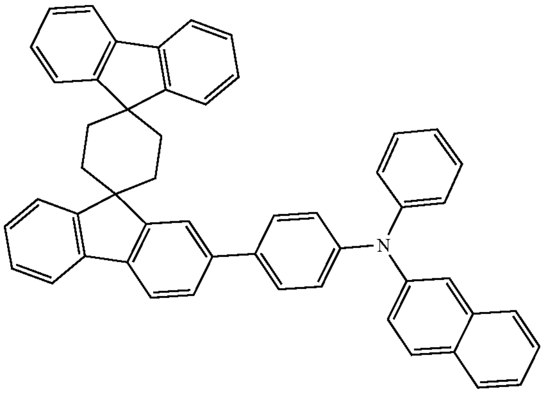
119
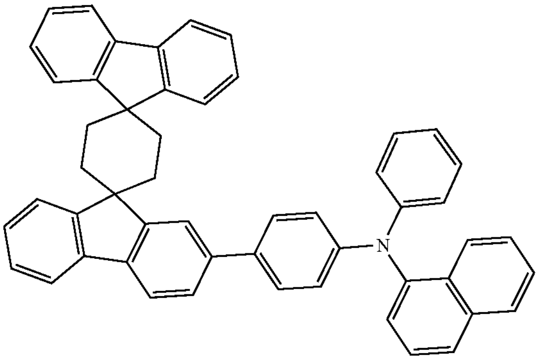
120
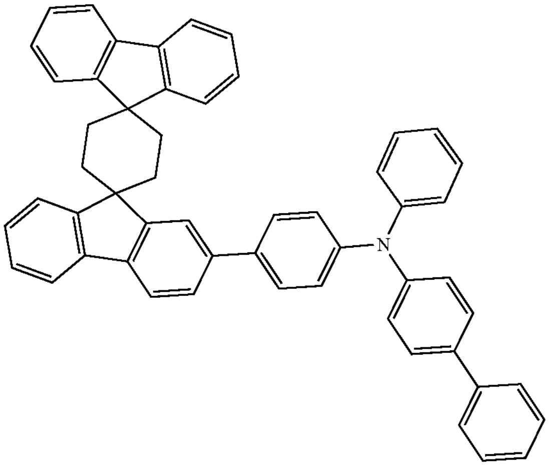
121
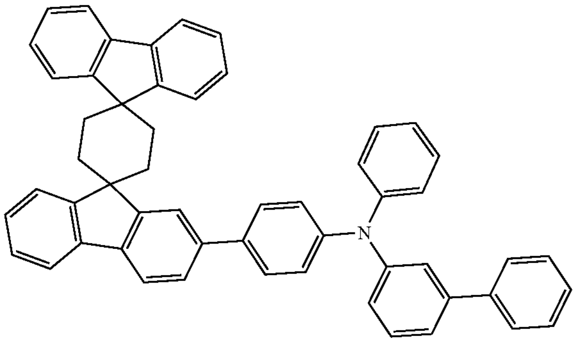

-continued
122
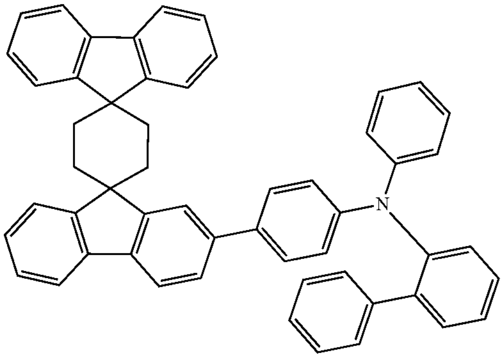
123
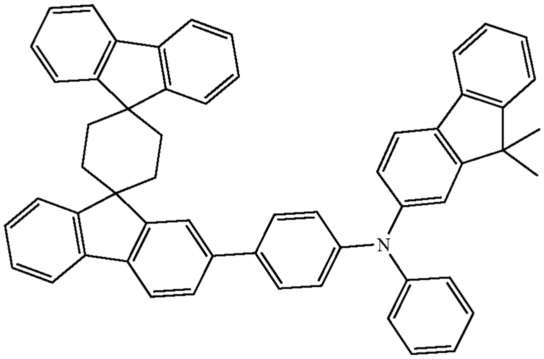
124
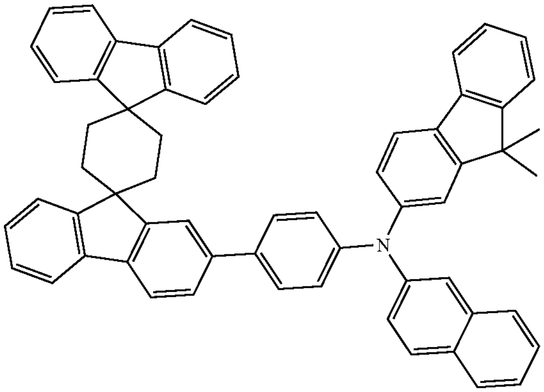
125
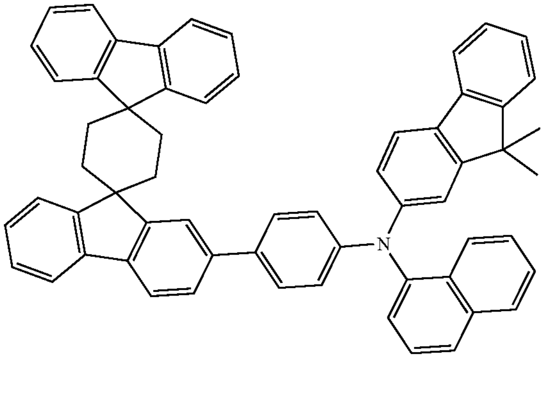
-continued
126
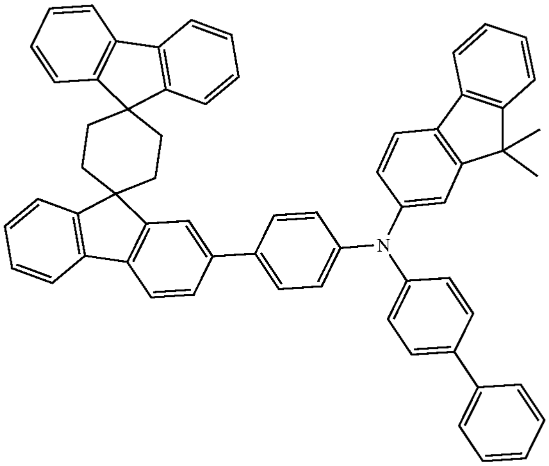
127
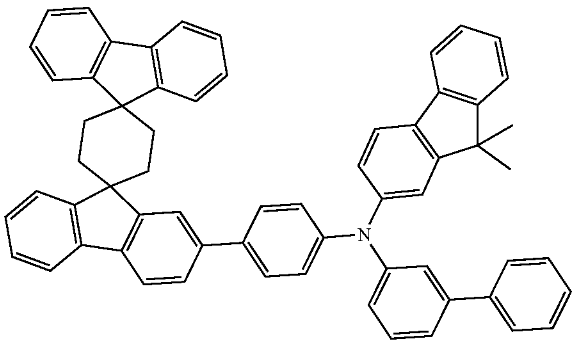
128
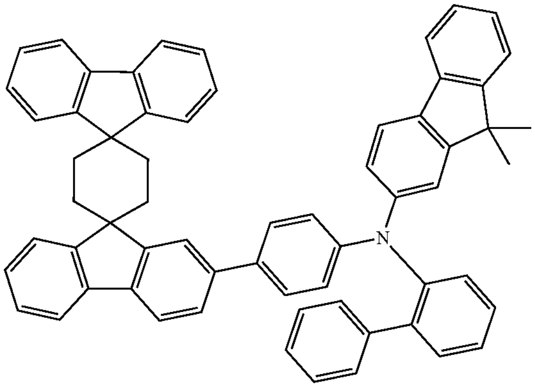
129
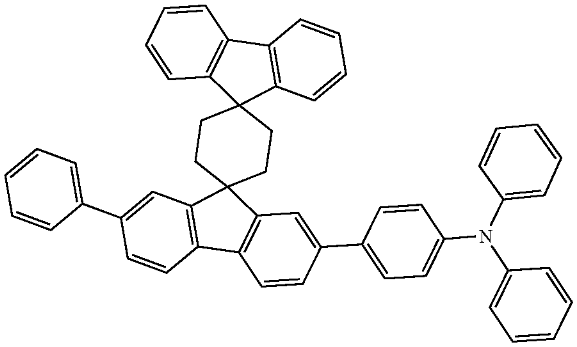

-continued
130
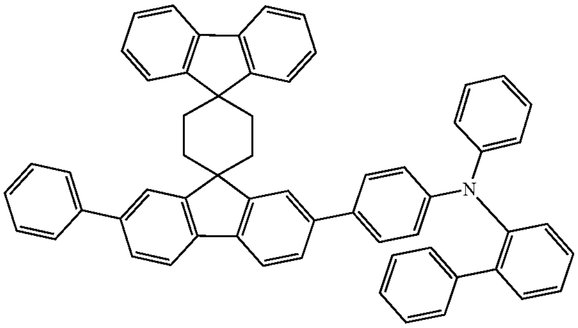
131
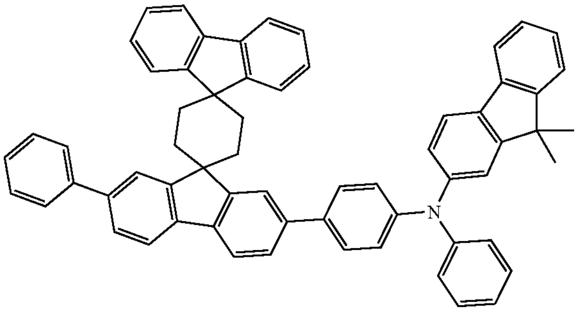
132
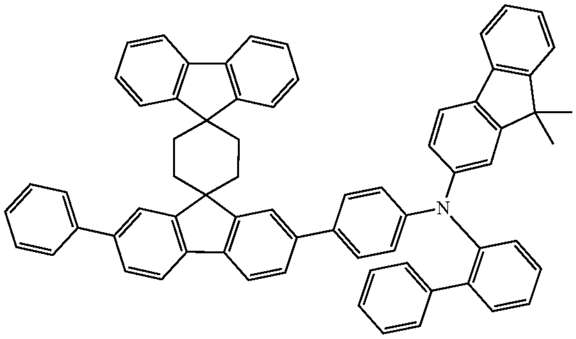
133
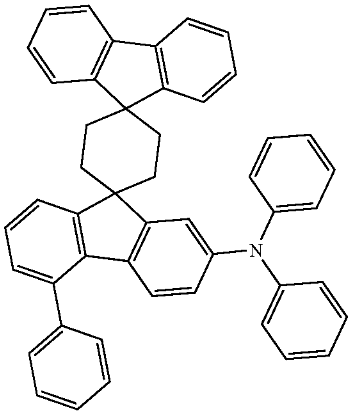
-continued
134
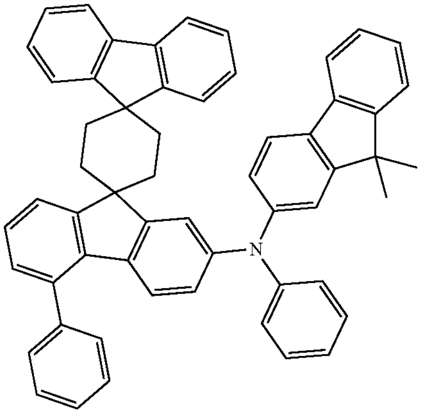
135
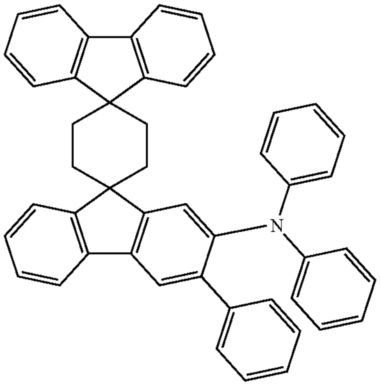
136
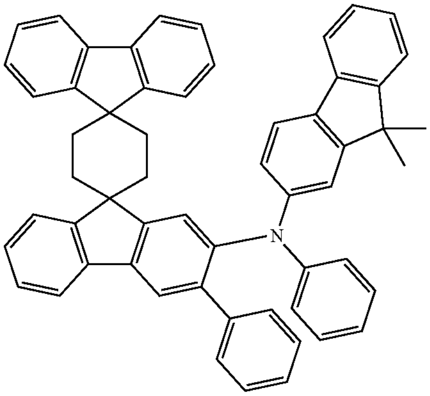
137
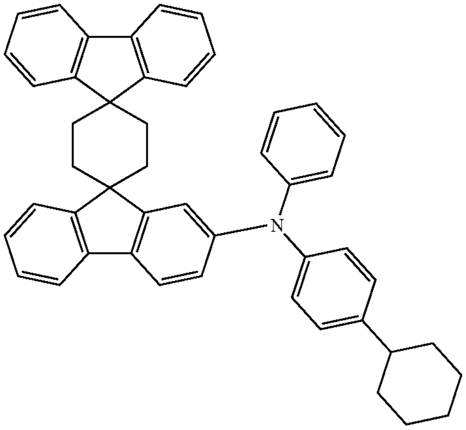

-continued
138
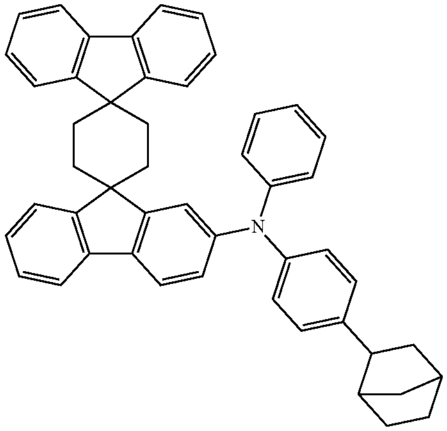
139
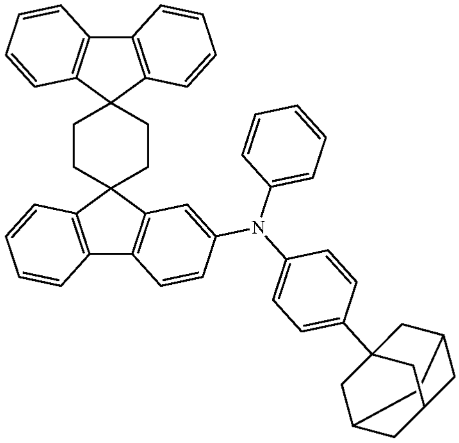
140
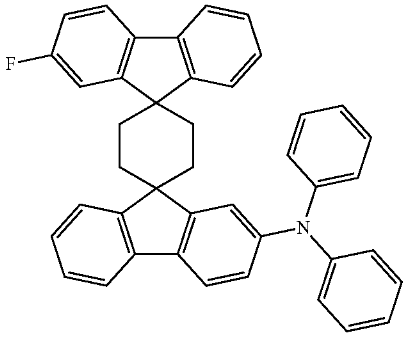
141
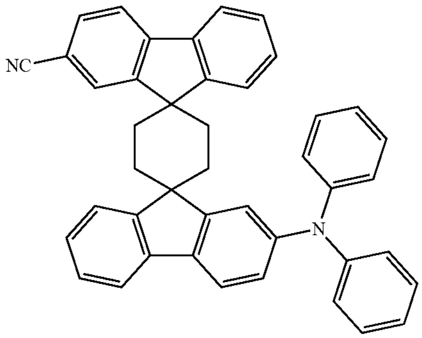
-continued
142
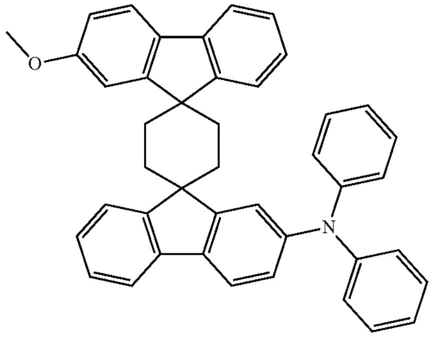
143
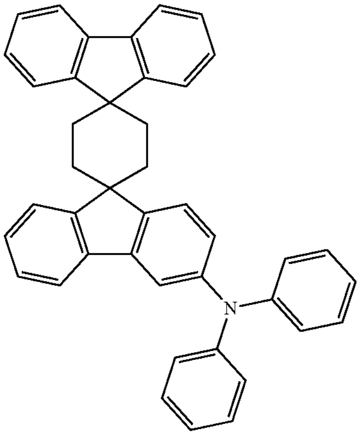
144
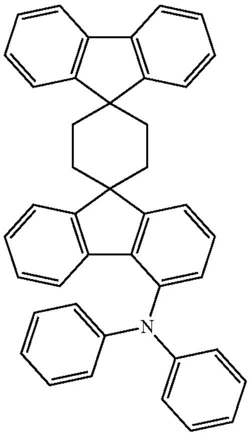
145
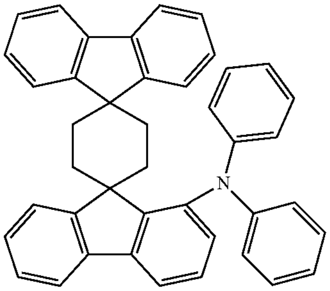

-continued

146

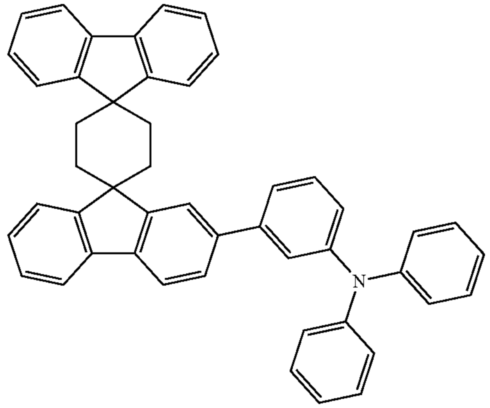

147

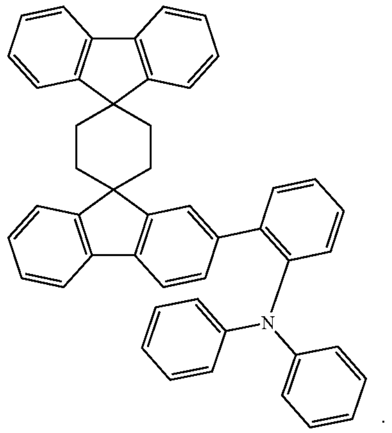

In the heterocyclic compound represented by Formula 1, ring $CY_1$ may be a 5-membered to 10-membered saturated cyclic group unsubstituted or substituted with $R_{10a}$.

While not wishing to be bound by any specific theory, the heterocyclic compound may have improved stability and charge transportability due to the inclusion of the saturated cyclic group, as compared with another compound having substantially the same structure as Formula 1 but not including ring $CY_1$ being a 5-membered to 10-membered saturated cyclic group unsubstituted or substituted with $R_{10a}$. Accordingly, the light-emitting device including the heterocyclic compound may have improved high luminescence efficiency, low driving voltage, high luminance, and long lifespan.

Thus, an electronic device, e.g., a light-emitting device, including the heterocyclic compound represented by Formula 1 may have improved luminescence efficiency and/or improved lifespan.

Methods of synthesizing the heterocyclic compound represented by Formula 1 may be easily understood by those of ordinary skill in the art by referring to Synthesis Examples and Examples described herein.

At least one of the heterocyclic compounds represented by Formula 1 may be utilized in a light-emitting device (e.g., an organic light-emitting device). According to one or more embodiments, a light-emitting device may include: a first electrode; a second electrode facing the first electrode; an interlayer located between the first electrode and the second electrode and including an emission layer; and the heterocyclic compound represented by Formula 1.

In some embodiments, the first electrode of the light-emitting device may be an anode, the second electrode of the light-emitting device may be a cathode, the interlayer may further include a hole transport region between the first electrode and the emission layer and an electron transport region between the emission layer and the second electrode, the hole transport region may include a hole injection layer, a hole transport layer, an emission auxiliary layer, an electron blocking layer, or any combination thereof, and the electron transport region may include a buffer layer, a hole blocking layer, an electron control layer, an electron transport layer, an electron injection layer, or any combination thereof.

In one or more embodiments, the heterocyclic compound may be included between the first electrode and the second electrode of the light-emitting device. In an embodiment, the heterocyclic compound may be included in the interlayer, e.g., a hole transport region or in a hole transport region of the interlayer. For example, the heterocyclic compound may be included in the interlayer, e.g., a hole transport layer or in a hole transport layer of the interlayer.

In an embodiment, a refractive index (at a wavelength of 460 nm) of the interlayer including the heterocyclic compound may be in a range of about 1.65 to about 1.8. In an embodiment, a refractive index (at a wavelength of 460 nm) of the hole transport region including the heterocyclic compound may be in a range of about 1.65 to about 1.8. In an embodiment, a refractive index (at a wavelength of 460 nm) of the hole transport layer including the heterocyclic compound may be in a range of about 1.65 to about 1.8. The refractive index (at a wavelength of 460 nm) may be a refractive index with respect to a wavelength of 460 nm.

The emission layer may be to emit red light, green light, blue light, and/or white light. In some embodiments, the emission layer may be to emit blue light. The blue light may have a maximum emission wavelength in a range of about 40 nanometers (nm) to about 490 nm.

In some embodiments, the emission layer may include a host and a dopant.

For example, a host included in the emission layer may include at least two different hosts.

In some embodiments, the emission layer may further include a phosphorescent dopant, a delayed fluorescence material, or a combination thereof. For example, the emission layer may further include a phosphorescent dopant, in addition to a host and a dopant.

In some embodiments, the dopant may include a transition metal and ligand(s) in the number of m, m may be an integer from 1 to 6, the ligand(s) in the number of m may be identical to or different from each other, at least one of the ligand(s) in the number of m may be linked to the transition metal via a carbon-transition metal bond, and the carbon-transition metal bond may be a coordinate bond. For example, at least one of the ligand(s) in the number of m may be a carbene ligand (e.g., $Ir(pmp)_3$ and/or the like). The transition metal may be, for example, iridium, platinum, osmium, palladium, rhodium, or gold. The emission layer and the dopant may respectively be understood by referring to the descriptions of the emission layer and the dopant provided herein:

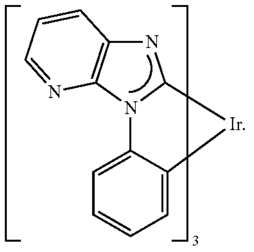

Ir(pmp)$_3$

In one or more embodiments, the light-emitting device may include a capping layer located outside the first electrode and/or the second electrode. In an embodiment, the heterocyclic compound represented by Formula 1 may be included in the capping layer.

In one or more embodiments, the light-emitting device may further include at least one selected from a first capping layer located outside a first electrode and a second capping layer located outside a second electrode, and at least one selected from the first capping layer and the second capping layer may include the heterocyclic compound represented by Formula 1. The first capping layer and the second capping layer may respectively be understood by referring to the descriptions of the first capping layer and the second capping layer provided herein.

In some embodiments, the light-emitting device may include:

a first capping layer located outside the first electrode and including the heterocyclic compound represented by Formula 1;

a second capping layer located outside the second electrode and including the heterocyclic compound represented by Formula 1; or both the first capping layer and the second capping layer.

The expression that an "(interlayer and/or a capping layer) includes a heterocyclic compound" as used herein may refer to that the "(interlayer and/or the capping layer) may include one heterocyclic compound represented by Formula 1" or the "(interlayer and/or the capping layer) may include two or more different heterocyclic compounds represented by Formula 1".

For example, the interlayer and/or the capping layer may include only Compound 1 as the heterocyclic compound. In this embodiment, Compound 1 may be included in the hole transport region of the light-emitting device. In some embodiments, the interlayer may include Compounds 1 and 2 as the heterocyclic compounds. In this regard, Compounds 1 and 2 may be present in substantially the same layer (for example, both (e.g., simultaneously) Compounds 1 and 2 may be present in a hole transport region), or in different layers (for example, Compound 1 may be present in a hole transport layer and Compound 2 may be present in an emission layer).

The term "interlayer" as utilized herein refers to a single layer and/or all of a plurality of layers located between a first electrode and a second electrode in a light-emitting device.

According to one or more embodiments, an electronic apparatus may include the light-emitting device. The electronic apparatus may further include a thin-film transistor. In some embodiments, the electronic apparatus may further include a thin-film transistor including a source electrode and a drain electrode, and a first electrode of the light-emitting device may be electrically connected to the source electrode or the drain electrode. The electronic apparatus may further include a color filter, a color-conversion layer, a touchscreen layer, a polarizing layer, or any combination thereof. The electronic apparatus may be understood by referring to the description of the electronic apparatus provided herein.

Description of FIG. 1

FIG. 1 is a schematic cross-sectional view of a light-emitting device 10 according to an embodiment. The light-emitting device 10 may include a first electrode 110, an interlayer 130, and a second electrode 150.

Hereinafter, the structure of the light-emitting device 10 according to an embodiment and a method of manufacturing the light-emitting device 10 according to an embodiment will be described in connection with FIG. 1.

First Electrode 110

In FIG. 1, a substrate may be additionally located under the first electrode 110 and/or above the second electrode 150. The substrate may be a glass substrate and/or a plastic substrate. The substrate may be a flexible substrate including plastic having excellent or suitable heat resistance and durability, for example, polyimide, polyethylene terephthalate (PET), polycarbonate, polyethylene naphthalate, polyarylate (PAR), polyetherimide, or any combination thereof.

The first electrode 110 may be formed by depositing or sputtering a material for forming the first electrode 110 on the substrate. When the first electrode 110 is an anode, a high work function material that may easily inject holes may be utilized as a material for a first electrode 110.

The first electrode 110 may be a reflective electrode, a semi-transmissive electrode, or a transmissive electrode. When the first electrode 110 is a transmissive electrode, a material for forming the first electrode 110 may be indium tin oxide (ITO), indium zinc oxide (IZO), tin oxide ($SnO_2$), zinc oxide (ZnO), or any combination thereof. In some embodiments, when the first electrode 110 is a semi-transmissive electrode or a reflective electrode, magnesium (Mg), silver (Ag), aluminum (Al), aluminum-lithium (Al—Li), calcium (Ca), magnesium-indium (Mg—In), magnesium-silver (Mg—Ag), or any combination thereof may be utilized as a material for forming the first electrode 110.

The first electrode 110 may have a single-layered structure consisting of a single layer or a multi-layered structure including two or more layers. In some embodiments, the first electrode 110 may have a triple-layered structure of ITO/Ag/ITO.

Interlayer 130

The interlayer 130 may be on the first electrode 110. The interlayer 130 may include an emission layer.

The interlayer 130 may further include a hole transport region between the first electrode 110 and the emission layer and an electron transport region between the emission layer and the second electrode 150.

The interlayer 130 may further include one or more metal-containing compounds (such as organometallic compounds), inorganic materials (such as quantum dots), and/or the like, in addition to one or more suitable organic materials.

The interlayer 130 may include: i) two or more light-emitting units sequentially stacked between the first electrode 110 and the second electrode 150; and ii) a charge generation layer located between the two or more light-emitting units. When the interlayer 130 includes the two or more light-emitting units and the charge generation layer, the light-emitting device 10 may be a tandem light-emitting device.

Hole Transport Region in Interlayer 130

The hole transport region may have i) a single-layered structure consisting of a single layer consisting of a single material, ii) a single-layered structure consisting of a single layer including a plurality of different materials, or iii) a multi-layered structure having a plurality of layers including a plurality of different materials.

The hole transport region may include a hole injection layer, a hole transport layer, an emission auxiliary layer, an electron blocking layer, or a combination thereof.

For example, the hole transport region may have a multi-layered structure, e.g., a hole injection layer/hole transport layer structure, a hole injection layer/hole transport layer/emission auxiliary layer structure, a hole injection layer/emission auxiliary layer structure, a hole transport layer/emission auxiliary layer structure, or a hole injection layer/hole transport layer/electron blocking layer structure, wherein constituting layers of each structure are sequentially stacked on the first electrode 110 in the respective stated order.

The hole transport region may include the heterocyclic compound represented by Formula 1. The hole transport region may further include, in addition to the heterocyclic compound represented by Formula 1, a compound represented by Formula 201, a compound represented by Formula 202, or any combination thereof:

Formula 201

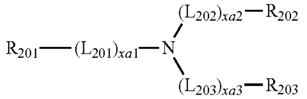

Formula 202

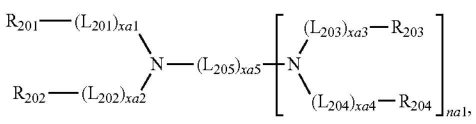

wherein, in Formulae 201 and 202, $L_{201}$ to $L_{204}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, $L_{205}$ may be *—O—*', *—S—*', *—N($Q_{201}$)-*', a $C_1$-$C_{20}$ alkylene group unsubstituted or substituted with at least one $R_{10a}$, a $C_2$-$C_{20}$ alkenylene group unsubstituted or substituted with at least one $R_{10a}$, a $C_3$-$C_{60}$ carbocyclic group unsubstituted or substituted with at least one $R_{10a}$, or a $C_1$-$C_{60}$ heterocyclic group unsubstituted or substituted with at least one $R_{10a}$, xa1 to xa4 may each independently be an integer from 0 to 5, xa5 may be an integer from 1 to 10, $R_{201}$ to $R_{204}$ and $Q_{201}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, $R_{201}$ and $R_{202}$ may optionally be linked to each other via a single bond, a $C_1$-$C_5$ alkylene group unsubstituted or substituted with at least one $R_{10a}$, or a $C_2$-$C_5$ alkenylene group unsubstituted or substituted with at least one $R_{10a}$ to form a $C_8$-$C_{60}$ polycyclic group (e.g., a carbazole group and/or the like) unsubstituted or substituted with at least one $R_{10a}$ (e.g., Compound HT16 described herein), $R_{203}$ and $R_{204}$ may optionally be linked to each other via a single bond, a $C_1$-$C_5$ alkylene group unsubstituted or substituted with at least one $R_{10a}$ or a $C_2$-$C_5$ alkenylene group unsubstituted or substituted with at least one $R_{10a}$ to form a $C_8$-$C_{60}$ polycyclic group unsubstituted or substituted with at least one $R_{10a}$, and na1 may be an integer from 1 to 4.

In some embodiments, Formulae 201 and 202 may each include at least one of the groups represented by Formulae CY201 to CY217:

CY201

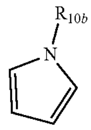

CY202

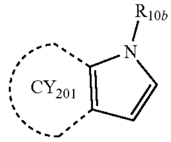

CY203

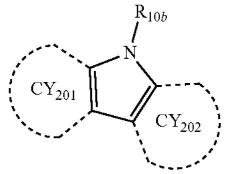

CY204

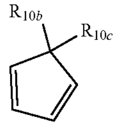

CY205

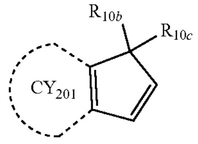

CY206

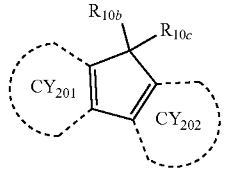

CY207

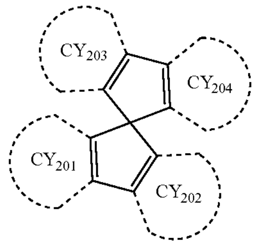

CY208

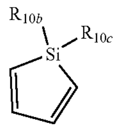

-continued

CY209

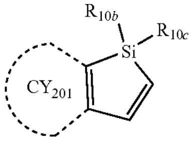

CY210

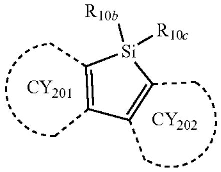

CY211

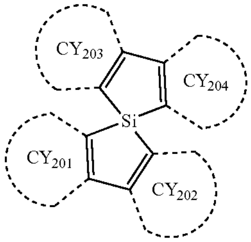

CY212

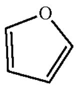

CY213

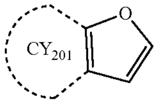

CY214

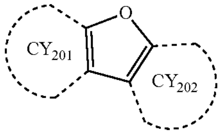

CY215

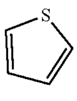

-continued

CY216

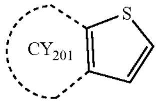

CY217

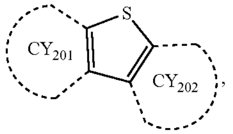

wherein, in Formulae CY201 to CY217, $R_{10b}$ and $R_{10c}$ may each independently be understood by referring to the descriptions of $R_{10a}$, ring $CY_{201}$ to ring $CY_{204}$ may each independently be a $C_3$-$C_{20}$ carbocyclic group or a $C_1$-$C_{20}$ heterocyclic group, and at least one hydrogen in Formulae CY201 to CY217 may be unsubstituted or substituted with $R_{10a}$.

In an embodiment, in Formulae CY201 to CY217, ring $CY_{201}$ to ring $CY_{204}$ may each independently be a benzene group, a naphthalene group, a phenanthrene group, or an anthracene group.

In one or more embodiments, Formulae 201 and 202 may each include at least one of the groups represented by Formulae CY201 to CY203.

In one or more embodiments, Formula 201 may include at least one of the groups represented by Formulae CY201 to CY203 and at least one of the groups represented by Formulae CY204 to CY217.

In one or more embodiments, in Formula 201, xa1 may be 1, $R_{201}$ may be a group represented by one of Formulae CY201 to CY203, xa2 may be 0, and $R_{202}$ may be a group represented by one of Formulae CY204 to CY207.

In one or more embodiments, each of Formulae 201 and 202 may not include any of the groups represented by Formulae CY201 to CY203.

In one or more embodiments, each of Formulae 201 and 202 may not include any of the groups represented by Formulae CY201 to CY203, and may include at least one of the groups represented by Formulae CY204 to CY217.

In one or more embodiments, each of Formulae 201 and 202 may not include any of the groups represented by Formulae CY201 to CY217.

In some embodiments, the hole transport region may further include at least one of Compounds HT1 to HT46, m-MTDATA, TDATA, 2-TNATA, NPB (NPD), β-NPB, TPD, spiro-TPD, spiro-NPB, methylated-NPB, TAPC, HMTPD, 4,4',4"-tris(N-carbazolyl)triphenylamine (TCTA), polyaniline/dodecylbenzenesulfonic acid (PANI/DBSA), poly(3,4-ethylenedioxythiophene)/poly(4-styrenesulfonate) (PEDOT/PSS), polyaniline/camphorsulfonic acid (PANI/CSA), and polyaniline/poly(4-styrenesulfonate (PANI/PSS), or any combination thereof:

HT1
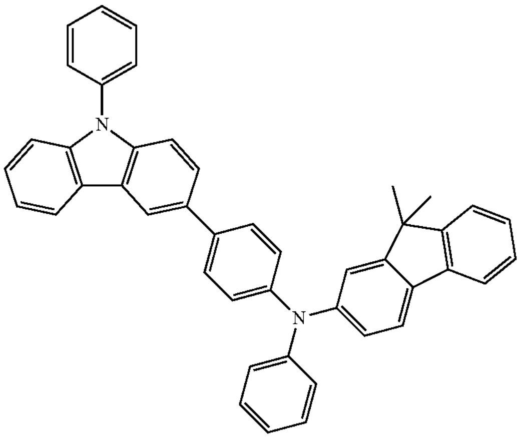
HT2
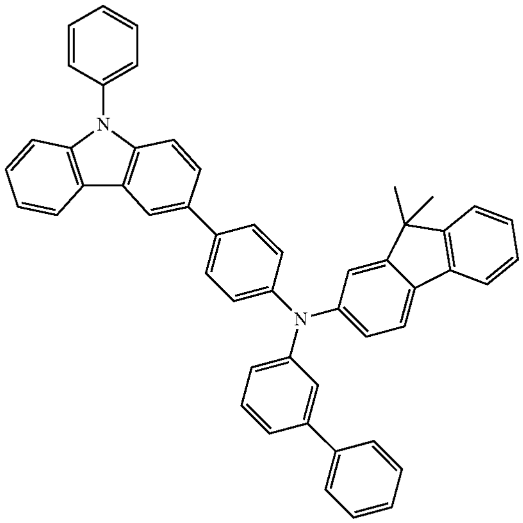
HT3
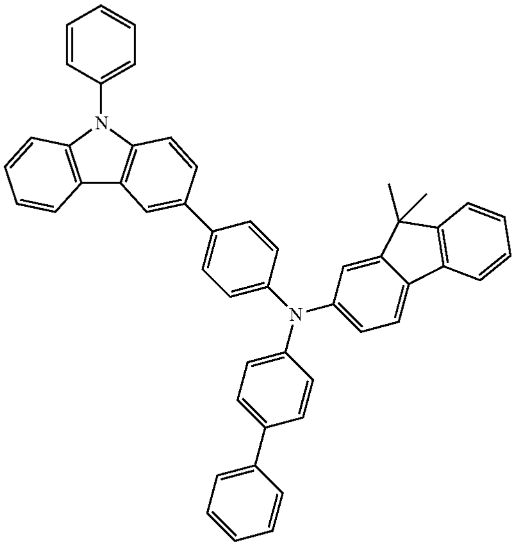
HT4
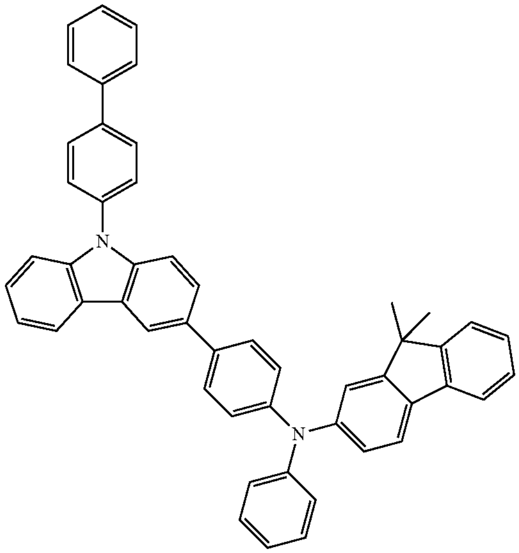
HT5
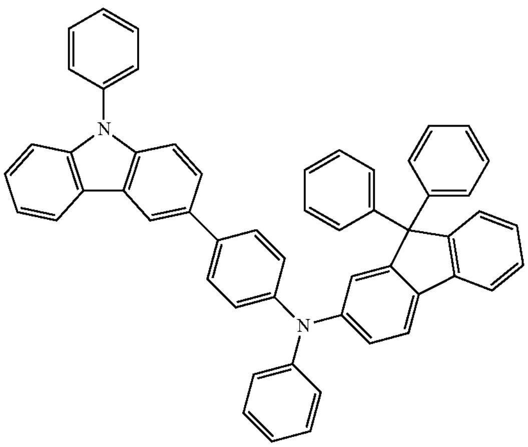
HT6
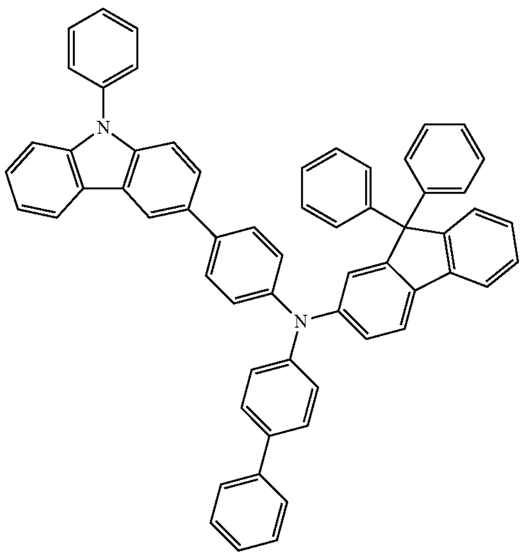

-continued
HT7
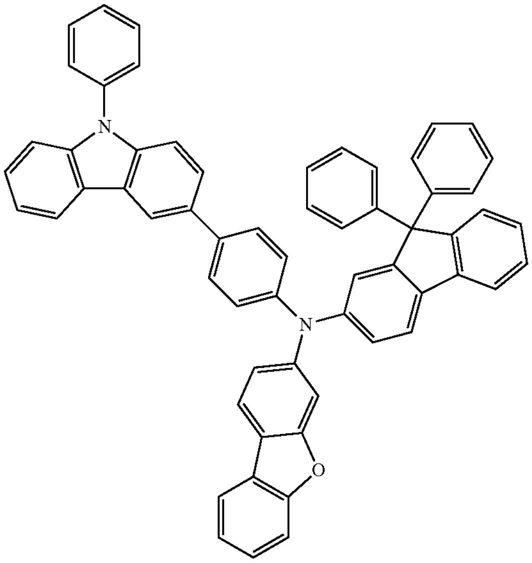
HT8
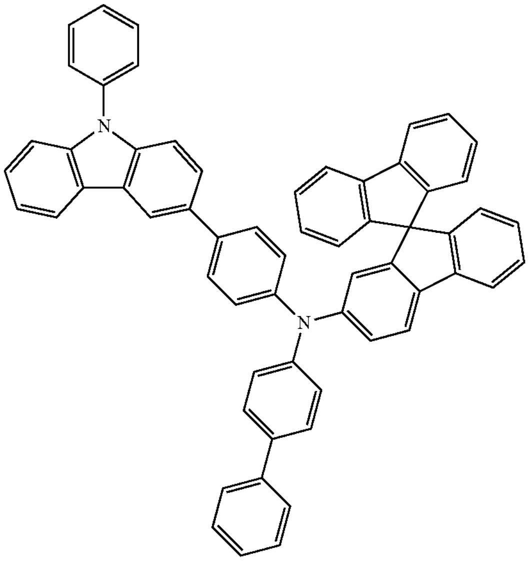
HT9
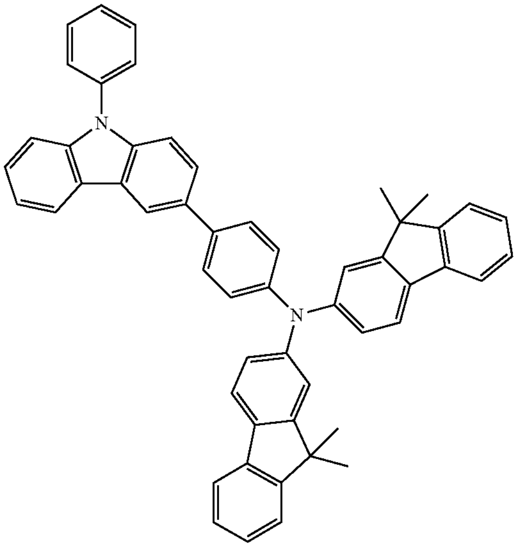
HT10
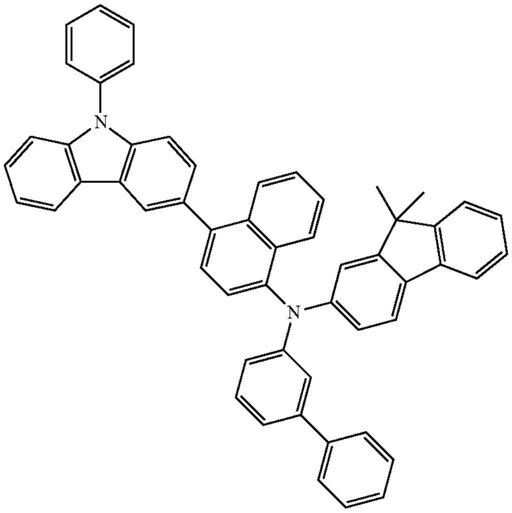
HT11
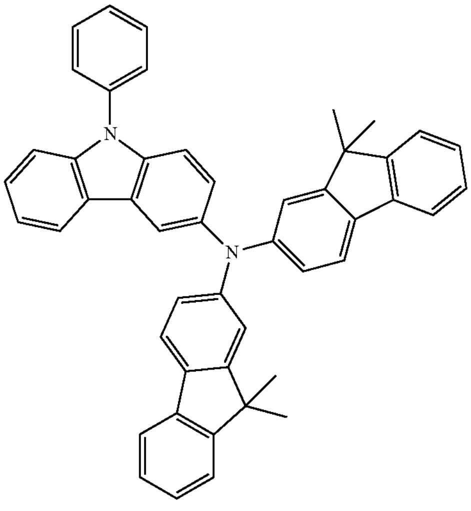
HT12
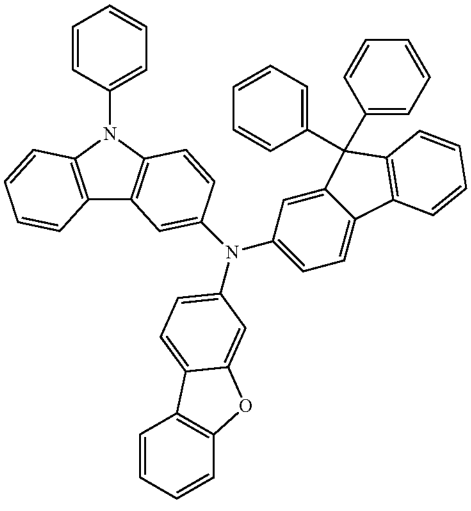

-continued
HT13
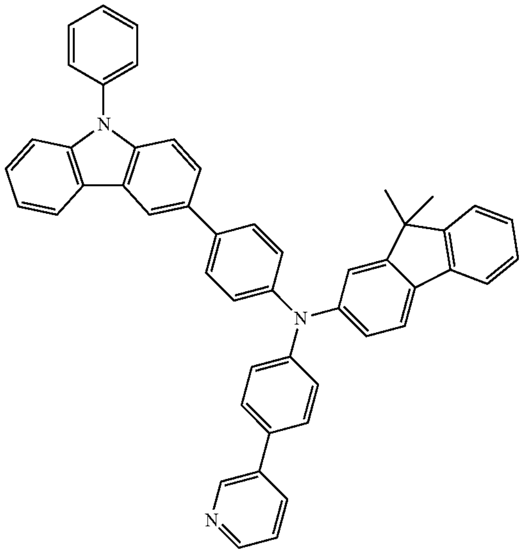
HT14
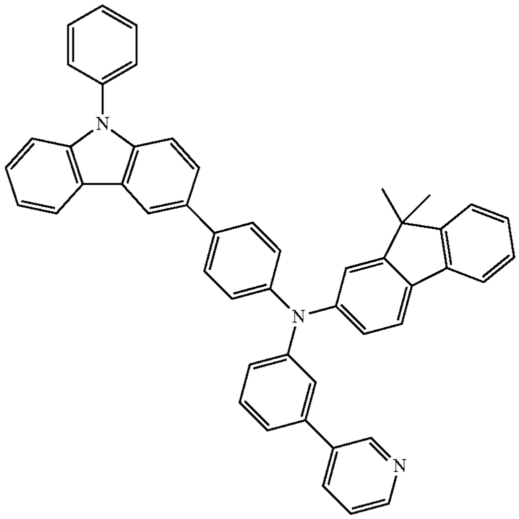
HT15
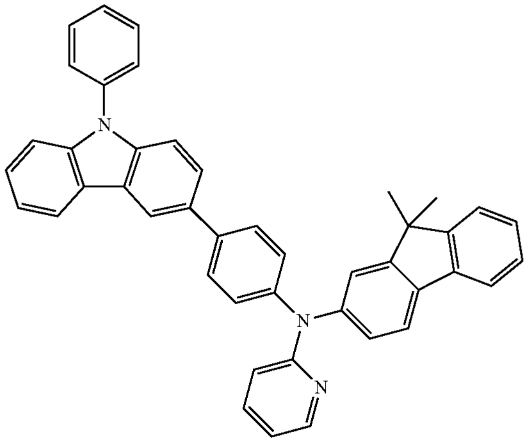
HT16
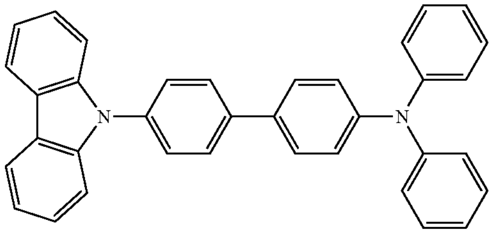
HT17
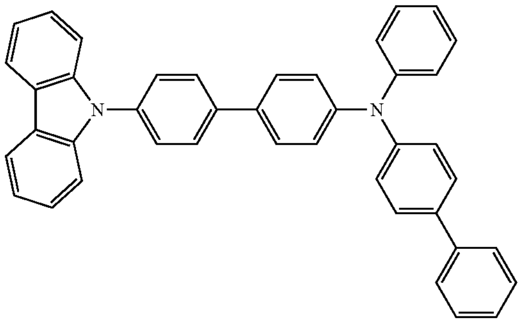
HT18
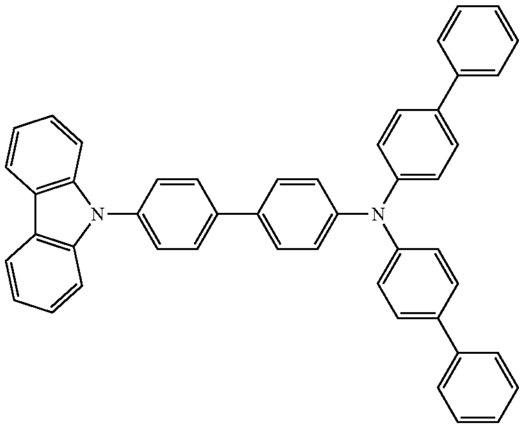

-continued
HT19
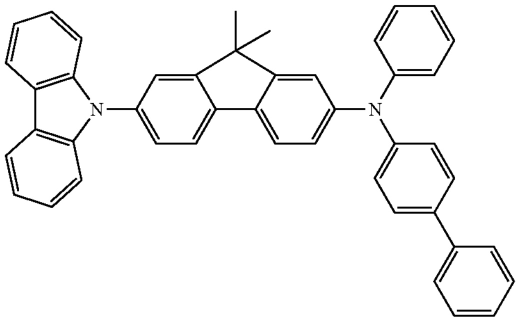
HT20
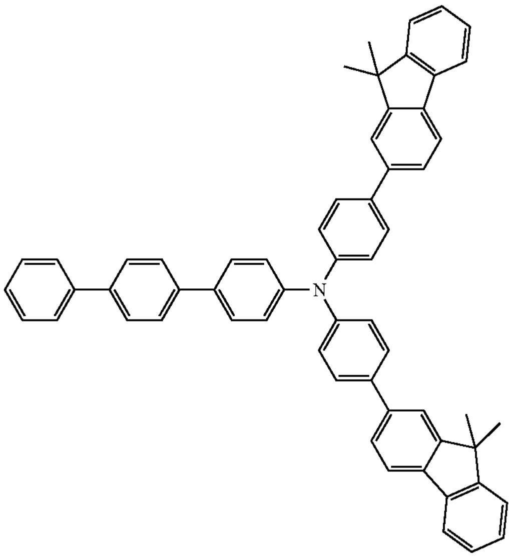
HT21
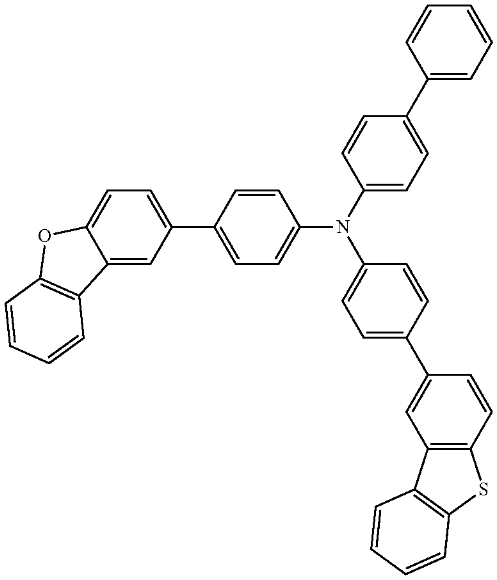
HT22
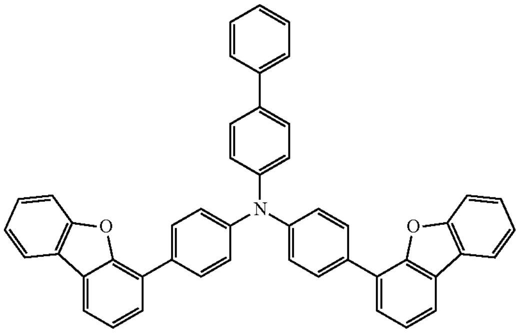
HT23
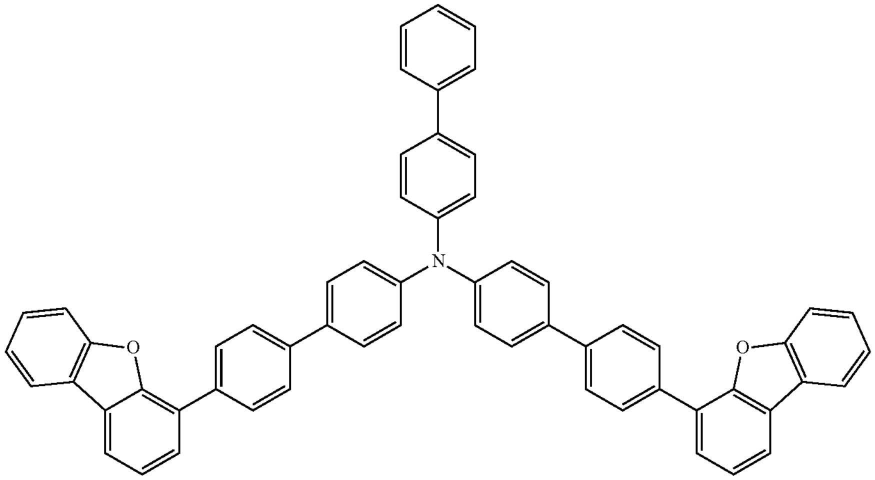

-continued
HT24
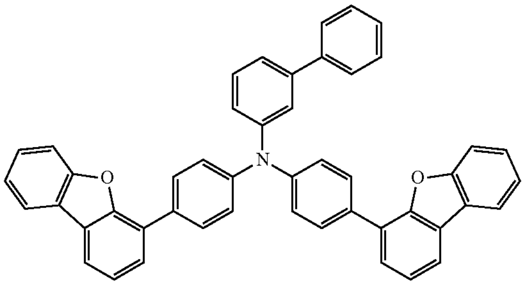
HT25
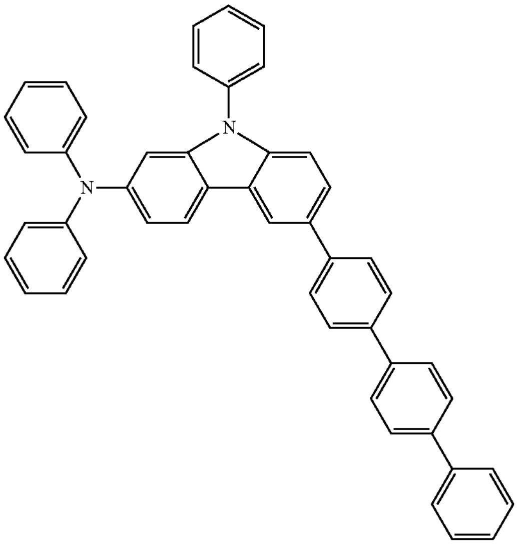
HT26
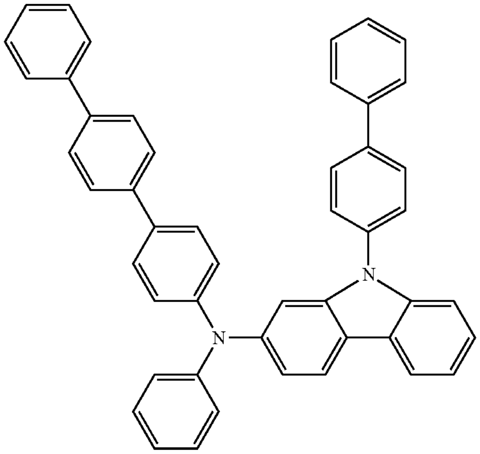
HT27
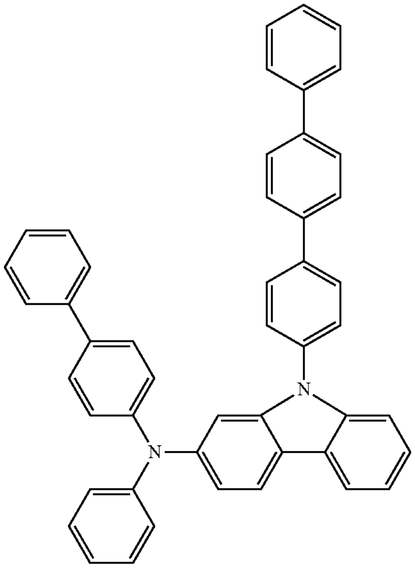
HT28
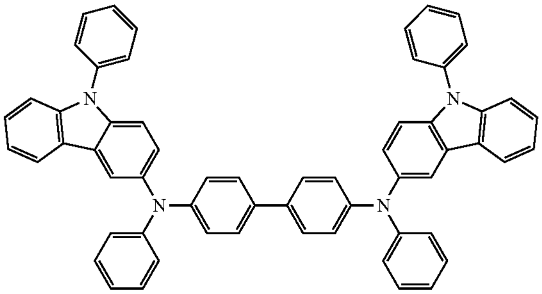
HT29
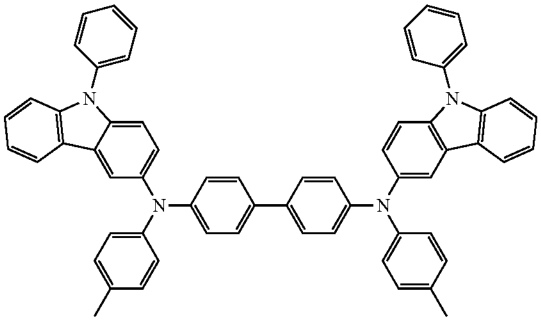

-continued
HT30
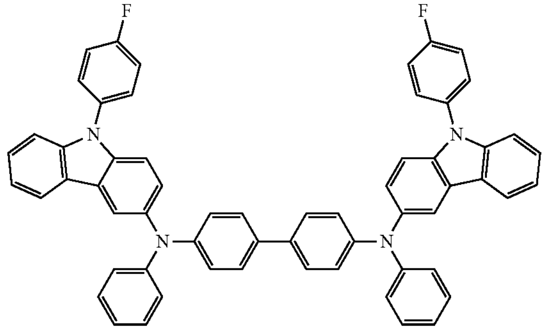
HT31
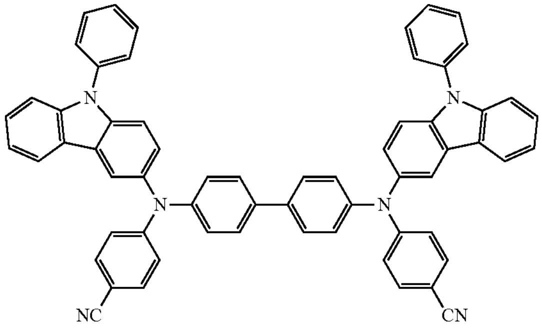
HT32
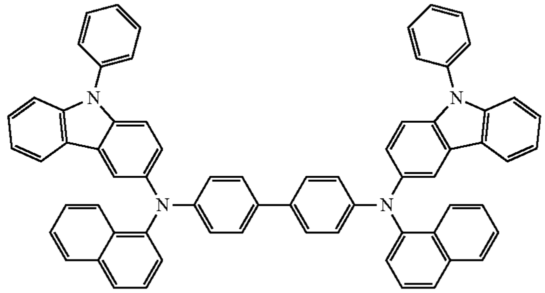
HT33
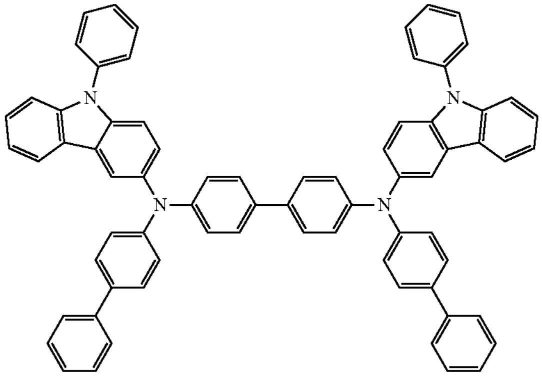
HT34
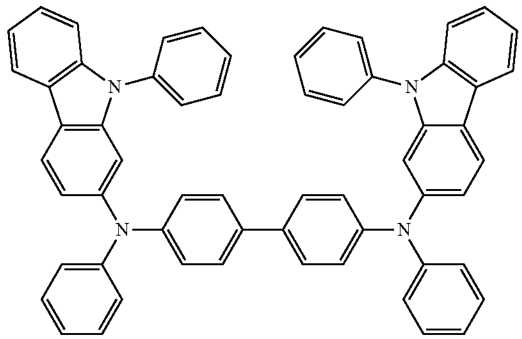
HT35
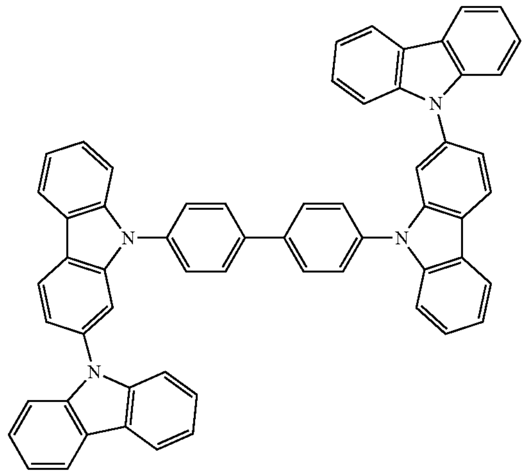

-continued
HT36
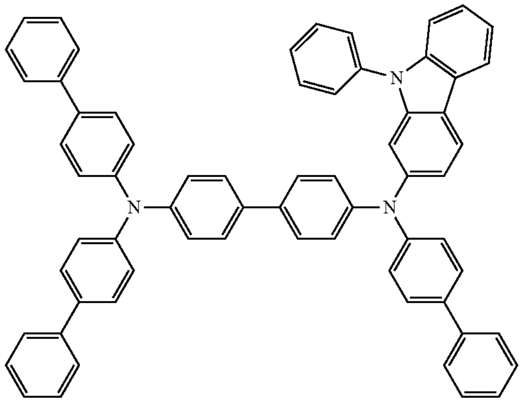
HT37
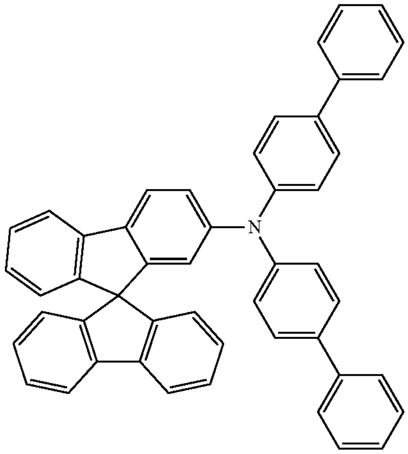
HT38
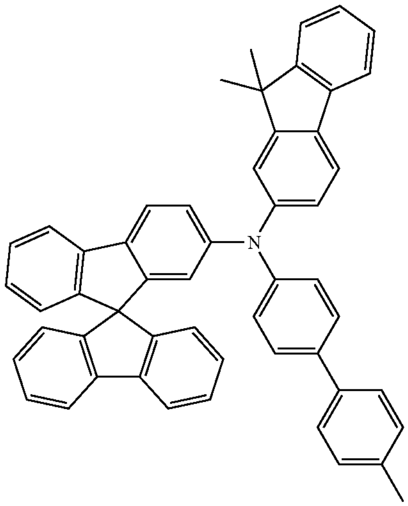
HT39
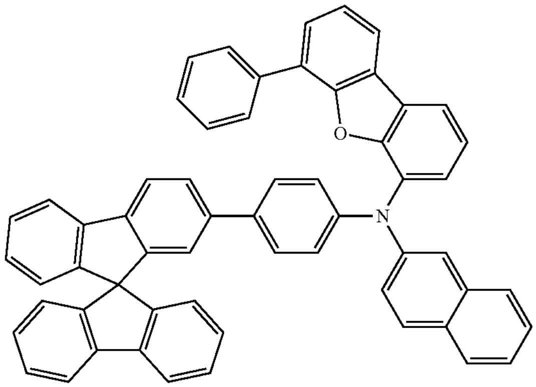
HT40
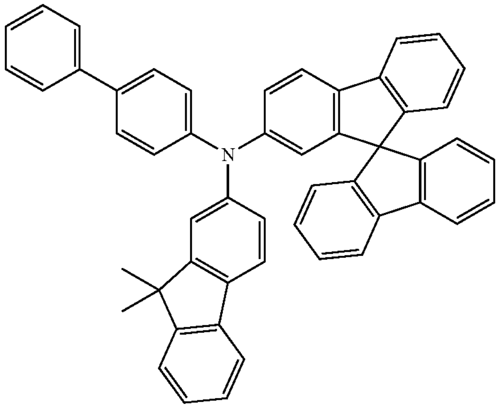
HT41
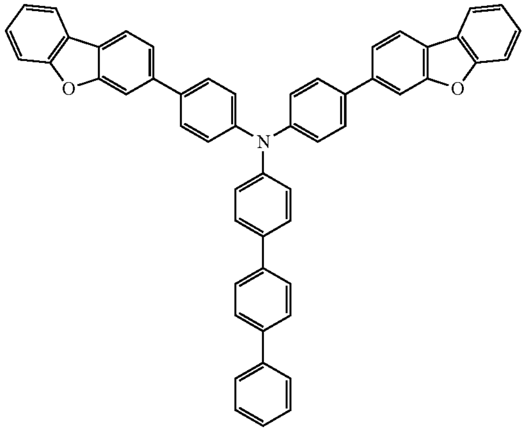

-continued
HT42
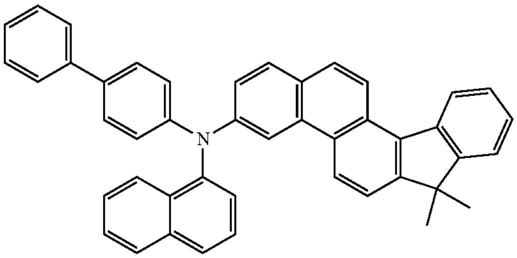
HT43
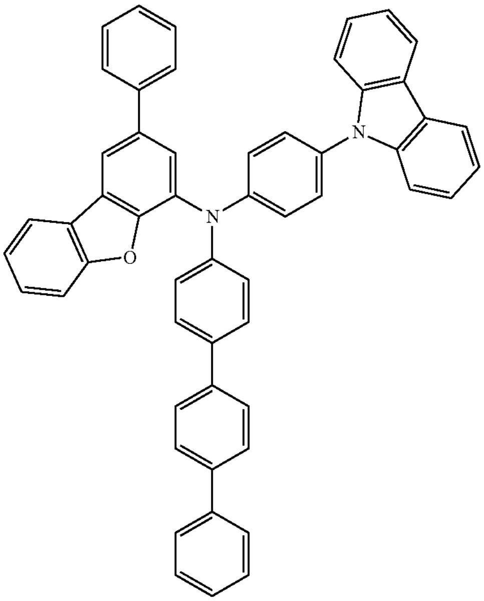
HT44
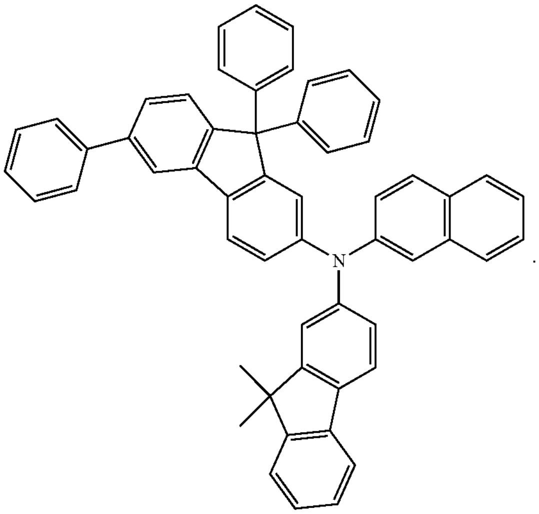
HT45
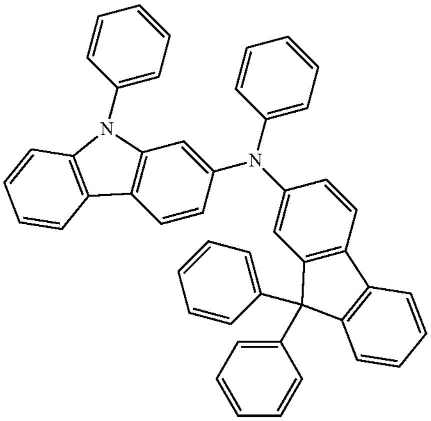
HT46
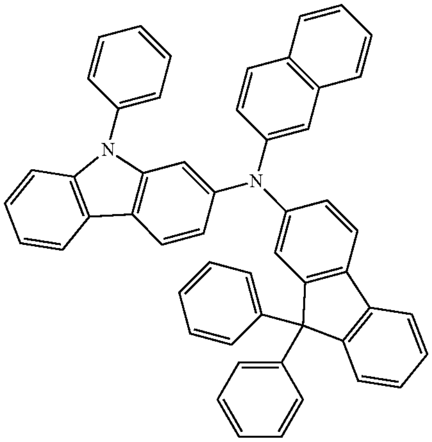

-continued
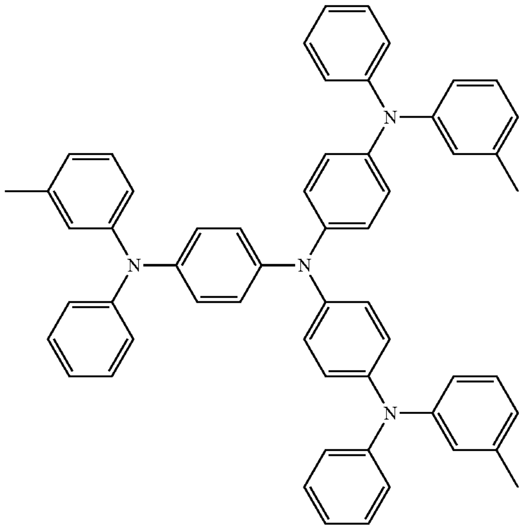
m-MTDATA
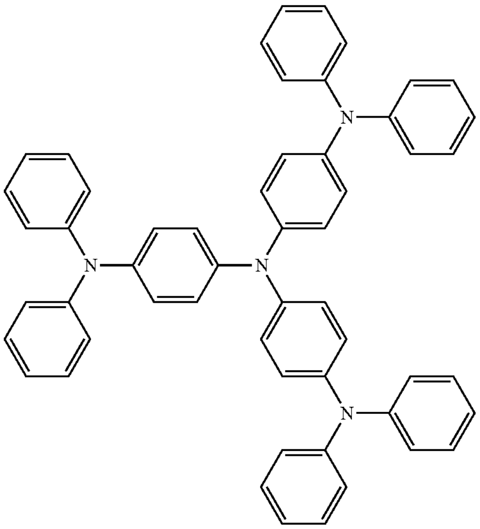
TDATA
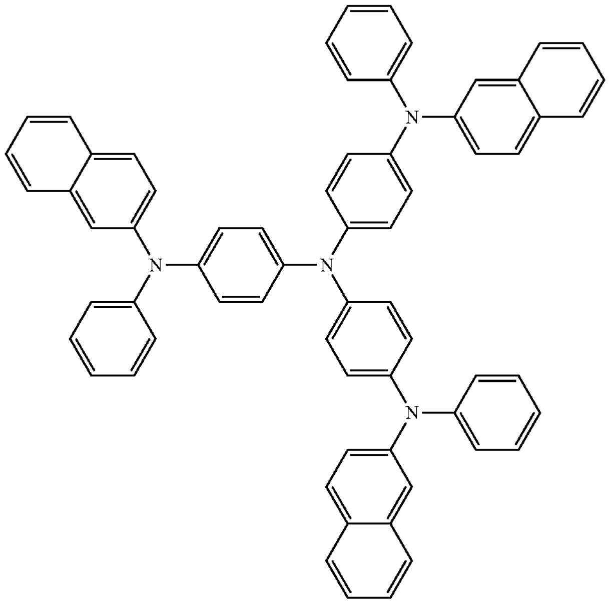
2-TNATA
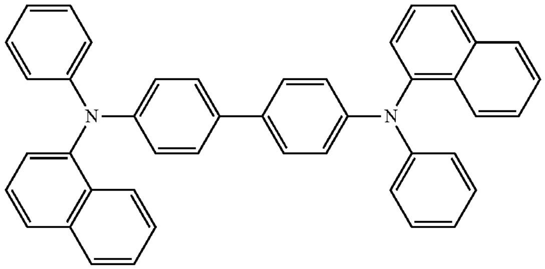
NPB -continued
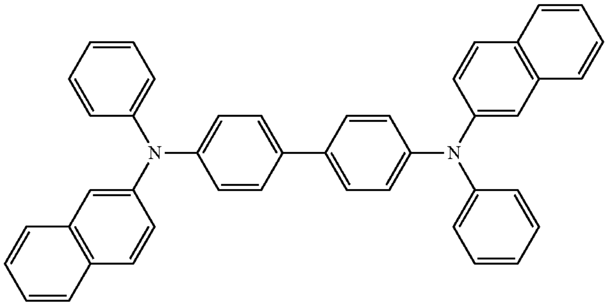
β-NPB
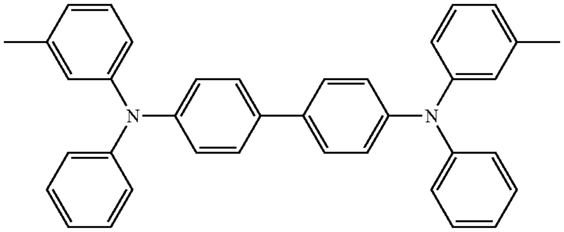
TPD
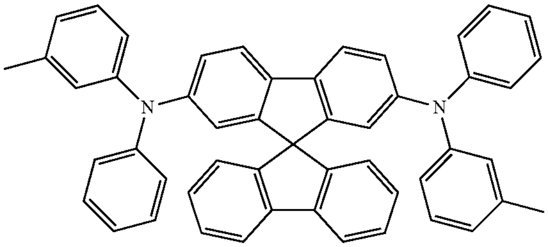
Spiro-TPD
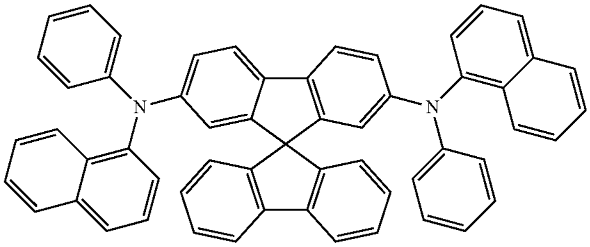
Spiro-NPB
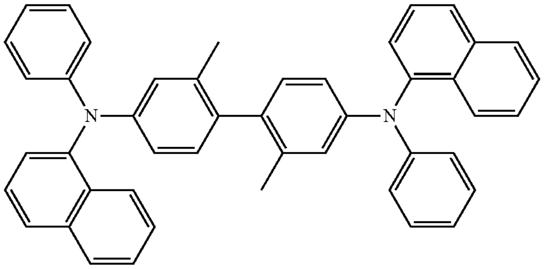
methylated-NPB
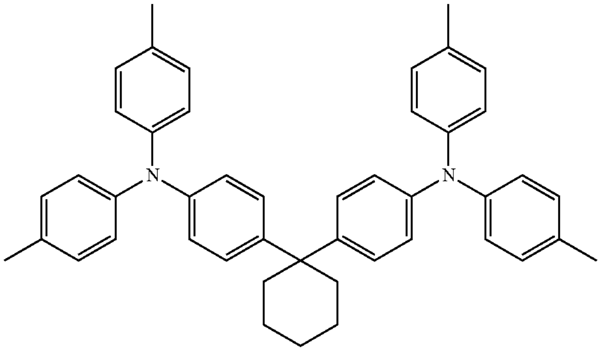
TAPC
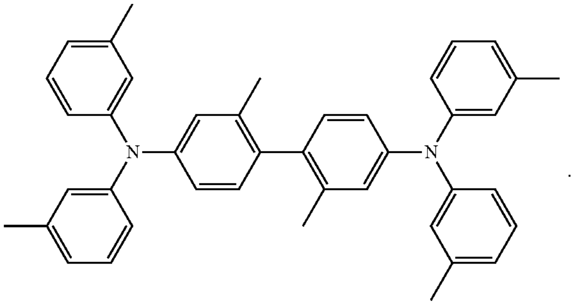
HMTPD The thickness of the hole transport region may be in a range of about 50 Angstroms (Å) to about 10,000 Å, and in some embodiments, about 100 Å to about 4,000 Å. When the hole transport region includes a hole injection layer, a hole transport layer, or any combination thereof, the thickness of the hole injection layer may be in a range of about 100 Å to about 9,000 Å, and in some embodiments, about 100 Å to about 1,000 Å, and the thickness of the hole transport layer may be in a range of about 50 Å to about 2,000 Å, and in some embodiments, about 100 Å to about 1,500 Å. When the thicknesses of the hole transport region, the hole injection layer, and the hole transport layer are within any of these ranges, excellent or suitable hole transport characteristics may be obtained without a substantial increase in driving voltage.

The emission auxiliary layer may increase light emission efficiency by compensating for an optical resonance distance according to the wavelength of light emitted by the emission layer. The electron blocking layer may prevent or reduce leakage of electrons to a hole transport region from the emission layer. Materials that may be included in the hole transport region may also be included in the emission auxiliary layer and the electron blocking layer.

p-Dopant

The hole transport region may further include a charge generating material in addition to the aforementioned materials to improve conductive properties of the hole transport region. The charge generating material may be substantially homogeneously or non-homogeneously dispersed in the hole transport region (for example, as a single layer consisting of the charge generating material).

The charge generating material may include, for example, a p-dopant.

In some embodiments, a lowest unoccupied molecular orbital (LUMO) energy level of the p-dopant may be −3.5 eV or less.

In some embodiments, the p-dopant may include a quinone derivative, a compound containing a cyano group, a compound containing element EL1 and element EL2 (to be described in more detail below), or any combination thereof.

Examples of the quinone derivative may include TCNQ, F4-TCNQ, and/or the like.

Examples of the compound containing a cyano group may include HAT-CN, a compound represented by Formula 221, and/or the like:

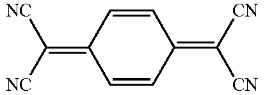

TCNQ

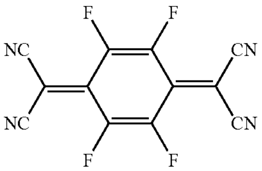

F4-TCNQ

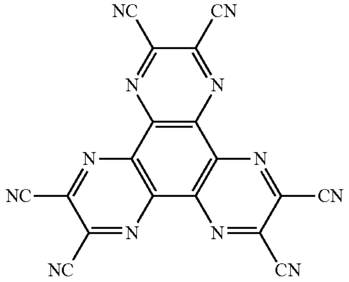

HAT-CN

-continued

Formula 221

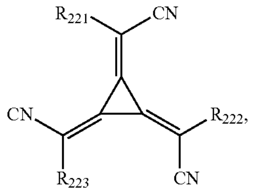

wherein, in Formula 221, $R_{221}$ to $R_{223}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, and at least one selected from $R_{221}$ to $R_{223}$ may each independently be: a $C_3$-$C_{60}$ carbocyclic group or a $C_1$-$C_{60}$ heterocyclic group, each substituted with a cyano group; —F; —Cl; —Br; —I; a $C_1$-$C_{20}$ alkyl group substituted with a cyano group, —F, —Cl, —Br, —I, or any combination thereof; or any combination thereof.

In the compound containing element EL1 and element EL2, element EL1 may be a metal, a metalloid, or a combination thereof, and element EL2 may be non-metal, a metalloid, or a combination thereof.

Examples of the metal may include: an alkali metal (e.g., lithium (Li), sodium (Na), potassium (K), rubidium (Rb), cesium (Cs), and/or the like); an alkaline earth metal (e.g., beryllium (Be), magnesium (Mg), calcium (Ca), strontium (Sr), barium (Ba), and/or the like); a transition metal (e.g., titanium (Ti), zirconium (Zr), hafnium (Hf), vanadium (V), niobium (Nb), tantalum (Ta), chromium (Cr), molybdenum (Mo), tungsten (W), manganese (Mn), technetium (Tc), rhenium (Re), iron (Fe), ruthenium (Ru), osmium (Os), cobalt (Co), rhodium (Rh), iridium (Ir), nickel (Ni), palladium (Pd), platinum (Pt), copper (Cu), silver (Ag), gold (Au), and/or the like); post-transition metal (e.g., zinc (Zn), indium (In), tin (Sn), and/or the like); a lanthanide metal (e.g., lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb), lutetium (Lu), and/or the like); and/or the like.

Examples of the metalloid may include silicon (Si), antimony (Sb), tellurium (Te), and/or the like.

Examples of the non-metal may include oxygen (O), halogen (e.g., F, Cl, Br, I, and/or the like), and/or the like.

Examples of the compound containing element EL1 and element EL2 may include a metal oxide, a metal halide (e.g., metal fluoride, metal chloride, metal bromide, metal iodide, and/or the like), a metalloid halide (e.g., a metalloid fluoride, a metalloid chloride, a metalloid bromide, a metalloid iodide, and/or the like), a metal telluride, or any combination thereof.

Examples of the metal oxide may include a tungsten oxide (e.g., WO, $W_2O_3$, $WO_2$, $WO_3$, or $W_2O_5$), a vanadium oxide (e.g., VO, $V_2O_3$, $VO_2$, or $V_2O_5$), a molybdenum oxide (MoO, $Mo_2O_3$, $MoO_2$, $MoO_3$, or $Mo_2O_5$), and a rhenium oxide (e.g., $ReO_3$).

Examples of the metal halide may include an alkali metal halide, an alkaline earth metal halide, a transition metal halide, a post-transition metal halide, a lanthanide metal halide, and/or the like.

Examples of the alkali metal halide may include LiF, NaF, KF, RbF, CsF, LiCl, NaCl, KCl, RbCl, CsCl, LiBr, NaBr, KBr, RbBr, CsBr, LiI, NaI, KI, RbI, CsI, and/or the like.

Examples of the alkaline earth metal halide may include $BeF_2$, $MgF_2$, $CaF_2$, $SrF_2$, $BaF_2$, $BeCl_2$, $MgCl_2$, $CaCl_2$, $SrCl_2$, $BaCl_2$, $BeBr_2$, $MgBr_2$, $CaBr_2$, $SrBr_2$, $BaBr_2$, $BeI_2$, $MgI_2$, $CaI_2$, $SrI_2$, and $BaI_2$.

Examples of the transition metal halide may include a titanium halide (e.g., $TiF_4$, $TiCl_4$, $TiBr_4$, and/or $TiI_4$), a zirconium halide (e.g., $ZrF_4$, $ZrCl_4$, $ZrBr_4$, and/or $ZrI_4$), a hafnium halide (e.g., $HfF_4$, $HfCl_4$, $HfBr_4$, and/or $HfI_4$), a vanadium halide (e.g., $VF_3$, $VCl_3$, $VBr_3$, and/or $VI_3$), a niobium halide (e.g., $NbF_3$, $NbCl_3$, $NbBr_3$, and/or $NbI_3$), a tantalum halide (e.g., $TaF_3$, $TaCl_3$, $TaBr_3$, and/or $TaI_3$), a chromium halide (e.g., $CrF_3$, $CrCl_3$, $CrBr_3$, and/or $CrI_3$), a molybdenum halide (e.g., $MoF_3$, $MoCl_3$, $MoBr_3$, and/or $MoI_3$), a tungsten halide (e.g., $WF_3$, $WCl_3$, $WBr_3$, and/or $WI_3$), a manganese halide (e.g., $MnF_2$, $MnCl_2$, $MnBr_2$, and/or $MnI_2$), a technetium halide (e.g., $TcF_2$, $TcCl_2$, $TcBr_2$, and/or $TcI_2$), a rhenium halide (e.g., $ReF_2$, $ReCl_2$, $ReBr_2$, and/or $ReI_2$), a ferrous halide (e.g., $FeF_2$, $FeCl_2$, $FeBr_2$, and/or $FeI_2$), a ruthenium halide (e.g., $RuF_2$, $RuCl_2$, $RuBr_2$, and/or $RuI_2$), an osmium halide (e.g., $OsF_2$, $OsCl_2$, $OsBr_2$, and/or $OsI_2$), a cobalt halide (e.g., $CoF_2$, $CoCl_2$, $CoBr_2$, and/or $CoI_2$), a rhodium halide (e.g., $RhF_2$, $RhCl_2$, $RhBr_2$, or $RhI_2$), an iridium halide (e.g., $IrF_2$, $IrCl_2$, $IrBr_2$, and/or $IrI_2$), a nickel halide (e.g., $NiF_2$, $NiCl_2$, $NiBr_2$, and/or $NiI_2$), a palladium halide (e.g., $PdF_2$, $PdCl_2$, $PdBr_2$, and/or $PdI_2$), a platinum halide (e.g., $PtF_2$, $PtCl_2$, $PtBr_2$, and/or $PtI_2$), a cuprous halide (e.g., CuF, CuCl, CuBr, and/or CuI), a silver halide (e.g., AgF, AgCl, AgBr, and/or AgI), and a gold halide (e.g., AuF, AuCl, AuBr, and/or AuI).

Examples of the post-transition metal halide may include a zinc halide (e.g., $ZnF_2$, $ZnCl_2$, $ZnBr_2$, and/or $ZnI_2$), an indium halide (e.g., $InI_3$), and a tin halide (e.g., $SnI_2$).

Examples of the lanthanide metal halide may include YbF, $YbF_2$, $YbF_3$, $SmF_3$, YbCl, $YbCl_2$, $YbCl_3$, $SmCl_3$, YbBr, $YbBr_2$, $YbBr_3$, $SmBr_3$, YbI, $YbI_2$, $YbI_3$, and $SmI_3$.

Examples of the metalloid halide may include an antimony halide (e.g., $SbCl_5$).

Examples of the metal telluride may include an alkali metal telluride (e.g., $Li_2Te$, $Na_2Te$, $K_2Te$, $Rb_2Te$, and/or $Cs_2Te$), an alkaline earth metal telluride (e.g., BeTe, MgTe, CaTe, SrTe, and/or BaTe), a transition metal telluride (e.g., $TiTe_2$, $ZrTe_2$, $HfTe_2$, $V_2Te_3$, $Nb_2Te_3$, $Ta_2Te_3$, $Cr_2Te_3$, $Mo_2Te_3$, $W_2Te_3$, MnTe, TcTe, ReTe, FeTe, RuTe, OsTe, CoTe, RhTe, IrTe, NiTe, PdTe, PtTe, $Cu_2Te$, CuTe, $Ag_2Te$, AgTe, and/or $Au_2Te$), a post-transition metal telluride (e.g., ZnTe), and a lanthanide metal telluride (e.g., LaTe, CeTe, PrTe, NdTe, PmTe, EuTe, GdTe, TbTe, DyTe, HoTe, ErTe, TmTe, YbTe, and/or LuTe).

Emission Layer in Interlayer 130

When the light-emitting device 10 is a full color light-emitting device, the emission layer may be patterned into a red emission layer, a green emission layer, and/or a blue emission layer, according to a sub-pixel. In one or more embodiments, the emission layer may have a stacked structure. The stacked structure may include two or more layers selected from a red emission layer, a green emission layer, and a blue emission layer. The two or more layers may be in direct contact with each other. In some embodiments, the two or more layers may be separated from each other. In one or more embodiments, the emission layer may include two or more materials. The two or more materials may include a red light-emitting material, a green light-emitting material, and/or a blue light-emitting material. The two or more materials may be mixed with each other in a single layer. The two or more materials mixed with each other in the single layer may be to emit white light. In some embodiments, the emission layer may be to emit blue light.

The emission layer may include a host and a dopant.

In some embodiments, the dopant may be a phosphorescent dopant, a fluorescent dopant, or any combination thereof. The phosphorescent dopant and the fluorescent dopant that may be included in the emission layer may be understood by referring to the descriptions of the phosphorescent dopant and the fluorescent dopant provided herein.

The amount of the dopant in the emission layer may be in a range of about 0.01 parts to about 15 parts by weight based on 100 parts by weight of the host.

In some embodiments, the emission layer may include a quantum dot.

In an embodiment, the emission layer may include a delayed fluorescence material. The delayed fluorescence material may serve as a host or a dopant in the emission layer.

The thickness of the emission layer may be in a range of about 100 Å to about 1,000 Å, and in some embodiments, about 200 Å to about 600 Å. When the thickness of the emission layer is within any of these ranges, improved luminescence characteristics may be obtained without a substantial increase in driving voltage.

Host

The host may include, for example, a carbazole-containing compound, an anthracene-containing compound, or any combination thereof.

In some embodiments, the host may further include a compound represented by Formula 301:

$$[Ar_{301}]_{xb11}\text{-}[(L_{301})_{xb1}\text{-}R_{301}]_{xb21}, \quad \text{Formula 301}$$

wherein, in Formula 301, $Ar_{301}$ and $L_{301}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, xb11 may be 1, 2, or 3, xb1 may be an integer from 0 to 5, $R_{301}$ may be hydrogen, deuterium, —F, —Cl, —Br, —I, a hydroxyl group, a cyano group, a nitro group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, —Si($Q_{301}$)($Q_{302}$)($Q_{303}$), —N($Q_{301}$)($Q_{302}$), —B($Q_{301}$)($Q_{302}$), —C(=O)($Q_{301}$), —S(=O)$_2$($Q_{301}$), or —P(=O)($Q_{301}$)($Q_{302}$), xb21 may be an integer from 1 to 5, and $Q_{301}$ to $Q_{303}$ may each independently be understood by referring to the description of $Q_1$ provided herein.

In some embodiments, when xb11 in Formula 301 is 2 or greater, at least two $Ar_{301}$(s) may be linked to each other via a single bond.

In some embodiments, the host may include a compound represented by Formula 301-1, a compound represented by Formula 301-2, or any combination thereof:

Formula 301-1

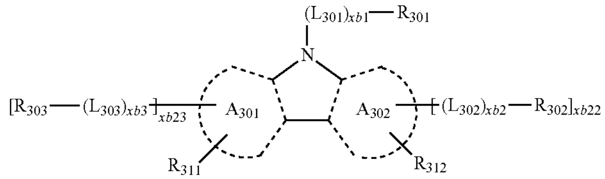

Formula 301-2

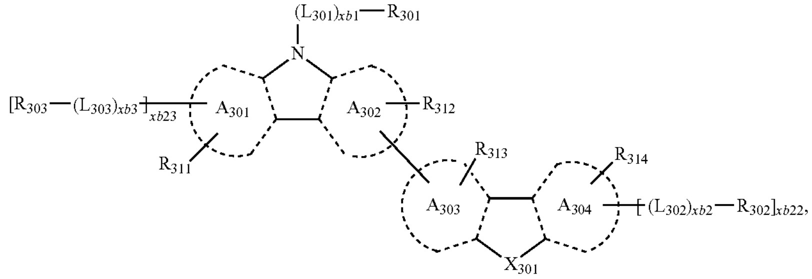

wherein, in Formulae 301-1 to 301-2, ring $A_{301}$ to ring $A_{304}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, $X_{301}$ may be O, S, N-[$(L_{304})_{xb4}$-$R_{304}$], C($R_{304}$)($R_{305}$), or Si($R_{304}$)($R_{305}$), xb22 and xb23 may each independently be 0, 1, or 2, $L_{301}$, xb1, and $R_{301}$ may respectively be understood by referring to the descriptions of $L_{301}$, xb1, and $R_{301}$ provided herein, $L_{302}$ to $L_{304}$ may each independently be understood by referring to the description of $L_{301}$ provided herein, xb2 to xb4 may each independently be understood by referring to the description of xb1 provided herein, and $R_{302}$ to $R_{305}$ and $R_{311}$ to $R_{314}$ may each independently be understood by referring to the description of $R_{301}$ provided herein.

In some embodiments, the host may include an alkaline earth-metal complex, a post-transitional metal complex, or any combination thereof. For example, the host may include a Be complex (e.g., Compound H55), a Mg complex, a Zn complex, or any combination thereof.

In some embodiments, the host may include at least one of Compounds H1 to H124, 9,10-di(2-naphthyl)anthracene (AND), 2-methyl-9,10-bis(naphthalen-2-yl)anthracene (MADN), 9,10-di(2-naphthyl)-2-t-butyl-anthracene (TBADN), 4,4'-bis(N-carbazolyl)-1,1'-biphenyl (CBP), 1,3-di-9-carbazolylbenzene (mCP), and 1,3,5-tri(carbazol-9-yl)benzene (TCP), or any combination thereof:

H1

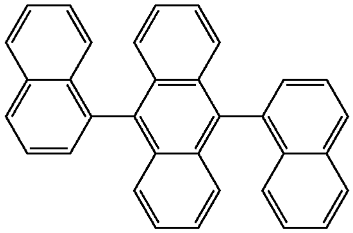

-continued

H2

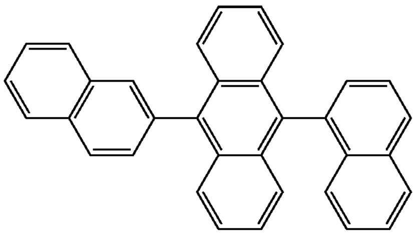

H3

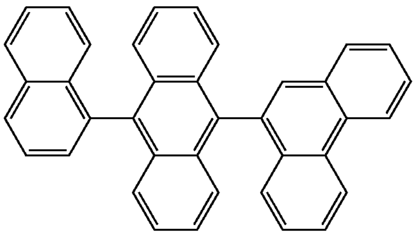

H4

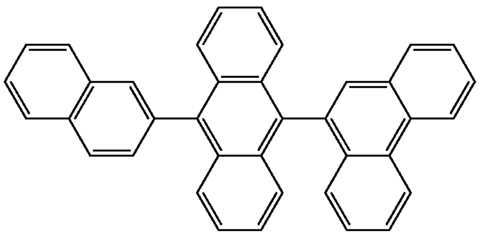

H5

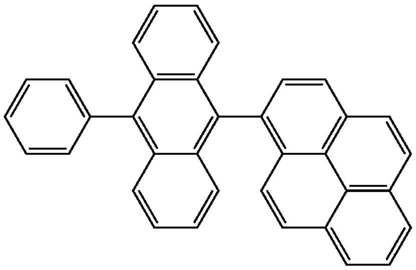

-continued
H6
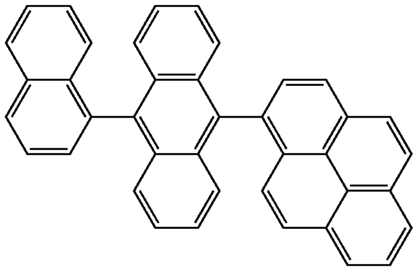
H7
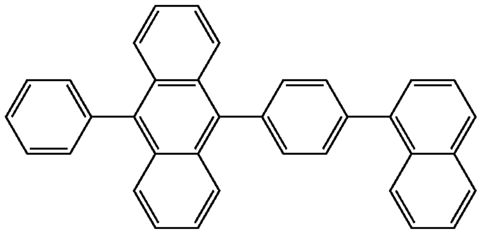
H8
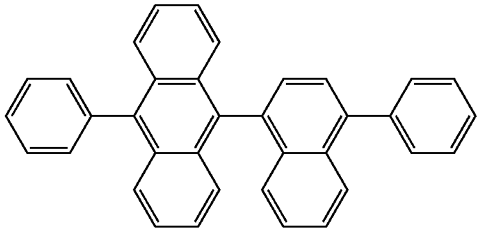
H9
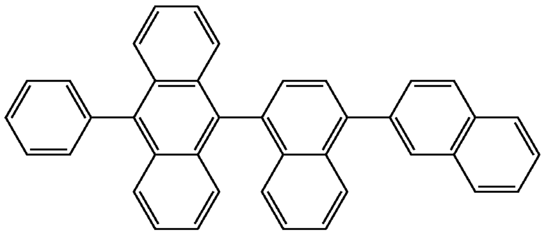
H10
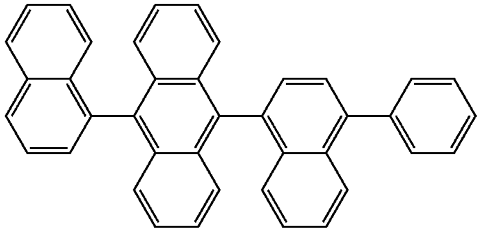
H11
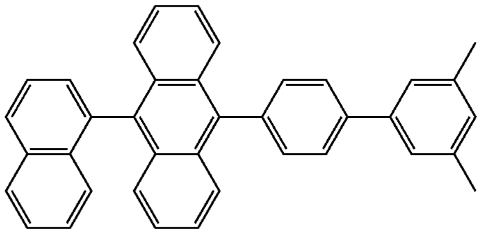
-continued
H12
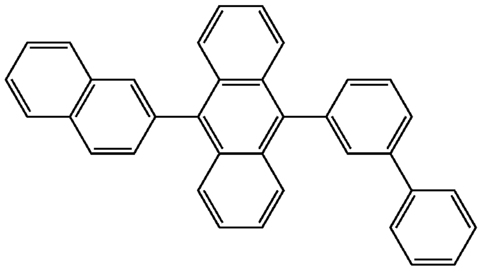
H13
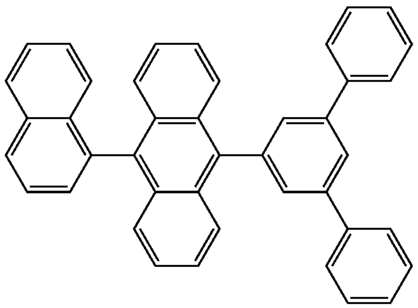
H14
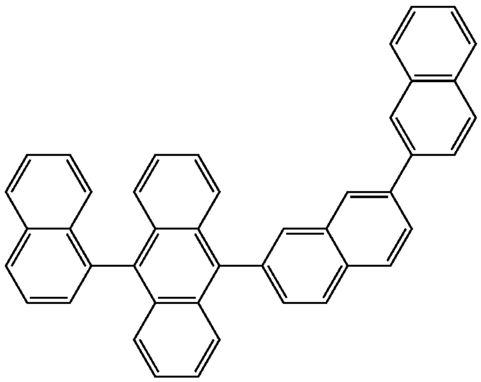
H15
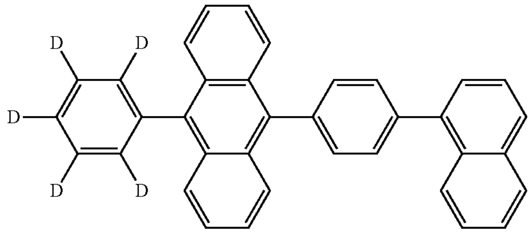
H16
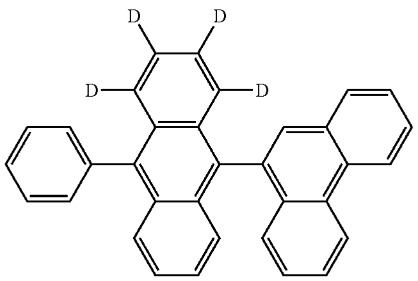

-continued
H17
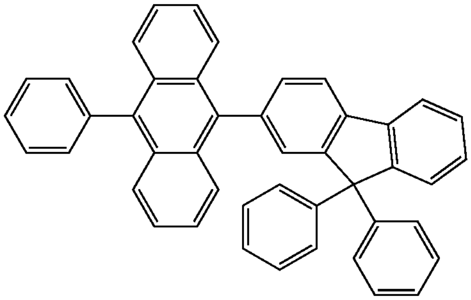
H18
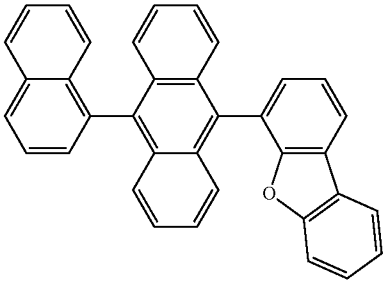
H19
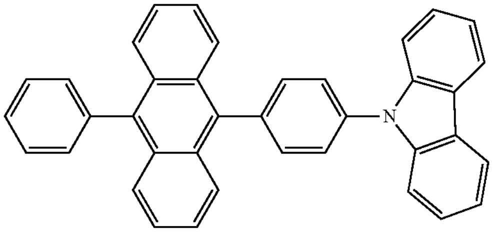
H20
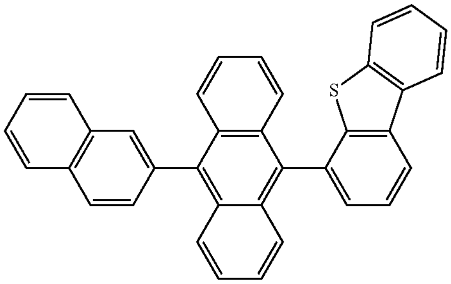
H21
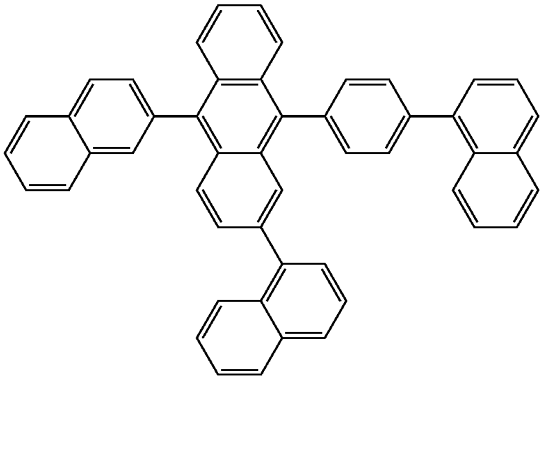
-continued
H22
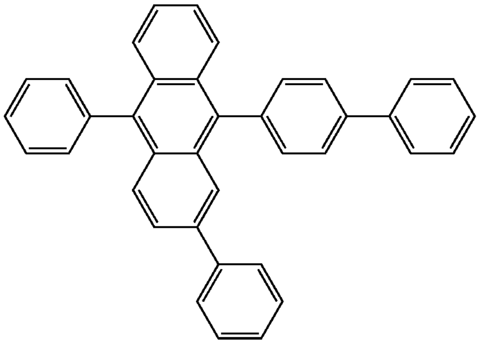
H23
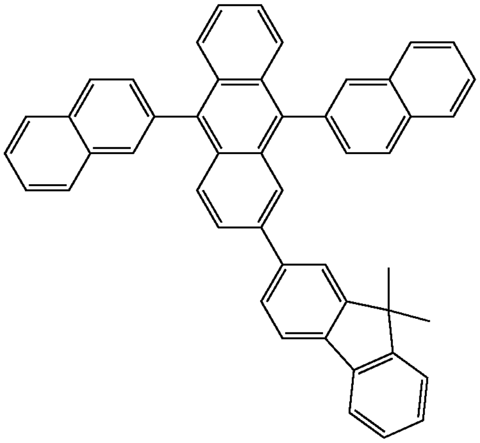
H24
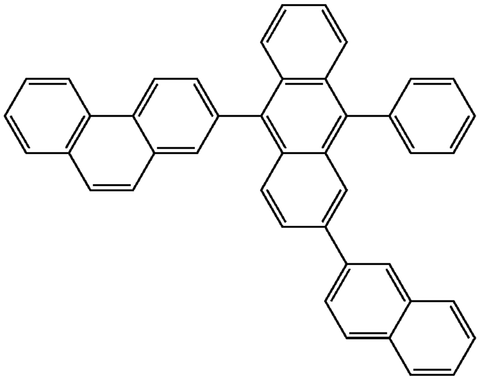

-continued
H25
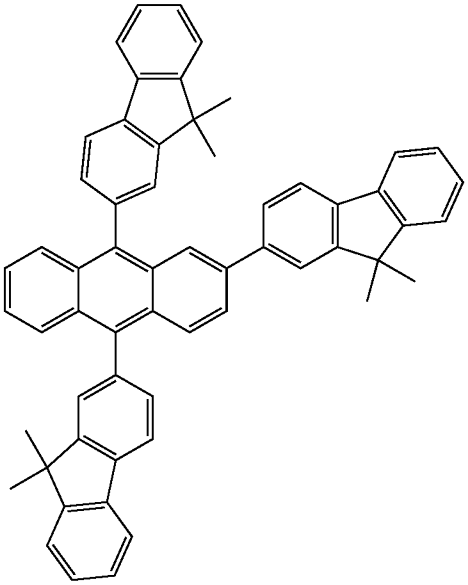
H26
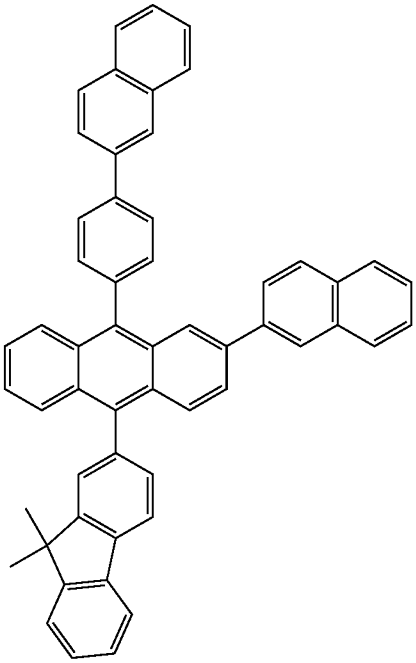
-continued
H27
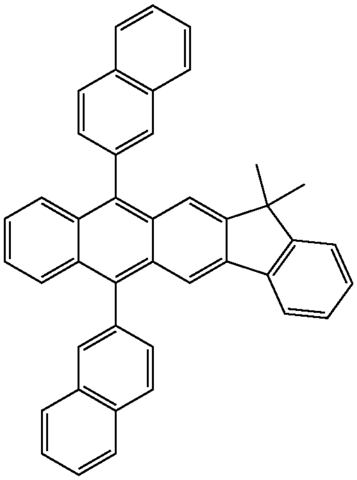
H28
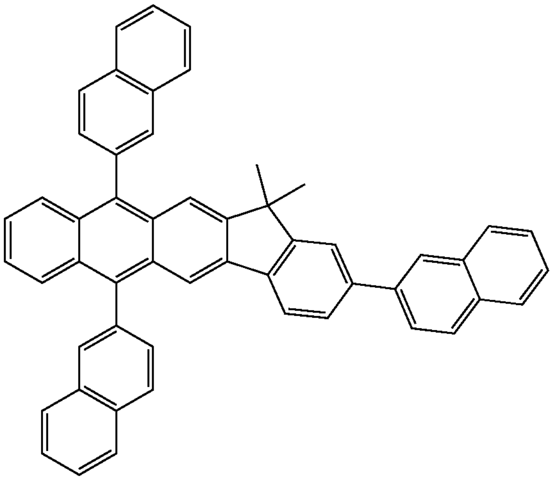
H29
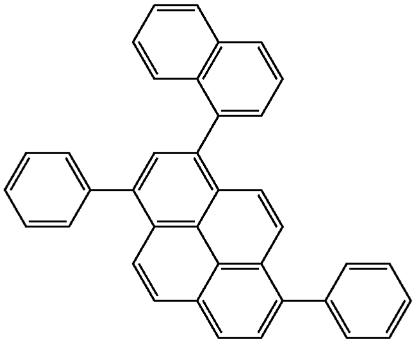

-continued
H30
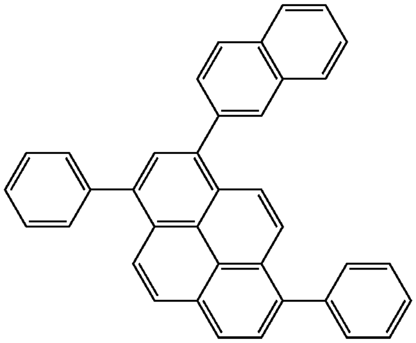
H31
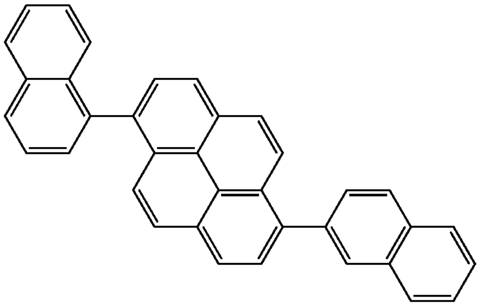
H32
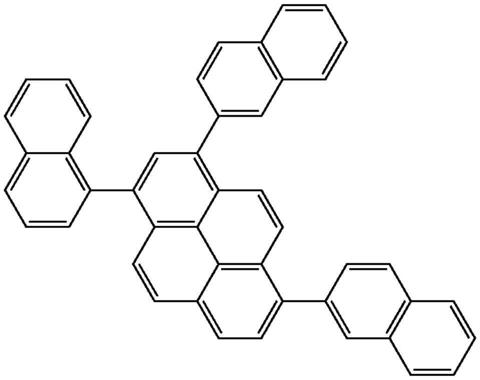
H33
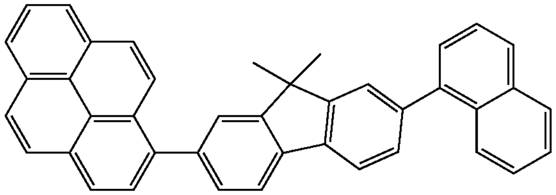
H34
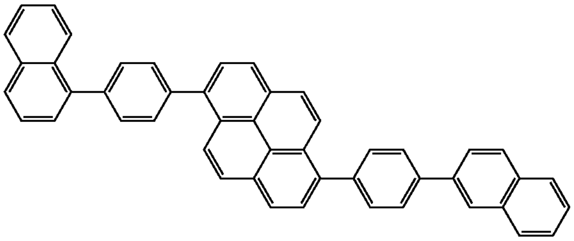
-continued
H35
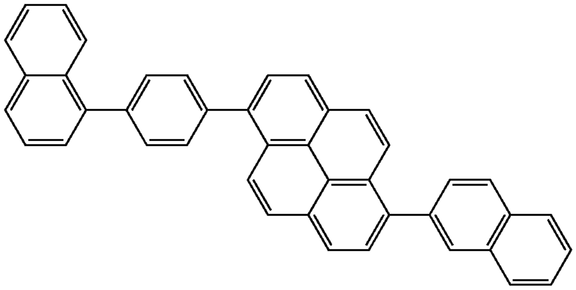
H36
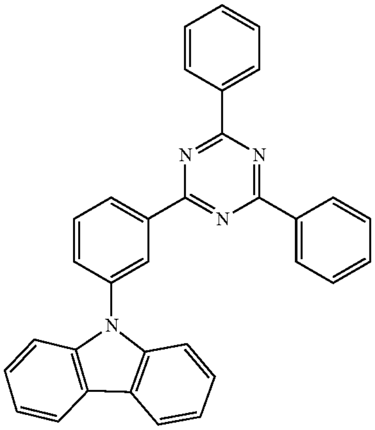
H37
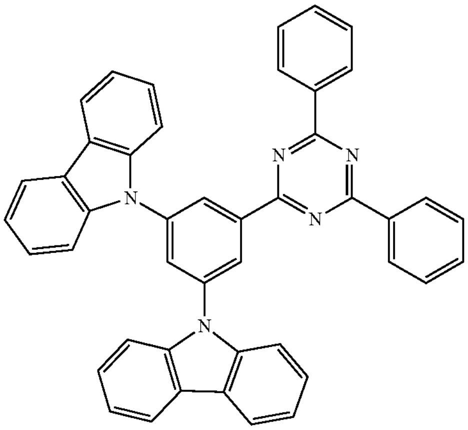
H38
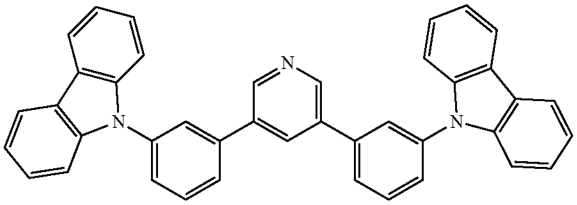

-continued
H39
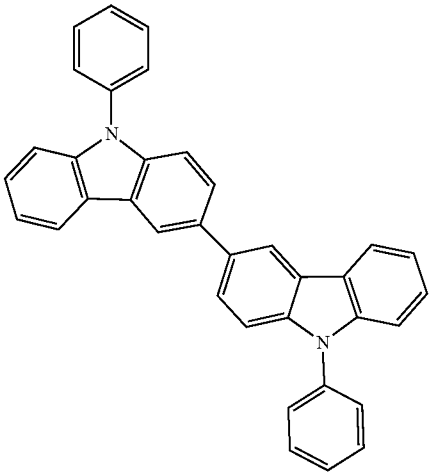
H40
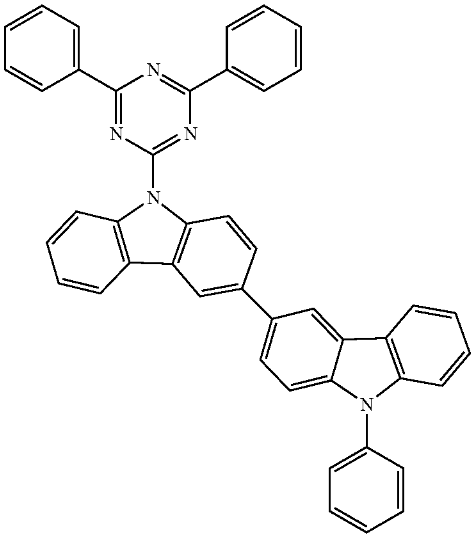
H41
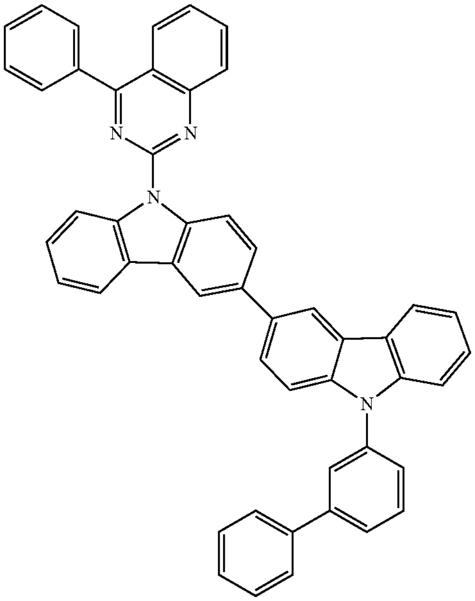
-continued
H42
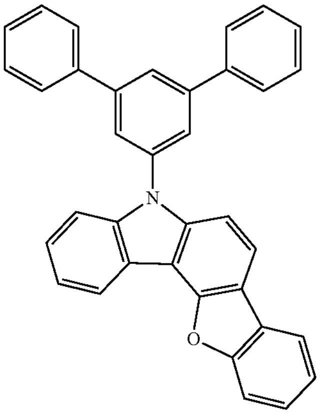
H43
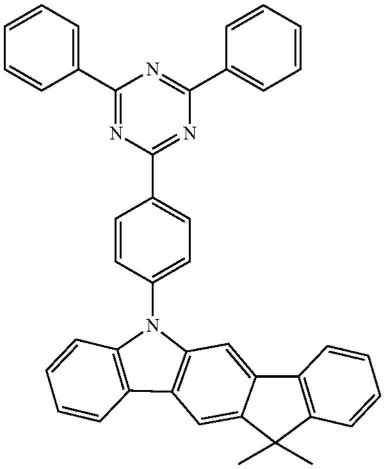
H44
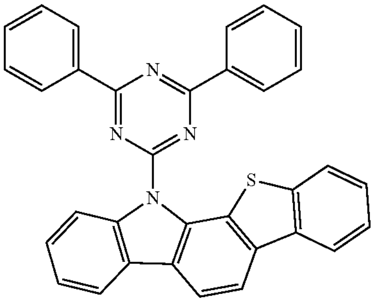
H45
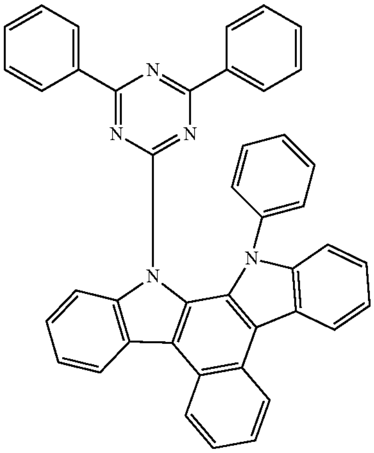

H46
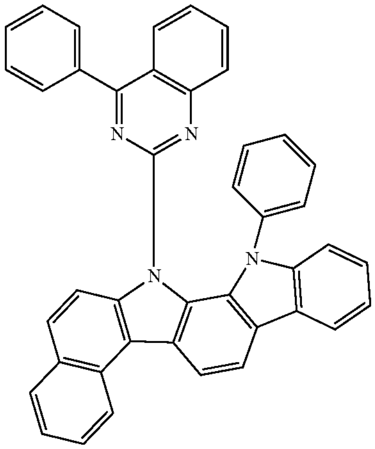
H47
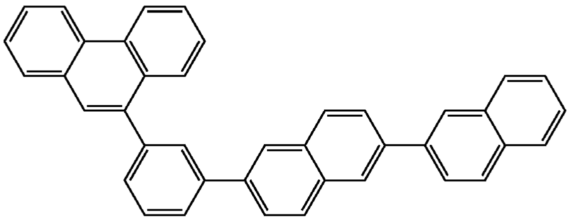
H48
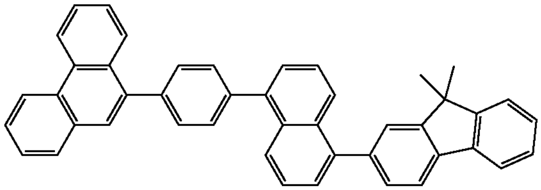
H49
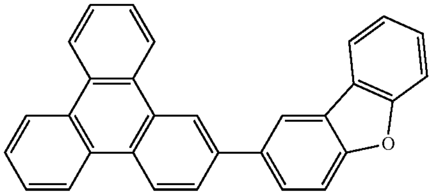
H50
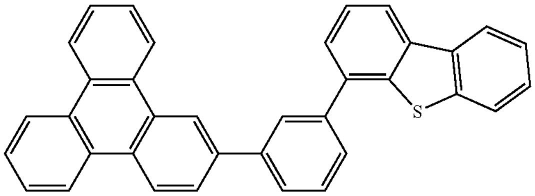
H51
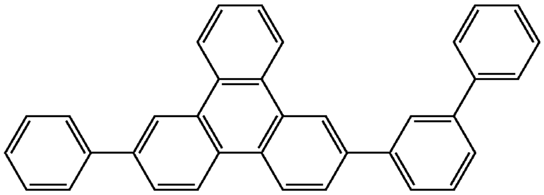
H52
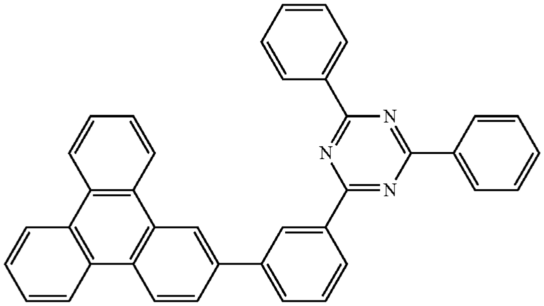
H53
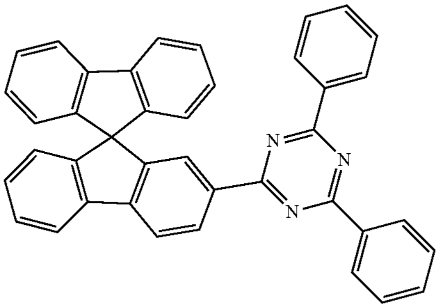
H54
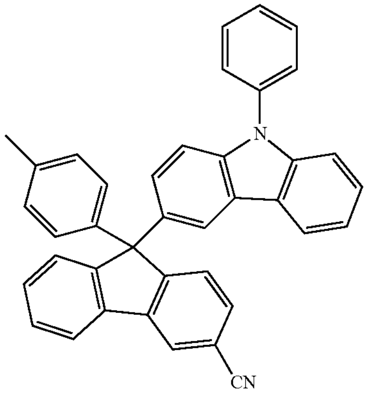
H55
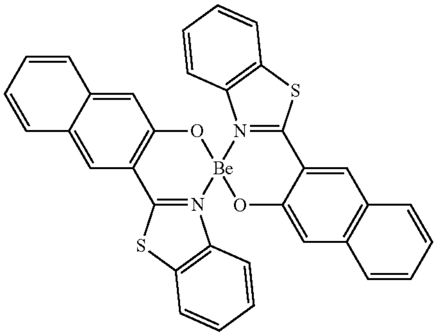

-continued
H56
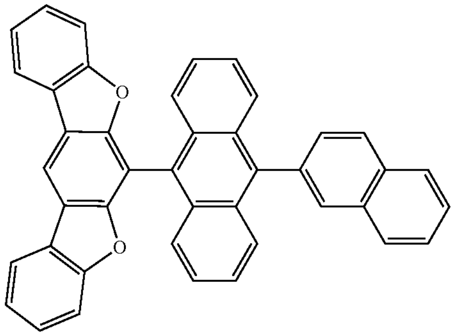
H57
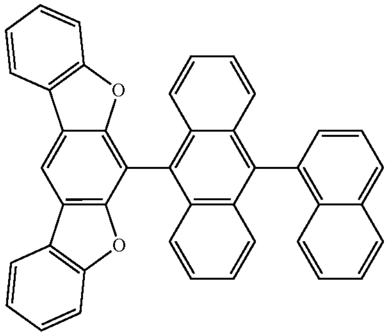
H58
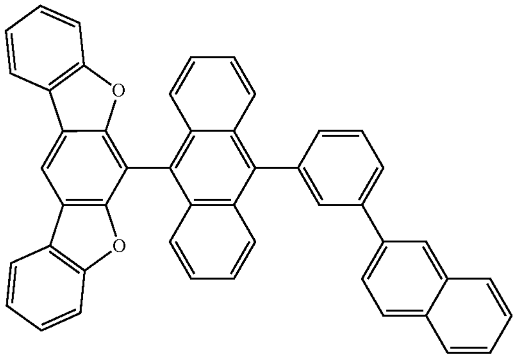
H59
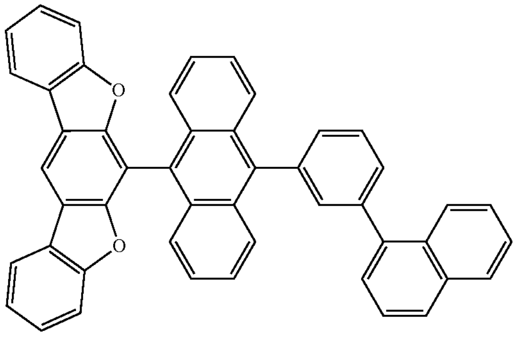
-continued
H60
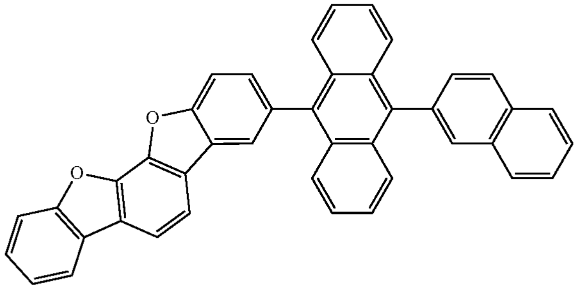
H61
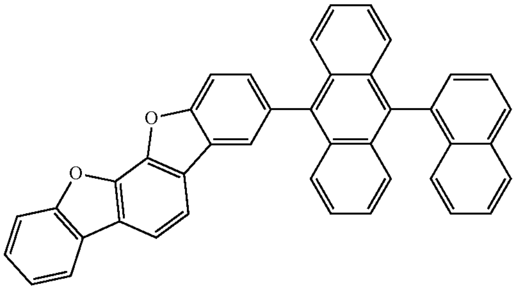
H62
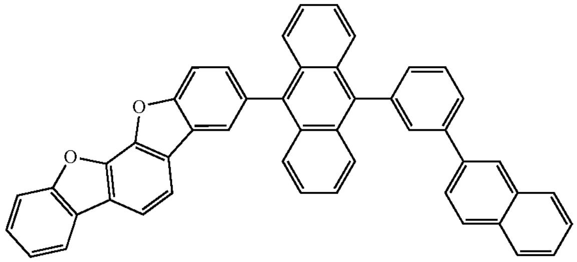
H63
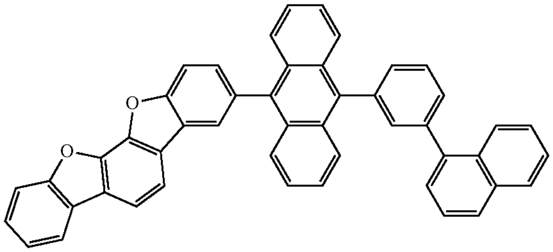
H64
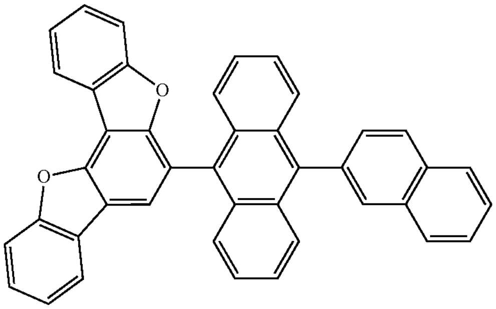

-continued
H65
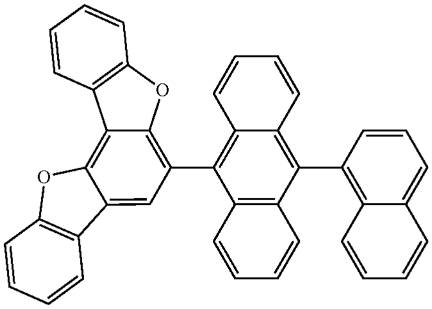
H66
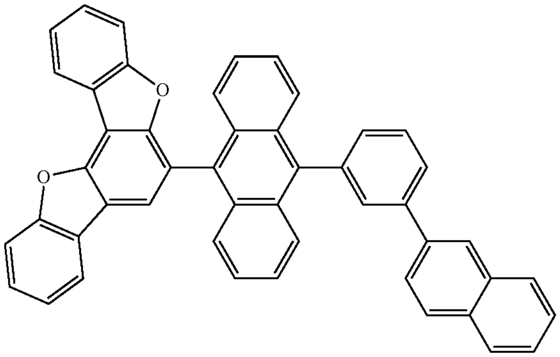
H67
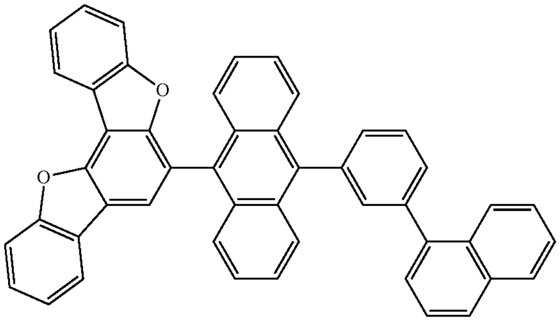
H68
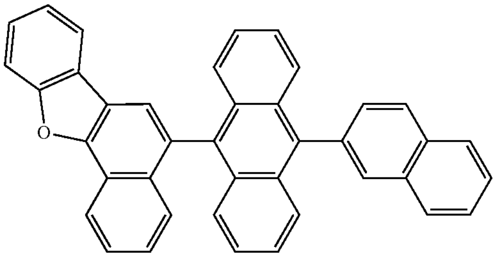
H69
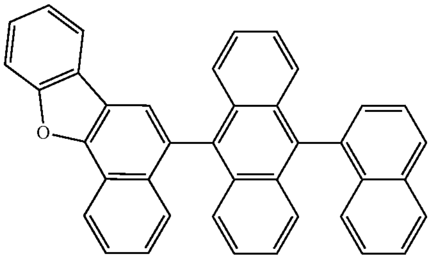
-continued
H70
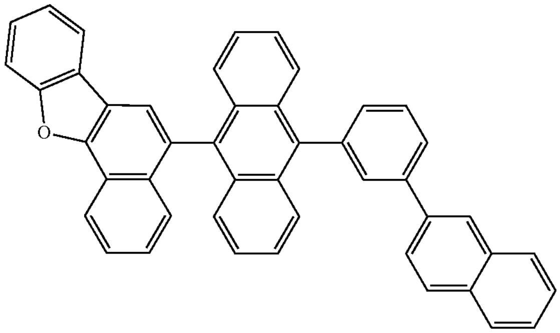
H71
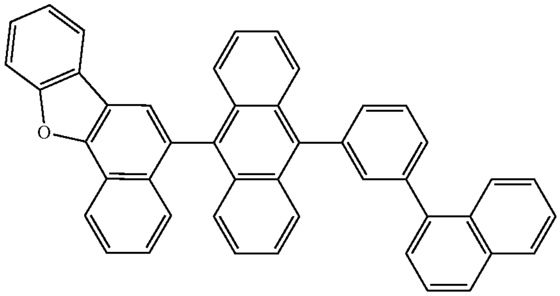
H72
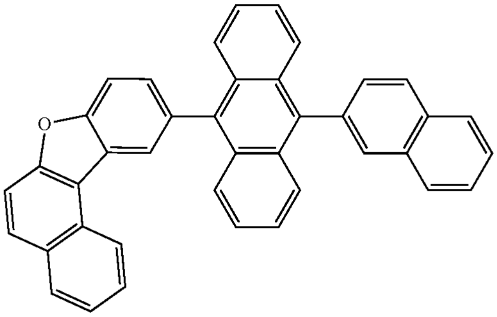
H73
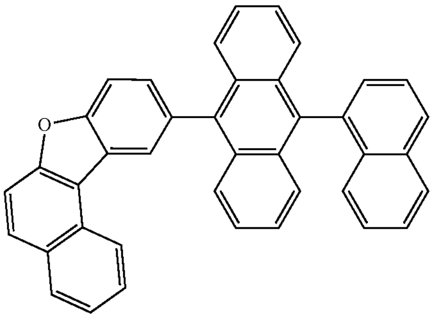

-continued
H74
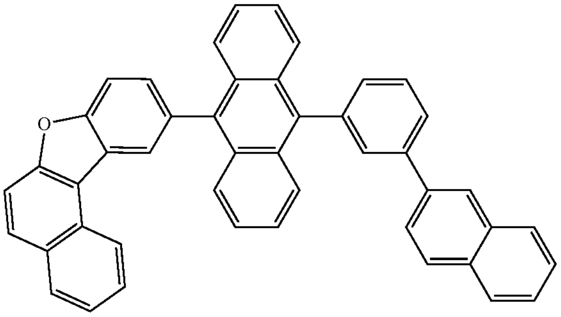
H75
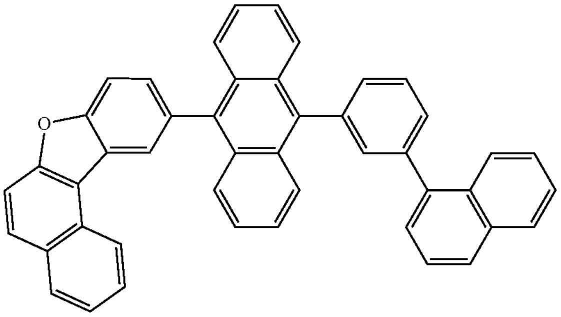
H76
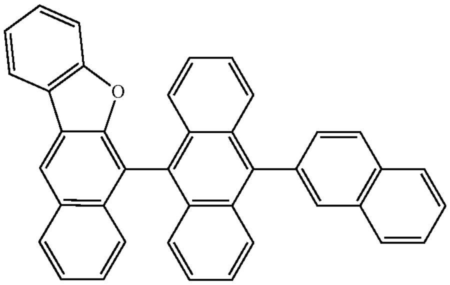
H77
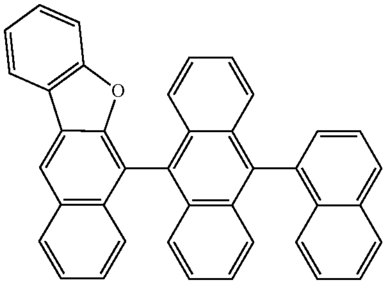
H78
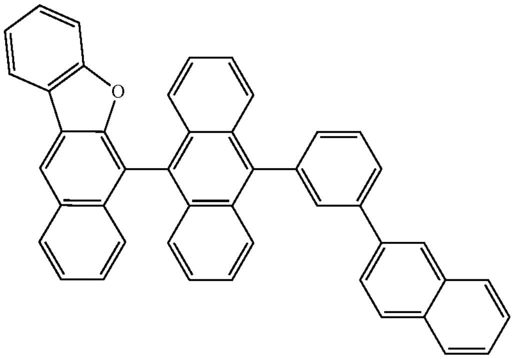
-continued
H79
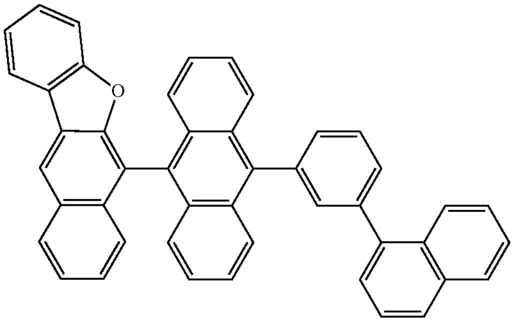
H80
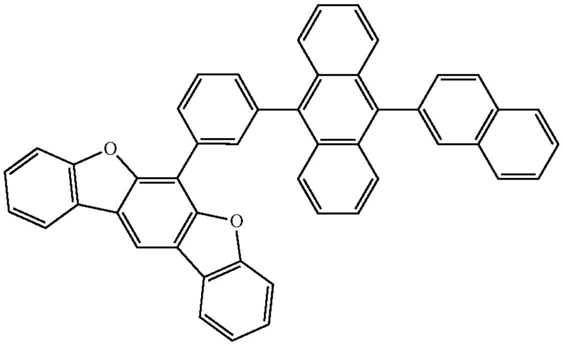
H81
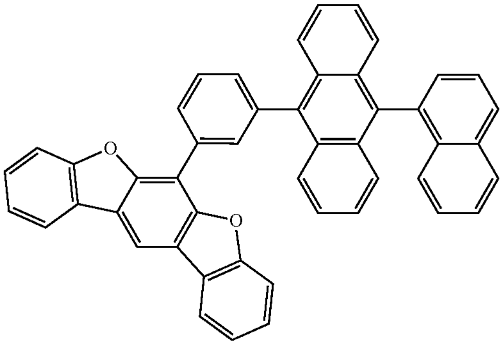
H82
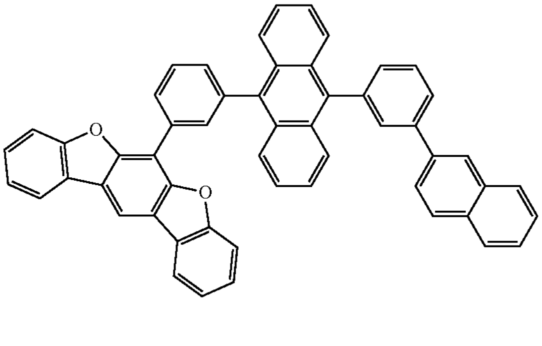

-continued
H83
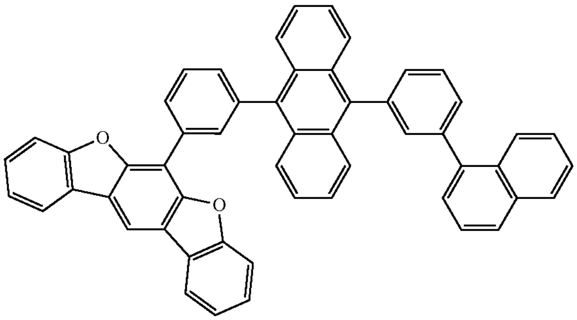
H84
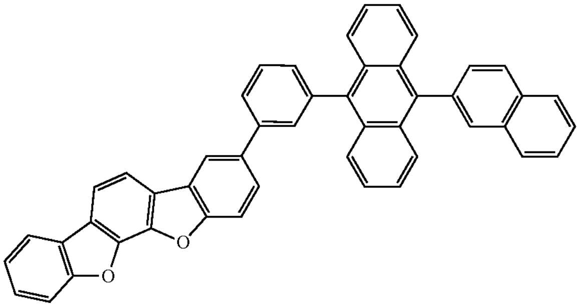
H85
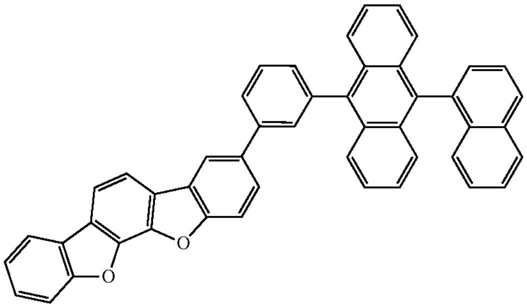
H86
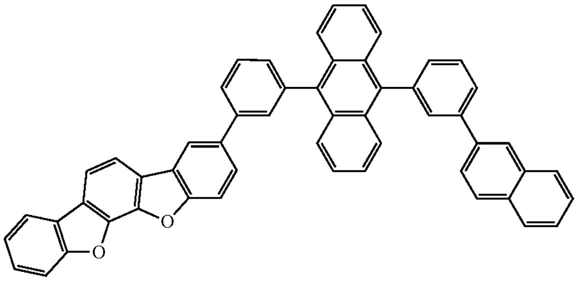
H87
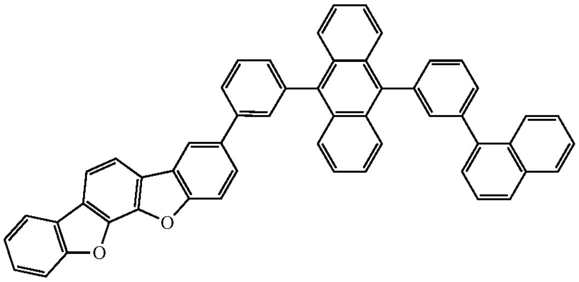
-continued
H88
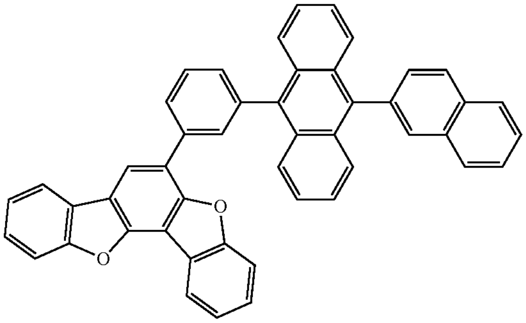
H89
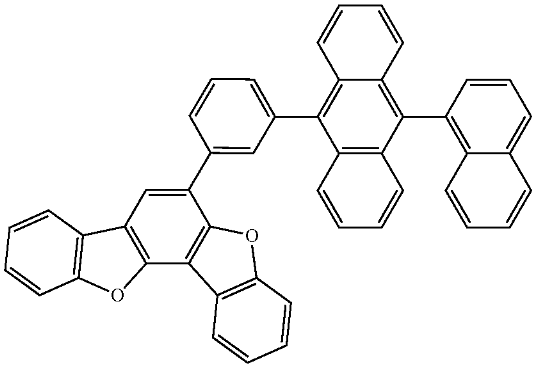
H91
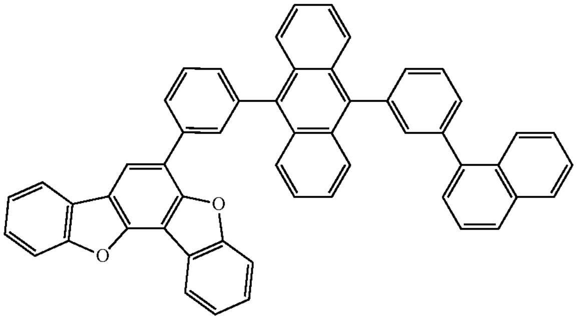
H92
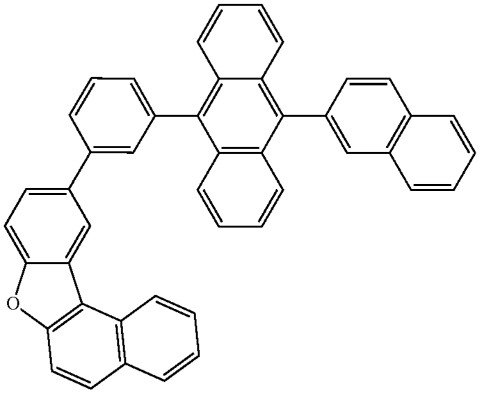

-continued
H93
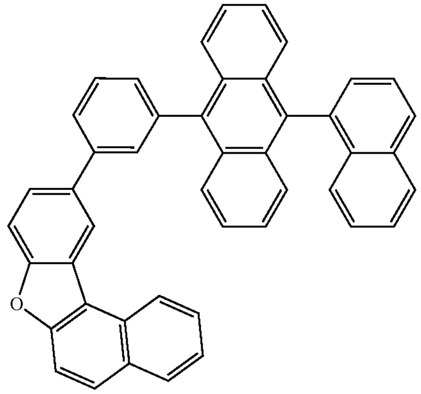
H94
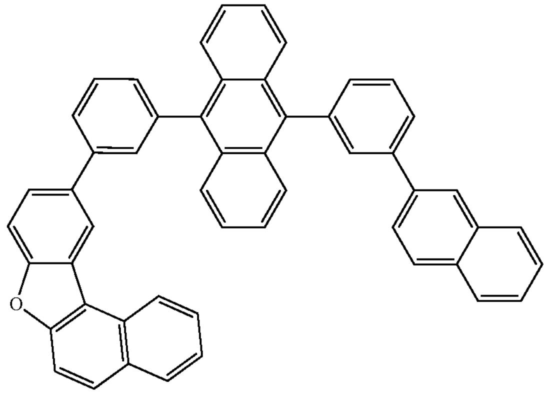
H95
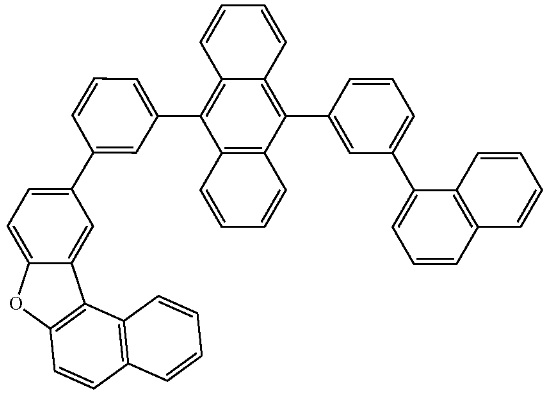
H96
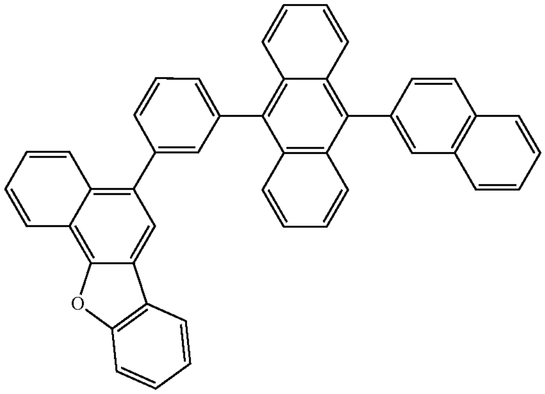
-continued
H97
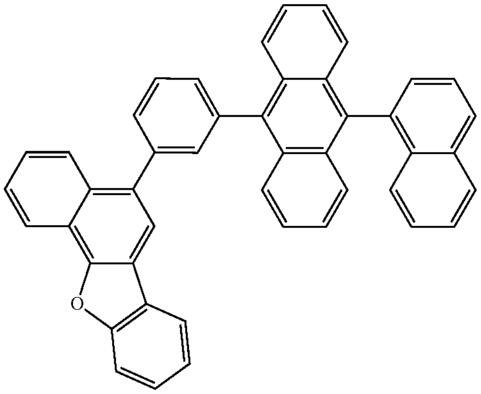
H98
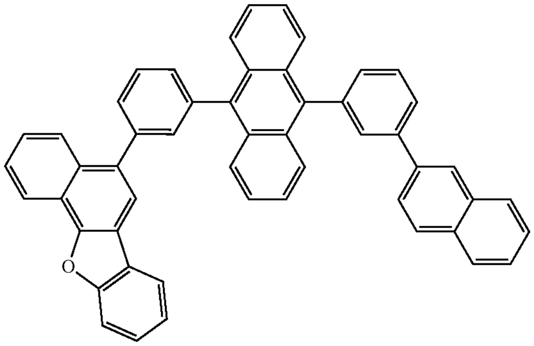
H99
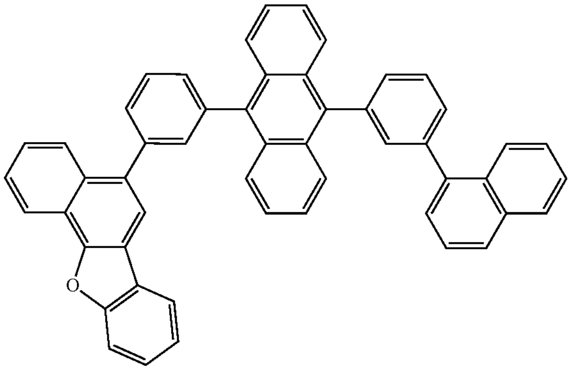
H100
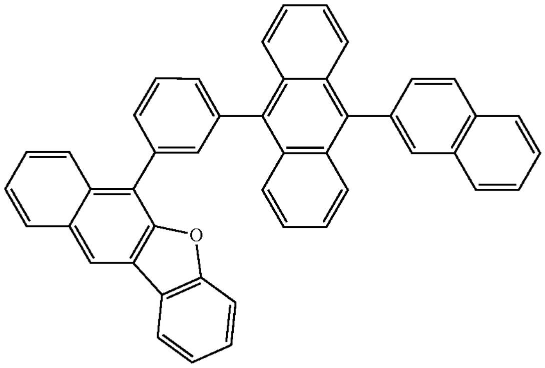

-continued
H101
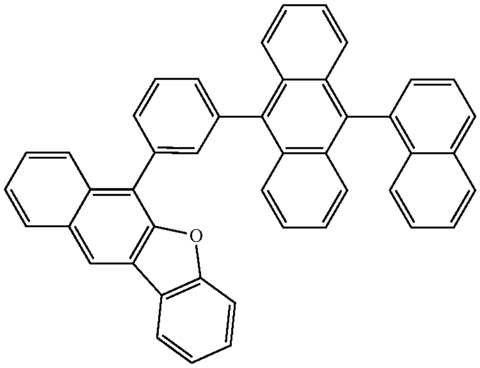
H102
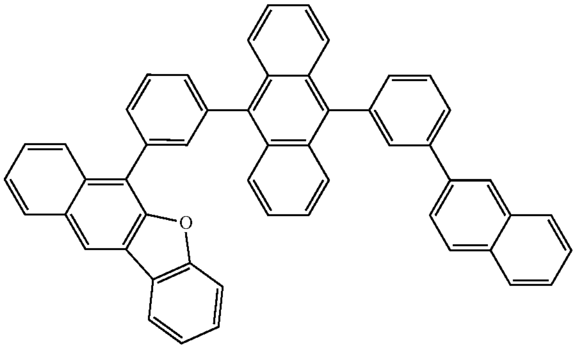
H103
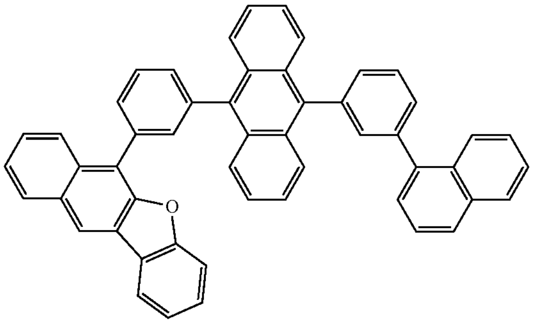
H104
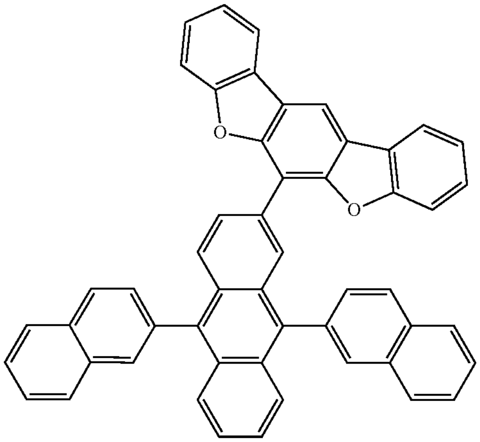
-continued
H105
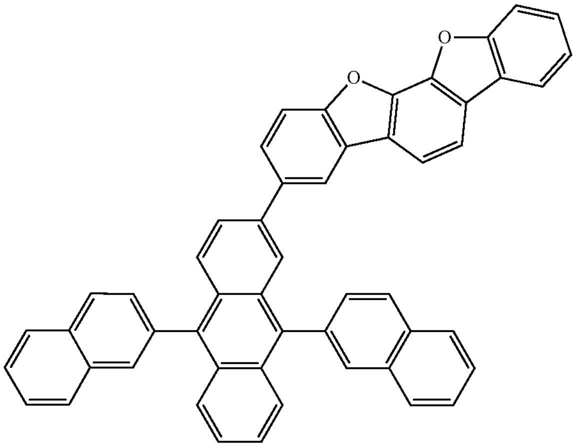
H106
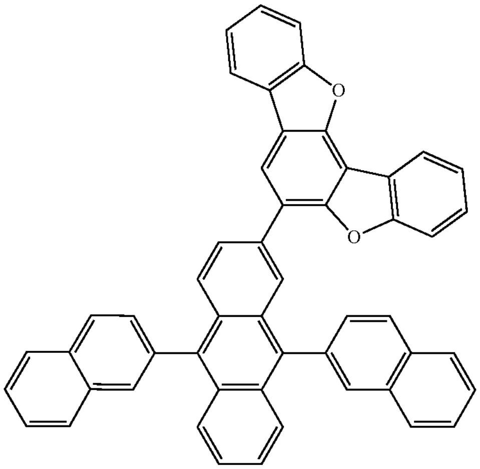
H107
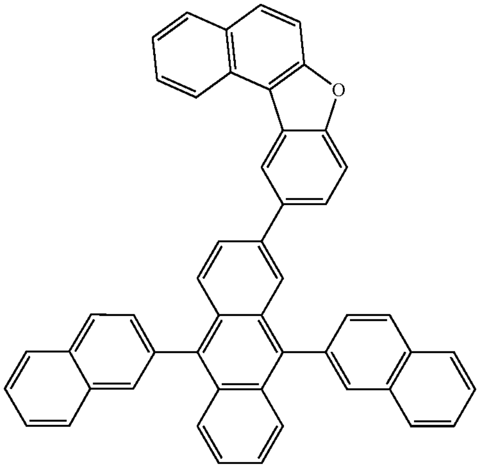

-continued
H108
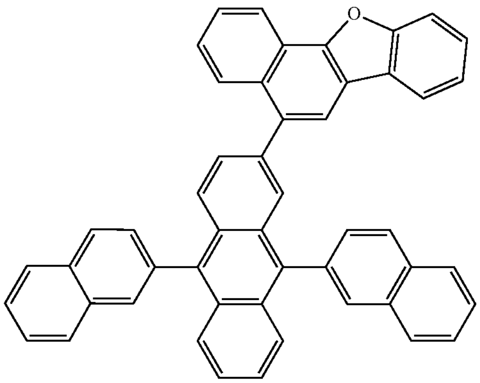
H109
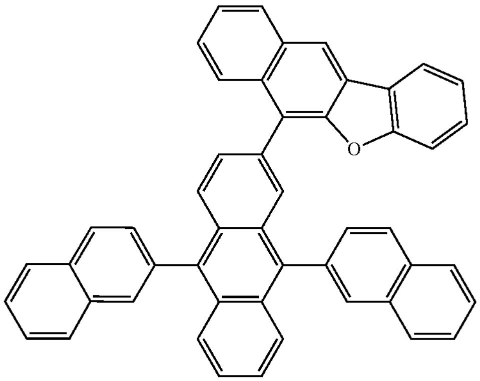
H110
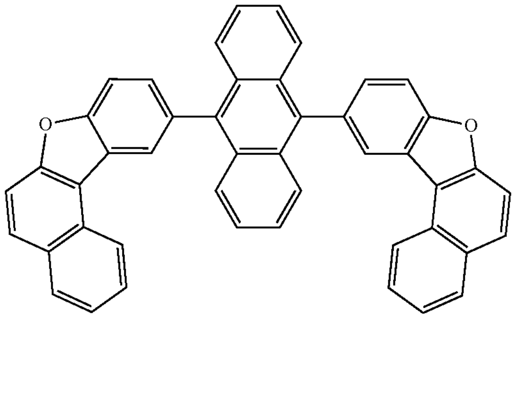
H111
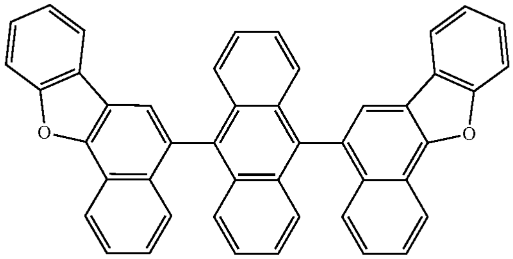
-continued
H112
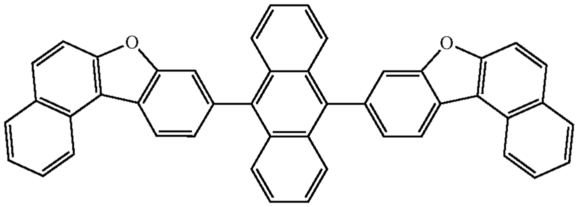
H113
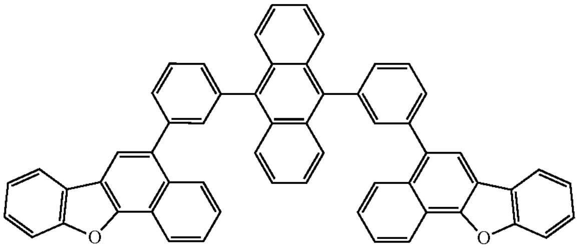
H114
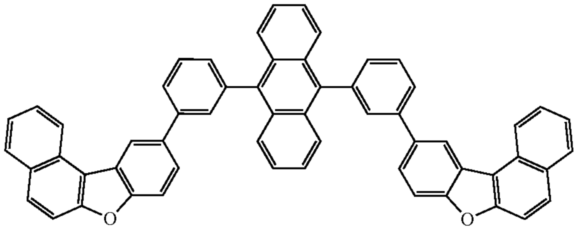
H115
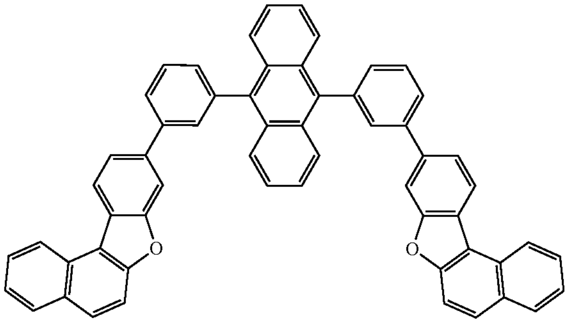
H116
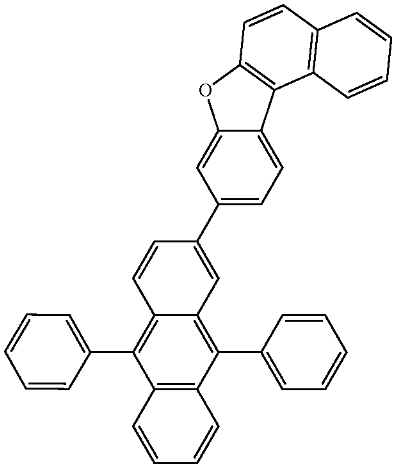

-continued
H117
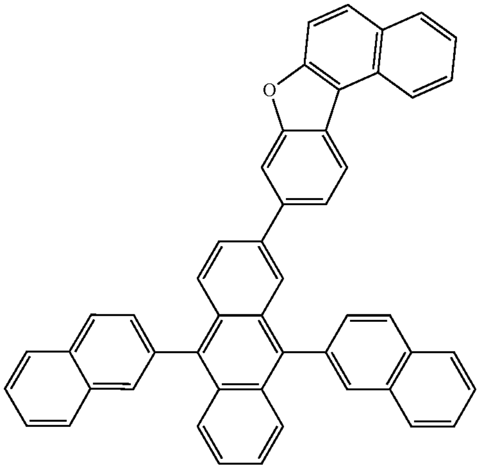
H118
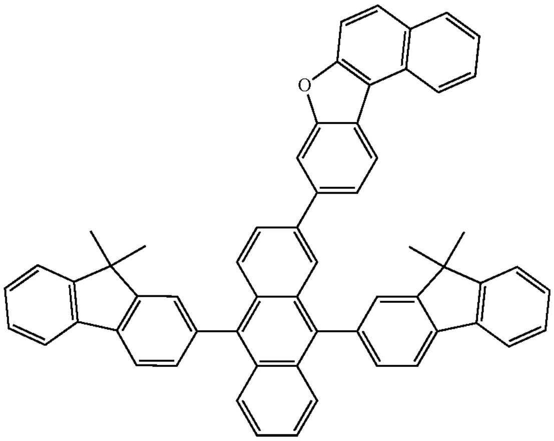
H119
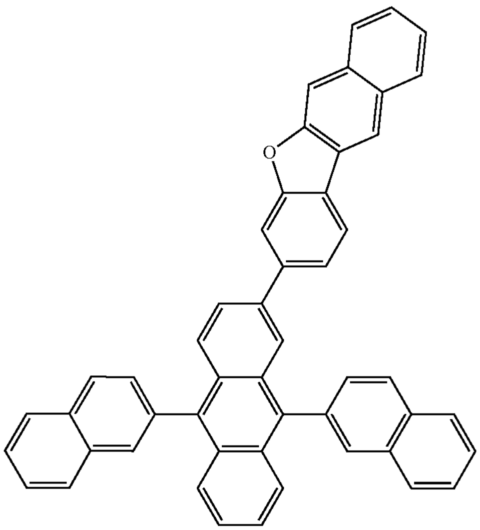
-continued
H120
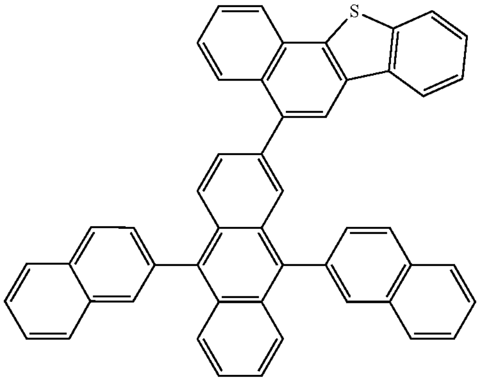
H121
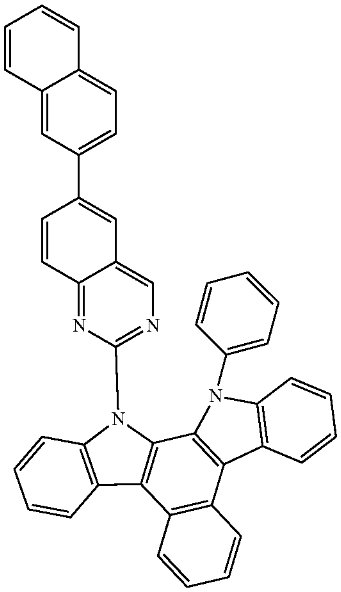
H122
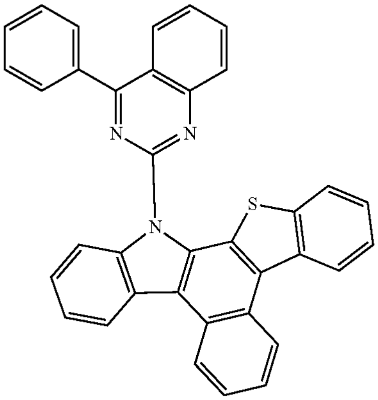

-continued

H123

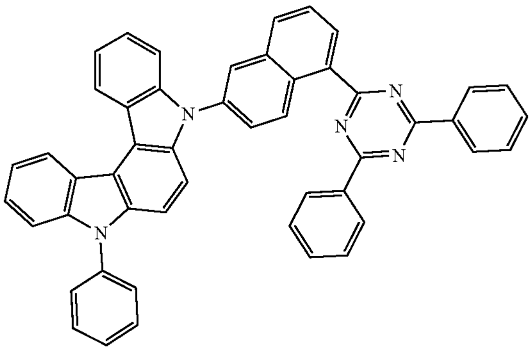

H124

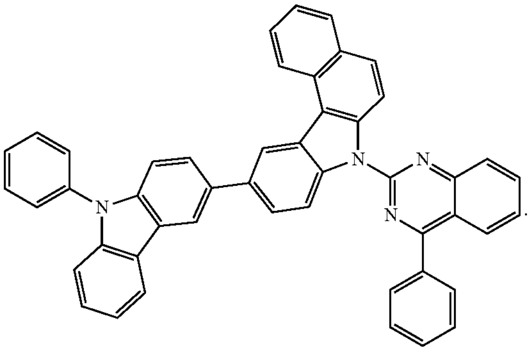

Phosphorescent Dopant

The phosphorescent dopant may include at least one transition metal as a center metal.

The phosphorescent dopant may include a monodentate ligand, a bidentate ligand, a tridentate ligand, a tetradentate ligand, a pentadentate ligand, a hexadentate ligand, or any combination thereof.

The phosphorescent dopant may be electrically neutral.

In some embodiments, the phosphorescent dopant may include an organometallic complex represented by Formula 401:

$$M(L_{401})_{xc1}(L_{402})_{xc2}$$ Formula 401

Formula 402

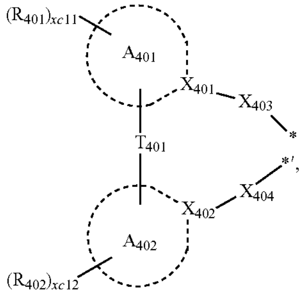

wherein, in Formulae 401 and 402,

M may be transition metal (e.g., iridium (Ir), platinum (Pt), palladium (Pd), osmium (Os), titanium (Ti), gold (Au), hafnium (Hf), europium (Eu), terbium (Tb), rhodium (Rh), rhenium (Re), or thulium (Tm)), $L_{401}$ may be a ligand represented by Formula 402, and xc1 may be 1, 2, or 3, and when xc1 is 2 or greater, at least two $L_{401}$(s) may be identical to or different from each other, $L_{402}$ may be an organic ligand, and xc2 may be an integer from 0 to 4, and when xc2 is 2 or greater, at least two $L_{402}$(s) may be identical to or different from each other, $X_{401}$ and $X_{402}$ may each independently be nitrogen or carbon, ring $A_{401}$ and ring $A_{402}$ may each independently be a $C_3$-$C_{60}$ carbocyclic group or a $C_1$-$C_{60}$ heterocyclic group, $T_{401}$ may be a single bond, *—O—*', *—S—*', *—C(=O)—*', *—N($Q_{411}$)-*', *—C($Q_{411}$)($Q_{412}$)-*40 , *—C($Q_{411}$)=C($Q_{412}$)-*', *—C($Q_{411}$)=*', or *=C=*', $X_{403}$ and $X_{404}$ may each independently be a chemical bond (e.g., a covalent bond or a coordinate bond), O, S, N($Q_{413}$), B($Q_{413}$), P($Q_{413}$), C($Q_{413}$)($Q_{414}$), or Si($Q_{413}$)($Q_{414}$), wherein $Q_{411}$ to $Q_{414}$ may each independently be understood by referring to the description of $Q_1$ provided herein, $R_{401}$ and $R_{402}$ may each independently be hydrogen, deuterium, —F, —Cl, —Br, —I, a hydroxyl group, a cyano group, a nitro group, a $C_1$-$C_{20}$ alkyl group unsubstituted or substituted with at least one $R_{10a}$, a $C_1$-$C_{20}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, —Si($Q_{401}$)($Q_{402}$)($Q_{403}$), —N($Q_{401}$)($Q_{402}$), —B($Q_{401}$)($Q_{402}$), —C(=O)($Q_{401}$), —S(=O)$_2$($Q_{401}$), or —P(=O)($Q_{401}$)($Q_{402}$), wherein $Q_{401}$ to $Q_{403}$ may each independently be understood by referring to the description of $Q_1$ provided herein, xc11 and xc12 may each independently be an integer from 0 to 10, and

* and *' in Formula 402 each indicate a binding site to M in Formula 401.

For example, in Formula 402, i) $X_{401}$ may be nitrogen, and $X_{402}$ may be carbon, or ii) $X_{401}$ and $X_{402}$ may each be nitrogen.

In one or more embodiments, when xc1 in Formula 401 is 2 or greater, two ring $A_{401}$(s) in two or more $L_{401}$(s) may optionally be linked to each other via $T_{402}$ as a linking group, or two ring $A_{402}$(s) may optionally be linked to each other via $T_{403}$ as a linking group (see Compounds PD1 to PD4 and PD7). $T_{402}$ and $T_{403}$ may each independently be understood by referring to the description of $T_{401}$ provided herein.

In Formula 401, $L_{402}$ may be any suitable organic ligand. For example, $L_{402}$ may be a halogen group, a diketone group (e.g., an acetylacetonate group), a carboxylic acid group (e.g., a picolinate group), —C(=O), an isonitrile group, —CN, or a phosphorus-containing group (e.g., a phosphine group or a phosphite group).

The phosphorescent dopant may include (e.g., may be), for example, at least one of Compounds PD1 to PD39, or any combination thereof:

PD1
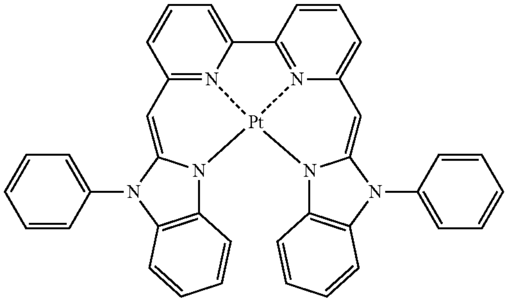
PD2
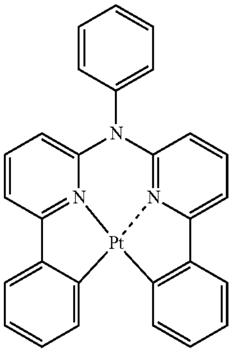
PD3
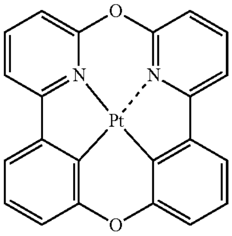
PD4
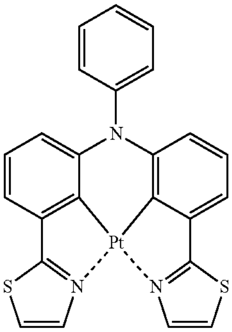
PD5
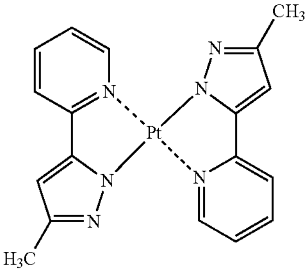
-continued
PD6
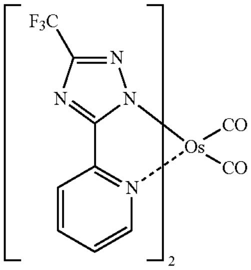
PD7
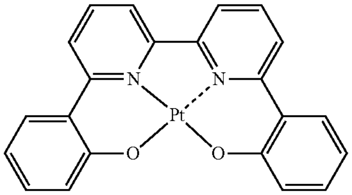
PD8
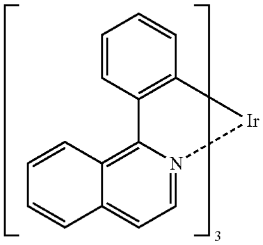
PD9
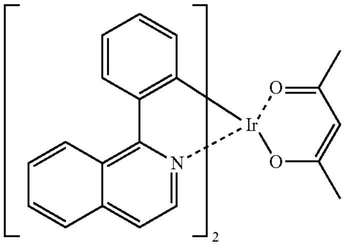
PD10
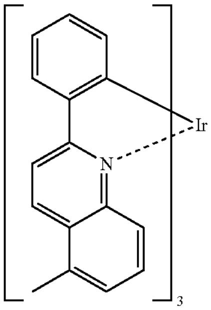
PD11
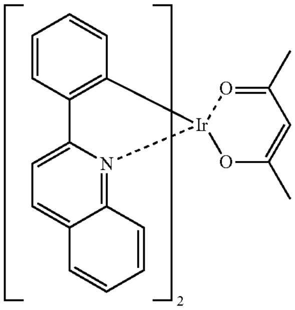

-continued
PD12
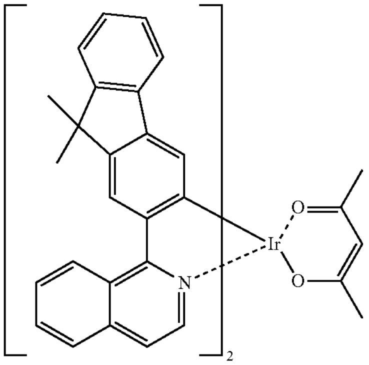
PD13
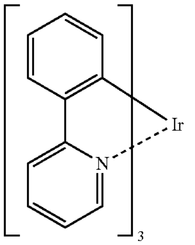
PD14
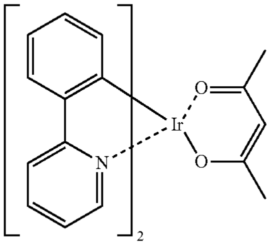
PD15
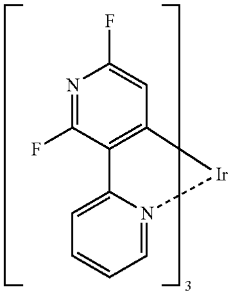
PD16
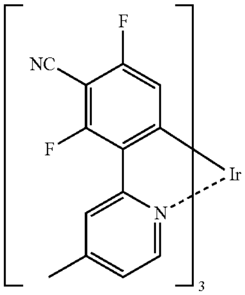
-continued
PD17
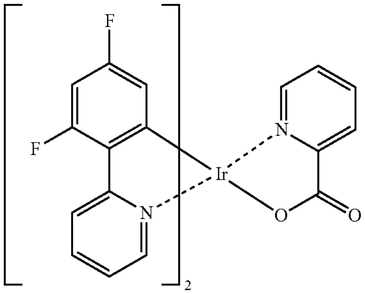
PD18
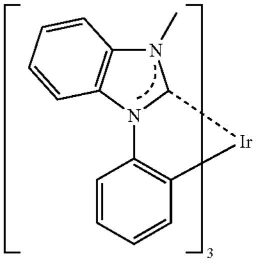
PD19
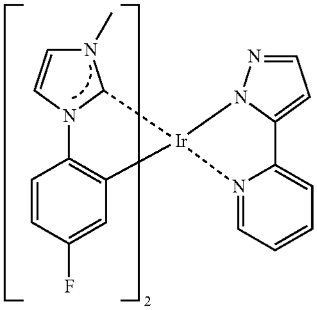
PD20
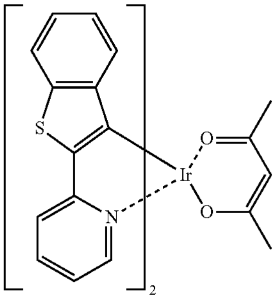
PD21
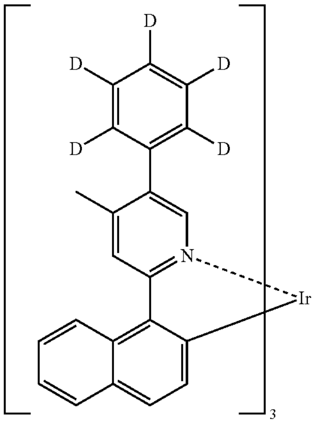

-continued
PD22
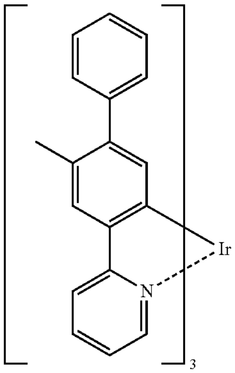
PD23
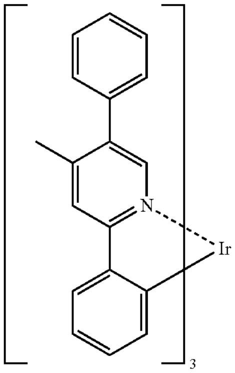
PD24
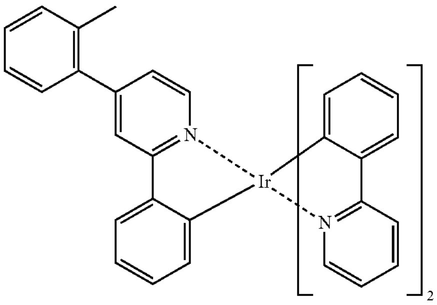
PD25
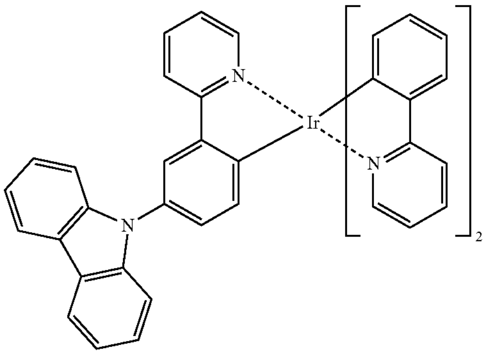
.
-continued
PD26
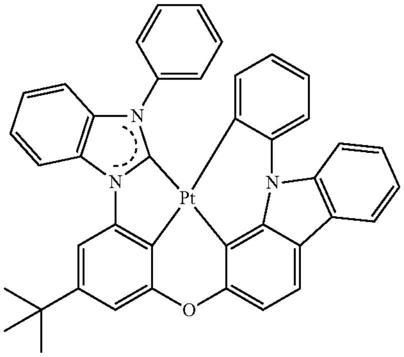
PD27
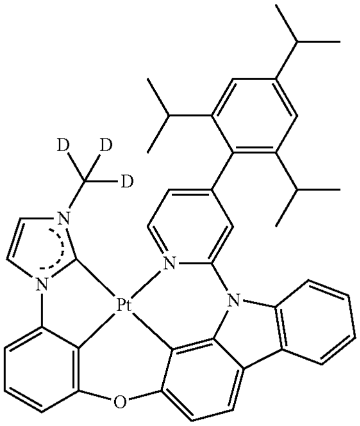
PD28
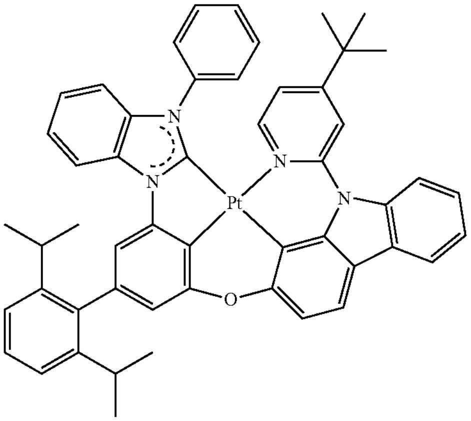
PD29
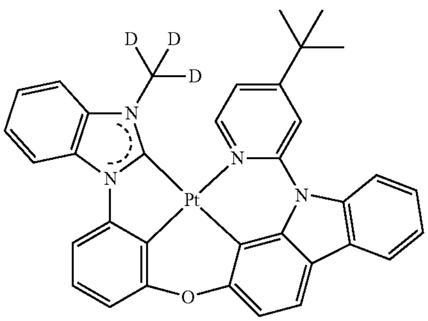

PD30
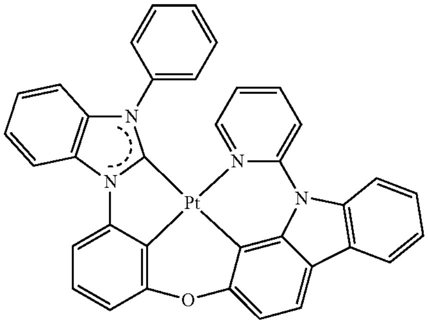
PD31
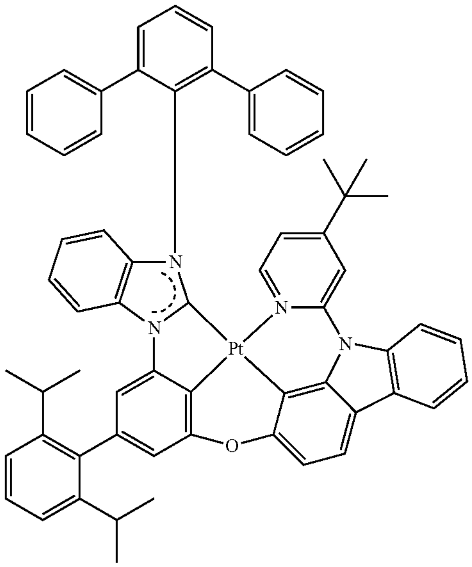
PD32
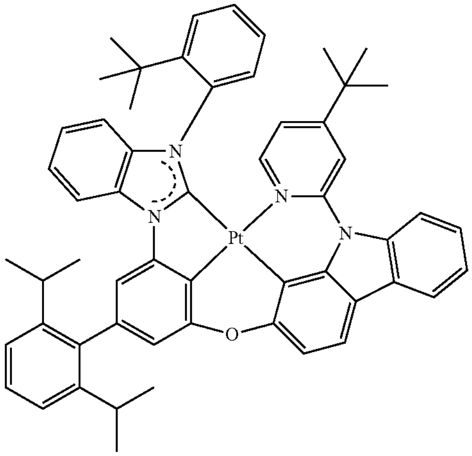
PD33
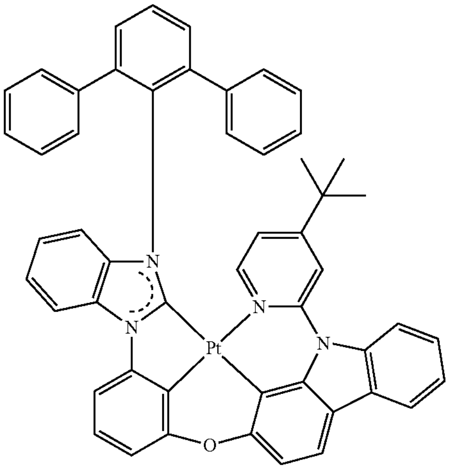
PD34
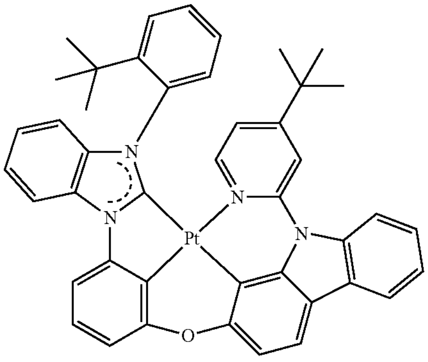
PD35
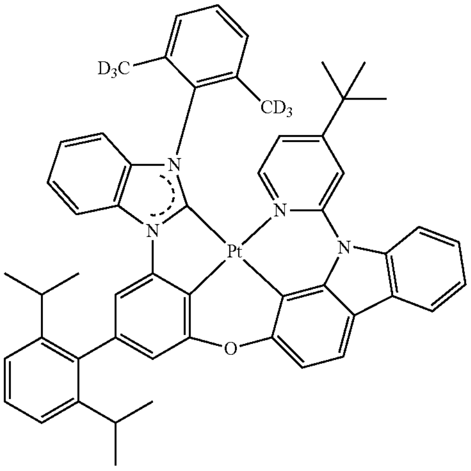

-continued

PD36

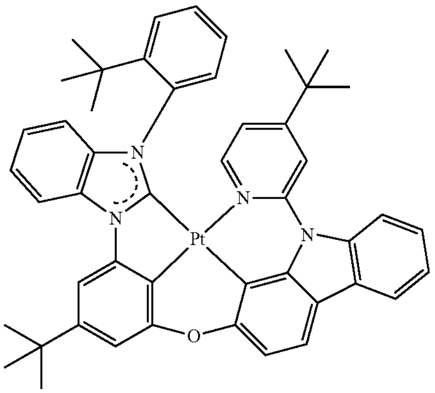

PD37

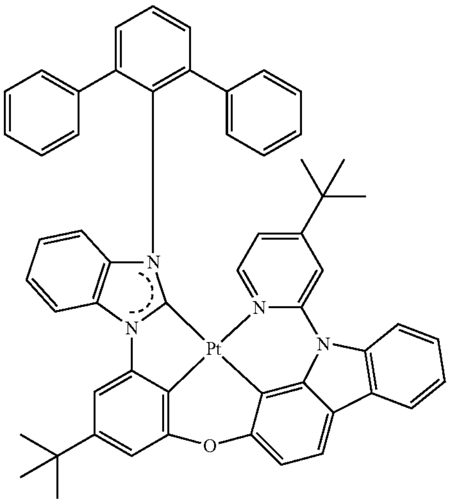

PD38

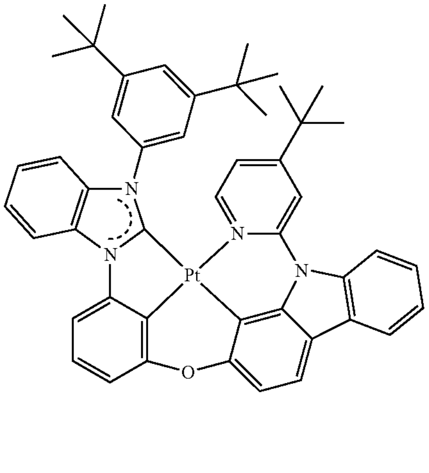

-continued

PD39

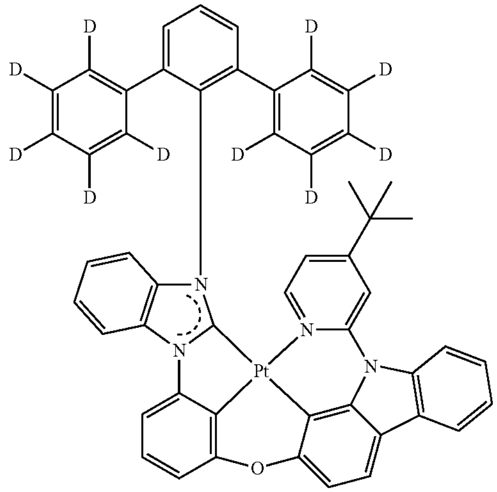

Fluorescent Dopant

The fluorescent dopant may include an amine group-containing compound, a styryl group-containing compound, or any combination thereof.

In some embodiments, the fluorescent dopant may include a compound represented by Formula 501:

Formula 501

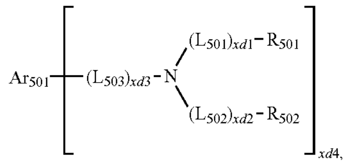

wherein, in Formula 501, $Ar_{501}$, $L_{501}$ to $L_{503}$, $R_{501}$, and $R_{502}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, xd1 to xd3 may each independently be 0, 1, 2, or 3, and xd4 may be 1, 2, 3, 4, 5, or 6.

In some embodiments, in Formula 501, $Ar_{501}$ may include a condensed ring group (e.g., an anthracene group, a chrysene group, or a pyrene group) in which three or more monocyclic groups are condensed with each other.

In some embodiments, xd4 in Formula 501 may be 2.

In some embodiments, the fluorescent dopant may include at least one of Compounds FD1 to FD36, DPVBi, and DPAVBi, or any combination thereof:

FD1
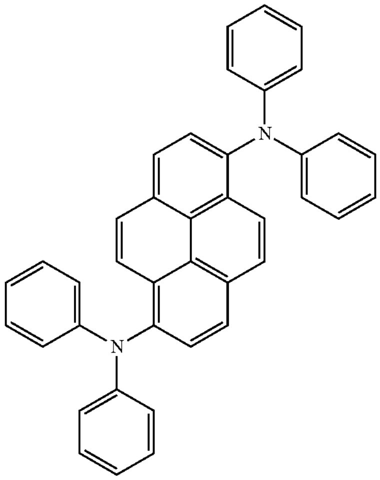
FD2
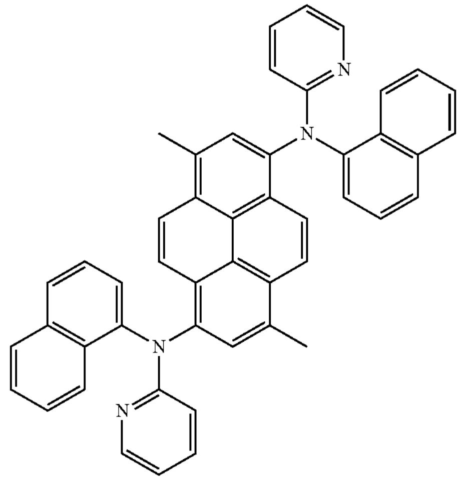
FD3
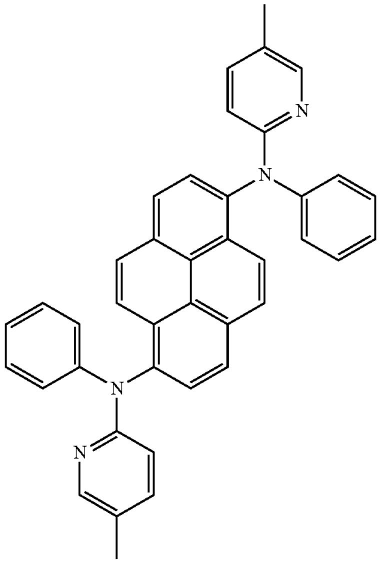
FD4
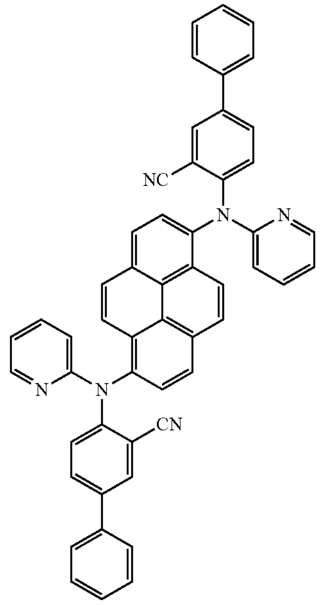
FD5
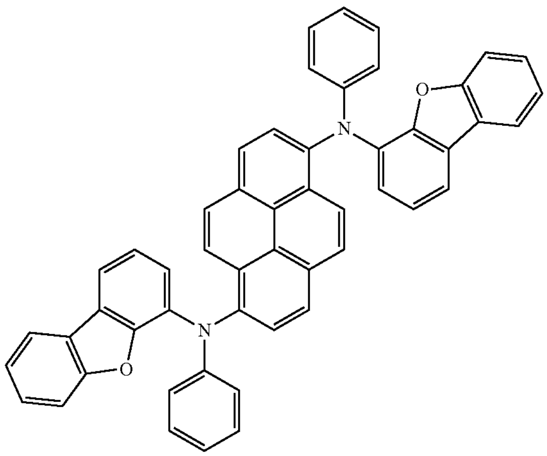
FD6
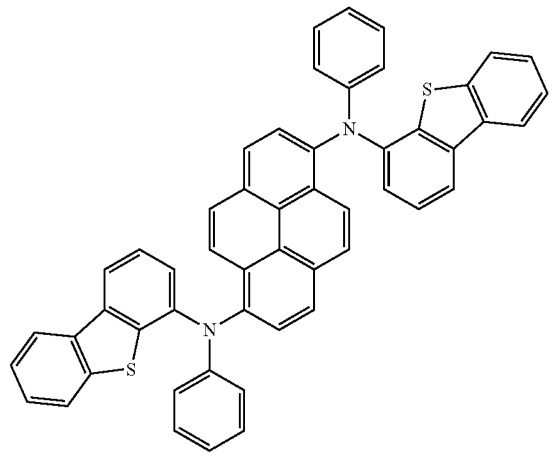

-continued
FD7
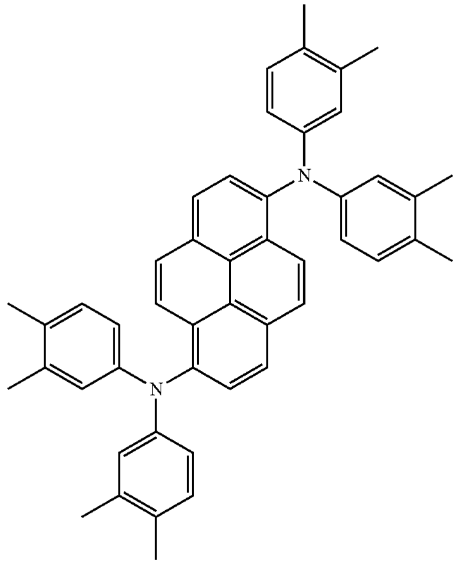
FD8
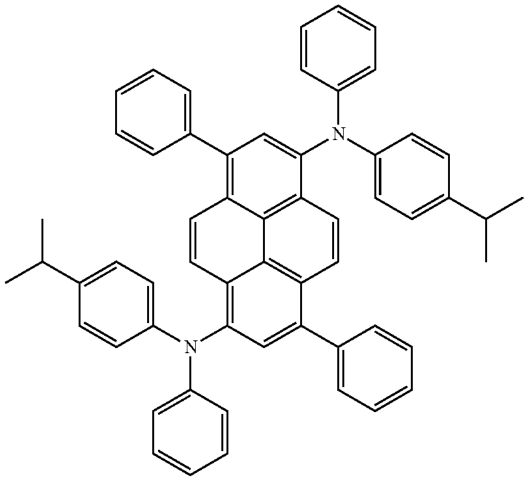
FD9
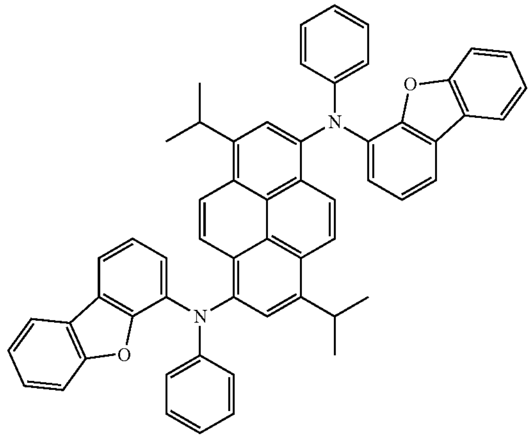
FD10
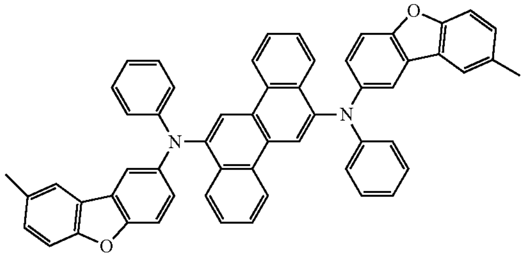
FD11
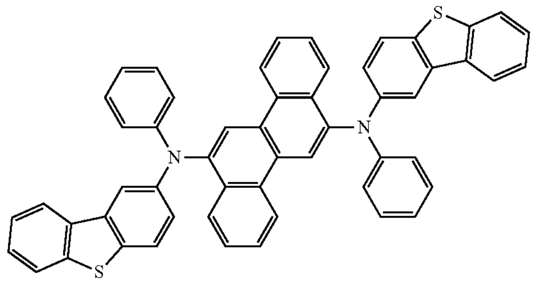
FD12
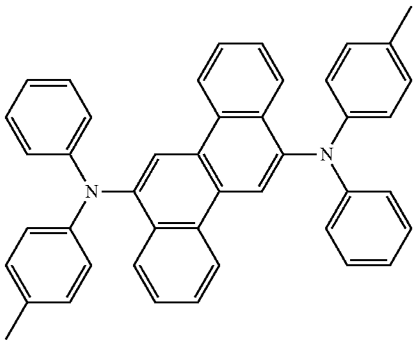

-continued
FD13
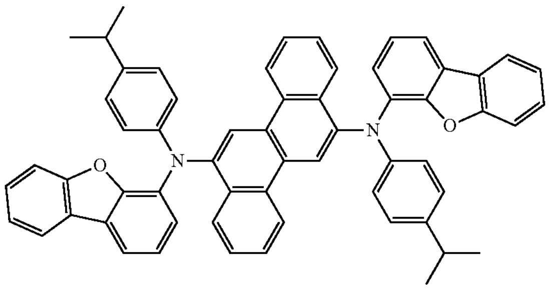
FD14
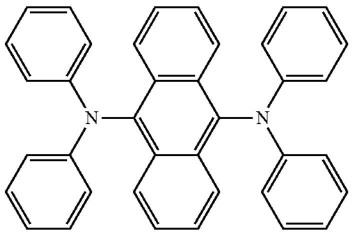
FD15
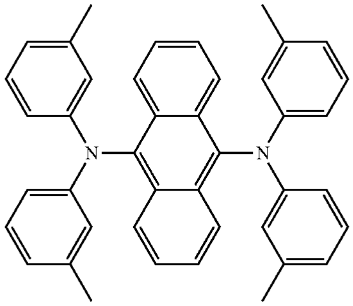
FD16
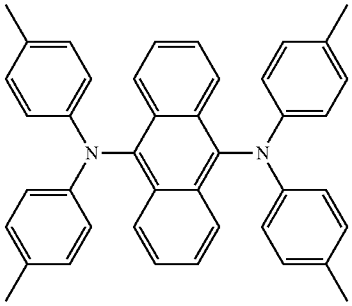
FD17
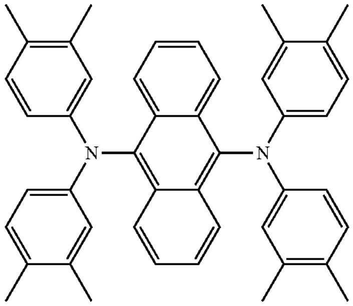
FD18
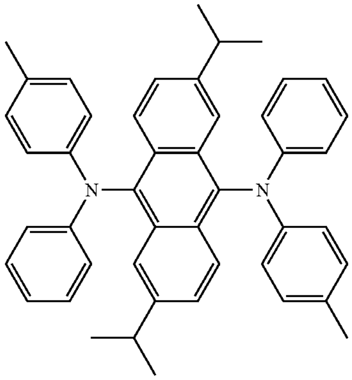
FD19
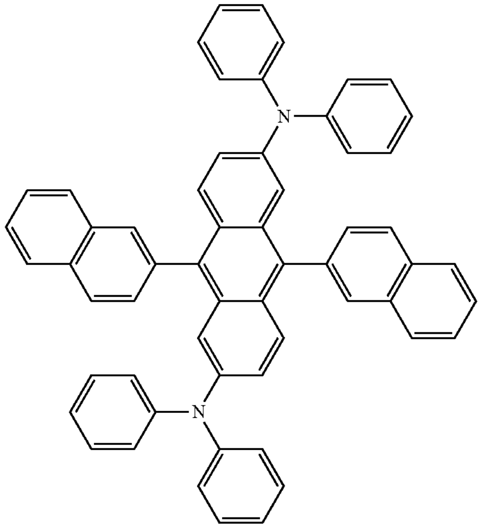
FD20
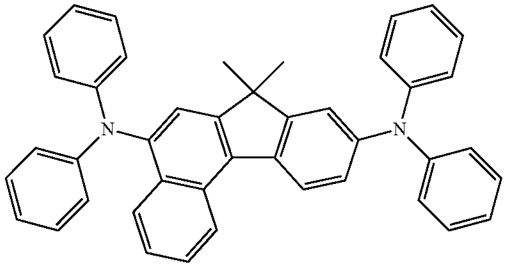

-continued
FD21
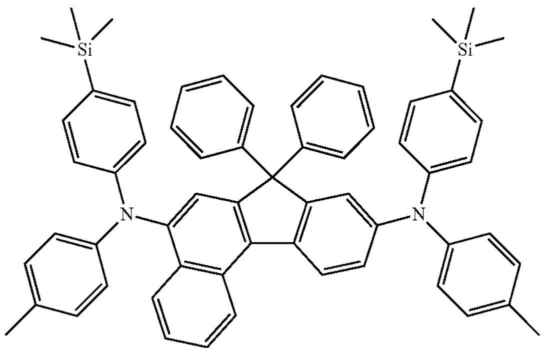
FD22
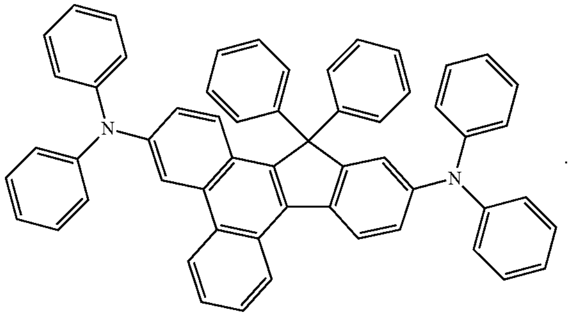
FD23
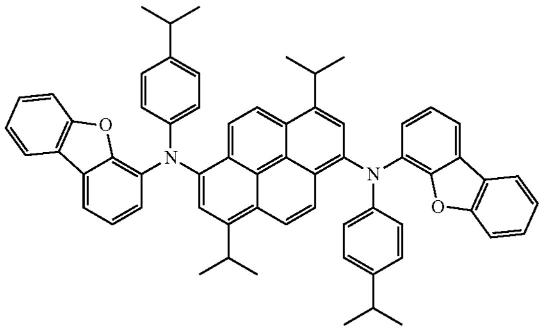
FD24
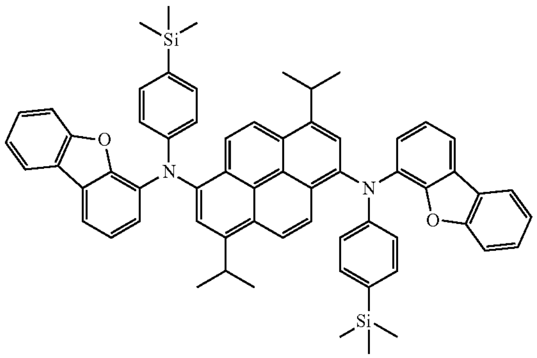
FD25
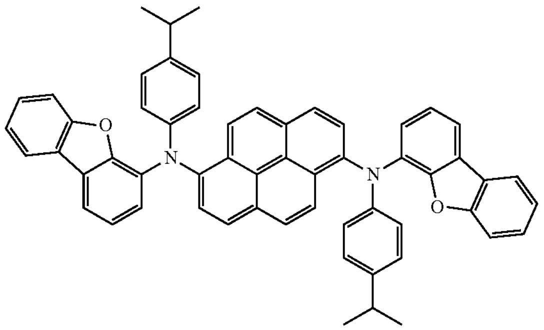
FD26
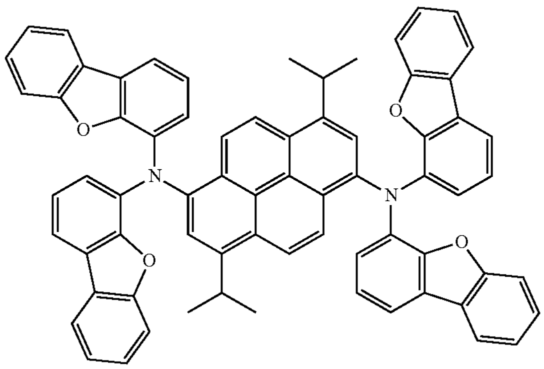
FD27
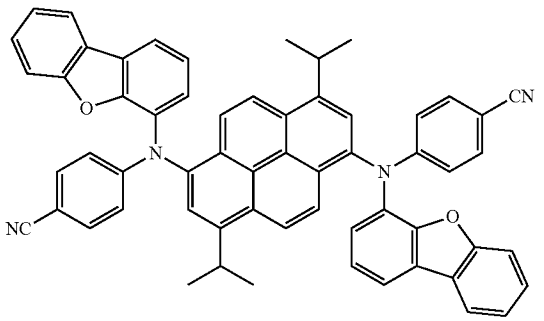
FD28
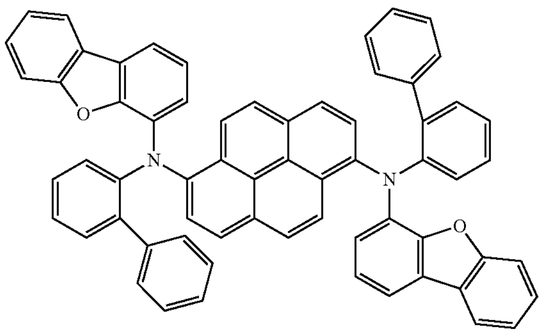

-continued
FD29
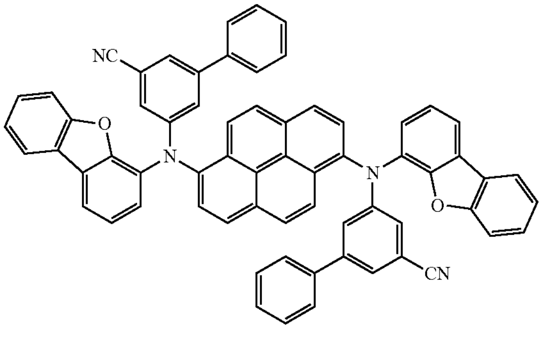
FD30
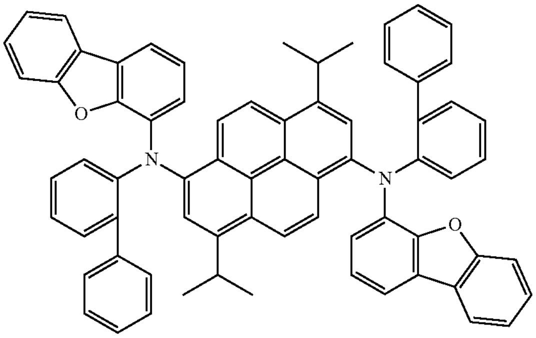
FD31
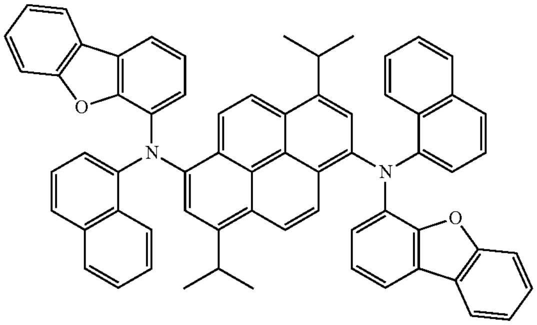
FD32
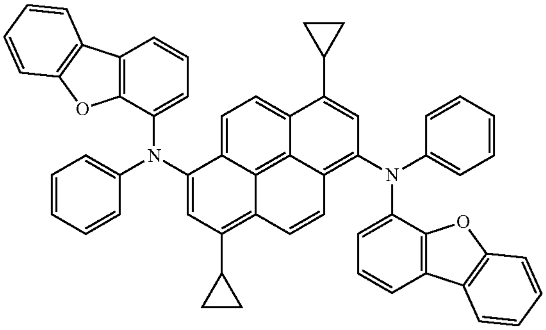
FD33
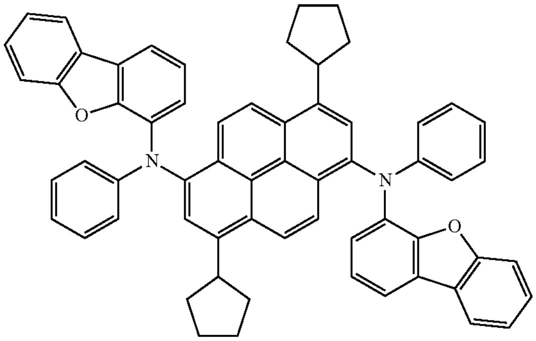
FD34
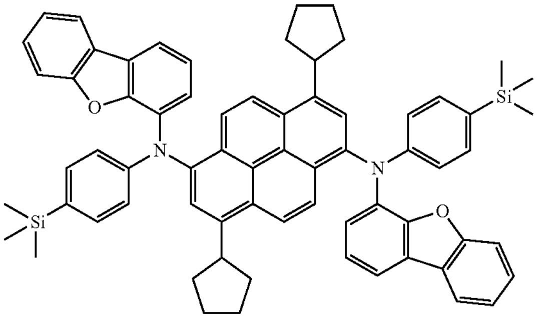
FD35
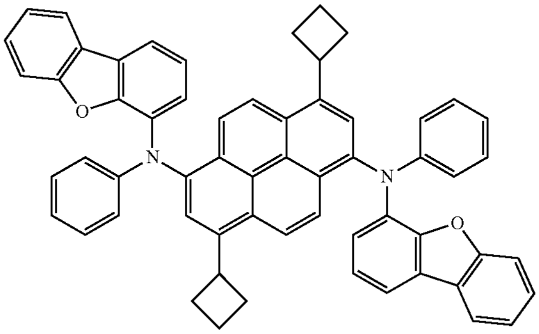
FD36
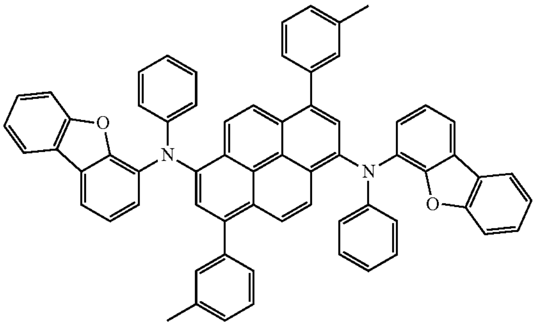

-continued

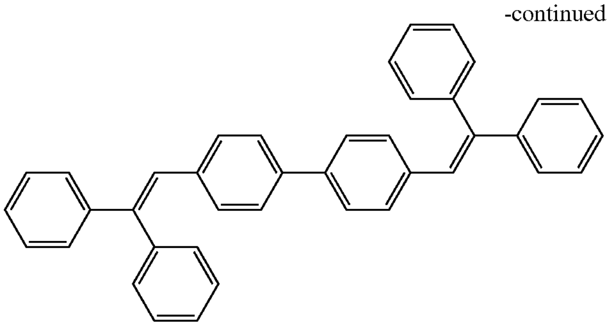

DPVBi

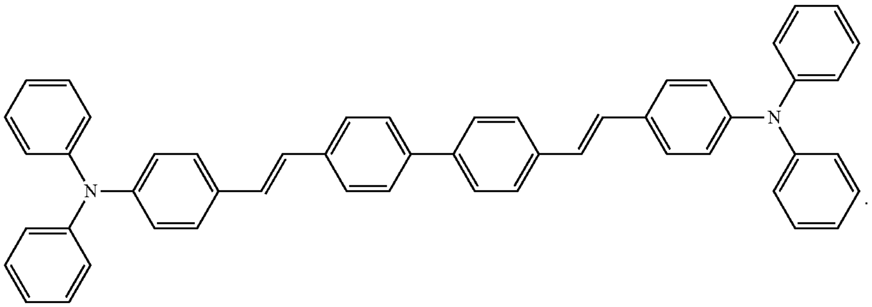

DPAVBi

Delayed Fluorescence Material

The emission layer may include a delayed fluorescence material.

The delayed fluorescence material described herein may be any suitable compound that may be to emit delayed fluorescence according to a delayed fluorescence emission mechanism.

The delayed fluorescence material included in the emission layer may serve as a host or a dopant, depending on types (kinds) of other materials included in the emission layer.

In some embodiments, a difference between a triplet energy level (eV) of the delayed fluorescence material and a singlet energy level (eV) of the delayed fluorescence material may be about 0 eV or greater and about 0.5 eV or less. When the difference between a triplet energy level (eV) of the delayed fluorescence material and a singlet energy level (eV) of the delayed fluorescence material is within this range, up-conversion from a triplet state to a singlet state in the delayed fluorescence material may occur effectively, thus improving luminescence efficiency and/or the like of the light-emitting device 10.

In some embodiments, the delayed fluorescence material may include: i) a material including at least one electron donor (e.g., a π electron-rich $C_3$-$C_{60}$ cyclic group such as a carbazole group and/or the like) and at least one electron acceptor (e.g., a sulfoxide group, a cyano group, a π electron-deficient nitrogen-containing $C_1$-$C_{60}$ cyclic group, and/or the like), and/or ii) a material including a $C_8$-$C_{60}$ polycyclic group including two or more cyclic groups condensed to each other and sharing boron (B), and/or the like.

Examples of the delayed fluorescence material may include at least one of Compounds DF1 to DF9:

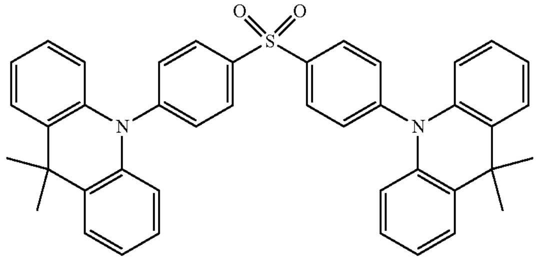

DF1(DMAC-DPS)

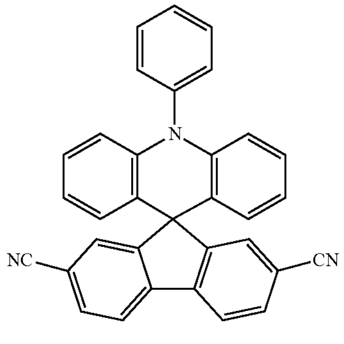

DF2(ACRFLCN)

-continued

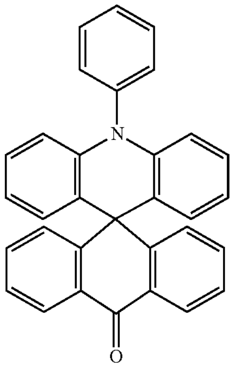

DF3(ACRSA)

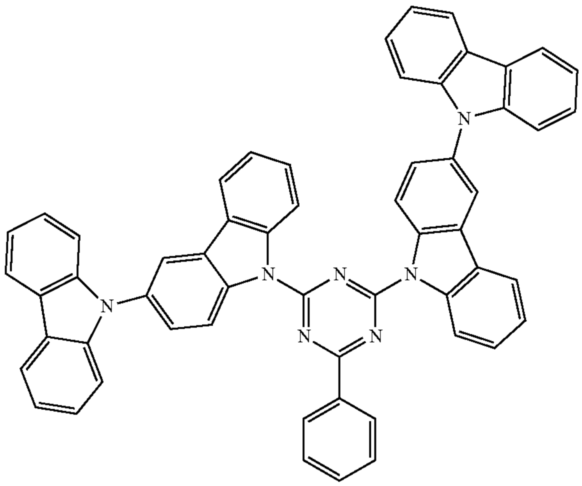

DF4(CC2TA)

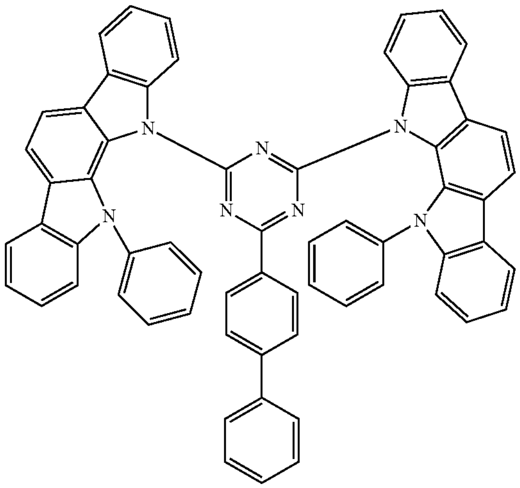

DF5(PIC-TRZ)

-continued

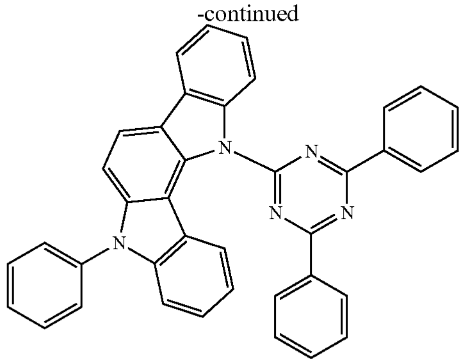

DF6(PIC-TRZ2)

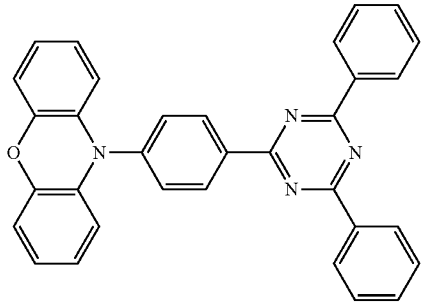

DF7(PXZ-TRZ)

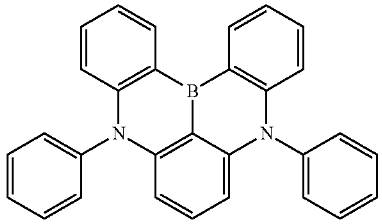

DF8(DABNA-1)

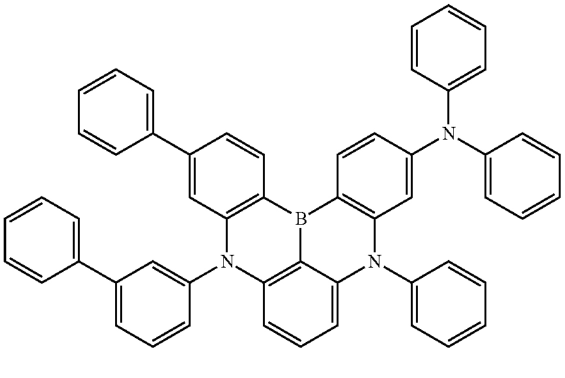

.

DF9(DABNA-2)

Quantum Dots

The emission layer may include quantum dots.

The term "quantum dot" as used herein refers to a crystal of a semiconductor compound and may include any suitable material capable of emitting light of emission wavelengths of one or more suitable lengths according to the size of the crystal.

The diameter (e.g., an average diameter) of the quantum dot may be, for example, in a range of about 1 nm to about 10 nm.

Quantum dots may be synthesized by a wet chemical process, an organic metal (e.g., organometallic) chemical vapor deposition process, a molecular beam epitaxy process, or any similar process.

The wet chemical process is a method of growing a quantum dot crystal particle by mixing a precursor material with an organic solvent. When the quantum dot crystal particle grows, the organic solvent may naturally serve as a dispersant coordinated on the surface of the quantum dot crystal particle and control the growth of the quantum dot crystal particle. Thus, the wet chemical method may be easier to perform than the vapor deposition process such as a metal organic chemical vapor deposition (MOCVD) or a molecular beam epitaxy (MBE) process. Further, the growth of quantum dot crystal particles may be controlled with a lower manufacturing cost.

The quantum dot may include a group II-VI semiconductor compound; a group III-V semiconductor compound; a group III-VI semiconductor compound; a group semiconductor compound; a group IV-VI semiconductor compound; a group IV element or compound; or any combination thereof.

Examples of the group II-VI semiconductor compound may include a binary compound such as CdS, CdSe, CdTe, ZnS, ZnSe, ZnTe, ZnO, HgS, HgSe, HgTe, MgSe, and/or MgS; a ternary compound such as CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, and/or MgZnS; a quaternary compound such as CdZnSeS, CdZnSeTe, CdZnSTe, CdHgSeS, CdHgSeTe, CdHgSTe, HgZnSeS, HgZnSeTe, and/or HgZnSTe; or any combination thereof.

Examples of the group III-V semiconductor compound may include a binary compound such as GaN, GaP, GaAs, GaSb, AlN, AlP, AlAs, AlSb, InN, InP, InAs, and/or InSb; a ternary compound such as GaNP, GaNAs, GaNSb, GaPAs, GaPSb, AlNP, AlNAs, AlNSb, AlPAs, AlPSb, InGaP, InNP, InAlP, InNAs, InNSb, InPAs, and/or InPSb; a quaternary compound such as GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, and/or InAlPSb; or any combination thereof. In some embodiments, the group III-V semiconductor compound may further include a group II element. Examples of the group III-V semiconductor compound further including the group II element may include InZnP, InGaZnP, InAlZnP, and/or the like.

Examples of the group III-VI semiconductor compound may include a binary compound such as GaS, GaSe, $Ga_2Se_3$, GaTe, InS, InSe, $In_2S_3$, $In_2Se_3$, InTe, and/or the like; a ternary compound such as $InGaS_3$, $InGaSe_3$, and/or the like; or any combination thereof.

Examples of the group semiconductor compound may include a ternary compound such as AgInS, $AgInS_2$, CuInS, $CuInS_2$, $CuGaO_2$, $AgGaO_2$, and/or $AgAlO_2$; or any combination thereof.

Examples of the group IV-VI semiconductor compound may include a binary compound such as SnS, SnSe, SnTe, PbS, PbSe, and/or PbTe; a ternary compound such as SnSeS, SnSeTe, SnSTe, PbSeS, PbSeTe, PbSTe, SnPbS, SnPbSe, and/or SnPbTe; a quaternary compound such as SnPbSSe, SnPbSeTe, and/or SnPbSTe; or any combination thereof.

The group IV element or compound may be a single element material such as Si and/or Ge; a binary compound such as SiC and/or SiGe; or any combination thereof.

Individual elements included in the multi-element compound, such as the binary compound, the ternary compound, and/or the quaternary compound, may be present in a particle thereof at a substantially uniform or non-uniform concentration.

The quantum dot may have a single structure in which the concentration of each element included in the quantum dot is substantially uniform or a core-shell double structure. In some embodiments, in a quantum dot with a core-shell structure, materials included in the core may be different from materials included in the shell.

The shell of the quantum dot may serve as a protective layer for preventing or reducing chemical denaturation of the core to maintain semiconductor characteristics and/or as a charging layer for imparting electrophoretic characteristics to the quantum dot. The shell may have a monolayer or a multilayer structure. An interface between a core and a shell may have a concentration gradient where a concentration of elements present in the shell decreases toward the core.

Examples of the shell of the quantum dot may include a metal oxide, a metalloid oxide, a nonmetal oxide, a semiconductor compound, or a combination thereof. Examples of the metal oxide, the metalloid oxide, and the nonmetal oxide may include: a binary compound such as $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$, and/or NiO; a ternary compound such as $MgAl_2O_4$, $CoFe_2O_4$, $NiFe_2O_4$, and/or $CoMn_2O_4$; and any combination thereof. Examples of the semiconductor compound may include a group II-VI semiconductor compound; a group III-V semiconductor compound; a group III-VI semiconductor compound; a group I-III-VI semiconductor compound; a group IV-VI semiconductor compound; or any combination thereof. In some embodiments, the semiconductor compound may be CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, AlSb, or any combination thereof.

The quantum dot may have a full width of half maximum (FWHM) of a spectrum of an emission wavelength of about 45 nm or less, about 40 nm or less, or about 30 nm or less. When the FWHM of the quantum dot is within these ranges, color purity or color reproducibility may be improved. In addition, because light emitted through the quantum dots is emitted in all directions, an optical viewing angle may be improved.

In some embodiments, the quantum dot may be a spherical, pyramidal, multi-arm, or cubic nanoparticle, a nanotube, a nanowire, a nanofiber, or a nanoplate particle.

By adjusting the size of the quantum dot, the energy band gap may also be adjusted, thereby obtaining light of one or more suitable wavelengths in the quantum dot emission layer. By utilizing quantum dots of one or more suitable sizes, a light-emitting device that may emit light of one or more suitable wavelengths may be realized. In some embodiments, the size of the quantum dot may be selected such that the quantum dot may be to emit red, green, and/or blue light. In some embodiments, the size of the quantum dot may be selected such that the quantum dot may be to emit white light by combining one or more suitable light colors.

Electron Transport Region in Interlayer 130

The electron transport region may have i) a single-layered structure consisting of a single layer consisting of a single material, ii) a single-layered structure consisting of a single layer including a plurality of different materials, or iii) a multi-layered structure having a plurality of layers including a plurality of different materials.

The electron transport region may include a buffer layer, a hole blocking layer, an electron control layer, an electron transport layer, an electron injection layer, or any combination thereof.

In some embodiments, the electron transport region may have an electron transport layer/electron injection layer structure, a hole blocking layer/electron transport layer/electron injection layer structure, an electron control layer/electron transport layer/electron injection layer structure, or a buffer layer/electron transport layer/electron injection layer structure, wherein constituting layers of each structure are sequentially stacked on the emission layer in each stated order.

The electron transport region (e.g., a buffer layer, a hole blocking layer, an electron control layer, and/or an electron transport layer in the electron transport region) may include a metal-free compound including at least one π electron-deficient nitrogen-containing $C_1$-$C_{60}$ cyclic group.

In some embodiments, the electron transport region may include a compound represented by Formula 601:

$$[Ar_{601}]_{xe11}\text{-}[(L_{601})_{xe1}\text{-}R_{601}]_{xe21},$$ Formula 601 wherein, in Formula 601, $Ar_{601}$ and $L_{601}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, xe11 may be 1, 2, or 3, xe1 may be 0, 1, 2, 3, 4, or 5, $R_{601}$ may be $C_3$-$C_{60}$ carbocyclic group unsubstituted or substituted with at least one R10a, a $C_1$-$C_{60}$ heterocyclic group unsubstituted or substituted with at least one R10a, —Si($Q_{601}$)($Q_{602}$)($Q_{603}$), —C(═O)($Q_{601}$), —S(═O)$_2$($Q_{601}$), or —P(═O)($Q_{601}$)($Q_{602}$), wherein $Q_{601}$ to $Q_{603}$ may each independently be understood by referring to the description of $Q_1$ provided herein, xe21 may be 1, 2, 3, 4, or 5, and at least one selected from $Ar_{601}$, $L_{601}$, and $R_{601}$ may each independently be a π electron-deficient nitrogen-containing $C_1$-$C_{60}$ cyclic group unsubstituted or substituted with at least one $R_{10a}$.

For example, in Formula 601, when xe11 is 2 or greater, two or more $Ar_{601}$(s) may be linked to each other via a single bond.

In some embodiments, in Formula 601, $Ar_{601}$ may be a substituted or unsubstituted anthracene group.

In some embodiments, the electron transport region may include a compound represented by Formula 601-1:

Formula 601-1

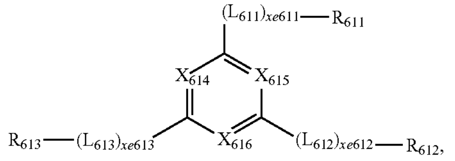

wherein, in Formula 601-1, $X_{614}$ may be N or C($R_{614}$), $X_{615}$ may be N or C($R_{615}$), $X_{616}$ may be N or C($R_{616}$), and at least one selected from $X_{614}$ to $X_{616}$ may be N, $L_{611}$ to $L_{613}$ may each independently be understood by referring to the description of $L_{601}$ provided herein, xe611 to xe613 may each independently be understood by referring to the description of xe1 provided herein, $R_{611}$ to $R_{613}$ may each independently be understood by referring to the description of $R_{601}$ provided herein, and $R_{614}$ to $R_{616}$ may each independently be hydrogen, deuterium, —F, —Cl, —Br, —I, a hydroxyl group, a cyano group, a nitro group, a $C_1$-$C_{20}$ alkyl group, a $C_1$-$C_{20}$ alkoxy group, a $C_3$-$C_{60}$ carbocyclic group unsubstituted or substituted with at least one $R_{10a}$, or a $C_1$-$C_{60}$ heterocyclic group unsubstituted or substituted with at least one $R_{10a}$.

For example, in Formulae 601 and 601-1, xe1 and xe611 to xe613 may each independently be 0, 1, or 2.

The electron transport region may include at least one of Compounds ET1 to ET45, 2,9-dimethyl-4,7-diphenyl-1,10-phenanthroline (BCP), 4,7-diphenyl-1,10-phenanthroline (Bphen), $Alq_3$, BAlq, TAZ, NTAZ, TSPO1, and TPBI, or any combination thereof:

ET1

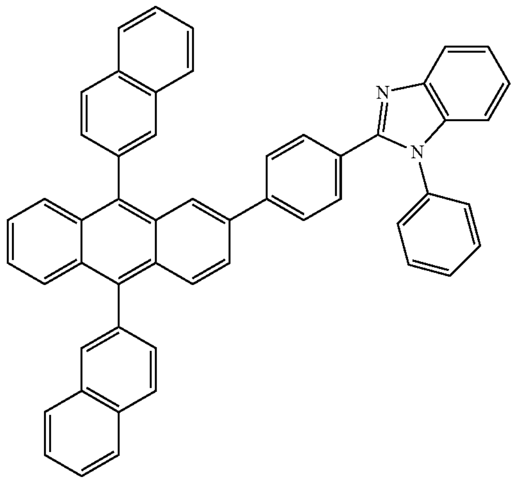

ET2

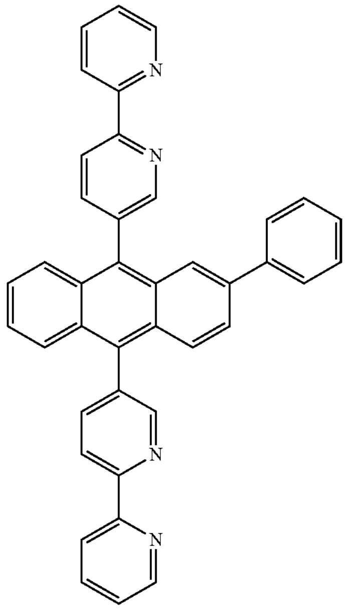

-continued
ET3
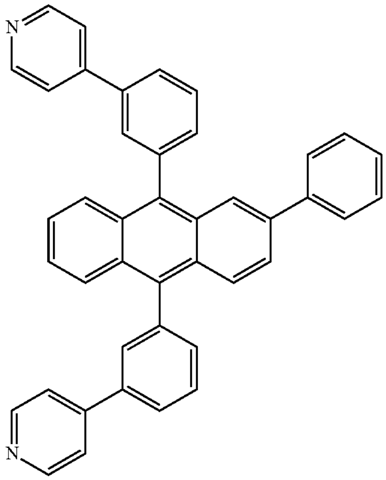
ET4
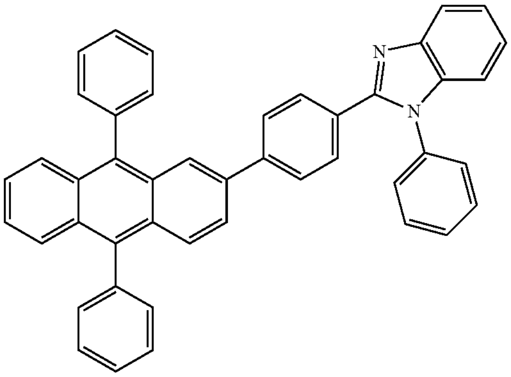
ET5
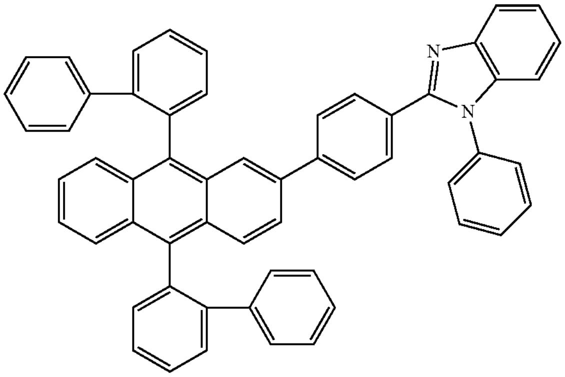
-continued
ET6
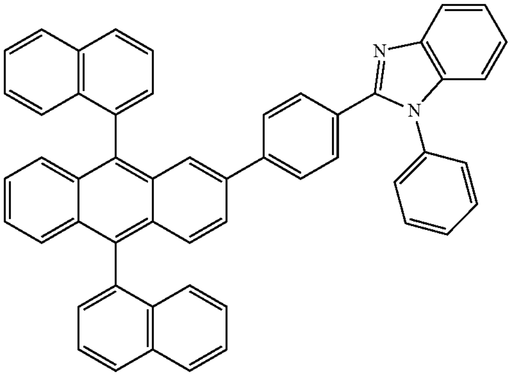
ET7
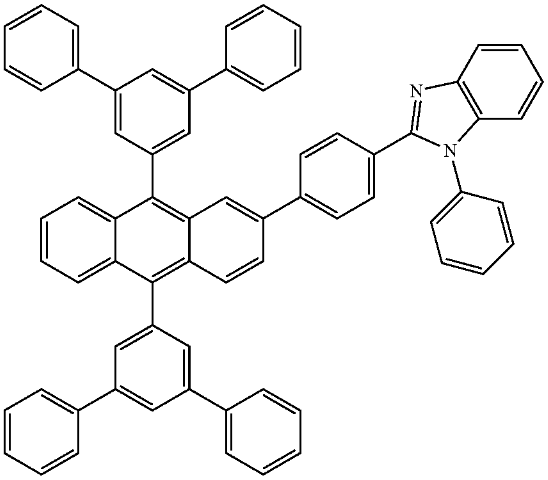
ET8
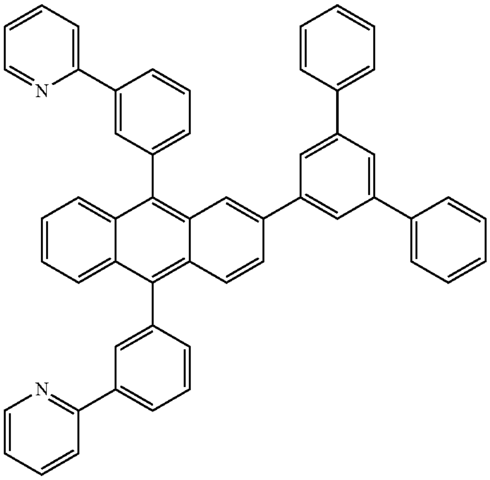

-continued
ET9
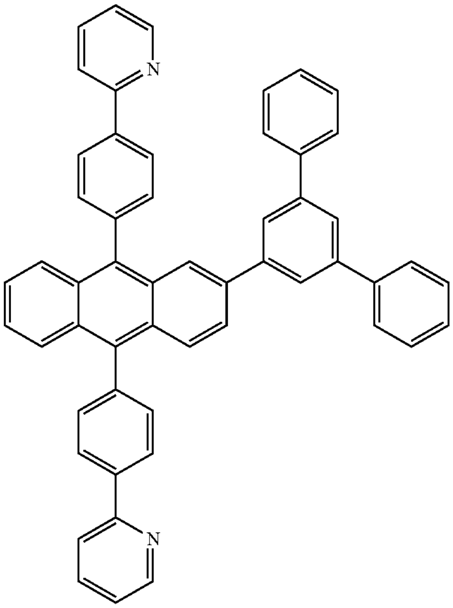
ET10
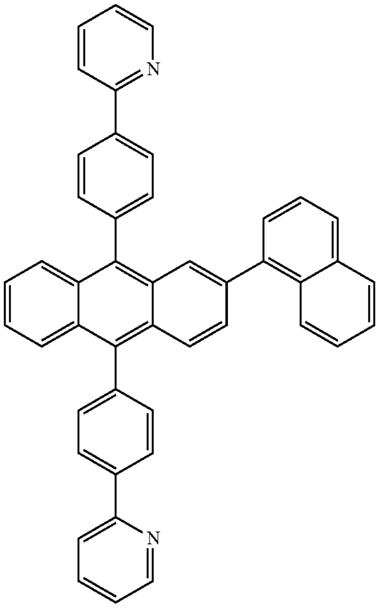
-continued
ET11
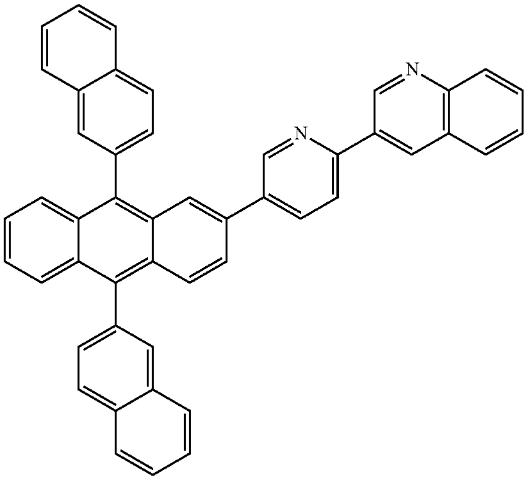
ET12
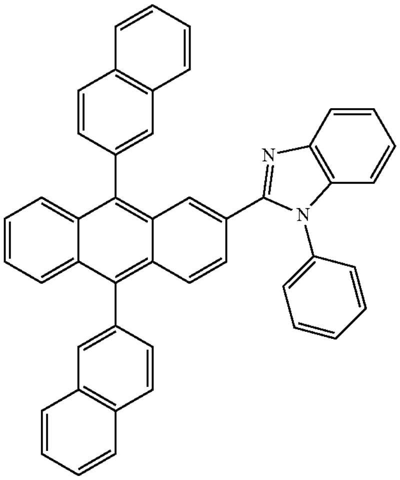
ET13
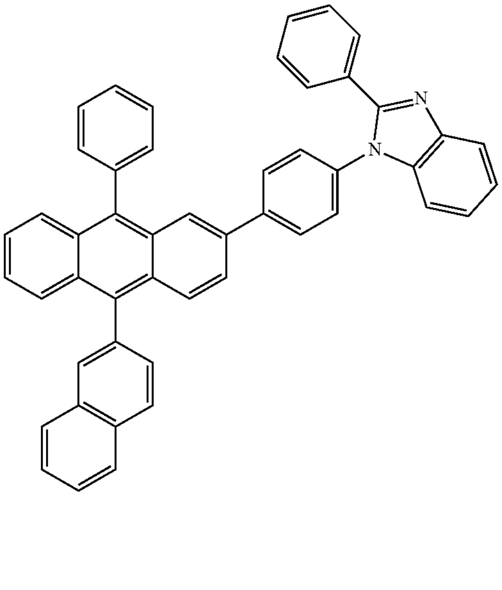

-continued
ET14
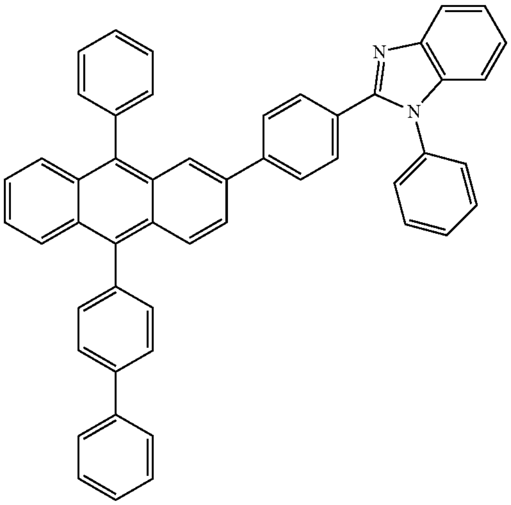
ET15
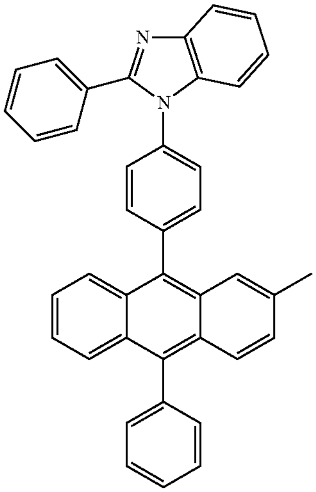
ET16
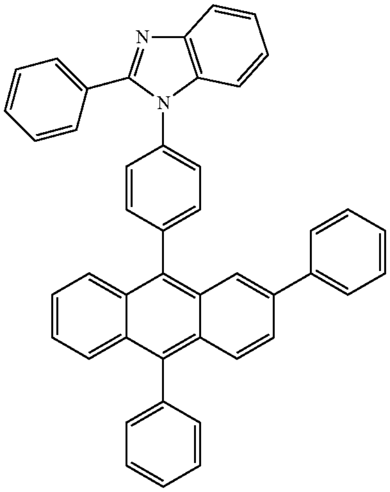
-continued
ET17
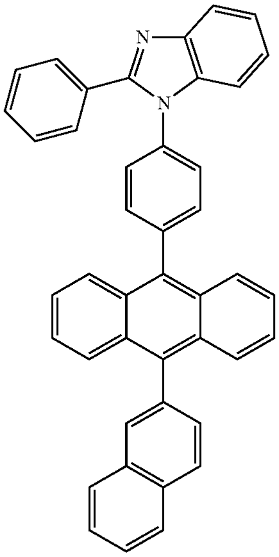
ET18
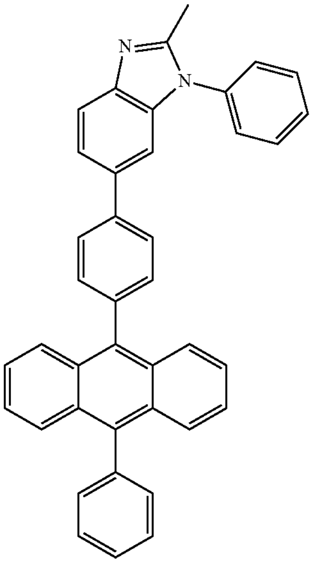
ET19
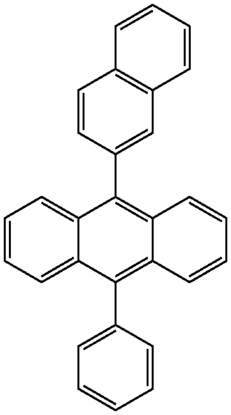

-continued
ET20
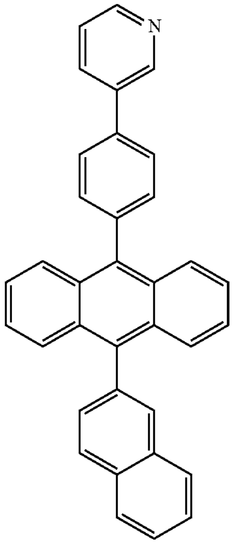
ET21
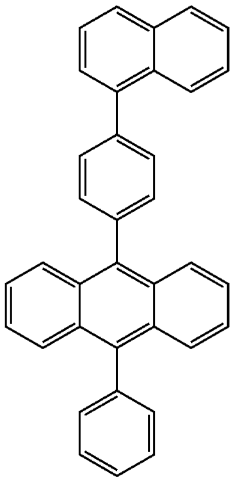
ET22
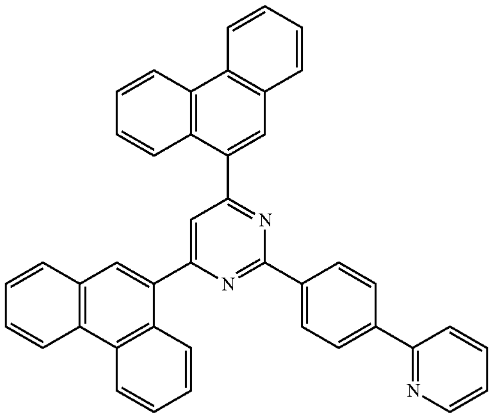
-continued
ET23
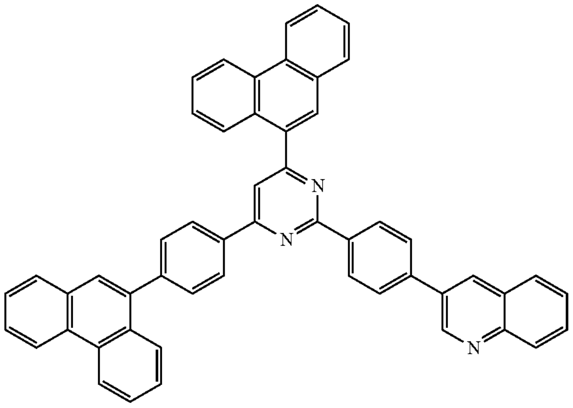
ET24
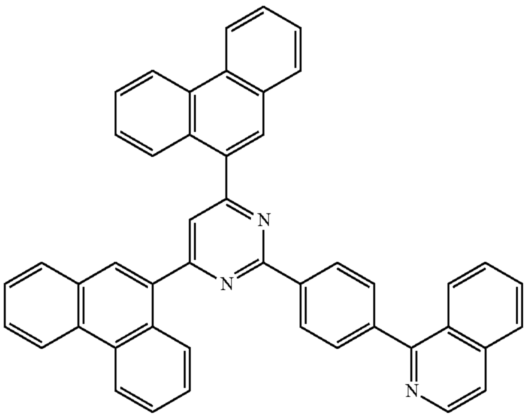
ET25
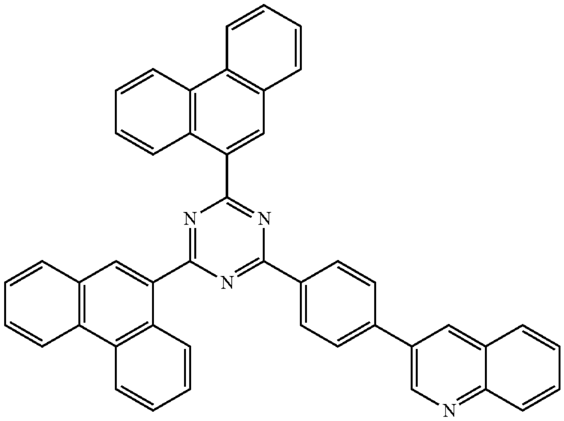

-continued
ET26
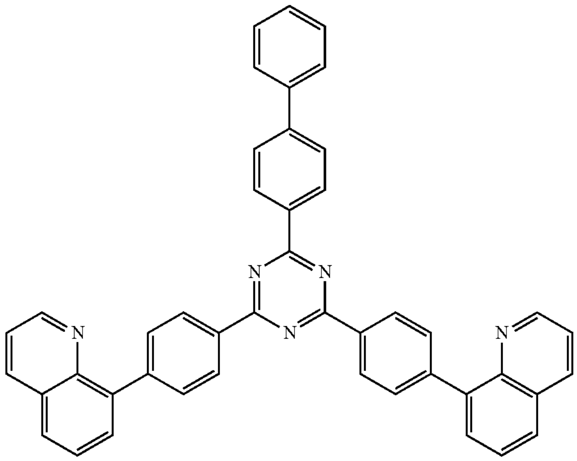
ET27
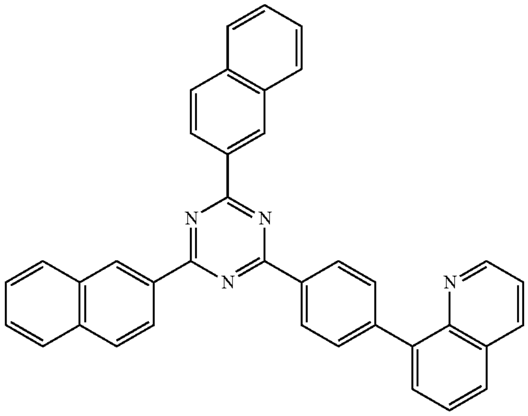
ET28
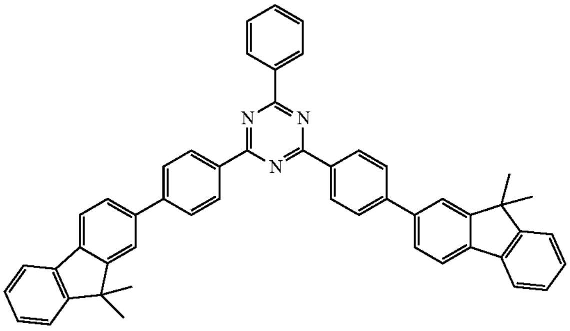
-continued
ET29
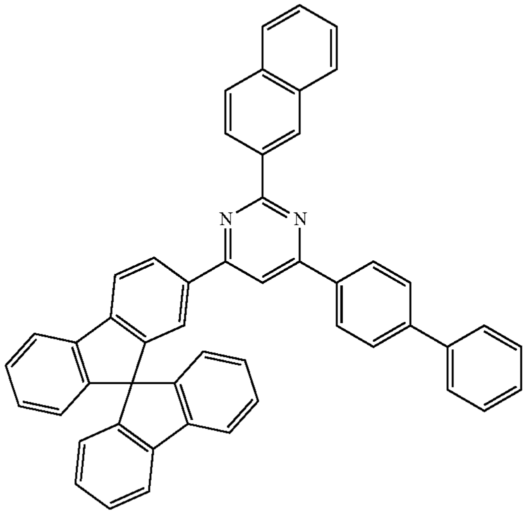
ET30
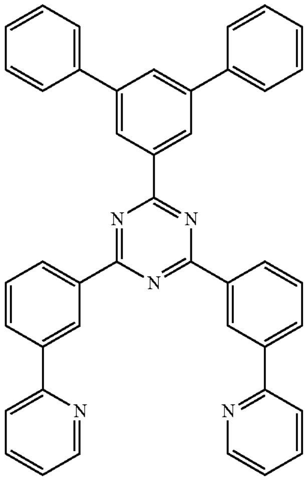
ET31
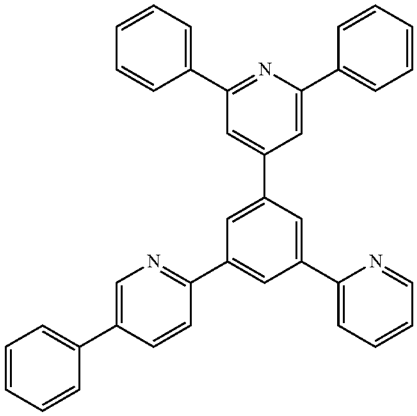

ET32
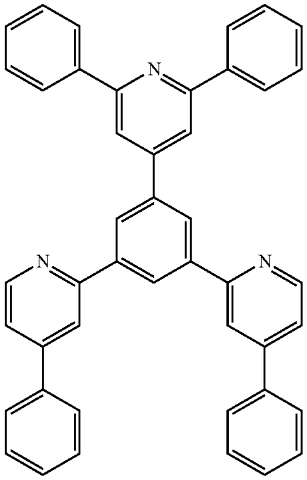
ET33
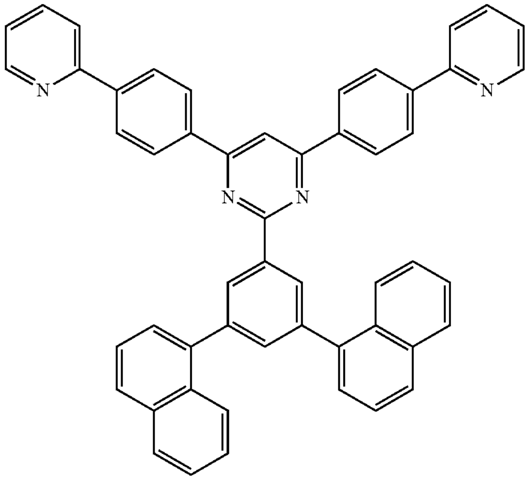
ET34
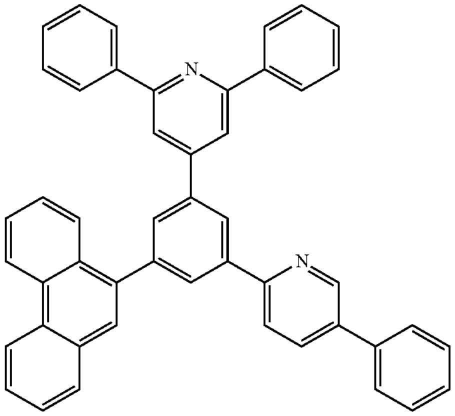
ET35
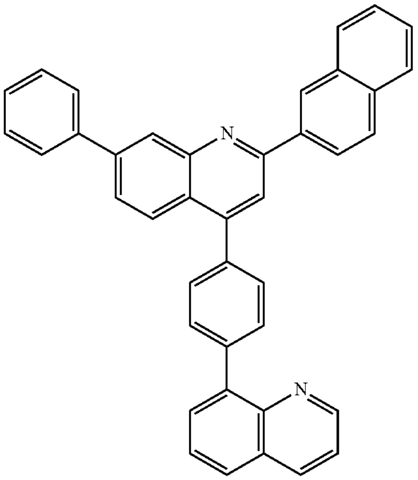
ET36
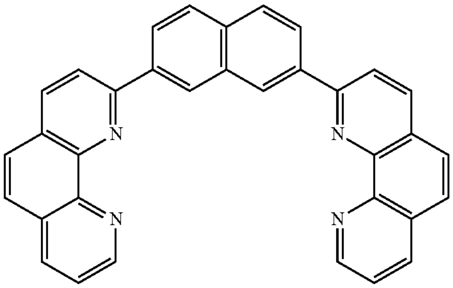
.
ET37
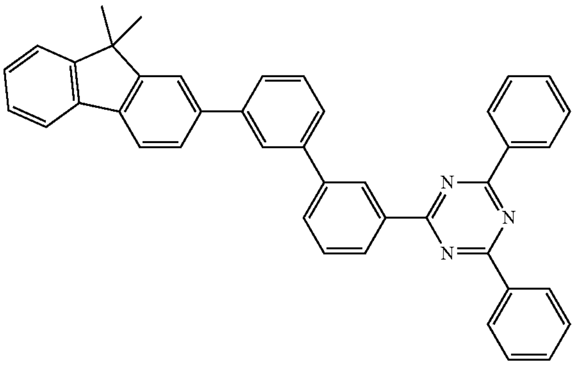
ET38
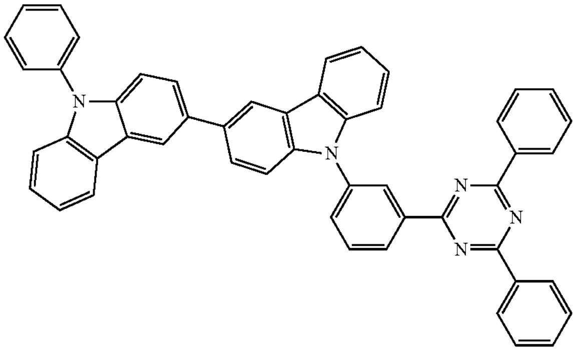

-continued
ET39
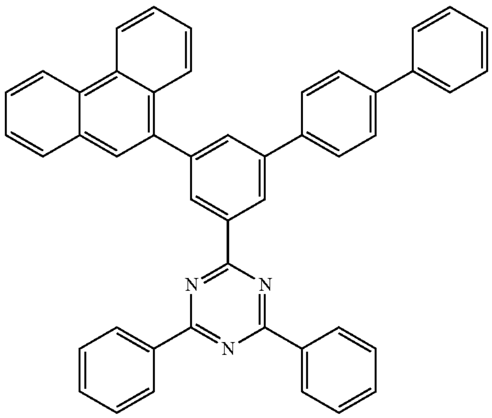
ET40
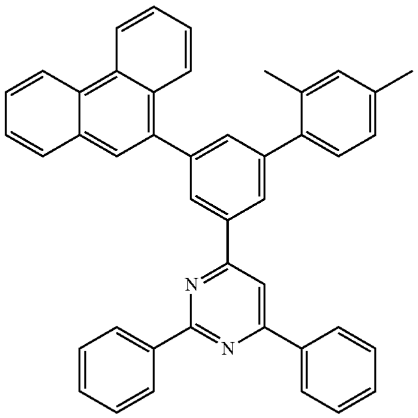
ET41
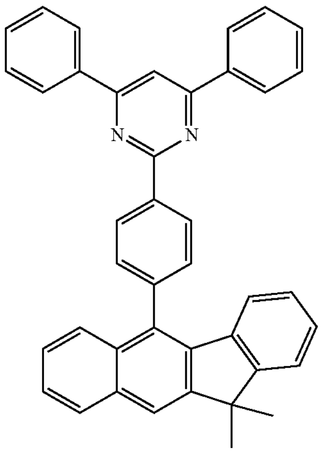
-continued
ET42
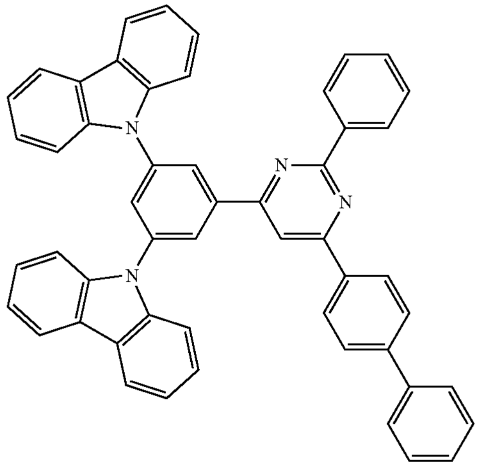
ET43
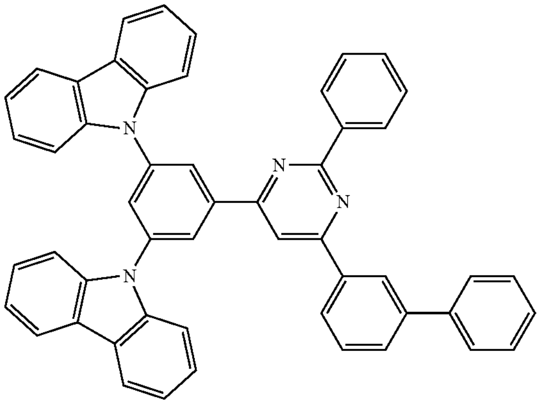
ET44
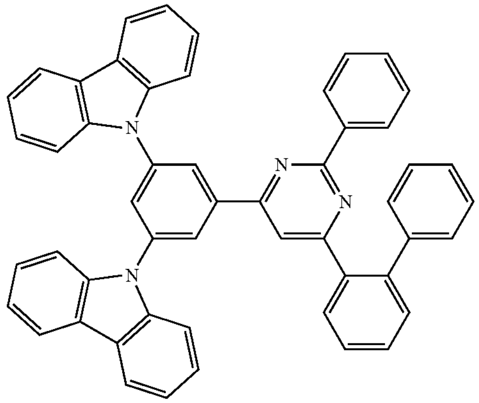
ET45
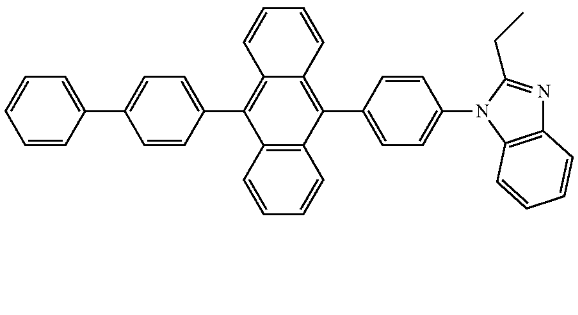

-continued

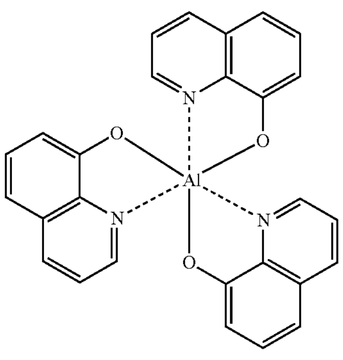

Alq3

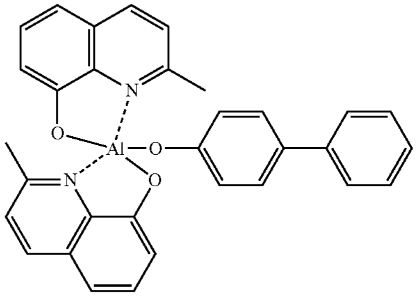

BAlq

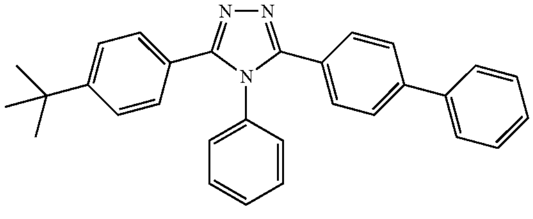

TAZ

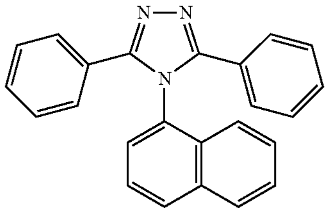

NTAZ

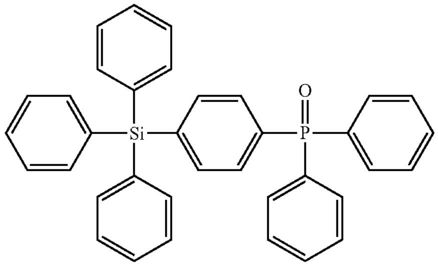

TSPO1

-continued

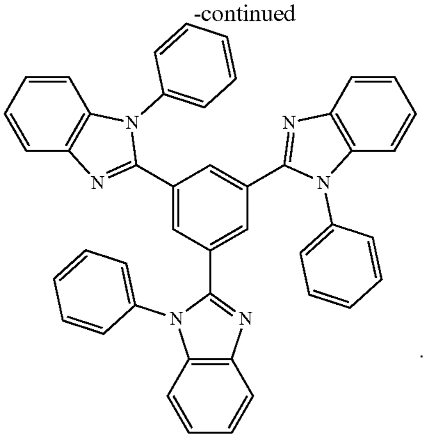

TPBI

The thickness of the electron transport region may be in a range of about 100 Å to about 5,000 Å, and in some embodiments, about 160 Å to about 4,000 Å. When the electron transport region includes a buffer layer, a hole blocking layer, an electron control layer, an electron transport layer, or any combination thereof, the thicknesses of the buffer layer, the hole blocking layer, or the electron control layer may each independently be in a range of about 20 Å to about 1,000 Å, for example, about 30 Å to about 300 Å, and the thickness of the electron transport layer may be in a range of about 100 Å to about 1,000 Å, for example, about 150 Å to about 500 Å. When the thicknesses of the buffer layer, the hole blocking layer, the electron control layer, the electron transport layer, and/or the electron transport region are each within these ranges, excellent or suitable electron transport characteristics may be obtained without a substantial increase in driving voltage.

The electron transport region (for example, the electron transport layer in the electron transport region) may further include, in addition to the materials described above, a metal-containing material.

The metal-containing material may include an alkali metal complex, an alkaline earth metal complex, or any combination thereof. A metal ion of the alkali metal complex may be a lithium (Li) ion, a sodium (Na) ion, a potassium (K) ion, a rubidium (Rb) ion, or a cesium (Cs) ion. A metal ion of the alkaline earth metal complex may be a beryllium (Be) ion, a magnesium (Mg) ion, a calcium (Ca) ion, a strontium (Sr) ion, or a barium (Ba) ion. Each ligand coordinated with the metal ion of the alkali metal complex and the alkaline earth metal complex may independently be hydroxyquinoline, hydroxyisoquinoline, hydroxybenzoquinoline, hydroxyacridine, hydroxyphenanthridine, hydroxyphenyloxazole, hydroxyphenylthiazole, hydroxyphenyloxadiazole, hydroxyphenylthiadiazole, hydroxyphenylpyridine, hydroxyphenylbenzimidazole, hydroxyphenylbenzothiazole, bipyridine, phenanthroline, cyclopentadiene, or any combination thereof.

For example, the metal-containing material may include a Li complex. The Li complex may include, e.g., Compound ET-D1 (Liq) or Compound ET-D2:

ET-D1

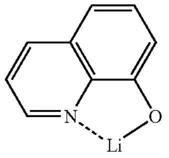

ET-D2

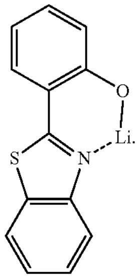

The electron transport region may include an electron injection layer that facilitates injection of electrons from the second electrode 150. The electron injection layer may be in direct contact with the second electrode 150.

The electron injection layer may have i) a single-layered structure consisting of a single layer consisting of a single material, ii) a single-layered structure consisting of a single layer including a plurality of different materials, or iii) a multi-layered structure having a plurality of layers including a plurality of different materials.

The electron injection layer may include an alkali metal, an alkaline earth metal, a rare earth metal, an alkali metal-containing compound, an alkaline earth metal-containing compound, a rare earth metal-containing compound, an alkali metal complex, an alkaline earth metal complex, a rare earth metal complex, or any combination thereof.

The alkali metal may include (e.g., may be) Li, Na, K, Rb, Cs or any combination thereof. The alkaline earth metal may include (e.g., may be) Mg, Ca, Sr, Ba, or any combination thereof. The rare earth metal may include (e.g., may be) Sc, Y, Ce, Tb, Yb, Gd, or any combination thereof.

The alkali metal-containing compound, the alkaline earth metal-containing compound, and the rare earth metal-containing compound may respectively be one or more oxides, halides (e.g., fluorides, chlorides, bromides, and/or iodides), and/or tellurides of the alkali metal, the alkaline earth metal, and the rare earth metal, or any combination thereof.

The alkali metal-containing compound may include (e.g., may be) one or more alkali metal oxides (such as $Li_2O$, $Cs_2O$, and/or $K_2O$), alkali metal halides (such as LiF, NaF, CsF, KF, LiI, NaI, CsI, and/or KI), or any combination thereof. The alkaline earth-metal-containing compound may include one or more alkaline earth-metal oxides, such as BaO, SrO, CaO, $Ba_xSr_{1-x}O$ (wherein x is a real number satisfying $0<x<1$), and/or $Ba_xCa_{1-x}O$ (wherein x is a real number satisfying $0<x<1$). The rare earth metal-containing compound may include $YbF_3$, $ScF_3$, $Sc_2O_3$, $Y_2O_3$, $Ce_2O_3$, $GdF_3$, $TbF_3$, $YbI_3$, $ScI_3$, $TbI_3$, or any combination thereof. In some embodiments, the rare earth metal-containing compound may include a lanthanide metal telluride. Examples of the lanthanide metal telluride may include LaTe, CeTe, PrTe, NdTe, PmTe, SmTe, EuTe, GdTe, TbTe, DyTe, HoTe, ErTe, TmTe, YbTe, LuTe, $La_2Te_3$, $Ce_2Te_3$, $Pr_2Te_3$, $Nd_2Te_3$, $Pm_2Te_3$, $Sm_2Te_3$, $Eu_2Te_3$, $Gd_2Te_3$, $Tb_2Te_3$, $Dy_2Te_3$, $Ho_2Te_3$, $Er_2Te_3$, $Tm_2Te_3$, $Yb_2Te_3$, and $Lu_2Te_3$.

The alkali metal complex, the alkaline earth metal complex, and the rare earth metal complex may include: i) one of ions of the alkali metal, the alkaline earth metal, and the rare earth metal described above and ii) a ligand bonded to the metal ion, e.g., hydroxyquinoline, hydroxyisoquinoline, hydroxybenzoquinoline, hydroxyacridine, hydroxyphenanthridine, hydroxyphenyloxazole, hydroxyphenylthiazole, hydroxyphenyloxadiazole, hydroxyphenylthiadiazole, hydroxyphenylpyridine, hydroxyphenylbenzimidazole, hydroxyphenylbenzothiazole, bipyridine, phenanthroline, cyclopentadiene, or any combination thereof.

The electron injection layer may include (e.g., consist of) an alkali metal, an alkaline earth metal, a rare earth metal, an alkali metal-containing compound, an alkaline earth metal-containing compound, a rare earth metal-containing compound, an alkali metal complex, an alkaline earth metal complex, a rare earth metal complex, or any combination thereof, as described above. In some embodiments, the electron injection layer may further include an organic material (e.g., a compound represented by Formula 601).

In some embodiments, the electron injection layer may include (e.g., consist of) i) an alkali metal-containing compound (e.g., alkali metal halide), or may include (e.g., consist of) ii) a) an alkali metal-containing compound (e.g., alkali metal halide); and b) an alkali metal, an alkaline earth metal, a rare earth metal, or any combination thereof. In some embodiments, the electron injection layer may be a KI:Yb co-deposited layer, a RbI:Yb co-deposited layer, and/or the like.

When the electron injection layer further includes an organic material, the alkali metal, the alkaline earth metal, the rare earth metal, the alkali metal-containing compound, the alkaline earth metal-containing compound, the rare earth metal-containing compound, the alkali metal complex, the alkaline earth metal complex, the rare earth metal complex, or any combination thereof may be homogeneously or non-homogeneously dispersed in a matrix including the organic material.

The thickness of the electron injection layer may be in a range of about 1 Å to about 100 Å, and in some embodiments, about 3 Å to about 90 Å. When the thickness of the electron injection layer is within any of these ranges, excellent or suitable electron injection characteristics may be obtained without a substantial increase in driving voltage.

Second Electrode 150

The second electrode 150 may be on the interlayer 130. In an embodiment, the second electrode 150 may be a cathode, which is an electron injection electrode. In this embodiment, a material for forming the second electrode 150 may be a material having a low work function, for example, a metal, an alloy, an electrically conductive compound, or any combination thereof.

The second electrode 150 may include lithium (Li), silver (Ag), magnesium (Mg), aluminum (Al), aluminum-lithium (Al—Li), calcium (Ca), magnesium-indium (Mg—In), magnesium-silver (Mg—Ag), ytterbium (Yb), silver-ytterbium (Ag—Yb), ITO, IZO, or any combination thereof. The second electrode 150 may be a transmissive electrode, a semi-transmissive electrode, or a reflective electrode.

The second electrode 150 may have a single-layered structure, or a multi-layered structure including two or more layers.

Capping Layer

A first capping layer may be located outside the first electrode 110 (e.g., on the side of the first electrode 110 facing oppositely away from the second electrode 150), and/or a second capping layer may be located outside the second electrode 150 (e.g., on the side of the second electrode 150 facing oppositely away from the first electrode 110). In some embodiments, the light-emitting device 10 may have a structure in which the first capping layer, the first electrode 110, the interlayer 130, and the second electrode 150 are sequentially stacked in this stated order, a structure in which the first electrode 110, the interlayer 130, the second electrode 150, and the second capping layer are sequentially stacked in this stated order, or a structure in which the first capping layer, the first electrode 110, the interlayer 130, the second electrode 150, and the second capping layer are sequentially stacked in this stated order.

In the light-emitting device 10, light emitted from the emission layer in the interlayer 130 may pass through the first electrode 110 (which may be a semi-transmissive electrode or a transmissive electrode) and through the first capping layer to the outside, or, light emitted from the emission layer in the interlayer 130 may pass through the second electrode 150 (which may be a semi-transmissive electrode or a transmissive electrode) and through the second capping layer to the outside.

The first capping layer and the second capping layer may improve the external luminescence efficiency based on the principle of constructive interference. Accordingly, the optical extraction efficiency of the light-emitting device 10 may be increased, thus improving the luminescence efficiency of the light-emitting device 10.

The first capping layer and the second capping layer may each include a material having a refractive index of 1.6 or higher (at 589 nm).

The first capping layer and the second capping layer may each independently be an organic capping layer including an organic material, an inorganic capping layer including an inorganic material, or an organic-inorganic composite capping layer including an organic material and an inorganic material.

At least one selected from the first capping layer and the second capping layer may each independently include one or more carbocyclic compounds, heterocyclic compounds, amine group-containing compounds, porphine derivatives, phthalocyanine derivatives, naphthalocyanine derivatives, alkali metal complexes, alkaline earth metal complexes, or any combination thereof. The carbocyclic compound, the heterocyclic compound, and the amine group-containing compound may optionally be substituted with a substituent including O, N, S, Se, Si, F, Cl, Br, I, or any combination thereof. In some embodiments, at least one selected from the first capping layer and the second capping layer may each independently include an amine group-containing compound.

In some embodiments, at least one selected from the first capping layer and the second capping layer may each independently include the compound represented by Formula 201, the compound represented by Formula 202, or any combination thereof.

In one or more embodiments, at least one selected from the first capping layer and the second capping layer may each independently include at least one of Compounds HT28 to HT33, Compounds CP1 to CP6, and β-NPB, or any combination thereof:

CP1

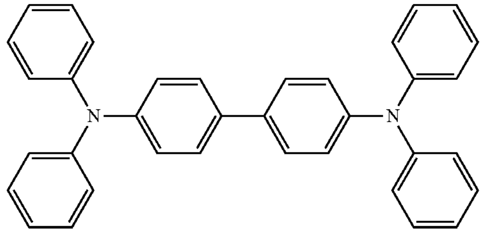

CP2

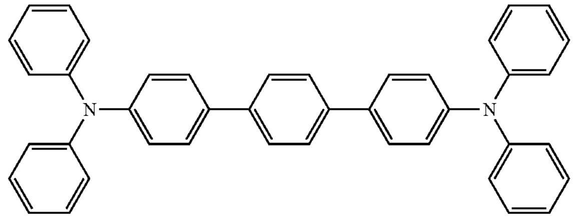

CP3

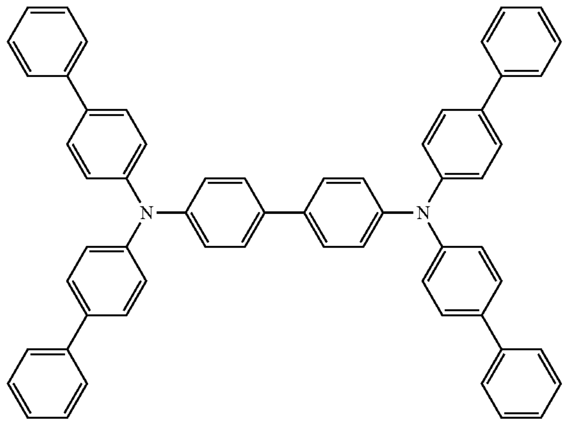

CP4

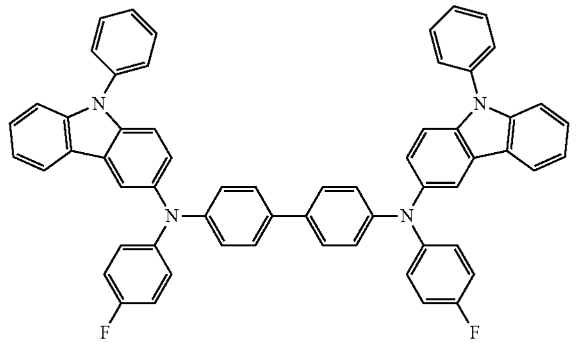

CP5

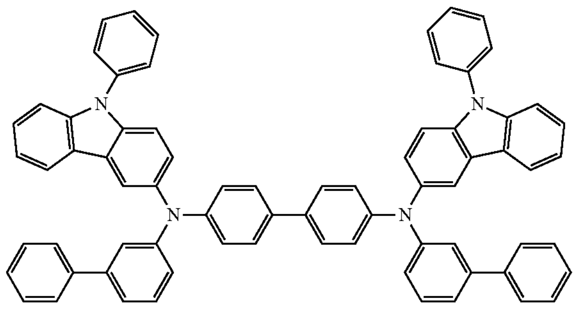

-continued

CP6

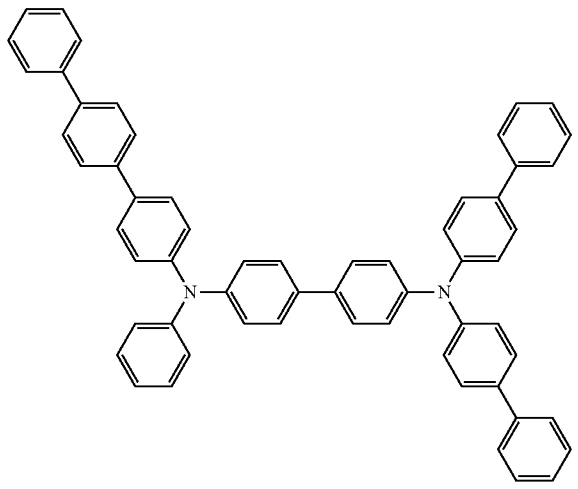

β-NPB

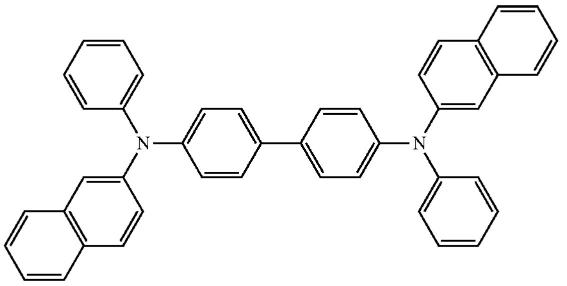

.

Film

The heterocyclic compound represented by Formula 1 may be included in one or more suitable films. According to one or more embodiments, a film including the heterocyclic compound represented by Formula 1 may be provided. The film may be, for example, an optical member (or, a light-controlling member) (e.g., a color filter, a color-conversion member, a capping layer, a light extraction efficiency improvement layer, a selective light-absorbing layer, a polarizing layer, a quantum dot-containing layer, and/or the like), a light-blocking member (e.g., a light reflection layer and/or a light-absorbing layer), or a protection member (e.g., an insulating layer and/or a dielectric material layer).

Electronic Apparatus

The light-emitting device may be included in one or more suitable electronic apparatuses. In some embodiments, an electronic apparatus including the light-emitting device may be a light-emitting apparatus and/or an authentication apparatus.

The electronic apparatus (e.g., a light-emitting apparatus) may further include, in addition to the light-emitting device, i) a color filter, ii) a color-conversion layer, or iii) a color filter and a color-conversion layer. The color filter and/or the color-conversion layer may be disposed on at least one traveling direction of light emitted from the light-emitting device. For example, light emitted from the light-emitting device may be blue light or white light. The light-emitting device may be understood by referring to the descriptions provided herein. In some embodiments, the color-conversion layer may include quantum dots. The quantum dot may be, for example, the quantum dot described herein.

The electronic apparatus may include a first substrate. The first substrate may include a plurality of sub-pixel areas, the color filter may include a plurality of color filter areas respectively corresponding to the plurality of sub-pixel areas, and the color-conversion layer may include a plurality of color-conversion areas respectively corresponding to the plurality of sub-pixel areas.

A pixel-defining film may be located among (e.g., around, surround, and/or between) the plurality of sub-pixel areas to define each sub-pixel area.

The color filter may further include a plurality of color filter areas and light-blocking patterns among the plurality of color filter areas, and the color-conversion layer may further include a plurality of color-conversion areas and light-blocking patterns among the plurality of color-conversion areas.

The plurality of color filter areas (or a plurality of color-conversion areas) may include: a first area emitting a first color light; a second area emitting a second color light; and/or a third area emitting a third color light, and the first color light, the second color light, and/or the third color light may have different maximum emission wavelengths. In some embodiments, the first color light may be red light, the second color light may be green light, and the third color light may be blue light. In some embodiments, the plurality of color filter areas (or the plurality of color-conversion areas) may each include quantum dots. In some embodiments, the first area may include red quantum dots (e.g., red-light emitting quantum dots), the second area may include green quantum dots (e.g., green-light emitting quantum dots), and the third area may not include (e.g., may exclude) a quantum dot. The quantum dot may be understood by referring to the description of the quantum dot provided herein. The first area, the second area, and/or the third area may each further include an emitter.

In some embodiments, the light-emitting device may be to emit a first light, the first area may be to absorb the first light to emit a 1-1 color light, the second area may be to absorb the first light to emit a 2-1 color light, and the third area may be to absorb the first light to emit a 3-1 color light. In this embodiment, the 1-1 color light, the 2-1 color light, and the 3-1 color light may each have a different maximum emission wavelength. In some embodiments, the first light may be blue light, the 1-1 color light may be red light, the 2-1 color light may be green light, and the 3-1 light may be blue light.

The electronic apparatus may further include a thin-film transistor, in addition to the light-emitting device. The thin-film transistor may include a source electrode, a drain electrode, and an active layer, wherein the source electrode or the drain electrode may be electrically connected to the first electrode or the second electrode of the light-emitting device.

The thin-film transistor may further include a gate electrode, a gate insulating film, and/or the like.

The active layer may include a crystalline silicon, an amorphous silicon, an organic semiconductor, and/or an oxide semiconductor.

The electronic apparatus may further include an encapsulation unit for sealing the light-emitting device. The encapsulation unit may be located between the color filter and/or the color-conversion layer and the light-emitting device. The encapsulation unit may allow light to pass to the outside from the light-emitting device and prevent or reduce the air and/or moisture from permeating into the light-emitting device at the same time (simultaneously). The encapsulation unit may be a sealing substrate including a transparent glass and/or a plastic substrate. The encapsulation unit may be a thin-film encapsulating layer including an organic layer and/or an inorganic layer. When the encapsulation unit is a thin-film encapsulating layer, the electronic apparatus may be flexible.

In addition to the color filter and/or the color-conversion layer, one or more suitable functional layers may be disposed on the encapsulation unit depending on the usage of an electronic apparatus. Examples of the functional layer may include a touch screen layer, a polarizing layer, and/or the like. The touch screen layer may be a resistive touch screen layer, a capacitive touch screen layer, or an infrared touch screen layer. The authentication apparatus may be, for example, a biometric authentication apparatus that identifies an individual according to biometric information (e.g., a fingertip, a pupil, and/or the like).

The authentication apparatus may further include a biometric information collecting unit, in addition to the light-emitting device described above.

The electronic apparatus may be applied to one or more suitable displays, optical sources, lighting apparatuses, personal computers (e.g., a mobile personal computer), cellphones, digital cameras, electronic notes, electronic dictionaries, electronic game consoles, medical devices (e.g., an electronic thermometer, a blood pressure meter, a glucometer, a pulse measuring device, a pulse wave measuring device, an electrocardiograph recorder, an ultrasonic diagnosis device, and/or an endoscope display device), fish finders, one or more suitable measurement devices, gauges (e.g., gauges of an automobile, an airplane, and/or a ship), and projectors.

Figure 2:
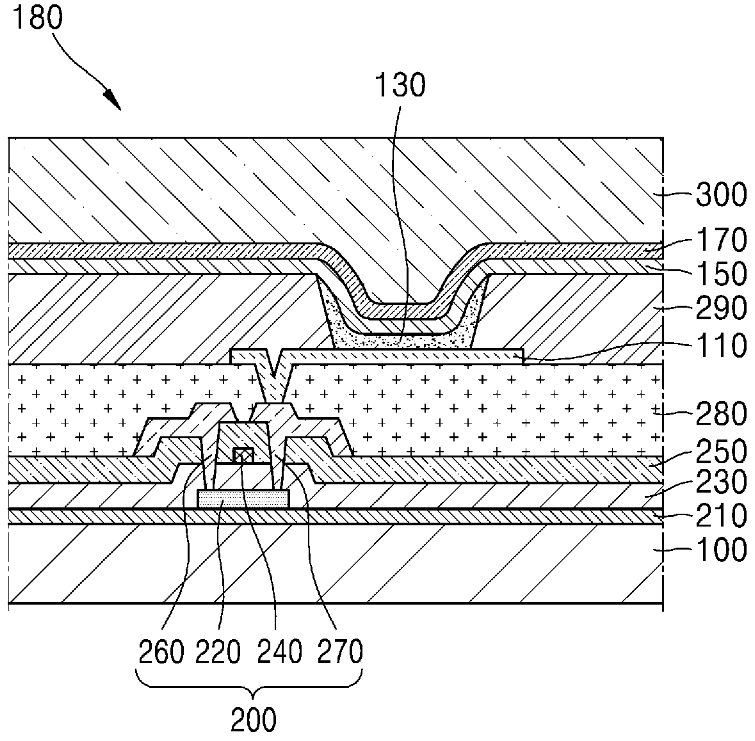
FIG. 2 is a schematic cross-sectional view of an electronic apparatus according to an embodiment.
Figure 3:
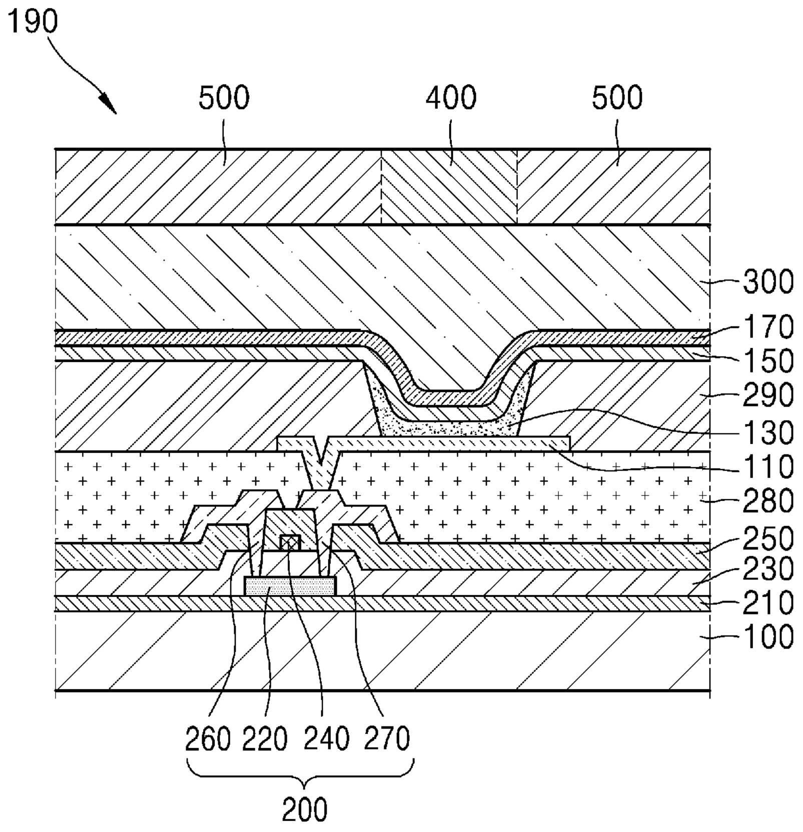
FIG. 3 is a schematic cross-sectional view of an electronic apparatus according to another embodiment.

Descriptions of FIGS. 2 and 3

FIG. 2 is a schematic cross-sectional view of an embodiment of a light-emitting apparatus 180.

The light-emitting apparatus 180 of FIG. 2 may include a substrate 100, a thin-film transistor 200, a light-emitting device, and an encapsulation unit (or an encapsulation layer) 300 sealing the light-emitting device.

The substrate 100 may be a flexible substrate, a glass substrate, and/or a metal substrate. A buffer layer 210 may be on the substrate 100. The buffer layer 210 may prevent or reduce penetration of impurities through the substrate 100 and provide a flat surface on the substrate 100.

A thin-film transistor 200 may be on the buffer layer 210. The thin-film transistor 200 may include an active layer 220, a gate electrode 240, a source electrode 260, and a drain electrode 270.

The active layer 220 may include an inorganic semiconductor such as silicon and/or polysilicon, an organic semiconductor, and/or an oxide semiconductor and may include a source area, a drain area, and a channel area.

A gate insulating film 230 for insulating the active layer 220 and the gate electrode 240 may be on the active layer 220, and the gate electrode 240 may be on the gate insulating film 230.

An interlayer insulating film 250 may be on the gate electrode 240. The interlayer insulating film 250 may be between the gate electrode 240 and the source electrode 260 to insulate the gate electrode 240 from the source electrode 260 and between the gate electrode 240 and the drain electrode 270 to insulate the gate electrode 240 from the drain electrode 270.

The source electrode 260 and the drain electrode 270 may be on the interlayer insulating film 250. The interlayer insulating film 250 and the gate insulating film 230 may be formed to expose the source area and the drain area of the active layer 220, and the source electrode 260 and the drain electrode 270 may be adjacent to (e.g., in contact with) the exposed source area and the exposed drain area of the active layer 220.

Such a thin-film transistor 200 may be electrically connected to a light-emitting device to drive the light-emitting device and may be protected by a passivation layer 280. The passivation layer 280 may include an inorganic insulating film, an organic insulating film, or a combination thereof. A light-emitting device may be on the passivation layer 280. The light-emitting device may include a first electrode 110, an interlayer 130, and a second electrode 150.

The first electrode 110 may be on the passivation layer 280. The passivation layer 280 may not fully cover the drain electrode 270 and may expose a portion (e.g., a specific area) of the drain electrode 270, and the first electrode 110 may be disposed to connect to the exposed area of the drain electrode 270.

A pixel-defining film 290 may be on the first electrode 110. The pixel-defining film 290 may expose a specific area of the first electrode 110, and the interlayer 130 may be formed in the exposed area of the first electrode 110. The pixel-defining film 290 may be a polyimide or polyacryl organic film. Although it is not shown in FIG. 2, some higher layers of the interlayer 130 may extend to the upper portion of the pixel-defining film 290 and may be disposed in the form of a common layer.

The second electrode 150 may be on the interlayer 130, and a capping layer 170 may be additionally formed on the second electrode 150. The capping layer 170 may be formed to cover the second electrode 150.

The encapsulation unit 300 may be on the capping layer 170. The encapsulation unit 300 may be on the light-emitting device to protect a light-emitting device from moisture and/or oxygen. The encapsulation unit 300 may include: an inorganic film including silicon nitride ($SiN_x$), silicon oxide ($SiO_x$), indium tin oxide, indium zinc oxide, or any combination thereof; an organic film including PET, polyethylene naphthalate, polycarbonate, polyimide, polyethylene sulfonate, polyoxy methylene, poly arylate, hexamethyl disiloxane, an acrylic resin (e.g., polymethyl methacrylate, polyacrylic acid, and/or the like), an epoxy resin (e.g., aliphatic glycidyl ether (AGE) and/or the like), or any combination thereof; or a combination of the inorganic film and the organic film.

FIG. 3 is a schematic cross-sectional view of another embodiment of a light-emitting apparatus 190.

The electronic apparatus shown in FIG. 3 may be substantially identical to the electronic apparatus shown in FIG. 2, except that a light-blocking pattern 500 and a functional area 400 are additionally located on the encapsulation unit 300. The functional area 400 may be i) a color filter area, ii) a color-conversion area, or iii) a combination of a color filter area and a color-conversion area. In some embodiments, the light-emitting device included in the electronic apparatus shown in FIG. 3 may be a tandem light-emitting device.

Manufacturing Method

The layers constituting the hole transport region, the emission layer, and the layers constituting the electron transport region may be formed in a specific region by utilizing one or more suitable methods such as vacuum deposition, spin coating, casting, Langmuir-Blodgett (LB) deposition, ink-jet printing, laser printing, and/or laser-induced thermal imaging.

When the layers constituting the hole transport region, the emission layer, and the layers constituting the electron transport region are each formed by vacuum deposition, the vacuum deposition may be performed at a deposition temperature in a range of about 100° C. to about 500° C. at a vacuum degree in a range of about $10^{-8}$ torr to about $10^{-3}$ torr, and at a deposition rate in a range of about 0.01 Angstroms per second (Å/sec) to about 100 Å/sec, depending on the material to be included in each layer and the structure of each layer to be formed.

General Definitions of Terms

The term "$C_3$-$C_{60}$ carbocyclic group" as used herein refers to a cyclic group consisting of only carbon atoms and having 3 to 60 carbon atoms as ring-forming atoms. The term "$C_1$-$C_{60}$ heterocyclic group" as used herein refers to a cyclic group having 1 to 60 carbon atoms in addition to a heteroatom other than carbon atoms as ring-forming atoms. The $C_3$-$C_{60}$ carbocyclic group and the $C_1$-$C_{60}$ heterocyclic group may each be a monocyclic group consisting of one ring or a polycyclic group in which two or more rings are condensed with each other. For example, the number of ring-forming atoms in the $C_1$-$C_{60}$ heterocyclic group may be in a range of 3 to 61.

The term "cyclic group" as used herein may include the $C_3$-$C_{60}$ carbocyclic group and the $C_1$-$C_{60}$ heterocyclic group.

The term "π electron-rich $C_3$-$C_{60}$ cyclic group" as used herein refers to a cyclic group having 3 to 60 carbon atoms and not including *—N=*' as a ring-forming moiety. The term "π electron-deficient nitrogen-containing $C_1$-$C_{60}$ cyclic group" as used herein refers to a heterocyclic group having 1 to 60 carbon atoms and *—N=*' as a ring-forming moiety.

In some embodiments, the $C_3$-$C_{60}$ carbocyclic group may be i) a T1 group or ii) a group in which two or more T1 groups are condensed with each other (for example, the $C_3$-$C_{60}$ carbocyclic group may be a cyclopentadiene group, an adamantane group, a norbornane group, a benzene group, a pentalene group, a naphthalene group, an azulene group, an indacene group, an acenaphthylene group, a phenalene group, a phenanthrene group, an anthracene group, a fluoranthene group, a triphenylene group, a pyrene group, a chrysene group, a perylene group, a pentaphene group, a heptalene group, a naphthacene group, a picene group, a hexacene group, a pentacene group, a rubicene group, a coronene group, an ovalene group, an indene group, a fluorene group, a spiro-bifluorene group, a benzofluorene group, an indenophenanthrene group, or an indenoanthracene group), the $C_1$-$C_{60}$ heterocyclic group may be i) a T2 group, ii) a group in which two or more T2 groups are condensed with each other, or iii) a group in which at least one T2 group is condensed with at least one T1 group (for example, the $C_1$-$C_{60}$ heterocyclic group may be a pyrrole group, a thiophene group, a furan group, an indole group, a benzoindole group, a naphthoindole group, an isoindole group, a benzoisoindole group, a naphthoisoindole group, a benzosilole group, a benzothiophene group, a benzofuran group, a carbazole group, a dibenzosilole group, a dibenzothiophene group, a dibenzofuran group, an indenocarbazole group, an indolocarbazole group, a benzofurocarbazole group, a benzothienocarbazole group, a benzosilolocarbazole group, a benzoindolocarbazole group, a benzocarbazole group, a benzonaphthofuran group, a benzonaphthothiophene group, a benzonaphthosilole group, a benzofurodibenzofuran group, a benzofurodibenzothiophene group, a benzothienodibenzothiophene group, a pyrazole group, an imidazole group, a triazole group, an oxazole group, an isoxazole group, an oxadiazole group, a thiazole group, an isothiazole group, a thiadiazole group, a benzopyrazole group, a benzimidazole group, a benzoxazole group, a benzisoxazole group, a benzothiazole group, a benzoisothiazole group, a pyridine group, a pyrimidine group, a pyrazine group, a pyridazine group, a triazine group, a quinoline group, an isoquinoline group, a benzoquinoline group, a benzoisoquinoline group, a quinoxaline group, a benzoquinoxaline group, a quinazoline group, a benzoquinazoline group, a phenanthroline group, a cinnoline group, a phthalazine group, a naphthyridine group, an imidazopyridine group, an imidazopyrimidine group, an imidazotriazine group, an imidazopyrazine group, an imidazopyridazine group, an azacarbazole group, an azafluorene group, an azadibenzosilole group, an azadibenzothiophene group, an azadibenzofuran group, and/or the like), the π electron-rich $C_3$-$C_{60}$ cyclic group may be i) a T1 group, ii) a condensed group in which two or more T1 groups are condensed with each other, iii) a T3 group, iv) a condensed group in which two or more T3 groups are condensed with each other, or v) a condensed group in which at least one T3 group is condensed with at least one T1 group (for example, the π electron-rich $C_3$-$C_{60}$ cyclic group may be a $C_3$-$C_{60}$ carbocyclic group, a 1H-pyrrole group, a silole group, a borole group, a 2H-pyrrole group, a 3H-pyrrole group, a thiophene group, a furan group, an indole group, a benzoindole group, a naphthoindole group, an isoindole group, a benzoisoindole group, a naphthoisoindole group, a benzosilole group, a benzothiophene group, a benzofuran group, a carbazole group, a dibenzosilole group, a dibenzothiophene group, a dibenzofuran group, an indenocarbazole group, an indolocarbazole group, a benzofurocarbazole group, a benzothienocarbazole group, a benzosilolocarbazole group, a benzoindolocarbazole group, a benzocarbazole group, a benzonaphthofuran group, a benzonaphthothiophene group, a benzonaphthosilole group, a benzofurodibenzofuran group, a benzofurodibenzothiophene group, a benzothienodibenzothiophene group, and/or the like), and the π electron-deficient nitrogen-containing $C_1$-$C_{60}$ cyclic group may be i) a T4 group, ii) a group in which two or more T4 groups are condensed with each other, iii) a group in which at least one T4 group is condensed with at least one T1 group, iv) a group in which at least one T4 group is condensed with at least one T3 group, or v) a group in which at least one T4 group, at least one T1 group, and at least one T3 group are condensed with one another (for example, the π electron-deficient nitrogen-containing $C_1$-$C_{60}$ cyclic group may be a pyrazole group, an imidazole group, a triazole group, an oxazole group, an isoxazole group, an oxadiazole group, a thiazole group, an isothiazole group, a thiadiazole group, a benzopyrazole group, a benzimidazole group, a benzoxazole group, a benzoisoxazole group, a benzothiazole group, a benzoisothiazole group, a pyridine group, a pyrimidine group, a pyrazine group, a pyridazine group, a triazine group, a quinoline group, an isoquinoline group, a benzoquinoline group, a benzoisoquinoline group, a quinoxaline group, a benzoquinoxaline group, a quinazoline group, a benzoquinazoline group, a phenanthroline group, a cinnoline group, a phthalazine group, a naphthyridine group, an imidazopyridine group, an imidazopyrimidine group, an imidazotriazine group, an imidazopyrazine group, an imidazopyridazine group, an azacarbazole group, an azafluorene group, an azadibenzosilole group, an azadibenzothiophene group, an azadibenzofuran group, and/or the like), wherein the T1 group may be a cyclopropane group, a cyclobutane group, a cyclopentane group, a cyclohexane group, a cycloheptane group, a cyclooctane group, a cyclobutene group, a cyclopentene group, a cyclopentadiene group, a cyclohexene group, a cyclohexadiene group, a cycloheptene group, an adamantane group, a norbornane (or a bicyclo[2.2.1]heptane) group, a norbornene group, a bicyclo[1.1.1]pentane group, a bicyclo[2.1.1]hexane group, a bicyclo[2.2.2]octane group, or a benzene group, the T2 group may be a furan group, a thiophene group, a 1H-pyrrole group, a silole group, a borole group, a 2H-pyrrole group, a 3H-pyrrole group, an imidazole group, a pyrazole group, a triazole group, a tetrazole group, an oxazole group, an isoxazole group, an oxadiazole group, a thiazole group, an isothiazole group, a thiadiazole group, an azasilole group, an azaborole group, a pyridine group, a pyrimidine group, a pyrazine group, a pyridazine group, a triazine group, a tetrazine group, a pyrrolidine group, an imidazolidine group, a dihydropyrrole group, a piperidine group, a tetrahydropyridine group, a dihydropyridine group, a hexahydropyrimidine group, a tetrahydropyrimidine group, a dihydropyrimidine group, a piperazine group, a tetrahydropyrazine group, a dihydropyrazine group, a tetrahydropyridazine group, or a dihydropyridazine group, the T3 group may be a furan group, a thiophene group, a 1H-pyrrole group, a silole group, or a borole group, and the T4 group may be a 2H-pyrrole group, a 3H-pyrrole group, an imidazole group, a pyrazole group, a triazole group, a tetrazole group, an oxazole group, an isoxazole group, an oxadiazole group, a thiazole group, an isothiazole group, a thiadiazole group, an azasilole group, an azaborole group, a pyridine group, a pyrimidine group, a pyrazine group, a pyridazine group, a triazine group, or a tetrazine group.

The term "cyclic group", "$C_3$-$C_{60}$ carbocyclic group", "$C_1$-$C_{60}$ heterocyclic group", "π electron-rich $C_3$-$C_{60}$ cyclic group", or "π electron-deficient nitrogen-containing $C_1$-$C_{60}$ cyclic group" as used herein may each refer to a group condensed with any suitable cyclic group, a monovalent group, or a polyvalent group (e.g., a divalent group, a trivalent group, a tetravalent group, and/or the like), depending on the structure of the formula to which the term is applied. For example, a "benzene group" may be a benzene ring, a phenyl group, a phenylene group, and/or the like, which may be understood by one of ordinary skill in the art according to the structure of the formula including the "benzene group".

In some embodiments, examples of the monovalent $C_3$-$C_{60}$ carbocyclic group and the monovalent $C_1$-$C_{60}$ heterocyclic group may include a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_{60}$ heteroaryl group, a monovalent non-aromatic condensed polycyclic group, and a monovalent non-aromatic condensed heteropolycyclic group, and examples of the divalent $C_3$-$C_{60}$ carbocyclic group and the divalent $C_1$-$C_{60}$ heterocyclic group may include a $C_3$-$C_{10}$ cycloalkylene group, a $C_1$-$C_{10}$ heterocycloalkylene group, a $C_3$-$C_{10}$ cycloalkenylene group, a $C_1$-$C_{10}$ heterocycloalkenylene group, a $C_6$-$C_{60}$ arylene group, a $C_1$-$C_{60}$ heteroarylene group, a divalent non-aromatic condensed polycyclic group, and a divalent non-aromatic condensed heteropolycyclic group.

The term "$C_1$-$C_{60}$ alkyl group" as used herein refers to a linear or branched aliphatic saturated hydrocarbon monovalent group having 1 to 60 carbon atoms, and examples thereof may include a methyl group, an ethyl group, an n-propyl group, an isopropyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, an n-hexyl group, an isohexyl group, a sec-hexyl group, a tert-hexyl group, an n-heptyl group, an isoheptyl group, a sec-heptyl group, a tert-heptyl group, an n-octyl group, an isooctyl group, a sec-octyl group, a tert-octyl group, an n-nonyl group, an iso-nonyl group, a sec-nonyl group, a tert-nonyl group, an n-decyl group, an isodecyl group, a sec-decyl group, and a tert-decyl group. The term "$C_1$-$C_{60}$ alkylene group" as used herein refers to a divalent group having substantially the same structure as the $C_1$-$C_{60}$ alkyl group.

The term "$C_2$-$C_{60}$ alkenyl group" as used herein refers to a monovalent hydrocarbon group having at least one carbon-carbon double bond in the middle and/or at a terminal end (e.g., the terminus) of the $C_2$-$C_{60}$ alkyl group. Examples thereof may include an ethenyl group, a propenyl group, and a butenyl group. The term "$C_2$-$C_{60}$ alkenylene group" as used herein refers to a divalent group having substantially the same structure as the $C_2$-$C_{60}$ alkenyl group.

The term "$C_2$-$C_{60}$ alkynyl group" as used herein refers to a monovalent hydrocarbon group having at least one carbon-carbon triple bond in the middle and/or at a terminal end (e.g., the terminus) of the $C_2$-$C_{60}$ alkyl group. Examples thereof may include an ethynyl group and a propynyl group. The term "$C_2$-$C_{60}$ alkynylene group" as used herein refers to a divalent group having substantially the same structure as the $C_2$-$C_{60}$ alkynyl group.

The term "$C_1$-$C_{60}$ alkoxy group" as used herein refers to a monovalent group represented by $-OA_{101}$ (wherein $A_{101}$ is a $C_1$-$C_{60}$ alkyl group). Examples thereof may include a methoxy group, an ethoxy group, and an isopropyloxy group.

The term "$C_3$-$C_{10}$ cycloalkyl group" as used herein refers to a monovalent saturated hydrocarbon monocyclic group including 3 to 10 carbon atoms. Examples of the $C_3$-$C_{10}$ cycloalkyl group as used herein may include a cyclopropyl group, a cyclobutyl group, a cyclopentyl group, a cyclohexyl group, a cycloheptyl group, a cyclooctyl group, an adamantanyl group, a norbornanyl (or a bicyclo[2.2.1]heptyl) group, a bicyclo[1.1.1]pentyl group, a bicyclo[2.1.1]hexyl group, and/or a bicyclo[2.2.2]octyl group. The term "$C_3$-$C_{10}$ cycloalkylene group" as used herein refers to a divalent group having substantially the same structure as the $C_3$-$C_{10}$ cycloalkyl group.

The term "$C_1$-$C_{10}$ heterocycloalkyl group" as used herein refers to a monovalent saturated monocyclic group including at least one heteroatom other than carbon atoms as a ring-forming atom and having 1 to 10 carbon atoms. Examples thereof may include a 1,2,3,4-oxatriazolidinyl group, a tetrahydrofuranyl group, and a tetrahydrothiophenyl group. The term "$C_1$-$C_{10}$ heterocycloalkylene group" as used herein refers to a divalent group having substantially the same structure as the $C_1$-$C_{10}$ heterocycloalkyl group.

The term "$C_3$-$C_{10}$ cycloalkenyl group" as used herein refers to a monovalent cyclic group that has 3 to 10 carbon atoms and at least one carbon-carbon double bond in its ring, and is not aromatic. Examples thereof may include a cyclopentenyl group, a cyclohexenyl group, and a cycloheptenyl group. The term "$C_3$-$C_{10}$ cycloalkenylene group" as used herein refers to a divalent group having substantially the same structure as the $C_3$-$C_{10}$ cycloalkenyl group.

The term "$C_1$-$C_{10}$ heterocycloalkenyl group" as used herein refers to a monovalent cyclic group including at least one heteroatom other than carbon atoms as a ring-forming atom, 1 to 10 carbon atoms, and at least one double bond in its ring. Examples of the $C_1$-$C_{10}$ heterocycloalkenyl group may include a 4,5-dihydro-1,2,3,4-oxatriazolyl group, a 2,3-dihydrofuranyl group, and a 2,3-dihydrothiophenyl group. The term "$C_1$-$C_{10}$ heterocycloalkylene group" as used herein refers to a divalent group having substantially the same structure as the $C_1$-$C_{10}$ heterocycloalkenyl group.

The term "$C_6$-$C_{60}$ aryl group" as used herein refers to a monovalent group having a carbocyclic aromatic system having 6 to 60 carbon atoms. The term "$C_6$-$C_{60}$ arylene group" as used herein refers to a divalent group having a carbocyclic aromatic system having 6 to 60 carbon atoms. Examples of the $C_6$-$C_{60}$ aryl group may include a phenyl group, a pentalenyl group, a naphthyl group, an azulenyl group, an indacenyl group, an acenaphthyl group, a phenalenyl group, a phenanthrenyl group, an anthracenyl group, a fluoranthenyl group, a triphenylenyl group, a pyrenyl group, a chrysenyl group, a perylenyl group, a pentaphenyl group, a heptalenyl group, a naphthacenyl group, a picenyl group, a hexacenyl group, a pentacenyl group, a rubicenyl group, a coronenyl group, a fluorenyl group, and an ovalenyl group. When the $C_6$-$C_{60}$ aryl group and the $C_6$-$C_{60}$ arylene group each independently include two or more rings, the respective rings may be fused with each other.

The term "$C_1$-$C_{60}$ heteroaryl group" as used herein refers to a monovalent group having a heterocyclic aromatic system that has, in addition to 1 to 60 carbon atoms, at least one heteroatom other than carbon atoms as a ring-forming atom. The term "$C_1$-$C_{60}$ heteroarylene group" as used herein refers to a divalent group having a heterocyclic aromatic system that has, in addition to 1 to 60 carbon atoms, at least one heteroatom other than carbon atoms as a ring-forming atom. Examples of the $C_1$-$C_{60}$ heteroaryl group may include a pyridinyl group, a pyrimidinyl group, a pyrazinyl group, a pyridazinyl group, a triazinyl group, a quinolinyl group, a benzoquinolinyl group, an isoquinolinyl group, a benzoisoquinolinyl group, a quinoxalinyl group, a benzoquinoxalinyl group, a quinazolinyl group, a benzoquinazolinyl group, a cinnolinyl group, a phenanthrolinyl group, a phthalazinyl group, a carbazolyl group, a dibenzofuranyl group, a dibenzothiophenyl group, and a naphthyridinyl group. When the $C_1$-$C_{60}$ heteroaryl group and the $C_1$-$C_{60}$ heteroarylene group each independently include two or more rings, the respective two or more rings may be fused with each other.

The term "monovalent non-aromatic condensed polycyclic group" as used herein refers to a monovalent group that has two or more condensed rings and only carbon atoms (e.g., 8 to 60 carbon atoms) as ring forming atoms, wherein the entire molecular structure when considered as a whole is non-aromatic. Examples of the monovalent non-aromatic condensed polycyclic group may include an indenyl group, a fluorenyl group, a spiro-bifluorenyl group, a benzofluorenyl group, an indenophenanthrenyl group, an adamantyl group, and an indenoanthracenyl group. The term "divalent non-aromatic condensed polycyclic group" as used herein refers to a divalent group having substantially the same structure as the monovalent non-aromatic condensed polycyclic group.

The term "monovalent non-aromatic condensed heteropolycyclic group" as used herein refers to a monovalent group that has two or more condensed rings and at least one heteroatom other than 1 to 60 carbon atoms, as a ring-forming atom, wherein the entire molecular structure when considered as a whole is non-aromatic. Examples of the monovalent non-aromatic condensed heteropolycyclic group may include a pyrrolyl group, a thiophenyl group, a furanyl group, an indolyl group, a benzoindolyl group, a naphthoindolyl group, an isoindolyl group, a benzoisoindolyl group, a naphthoisoindolyl group, a benzosilolyl group, a benzothiophenyl group, a benzofuranyl group, a carbazolyl group, a dibenzosilolyl group, a dibenzothiophenyl group, a dibenzofuranyl group, an azacarbazolyl group, an azafluorenyl group, an azadibenzosilolyl group, an azadibenzothiophenyl group, an azadibenzofuranyl group, a pyrazolyl group, an imidazolyl group, a triazolyl group, a tetrazolyl group, an oxazolyl group, an isoxazolyl group, a thiazolyl group, an isothiazolyl group, an oxadiazolyl group, a thiadiazolyl group, a benzopyrazolyl group, a benzimidazolyl group, a benzoxazolyl group, a benzothiazolyl group, a benzooxadiazolyl group, a benzothiadiazolyl group, an imidazopyridinyl group, an imidazopyrimidinyl group, an imidazotriazinyl group, an imidazopyrazinyl group, an imidazopyridazinyl group, an indenocarbazolyl group, an indolocarbazolyl group, a benzofurocarbazolyl group, a benzothienocarbazolyl group, a benzosilolocarbazolyl group, a benzoindolocarbazolyl group, a benzocarbazolyl group, a benzonaphthofuranyl group, a benzonaphthothiophenyl group, a benzonaphthosilolyl group, a benzofurodibenzofuranyl group, a benzofurodibenzothiophenyl group, an azaadamantyl group, and a benzothienodibenzothiophenyl group. The term "divalent non-aromatic condensed heteropolycyclic group" as used herein refers to a divalent group having substantially the same structure as the monovalent non-aromatic condensed heteropolycyclic group.

The term "$C_6$-$C_{60}$ aryloxy group" as used herein refers to a monovalent group represented by —$OA_{102}$ (wherein $A_{102}$ is a $C_6$-$C_{60}$ aryl group). The term "$C_6$-$C_{60}$ arylthio group" as used herein refers to a monovalent group represented by —$SA_{103}$ (wherein $A_{103}$ is a $C_6$-$C_{60}$ aryl group).

The term "$C_7$-$C_{60}$ aryl alkyl group" as used herein refers to a monovalent group represented by -$A_{104}A_{105}$ (wherein $A_{104}$ is a $C_1$-$C_{54}$ alkylene group, and $A_{105}$ is a $C_6$-$C_{59}$ aryl group). The term "$C_2$-$C_{60}$ heteroaryl alkyl group" as used herein refers to a monovalent group represented by -$A_{106}A_{107}$ (wherein $A_{106}$ is a $C_1$-$C_{50}$ alkylene group, and $A_{107}$ is a $C_1$-$C_{50}$ heteroaryl group).

The term "$R_{10a}$" as used herein may be:

deuterium, —F, —Cl, —Br, —I, a hydroxyl group, a cyano group, or a nitro group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each unsubstituted or substituted with deuterium, —F, —Cl, —Br, —I, a hydroxyl group, a cyano group, a nitro group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ aryl alkyl group, a $C_2$-$C_{60}$ heteroaryl alkyl group, —$Si(Q_{11})(Q_{12})(Q_{13})$, —$N(Q_{11})(Q_{12})$, —$B(Q_{11})(Q_{12})$, —$C(=O)(Q_{11})$, —$S(=O)_2(Q_{11})$, —$P(=O)(Q_{11})(Q_{12})$, or any combination thereof;

a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ aryl alkyl group, or a $C_2$-$C_{60}$ heteroaryl alkyl group, each unsubstituted or substituted with deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ aryl alkyl group, a $C_2$-$C_{60}$ heteroaryl alkyl group, —Si($Q_{21}$)($Q_{22}$)($Q_{23}$), —N($Q_{21}$)($Q_{22}$), —B($Q_{21}$)($Q_{22}$), —C(=O)($Q_{21}$), —S(=O)$_2$($Q_{21}$), —P(=O)($Q_{21}$)($Q_{22}$), or any combination thereof; or —Si($Q_{31}$)($Q_{32}$)($Q_{33}$), —N($Q_{31}$)($Q_{32}$), —B($Q_{31}$)($Q_{32}$), —C(=O)($Q_{31}$), —S(=O)$_2$($Q_{31}$), or —P(=O)($Q_{31}$)($Q_{32}$).

$Q_1$ to $Q_3$, $Q_{11}$ to $Q_{13}$, $Q_{21}$ to $Q_{23}$, and $Q_{31}$ to $Q_{33}$ as used herein may each independently be: hydrogen; deuterium; —F; —Cl; —Br; —I; a hydroxyl group; a cyano group; a nitro group; a $C_1$-$C_{60}$ alkyl group; a $C_2$-$C_{60}$ alkenyl group; a $C_2$-$C_{60}$ alkynyl group; a $C_1$-$C_{60}$ alkoxy group; a $C_3$-$C_{60}$ carbocyclic group or a $C_1$-$C_{60}$ heterocyclic group, each unsubstituted or substituted with deuterium, —F, a cyano group, a $C_1$-$C_{60}$ alkyl group, a $C_1$-$C_{60}$ alkoxy group, a phenyl group, a biphenyl group, or any combination thereof; a $C_7$-$C_{60}$ aryl alkyl group; or a $C_2$-$C_{60}$ heteroaryl alkyl group.

The term "heteroatom" as used herein refers to any atom other than a carbon atom. Examples of the heteroatom may include O, S, N, P, Si, B, Ge, Se, or any combination thereof.

A third-row transition metal as used herein may include hafnium (Hf), tantalum (Ta), tungsten (W), rhenium (Re), osmium (Os), iridium (Ir), platinum (Pt), and/or gold (Au).

The term "Ph" as used herein represents a phenyl group, the term "Me" as used herein represents a methyl group, the term "Et" as used herein represents an ethyl group, the term "tert-Bu" or "$Bu^t$" as used herein represents a tert-butyl group, and the term "OMe" as used herein represents a methoxy group.

The term "biphenyl group" as used herein refers to a phenyl group substituted with a phenyl group. The "biphenyl group" belongs to "a substituted phenyl group" having a "$C_6$-$C_{60}$ aryl group" as a substituent.

The term "terphenyl group" as used herein refers to a phenyl group substituted with a biphenyl group. The "terphenyl group" belongs to "a substituted phenyl group" having a "$C_6$-$C_{60}$ aryl group substituted with a $C_6$-$C_{60}$ aryl group" as a substituent.

The symbols * and *' as used herein, unless defined otherwise, each refer to a binding site to an adjacent atom in a corresponding formula or moiety.

Hereinafter, compounds and a light-emitting device according to one or more embodiments will be described in more detail with reference to Synthesis Examples and Examples. The wording "B was utilized instead of A" used in describing Synthesis Examples refers to that an amount of B utilized was identical to an amount of A utilized in terms of molar equivalents.

EXAMPLES

Synthesis Example of Compound 4

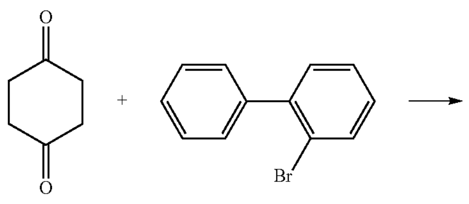

-continued

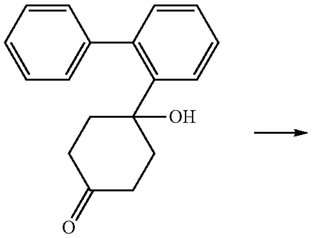

4-1

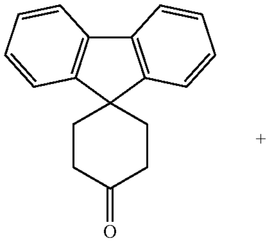

4-2

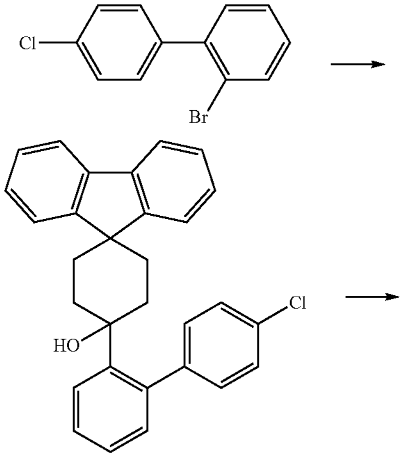

4-3

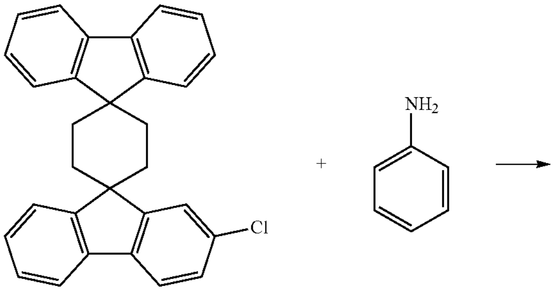

4-4

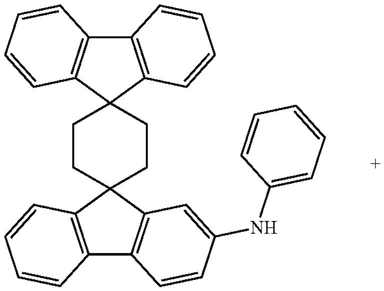

4-5

-continued

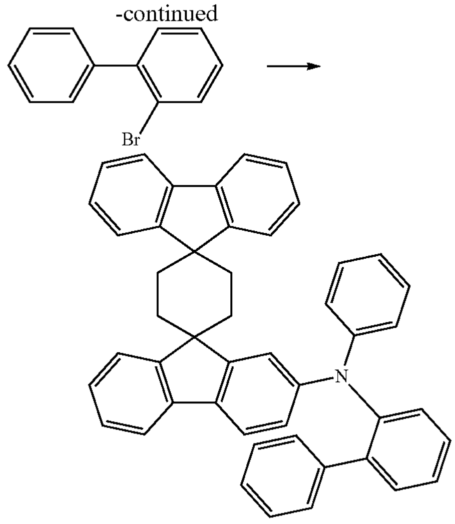

compound 4

Synthesis of Intermediate 4-1

2.33 g (10 mmol) of 2-bromobiphenyl was dissolved in 30 mL of tetrahydrofuran (THF), and then 4 mL of n-BuLi (2.5 M in hexane) was added thereto at −78° C. 1 hour after the addition, at the same temperature, 1.12 g of cyclohexane-1,4-dione dissolved in 30 mL of THF was added thereto. The reaction solution was stirred at room temperature for 5 hours, and distilled water was added thereto. Then, an extraction process was performed three times by utilizing 50 mL of ethyl ether. The collected ethyl ether phase was dried utilizing anhydrous $MgSO_4$, and a solvent was evaporated therefrom to obtain a residue. The resulting residue was separated and purified through silica gel column chromatography to thereby obtain 1.46 g of Intermediate 4-1 (yield: 55%). The resulting compound was identified by liquid chromatography-mass spectrometry (LC-MS). $C_{18}H_{18}O_2$: $M^+$ 266.3

Synthesis of Intermediate 4-2

2.66 g (10 mmol) of Intermediate 4-1 was dissolved in 20 mL of acetic acid/HCl (4/1), followed by stirring at a temperature of 60° C. for 6 hours. Once the reaction solution was cooled to room temperature, 10 g of sodium hydroxide dissolved in 20 mL of water was added thereto. Then, an extraction process was performed thereon by utilizing 60 mL of water and 60 mL of dichloromethane three times. The resulting organic layer was dried by utilizing anhydrous $MgSO_4$. A solvent was then removed therefrom by evaporation. The resulting residue was separated and purified through silica gel chromatography to thereby obtain 1.74 g of Intermediate 4-2 (yield: 70%). The resulting compound was identified by LC-MS. $C_{18}H_{16}O$: $M^+$ 248.3

Synthesis of Intermediate 4-3

2.68 g (10 mmol) of 2-bromo-4'-chloro-1,1'-biphenyl was dissolved in 30 mL of tetrahydrofuran (THF), and then 4 mL of n-BuLi (2.5 M in hexane) was added thereto at −78° C. 1 hour after the addition, at the same temperature, 2.66 g of Intermediate 4-2 dissolved in 30 mL of THF was added thereto. The reaction solution was stirred at room temperature for 5 hours, and distilled water was added thereto. Then, an extraction process was performed three times by utilizing 50 mL of ethyl ether. The collected ethyl ether phase was dried utilizing anhydrous $MgSO_4$, and a solvent was evaporated therefrom to obtain a residue. The resulting residue was separated and purified through silica gel column chromatography to thereby obtain 2.84 g of Intermediate 4-3 (yield: 65%). The resulting compound was identified by LC-MS. $C_{30}H_{25}ClO$: $M^+$ 436.9

Synthesis of Intermediate 4-4

4.36 g (10 mmol) of Intermediate 4-3 was dissolved in 20 mL of acetic acid/HCl (4/1), followed by stirring at a temperature of 60° C. for 6 hours. Once the reaction solution was cooled to room temperature, 10 g of sodium hydroxide dissolved in 20 mL of water was added thereto. Then, an extraction process was performed thereon by utilizing 60 mL of water and 60 mL of dichloromethane three times. The resulting organic layer was dried by utilizing anhydrous $MgSO_4$. A solvent was then removed therefrom by evaporation. The resulting residue was separated and purified through silica gel chromatography to thereby obtain 2.93 g of Intermediate 4-4 (yield: 70%). The resulting compound was identified by LC-MS. $C_{30}H_{23}Cl$: $M^+$ 418.9

Synthesis of Intermediate 4-5

4.19 g (10.0 mmol) of Intermediate 4-4, 1.40 g (15 mmol) of aniline, 0.46 g (0.5 mmol) of tris(dibenzylideneacetone) dipalladium(0) ($Pd_2dba_3$), 0.24 g (1 mmol) of $P(t\text{-}Bu)_3$, and 2.88 g (30 mmol) of sodium tert-butoxide were dissolved in 60 mL of toluene, followed by stirring at a temperature of 80° C. for 3 hours. The reaction solution was allowed to come to room temperature. Then, 40 mL of water was added thereto, and an extraction process was performed three times thereon by utilizing 50 mL of ethyl ether. The collected ethyl ether phase was dried utilizing anhydrous $MgSO_4$, and a solvent was evaporated therefrom to obtain a residue. The resulting residue was separated and purified through silica gel column chromatography to thereby obtain 3.57 g of Intermediate 4-5 (yield: 75%). The resulting compound was identified by LC-MS. $C_{36}H_{29}N$: $M^+$ 475.6

Synthesis of Compound 4

4.76 g (10.0 mmol) of Intermediate 4-5, 2.31 g (10 mmol) of 2-bromobiphenyl, 0.46 g (0.5 mmol) of tris(dibenzylideneacetone)dipalladium(0) ($Pd_2dba_3$), 0.24 g (1 mmol) of $P(t\text{-}Bu)_3$, and 2.88 g (30 mmol) of sodium tert-butoxide were dissolved in 60 mL of toluene, followed by stirring at a temperature of 80° C. for 3 hours. The reaction solution was allowed to come to room temperature. Then, 40 mL of water was added thereto, and an extraction process was performed three times thereon by utilizing 50 mL of ethyl ether. The collected ethyl ether phase was dried utilizing anhydrous $MgSO_4$, and a solvent was evaporated therefrom to obtain a residue. The resulting residue was separated and purified through silica gel column chromatography to thereby obtain 4.08 g of Compound 4 (yield: 65%). The obtained compound was identified by MS/FAB and $^1H$ NMR.

Synthesis Example of Compound 11

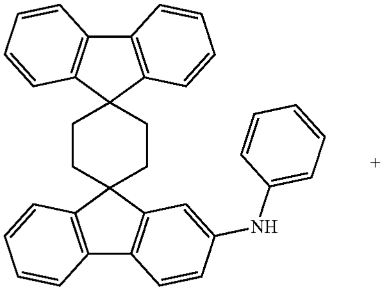

4-5

-continued

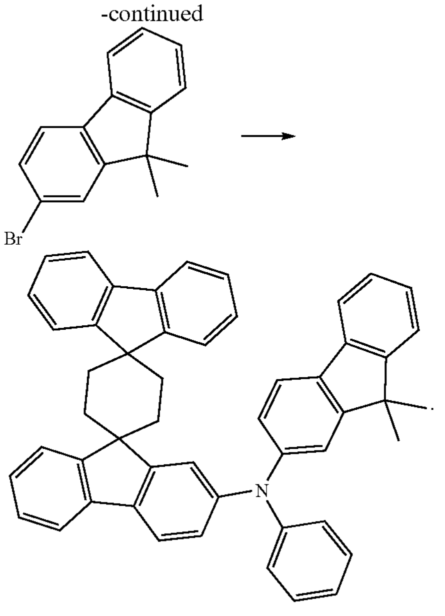

compound 11

Compound 11 was synthesized in substantially the same manner as in Synthesis of Compound 4, except that 2-bromo-9,9-dimethyl-9H-fluorene was utilized instead of 2-bromobiphenyl. The obtained compound was identified by MS/FAB and $^1$H NMR.

Synthesis Example of Compound 14

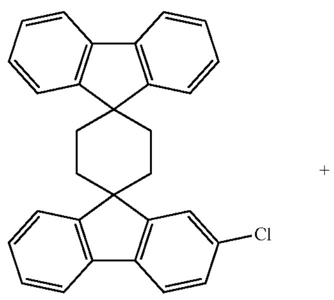

4-4

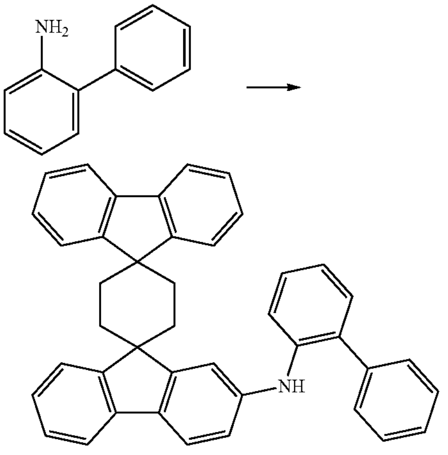

14-1

-continued

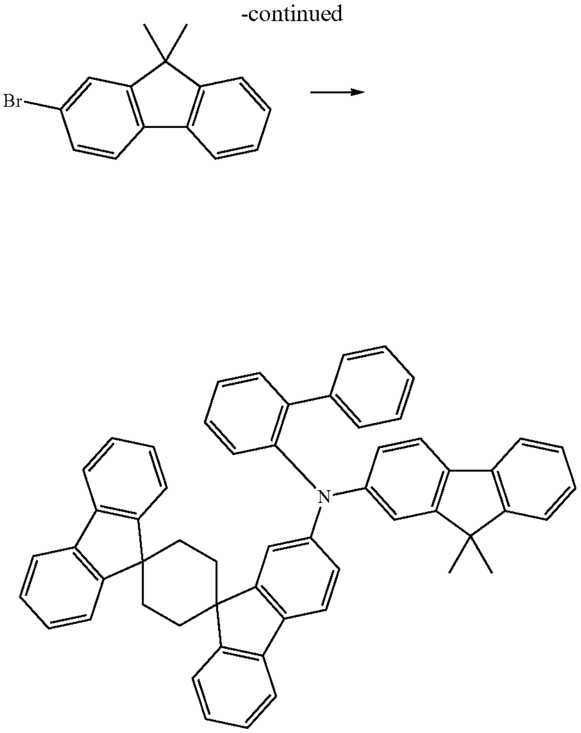

compound 14

Synthesis of Intermediate 14-1

4.19 g (10.0 mmol) of Intermediate 4-4, 1.40 g (15 mmol) of 2-aminobiphenyl, 0.46 g (0.5 mmol) of tris(dibenzylideneacetone)dipalladium(0) ($Pd_2dba_3$), 0.24 g (1 mmol) of $P(t-Bu)_3$, and 2.88 g (30 mmol) of sodium tert-butoxide were dissolved in 60 mL of toluene, followed by stirring at a temperature of 80° C. for 3 hours. The reaction solution was allowed to come to room temperature. Then, 40 mL of water was added thereto, and an extraction process was performed three times thereon by utilizing 50 mL of ethyl ether. The collected ethyl ether phase was dried utilizing anhydrous $MgSO_4$, and a solvent was evaporated therefrom to obtain a residue. The resulting residue was separated and purified through silica gel column chromatography to thereby obtain 4.14 g of Intermediate 14-1 (yield: 75%). The resulting compound was identified by LC-MS. $C_{42}H_{33}N$: $M^+$ 551.7

Synthesis of Compound 14

5.52 g (10.0 mmol) of Intermediate 14-1, 2.73 g (10 mmol) of 2-bromo-9,9-dimethyl-9H-fluorene, 0.46 g (0.5 mmol) of tris(dibenzylideneacetone)dipalladium(0) ($Pd_2dba_3$), 0.24 g (1 mmol) of $P(t-Bu)_3$, and 2.88 g (30 mmol) of sodium tert-butoxide were dissolved in 60 mL of toluene, followed by stirring at a temperature of 80° C. for 3 hours. The reaction solution was allowed to come to room temperature. Then, 40 mL of water was added thereto, and an extraction process was performed three times thereon by utilizing 50 mL of ethyl ether. The collected ethyl ether phase was dried utilizing anhydrous $MgSO_4$, and a solvent was evaporated therefrom to obtain a residue. The resulting residue was separated and purified through silica gel column chromatography to thereby obtain 5.21 g of Compound 14 (yield: 70%). The obtained compound was identified by MS/FAB and $^1$H NMR.

Synthesis Example of Compound 19

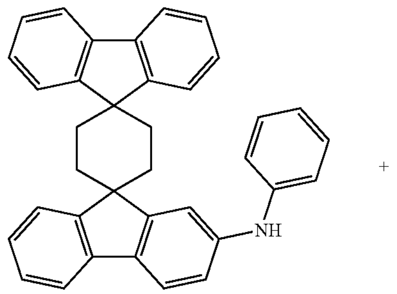

4-5

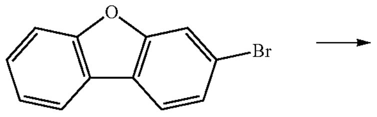

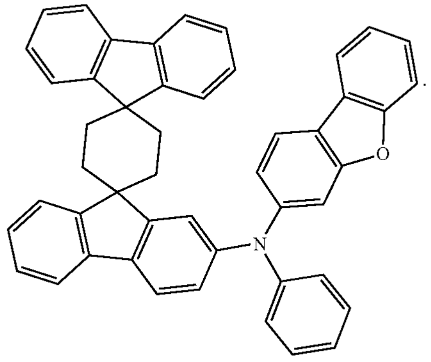

compound 19

Compound 19 was synthesized in substantially the same manner as in Synthesis of Compound 4, except that 3-bromodibenzo[b,d]furan was utilized instead of 2-bromobiphenyl. The obtained compound was identified by MS/FAB and $^{1}$H NMR.

Synthesis Example of Compound 27

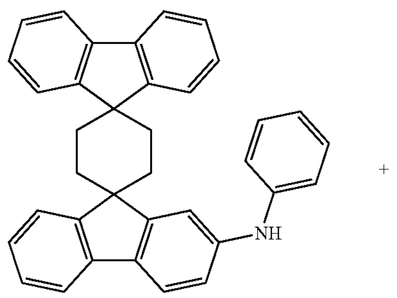

4-5

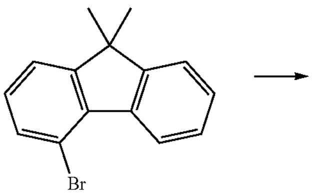

-continued

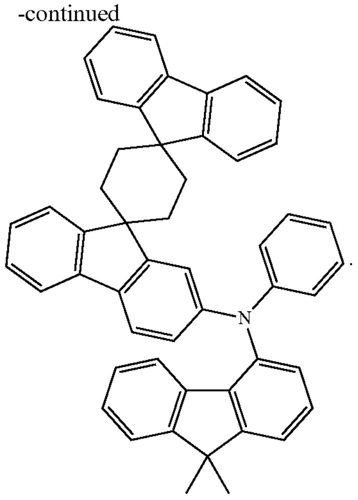

compound 27

Compound 27 was synthesized in substantially the same manner as in Synthesis of Compound 4, except that 4-bromo-9,9-dimethyl-9H-fluorene was utilized instead of 2-bromobiphenyl. The obtained compound was identified by MS/FAB and $^{1}$H NMR.

Synthesis Example of Compound 63

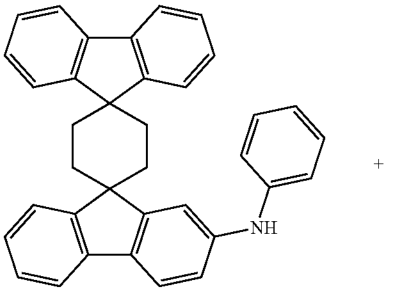

4-5

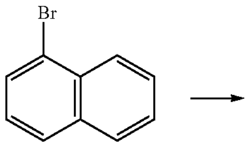

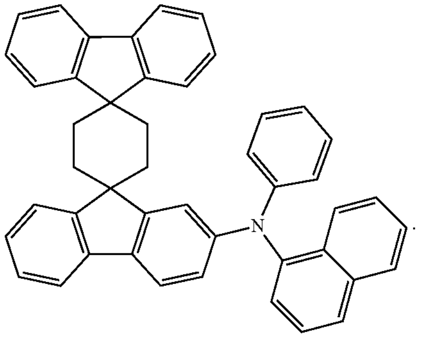

compound 63

Compound 63 was synthesized in substantially the same manner as in Synthesis of Compound 4, except that 1-bromonaphthalene was utilized instead of 2-bromobiphenyl. The obtained compound was identified by MS/FAB and $^1$H NMR.

Synthesis Example of Compound 79

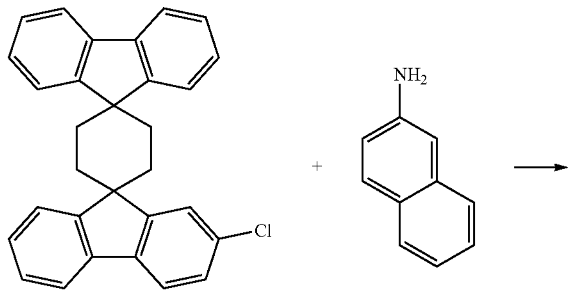

4-4

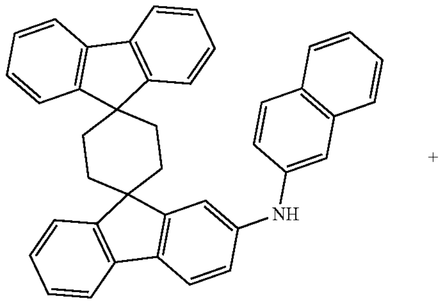

79-1

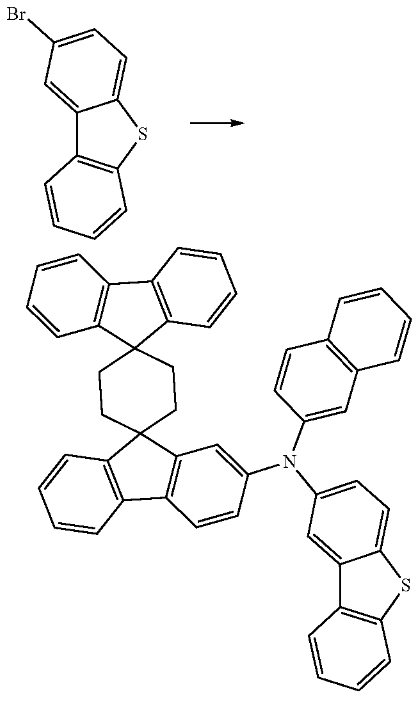

compound 79

Synthesis of Intermediate 79-1

4.19 g (10.0 mmol) of Intermediate 4-4, 2.15 g (15 mmol) of 2-aminonaphthalene, 0.46 g (0.5 mmol) of tris(dibenzylideneacetone)dipalladium(0) ($Pd_2dba_3$), 0.24 g (1 mmol) of $P(t\text{-}Bu)_3$, and 2.88 g (30 mmol) of sodium tert-butoxide were dissolved in 60 mL of toluene, followed by stirring at a temperature of 80° C. for 3 hours. The reaction solution was allowed to come to room temperature. Then, 40 mL of water was added thereto, and an extraction process was performed three times thereon by utilizing 50 mL of ethyl ether. The collected ethyl ether phase was dried utilizing anhydrous $MgSO_4$, and a solvent was evaporated therefrom to obtain a residue. The resulting residue was separated and purified through silica gel column chromatography to thereby obtain 3.68 g of Intermediate 79-1 (yield: 70%). The resulting compound was identified by LC-MS. $C_{40}H_{31}N$: $M^+$ 525.7

Synthesis of Compound 79

5.26 g (10.0 mmol) of Intermediate 79-1, 2.63 g (10 mmol) of 2-bromodibenzo[b,d]thiophene, 0.46 g (0.5 mmol) of tris(dibenzylideneacetone)dipalladium(0) ($Pd_2dba_3$), 0.24 g (1 mmol) of $P(t\text{-}Bu)_3$, and 2.88 g (30 mmol) of sodium tert-butoxide were dissolved in 60 mL of toluene, followed by stirring at a temperature of 80° C. for 3 hours. The reaction solution was allowed to come to room temperature. Then, 40 mL of water was added thereto, and an extraction process was performed three times thereon by utilizing 50 mL of ethyl ether. The collected ethyl ether phase was dried utilizing anhydrous $MgSO_4$, and a solvent was evaporated therefrom to obtain a residue. The resulting residue was separated and purified through silica gel column chromatography to thereby obtain 4.96 g of Compound 79 (yield: 70%). The obtained compound was identified by MS/FAB and $^1$H NMR.

Synthesis Example of Compound 95

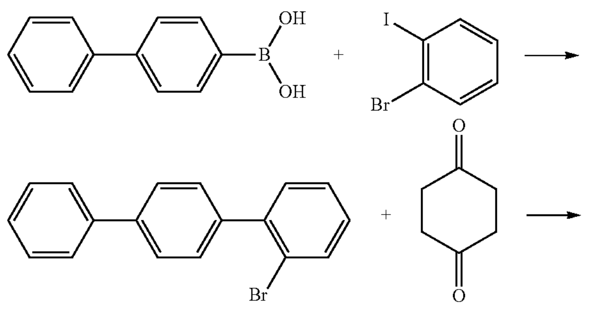

95-1

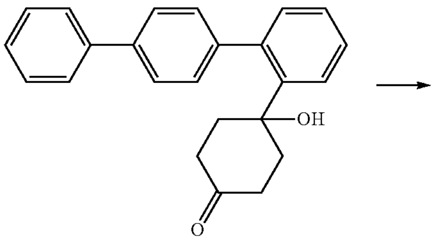

95-2

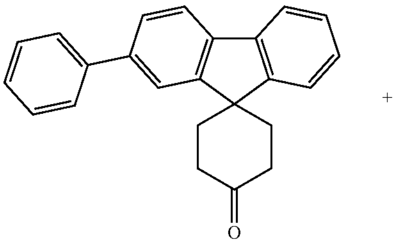

95-3

-continued

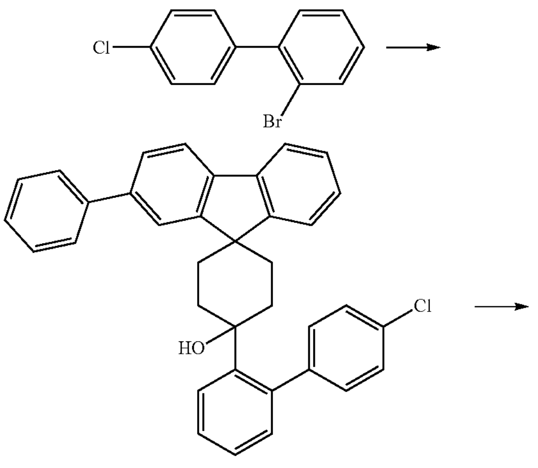

95-4

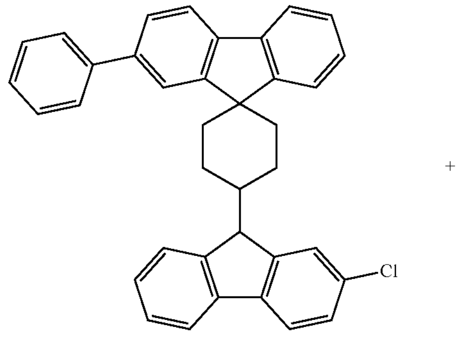

95-5

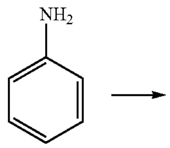

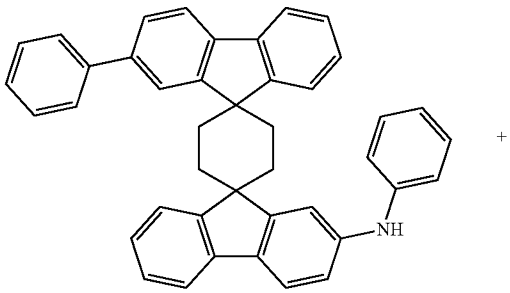

95-6

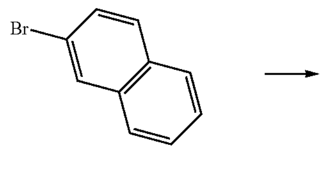

-continued

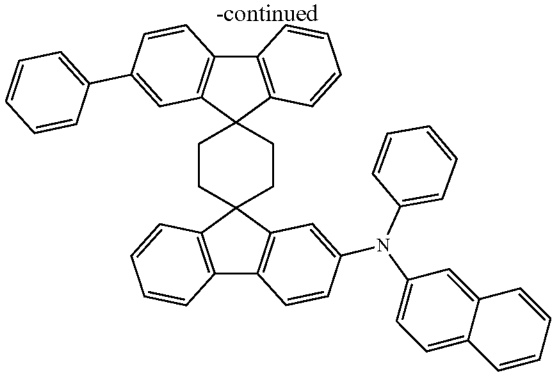

compound 95

Synthesis of Intermediate 95-1

1.98 g (10.0 mmol) of 4-biphenylboronic acid, 2.75 g (15.0 mmol) of 1-bromo-2-iodobenzene, 0.58 g (0.5 mmol) of $Pd(PPh_3)_4$, and 4.14 g (30.0 mmol) of $K_2CO_3$ were dissolved in 60 mL of a mixture solution of tetrahydrofuran (THF)/$H_2O$ (2/1). Then, the mixture was stirred at a temperature of 80° C. for 16 hours. The reaction solution was cooled to room temperature, and then an extraction process was performed thereon three times by utilizing 60 mL of water and 60 mL of diethyl ether. The collected diethyl ether phase was dried utilizing anhydrous $MgSO_4$, and a solvent was evaporated therefrom to obtain a residue. The resulting residue was separated and purified through silica gel column chromatography to thereby obtain 1.85 g of Intermediate 95-1 (yield: 60%). The resulting compound was identified by LC-MS. $C_{18}H_{13}Br$: $M^+$ 309.2

Synthesis of Intermediate 95-2

3.09 g (10 mmol) of Intermediate 95-1 was dissolved in 30 mL of THF, and then 4 mL of n-BuLi (2.5 M in hexane) was added thereto at −78° C. 1 hour after the addition, at the same temperature, 1.12 g of cyclohexane-1,4-dione dissolved in 30 mL of THF was added thereto. The reaction solution was stirred at room temperature for 5 hours, and distilled water was added thereto. Then, an extraction process was performed three times by utilizing 50 mL of ethyl ether. The collected ethyl ether phase was dried utilizing anhydrous $MgSO_4$, and a solvent was evaporated therefrom to obtain a residue. The resulting residue was separated and purified through silica gel column chromatography to thereby obtain 1.88 g of Intermediate 95-2 (yield: 55%). The resulting compound was identified by LC-MS. $C_{24}H_{22}O_2$: $M^+$ 342.4

Synthesis of Intermediate 95-3

3.42 g (10 mmol) of Intermediate 95-2 was dissolved in 20 mL of acetic acid/HCl (4/1), followed by stirring at a temperature of 60° C. for 6 hours. Once the reaction solution was cooled to room temperature, 10 g of sodium hydroxide dissolved in 20 mL of water was added thereto. Then, an extraction process was performed thereon by utilizing 60 mL of water and 60 mL of dichloromethane three times. The resulting organic layer was dried by utilizing anhydrous $MgSO_4$. A solvent was then removed therefrom by evaporation. The resulting residue was separated and purified through silica gel chromatography to thereby obtain 2.27 g of Intermediate 95-3 (yield: 70%). The resulting compound was identified by LC-MS. $C_{24}H_{26}O$: $M^+$ 342.4

Synthesis of Intermediate 95-4

2.68 g (10 mmol) of 2-bromo-4'-chloro-1,1'-biphenyl was dissolved in 30 mL of THF, and then 4 mL of n-BuLi (2.5

M in hexane) was added thereto at −78° C. 1 hour after the addition, at the same temperature, 3.56 g of Intermediate 95-3 dissolved in 30 mL of THF was added thereto. The reaction solution was stirred at room temperature for 5 hours, and distilled water was added thereto. Then, an extraction process was performed three times by utilizing 50 mL of ethyl ether. The collected ethyl ether phase was dried utilizing anhydrous $MgSO_4$, and a solvent was evaporated therefrom to obtain a residue. The resulting residue was separated and purified through silica gel column chromatography to thereby obtain 3.33 g of Intermediate 95-4 (yield: 65%). The resulting compound was identified by LC-MS. $C_{36}H_{29}ClO$: $M^+$ 513.0

Synthesis of Intermediate 95-5

5.13 g (10 mmol) of Intermediate 95-4 was dissolved in 20 mL of acetic acid/HCl (4/1), followed by stirring at a temperature of 60° C. for 6 hours. Once the reaction solution was cooled to room temperature, 10 g of sodium hydroxide dissolved in 20 mL of water was added thereto. Then, an extraction process was performed thereon by utilizing 60 mL of water and 60 mL of dichloromethane three times. The resulting organic layer was dried by utilizing anhydrous $MgSO_4$. A solvent was then removed therefrom by evaporation. The resulting residue was separated and purified through silica gel chromatography to thereby obtain 3.47 g of Intermediate 95-5 (yield: 70%). The resulting compound was identified by LC-MS. $C_{36}H_{27}Cl$: $M^+$ 495.0

Synthesis of Intermediate 95-6

4.95 g (10.0 mmol) of Intermediate 95-5, 1.40 g (15 mmol) of aniline, 0.46 g (0.5 mmol) of tris(dibenzylideneacetone)dipalladium(0) ($Pd_2dba_3$), 0.24 g (1 mmol) of $P(t-Bu)_3$, and 2.88 g (30 mmol) of sodium tert-butoxide were dissolved in 60 mL of toluene, followed by stirring at a temperature of 80° C. for 3 hours. The reaction solution was allowed to come to room temperature. Then, 40 mL of water was added thereto, and an extraction process was performed three times thereon by utilizing 50 mL of ethyl ether. The collected ethyl ether phase was dried utilizing anhydrous $MgSO_4$, and a solvent was evaporated therefrom to obtain a residue. The resulting residue was separated and purified through silica gel column chromatography to thereby obtain 4.13 g of Intermediate 95-6 (yield: 75%). The resulting compound was identified by LC-MS. $C_{42}H_{33}N$: $M^+$ 551.7

Synthesis of Compound 95

5.52 g (10.0 mmol) of Intermediate 95-6, 2.07 g (10 mmol) of 2-bromonaphthalene, 0.46 g (0.5 mmol) of tris (dibenzylideneacetone)dipalladium(0) ($Pd_2dba_3$), 0.24 g (1 mmol) of $P(t-Bu)_3$, and 2.88 g (30 mmol) of sodium tert-butoxide were dissolved in 60 mL of toluene, followed by stirring at a temperature of 80° C. for 3 hours. The reaction solution was allowed to come to room temperature. Then, 40 mL of water was added thereto, and an extraction process was performed three times thereon by utilizing 50 mL of ethyl ether. The collected ethyl ether phase was dried utilizing anhydrous $MgSO_4$, and a solvent was evaporated therefrom to obtain a residue. The resulting residue was separated and purified through silica gel column chromatography to thereby obtain 4.41 g of Compound 95 (yield: 65%). The obtained compound was identified by MS/FAB and $^1H$ NMR.

Synthesis Example of Compound 99

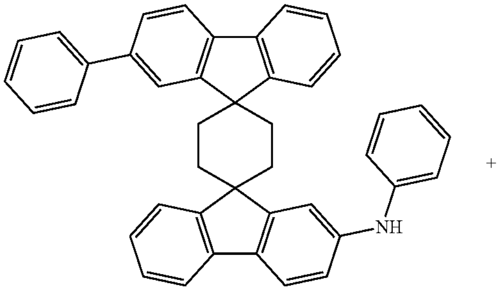

95-6

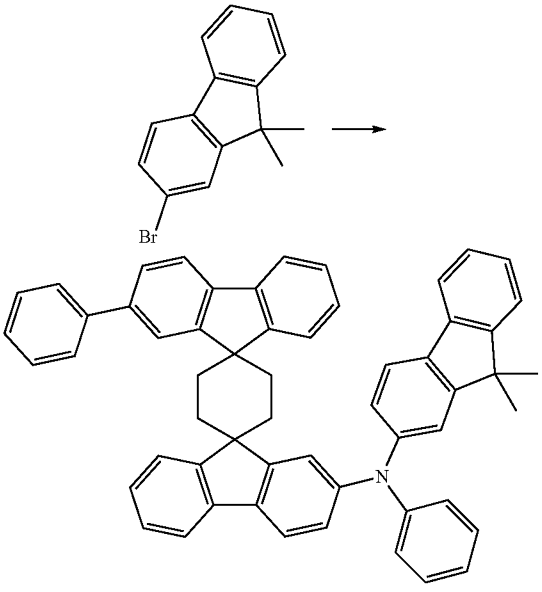

compound 99

Compound 99 was synthesized in substantially the same manner as in Synthesis of Compound 95, except that 2-bromo-9,9-dimethyl-9H-fluorene was utilized instead of 2-bromonaphthalene. The obtained compound was identified by MS/FAB and $^1H$ NMR.

Synthesis Example 10

Synthesis of Compound 117

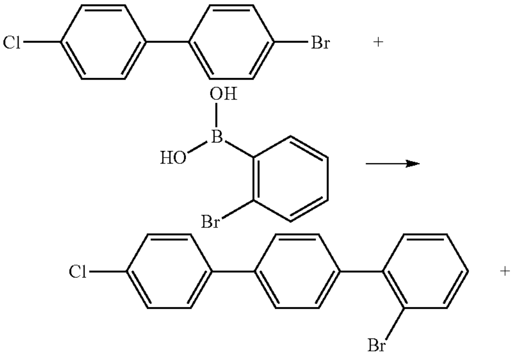

117-1

-continued

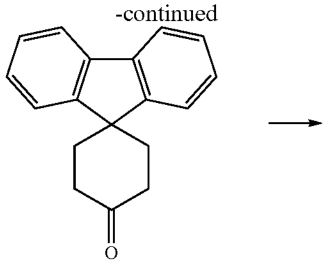

4-2

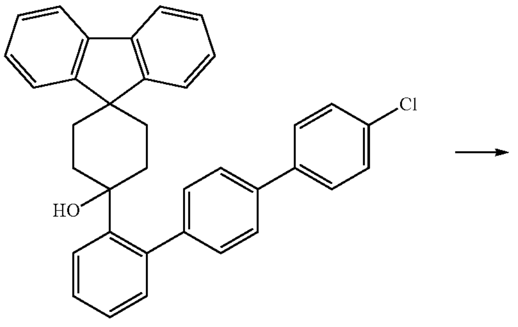

117-2

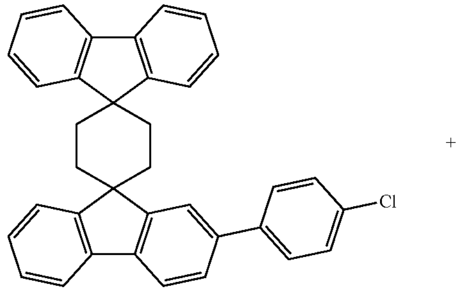

117-3

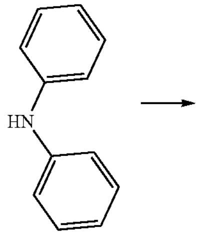

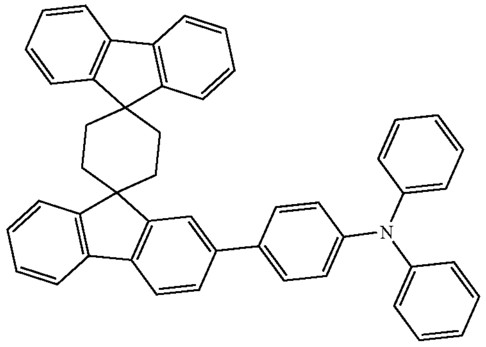

compound 117

Synthesis of Intermediate 117-1

2.01 g (10.0 mmol) of 2-bromophenylboronic acid, 3.22 g (12.0 mmol) of 4-bromo-4'-chloro-1,1'-biphenyl, 0.58 g (0.5 mmol) of $Pd(PPh_3)_4$, and 4.14 g (30.0 mmol) of $K_2CO_3$ were dissolved in 60 mL of a mixture solution of $THF/H_2O$ (2/1). Then, the mixture was stirred at a temperature of 80° C. for 16 hours. The reaction solution was cooled to room temperature, and then an extraction process was performed thereon three times by utilizing 60 mL of water and 60 mL of diethyl ether. The collected ethyl ether phase was dried utilizing anhydrous $MgSO_4$, and a solvent was evaporated therefrom to obtain a residue. The resulting residue was separated and purified through silica gel column chromatography to thereby obtain 2.06 g of Intermediate 117-1 (yield: 60%). The resulting compound was identified by LC-MS. $C_{18}H_{12}BrCl$: $M^+$ 343.6

Synthesis of Intermediate 117-2

3.44 g (10 mmol) of Intermediate 117-1 was dissolved in 30 mL of THF, and then 4 mL of n-BuLi (2.5 M in hexane) was added thereto at −78° C. 1 hour after the addition, at the same temperature, 2.73 g (11 mmol) of Intermediate 4-2 dissolved in 30 mL of THF was added thereto. The reaction solution was stirred at room temperature for 5 hours, and distilled water was added thereto. Then, an extraction process was performed three times by utilizing 50 mL of ethyl ether. The collected ethyl ether phase was dried utilizing anhydrous $MgSO_4$, and a solvent was evaporated therefrom to obtain a residue. The resulting residue was separated and purified through silica gel column chromatography to thereby obtain 2.57 g of Intermediate 117-2 (yield: 50%). The resulting compound was identified by LC-MS. $C_{36}H_{29}ClO$: $M^+$ 513.0

Synthesis of Intermediate 117-3

5.13 g (10 mmol) of Intermediate 117-2 was dissolved in 20 mL of acetic acid/HCl (4/1), followed by stirring at a temperature of 60° C. for 6 hours. Once the reaction solution was cooled to room temperature, 10 g of sodium hydroxide dissolved in 20 mL of water was added thereto. Then, an extraction process was performed thereon by utilizing 60 mL of water and 60 mL of dichloromethane three times. The resulting organic layer was dried by utilizing anhydrous $MgSO_4$. A solvent was then removed therefrom by evaporation. The resulting residue was separated and purified through silica gel chromatography to thereby obtain 3.47 g of Intermediate 117-3 (yield: 70%). The resulting compound was identified by LC-MS. $C_{36}H_{27}Cl$: $M^+$ 495.0

Synthesis of Compound 117

4.95 g (10.0 mmol) of Intermediate 117-3, 1.69 g (10 mmol) of diphenylamine, 0.46 g (0.5 mmol) of tris(dibenzylideneacetone)dipalladium(0) ($Pd_2dba_3$), 0.24 g (1 mmol) of $P(t-Bu)_3$, and 2.88 g (30 mmol) of sodium tert-butoxide were dissolved in 60 mL of toluene, followed by stirring at a temperature of 80° C. for 3 hours. The reaction solution was allowed to come to room temperature. Then, 40 mL of water was added thereto, and an extraction process was performed three times thereon by utilizing 50 mL of ethyl ether. The collected ethyl ether phase was dried utilizing anhydrous $MgSO_4$, and a solvent was evaporated therefrom to obtain a residue. The resulting residue was separated and purified through silica gel column chromatography to thereby obtain 4.08 g of Compound 117 (yield: 65%). The obtained compound was identified by MS/FAB and $^1H$ NMR.

The results of MS/FAB and $^1H$ NMR of Example Compounds are shown in Table 1.

TABLE 1

| Compound | $^1H$ NMR ($CDCl_3$, 400 MHz) | MS/FAB found | MS/FAB calc. |
|---|---|---|---|
| Compound 4 | 8.10(d, 1H), 7.90-7.86(m, 4H), 7.55(m, 3H), 7.43-7.00(m, 21H), 2.15-1.90(m, 8H) | 627.29 | 627.25 |

TABLE 1-continued

| Compound | $^1$H NMR ($CDCl_3$, 400 MHz) | MS/FAB found | MS/FAB calc. |
|---|---|---|---|
| Compound 11 | 7.90-7.86(m, 6H), 7.55-7.54(m, 4H), 7.38-7.00(m, 17H), 2.15-1.90(m, 8H), 1.69(s, 6H) | 667.32 | 667.37 |
| Compound 14 | 8.10(d, 1H), 7.90-7.86(m, 6H), 7.55-7.54(m, 4H), 7.43-7.28(m, 15H), 7.16-7.08 (m, 5H), 2.15-1.90(m, 8H), 1.69(s, 6H) | 743.36 | 743.34 |
| Compound 19 | 7.98-7.80(m, 7H), 7.55-7.54(m, 4H), 7.39-7.00(m, 15H), 6.91 (d, 1H), 2.15-1.90 (m, 8H) | 641.27 | 641.27 |
| Compound 27 | 7.90-7.86(m, 5H), 7.55-7.54(m, 4H), 7.38-7.00(m, 18H), 2.15-1.90(m, 8H), 1.69(s, 6H) | 667.32 | 667.36 |
| Compound 63 | 8.22-8.15(m, 2H), 7.90-7.81(m, 5H), 7.63-7.49(m, 7H), 7.38-7.00(m, 13H), 2.15-1.90(m, 8H) | 601.28 | 601.25 |
| Compound 79 | 8.45(d, 1H), 7.93-7.71 (m, 9H), 7.56-7.28 (m, 17H), 7.16-7.11(m, 2H), 2.15-1.90(m, 8H) | 707.26 | 707.29 |
| Compound 95 | 8.09(d, 1H), 7.90-7.71 (m, 9H), 7.55-7.00(m, 21H), 2.15-1.90(m, 8H) | 677.31 | 677.38 |
| Compound 99 | 8.09(d, 1H), 7.90-7.86(m, 6H), 7.78-7.75(m, 3H), 7.55-7.00(m, 21H), 2.15-1.90(m, 8H), 1.69(s, 6H) | 743.36 | 743.34 |
| Compound 117 | 8.09(d, 1H), 7.90-7.89(m, 4H), 7.78(d, 1H), 7.55-7.54(m, 5H), 7.38-7.24(m, 12H), 7.08-7.00(m, 6H), 2.15-1.90(m, 8H) | 627.29 | 627.22 |

Example 1

As an anode, a 15 Ohms per square centimeter (Ω/cm$^2$) (1,200 Å) ITO glass substrate (available from Corning Co., Ltd) was cut to a size of 50 millimeters (mm)×50 mm×0.7 mm, sonicated in isopropyl alcohol and pure water for 5 minutes each, cleaned with ultraviolet rays for 30 minutes, and then with ozone, and the anode was mounted in a vacuum deposition apparatus.

2-TNATA was vacuum-deposited on the anode to form a hole injection layer having a thickness of 600 Å. Compound 4 was then vacuum-deposited on the hole injection layer to form a hole transport layer having a thickness of 200 Å.

9,10-di(naphthalen-2-yl)anthracene (DNA (or AND)) and 4,4'-bis[2-(4-(N,N-diphenylamino)phenyl)vinyl]biphenyl (DPAVBi) were co-deposited on the hole transport layer at a weight ratio of 98:2 to form an emission layer having a thickness of 300 Å.

Then, $Alq_3$ was deposited on the emission layer to form an electron transport layer having a thickness of 300 Å. LiF was deposited on the electron transport layer to form an electron injection layer having a thickness of 10 Å. Al was deposited on the electron injection layer to form a cathode having a thickness of 3,000 Å. Accordingly, an organic light-emitting device having a structure of ITO (1,200 Å)/2-TNATA (600 Å)/Compound 4 (200 Å)/DNA (98 wt %)+DPAVBi (2 wt %) (300 Å)/$Alq_3$ (300 Å)/LiF (10 Å)/Al (3,000 Å) was prepared.

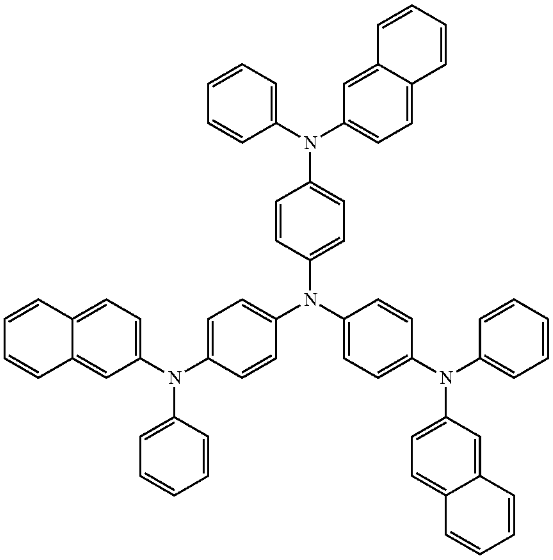

2-TNATA

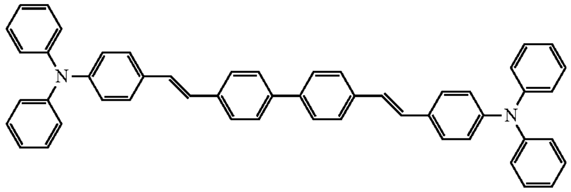

DPAVBi

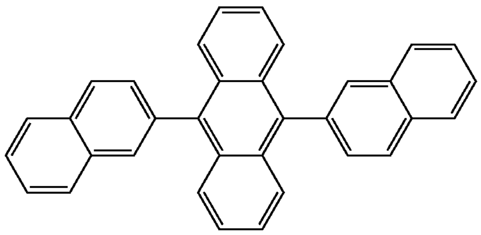

DNA

Examples 2 to 10 and Comparative Examples 1 to 4

Organic light-emitting devices were manufactured in substantially the same manner as in Example 1, except that the compounds shown in Table 2 were utilized instead of Compound 4 in forming each hole transport layer before forming the emission layer.

Evaluation Example 1

The driving voltage (V), luminescence efficiency (Cd/A), maximum value (%) of the external quantum efficiency (EQE), and emission color of the organic light-emitting devices of Examples 1 to 10 and Comparative Examples 1 to 4 at 1,000 cd/m$^2$ were measured by utilizing Keithley SMU236 and luminance meter PR650. The results thereof are shown in Table 2.

TABLE 2

| No. | Hole transporting material | Driving voltage (V) | Current density (mA/cm²) | Luminance (cd/m²) | Luminescence Efficiency (cd/A) | Emission color | Half-life (hr @100 mA/cm²) |
|---|---|---|---|---|---|---|---|
| Example 1 | Compound 4 | 5.15 | 50 | 3165 | 6.33 | Blue | 590 |
| Example 2 | Compound 11 | 5.12 | 50 | 3175 | 6.35 | Blue | 610 |
| Example 3 | Compound 14 | 5.15 | 50 | 3110 | 6.22 | Blue | 650 |
| Example 4 | Compound 19 | 5.12 | 50 | 3175 | 6.35 | Blue | 450 |
| Example 5 | Compound 27 | 5.11 | 50 | 3160 | 6.32 | Blue | 660 |
| Example 6 | Compound 63 | 5.12 | 50 | 3165 | 6.33 | Blue | 630 |
| Example 7 | Compound 79 | 5.15 | 50 | 3250 | 6.50 | Blue | 590 |
| Example 8 | Compound 95 | 5.05 | 50 | 3125 | 6.25 | Blue | 650 |
| Example 9 | Compound 99 | 5.03 | 50 | 3225 | 6.45 | Blue | 660 |
| Example 10 | Compound 117 | 5.20 | 50 | 3260 | 6.52 | Blue | 680 |
| Comparative Example 1 | NPB | 7.01 | 50 | 2645 | 5.29 | Blue | 258 |
| Comparative Example 2 | HT2 | 5.52 | 50 | 2950 | 5.90 | Blue | 450 |
| Comparative Example 3 | A | 5.86 | 50 | 2850 | 5.70 | Blue | 460 |
| Comparative Example 4 | B | 5.95 | 50 | 2790 | 5.58 | Blue | 450 |

4

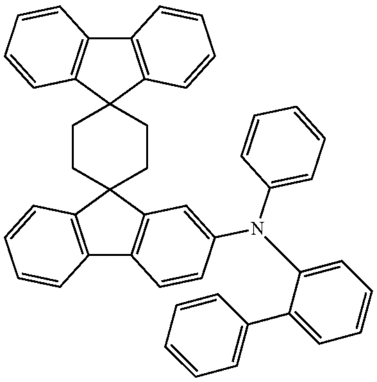

11

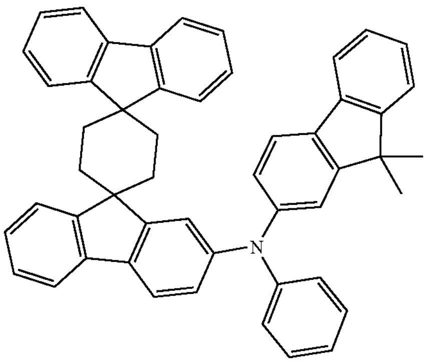

-continued

14

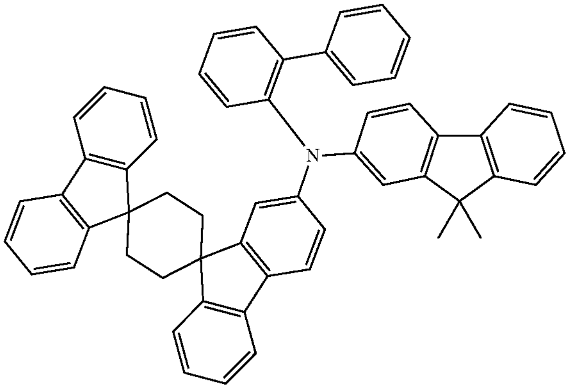

19

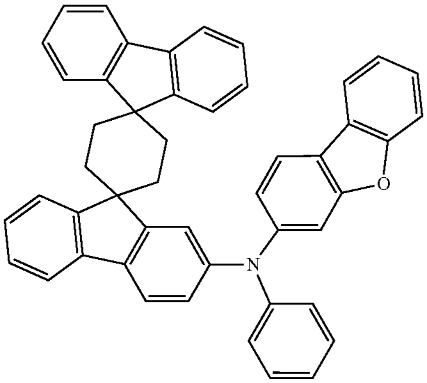

-continued
27
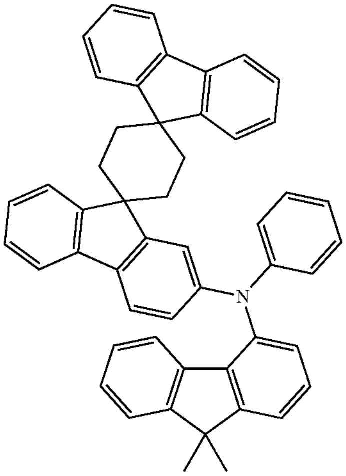
63
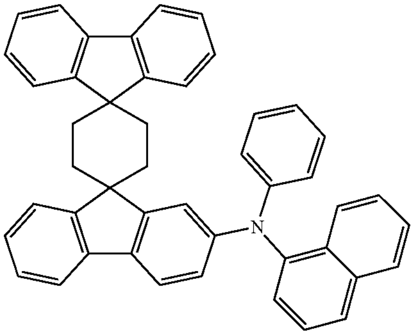
79
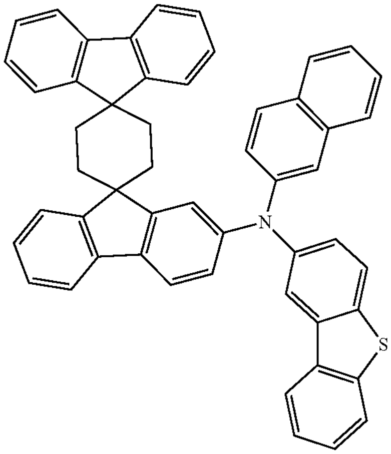
95
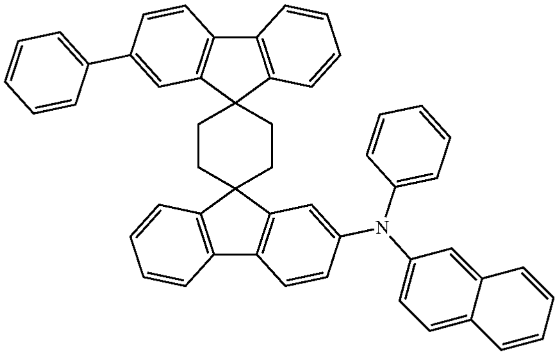
-continued
99
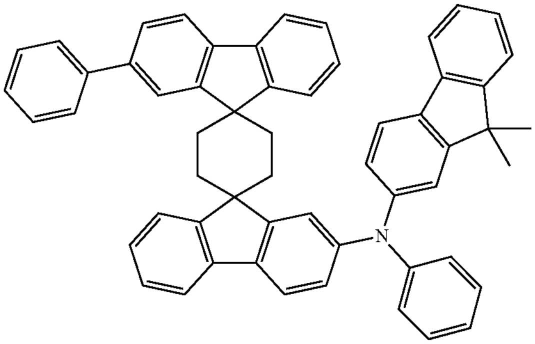
117
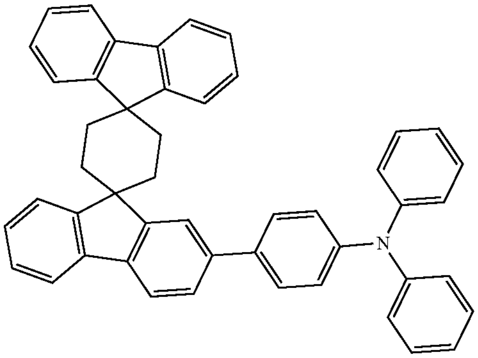
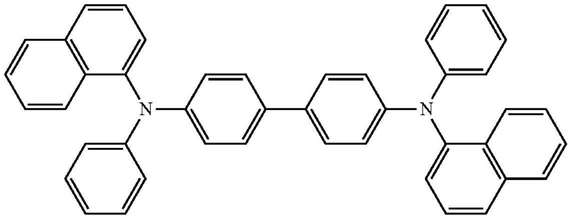
NPB
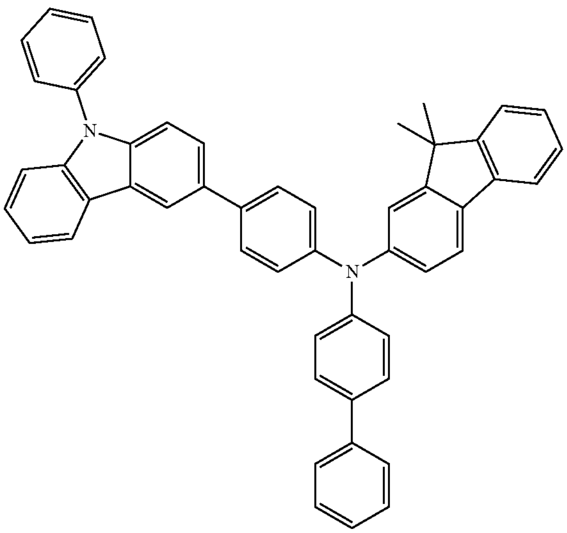
HT2

-continued

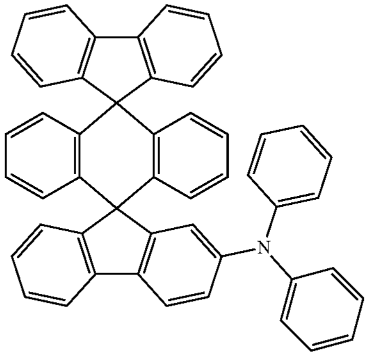

A

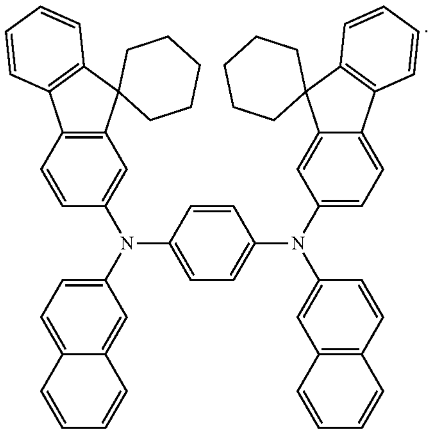

B

Referring to the results of Table 2, the organic light-emitting devices of Examples 1 to 10 were found to have improved driving voltage, luminescence efficiency, and external quantum efficiency, while emitting dark blue light, as compared with the organic light-emitting devices of Comparative Examples 1 to 4.

As apparent from the foregoing description, when the light-emitting device according to embodiments include the heterocyclic compound represented by Formula 1, the light-emitting device may have excellent or suitable driving voltage, excellent or suitable luminescence efficiency, and excellent or suitable external quantum efficiency. Thus, a high-quality electronic apparatus may be manufactured by utilizing the light-emitting device.

Expressions such as "at least one of" or "at least one selected from" when preceding a list of elements, modify the entire list of elements and do not modify the individual elements of the list. Further, the use of "may" when describing embodiments of the present invention refers to "one or more embodiments of the present invention." It will be understood that when an element or layer is referred to as being "on", "connected to", "coupled to", or "adjacent to" another element or layer, it can be directly on, connected to, coupled to, or adjacent to the other element or layer, or one or more intervening elements or layers may be present. In contrast, when an element or layer is referred to as being "directly on," "directly connected to", "directly coupled to", or "immediately adjacent to" another element or layer, there are no intervening elements or layers present. As used herein, the term "substantially," "about," and similar terms are used as terms of approximation and not as terms of degree, and are intended to account for the inherent deviations in measured or calculated values that would be recognized by those of ordinary skill in the art. Moreover, any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein.

The electronic apparatus and/or any other relevant devices or components according to embodiments of the present invention described herein may be implemented utilizing any suitable hardware, firmware (e.g. an application-specific integrated circuit), software, or a combination of software, firmware, and hardware. For example, the various components of the apparatus may be formed on one integrated circuit (IC) chip or on separate IC chips. Further, the various components of the apparatus may be implemented on a flexible printed circuit film, a tape carrier package (TCP), a printed circuit board (PCB), or formed on one substrate. Further, the various components of the apparatus may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the scope of the embodiments.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the drawings, it will be understood by those of ordinary skill in the art that one or more suitable changes in form and details may be made therein without departing from the spirit and scope as defined by the claims and equivalents thereof.

What is claimed is:

1. A light-emitting device comprising:

a first electrode;

a second electrode facing the first electrode;

an interlayer between the first electrode and the second electrode, the interlayer comprising an emission layer; and a heterocyclic compound represented by Formula 1:

Formula 1

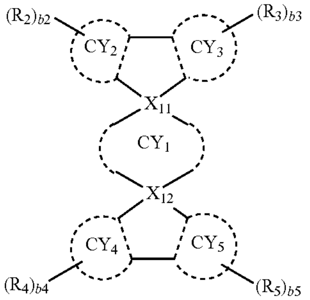

Formula 2

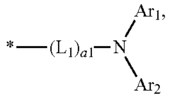

wherein, in Formulae 1 and 2, $X_{11}$ and $X_{12}$ are each independently C or Si, ring $CY_1$ is a 5-membered to 10-membered saturated cyclic group unsubstituted or substituted with $R_{10a}$, ring $CY_2$ to ring $CY_5$ are each independently a $C_3$-$C_{60}$ carbocyclic group or a $C_1$-$C_{60}$ heterocyclic group, $L_1$ is a single bond, a $C_5$-$C_{30}$ carbocyclic group unsubstituted or substituted with at least one $R_{10a}$, or a $C_1$-$C_{30}$ heterocyclic group unsubstituted or substituted with at least one $R_{10a}$, a1 is an integer from 0 to 3, $R_2$ to $R_5$, $Ar_1$, and $Ar_2$ are each independently a group represented by Formula 2, hydrogen, deuterium, —F, —Cl, —Br, —I, a hydroxyl group, a cyano group, a nitro group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, a $C_6$-$C_{60}$ aryloxy group unsubstituted or substituted with at least one $R_{10a}$, a $C_6$-$C_{60}$ arylthio group unsubstituted or substituted with at least one $R_{10a}$, a $C_7$-$C_{60}$ aryl alkyl group unsubstituted or substituted with at least one $R_{10a}$, a $C_2$-$C_{60}$ heteroaryl alkyl group unsubstituted or substituted with at least one $R_{10a}$, —$Si(Q_1)(Q_2)(Q_3)$, —$N(Q_1)(Q_2)$, —$B(Q_1)(Q_2)$, —$C(=O)(Q_1)$, —$S(=O)_2(Q_1)$, or —$P(=O)(Q_1)(Q_2)$, wherein at least one selected from $R_2$ to $R_5$ is a group represented by Formula 2, each of $Ar_1$ and $Ar_2$ is not a group represented by Formula 2, b2 to b5 are each independently an integer from 0 to 10,

* indicates a binding site to Formula 1, and $R_{10a}$ is:

deuterium, —F, —Cl, —Br, —I, a hydroxyl group, a cyano group, or a nitro group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each unsubstituted or substituted with deuterium, —F, —Cl, —Br, —I, a hydroxyl group, a cyano group, a nitro group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ aryl alkyl group, a $C_2$-$C_{60}$ heteroaryl alkyl group, —$Si(Q_{11})(Q_{12})(Q_{13})$, —$N(Q_{11})(Q_{12})$, —$B(Q_{11})(Q_{12})$, —$C(=O)(Q_{11})$, —$S(=O)_2(Q_{11})$, —$P(=O)(Q_{11})(Q_{12})$, or any combination thereof;

a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ aryl alkyl group, or a $C_2$-$C_{60}$ heteroaryl alkyl group, each unsubstituted or substituted with deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ aryl alkyl group, a $C_2$-$C_{60}$ heteroaryl alkyl group, —$Si(Q_{21})(Q_{22})(Q_{23})$, —$N(Q_{21})(Q_{22})$, —$B(Q_{21})(Q_{22})$, —$C(=O)(Q_{21})$, —$S(=O)_2(Q_{21})$, —$P(=O)(Q_{21})(Q_{22})$, or any combination thereof; or —$Si(Q_{31})(Q_{32})(Q_{33})$, —$N(Q_{31})(Q_{32})$, —$B(Q_{31})(Q_{32})$, —$C(=O)(Q_{31})$, —$S(=O)_2(Q_{31})$, or —$P(=O)(Q_{31})(Q_{32})$, and wherein $Q_1$ to $Q_3$, $Q_{11}$ to $Q_{13}$, $Q_{21}$ to $Q_{23}$, and $Q_{31}$ to $Q_{33}$ are each independently: hydrogen; deuterium; —F; —Cl; —Br; —I; a hydroxyl group; a cyano group; a nitro group; a $C_1$-$C_{60}$ alkyl group; a $C_2$-$C_{60}$ alkenyl group; a $C_2$-$C_{60}$ alkynyl group; a $C_1$-$C_{60}$ alkoxy group; a $C_3$-$C_{60}$ carbocyclic group or a $C_1$-$C_{60}$ heterocyclic group, each unsubstituted or substituted with deuterium, —F, a cyano group, a $C_1$-$C_{60}$ alkyl group, a $C_1$-$C_{60}$ alkoxy group, a phenyl group, a biphenyl group, or any combination thereof; a $C_7$-$C_{60}$ aryl alkyl group; or a $C_2$-$C_{60}$ heteroaryl alkyl group.

2. The light-emitting device of claim 1, wherein the heterocyclic compound represented by Formula 1 is represented by Formula 1-1:

Formula 1-1

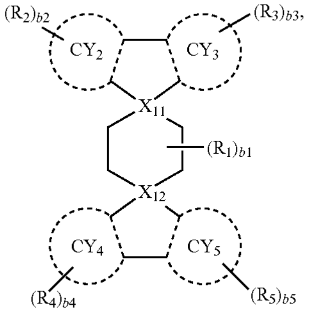

wherein, in Formula 1-1, $X_{11}$, $X_{12}$, $R_2$ to $R_5$, and b2 to b5 are respectively the same as defined in connection with Formula 1, $R_1$ is:

deuterium, —F, —Cl, —Br, —I, a hydroxyl group, a cyano group, or a nitro group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each unsubstituted or substituted with deuterium, —F, —Cl, —Br, —I, a hydroxyl group, a cyano group, a nitro group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ aryl alkyl group, a $C_2$-$C_{60}$ heteroaryl alkyl group, —$Si(Q_{11})(Q_{12})(Q_{13})$, —$N(Q_{11})(Q_{12})$, —$B(Q_{11})(Q_{12})$, —$C(=O)(Q_{11})$, —$S(=O)_2(Q_{11})$, —$P(=O)(Q_{11})(Q_{12})$, or any combination thereof;

a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ aryl alkyl group, or a $C_2$-$C_{60}$ heteroaryl alkyl group, each unsubstituted or substituted with deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ aryl alkyl group, a $C_2$-$C_{60}$ heteroaryl alkyl group, $—Si(Q_{21})(Q_{22})(Q_{23})$, $—N(Q_{21})(Q_{22})$, $—B(Q_{21})(Q_{22})$, $—C(=O)(Q_{21})$, $—S(=O)_2(Q_{21})$, $—P(=O)(Q_{21})(Q_{22})$, or any combination thereof; or $—Si(Q_{31})(Q_{32})(Q_{33})$, $—N(Q_{31})(Q_{32})$, $—B(Q_{31})(Q_{32})$, $—C(=O)(Q_{31})$, $—S(=O)_2(Q_{31})$, or $—P(=O)(Q_{31})(Q_{32})$, and wherein $Q_{11}$ to $Q_{13}$, $Q_{21}$ to $Q_{23}$, and $Q_{31}$ to $Q_{33}$ are each independently: hydrogen; deuterium; —F; —Cl; —Br; —I; a hydroxyl group; a cyano group; a nitro group; a $C_1$-$C_{60}$ alkyl group; a $C_2$-$C_{60}$ alkenyl group; a $C_2$-$C_{60}$ alkynyl group; a $C_1$-$C_{60}$ alkoxy group; a $C_3$-$C_{60}$ carbocyclic group or a $C_1$-$C_{60}$ heterocyclic group, each unsubstituted or substituted with deuterium, —F, a cyano group, a $C_1$-$C_{60}$ alkyl group, a $C_1$-$C_{60}$ alkoxy group, a phenyl group, a biphenyl group, or any combination thereof; a $C_7$-$C_{60}$ aryl alkyl group; or a $C_2$-$C_{60}$ heteroaryl alkyl group, and b1 is an integer from 0 to 4.

3. The light-emitting device of claim 1, wherein ring $CY_2$ to ring $CY_5$ are each a benzene group.

4. The light-emitting device of claim 1, wherein, in Formula 2, $L_1$ is:

a single bond; or a benzene group, a naphthalene group, an anthracene group, a dibenzofuran group, a dibenzothiophene group, a carbazole group, a fluorene group, or a dibenzosilole group, each unsubstituted or substituted with at least one $R_{10a}$.

5. The light-emitting device of claim 1, wherein $R_2$ to $R_5$ are each independently:

a group represented by Formula 2, hydrogen, deuterium, —F, or a cyano group; or a cyclohexyl group, an adamantanyl group, a norbornanyl group, a phenyl group, a naphthyl group, a fluorenyl group, an anthracenyl group, a carbazolyl group, a dibenzofuranyl group, a dibenzothiophenyl group, or a dibenzosilolyl group, each unsubstituted or substituted with deuterium, —F, a cyano group, a $C_1$-$C_{20}$ alkyl group, a $C_1$-$C_{20}$ alkoxy group, a cyclohexyl group, an adamantanyl group, a norbornanyl group, a phenyl group, a naphthyl group, a fluorenyl group, an anthracenyl group, a carbazolyl group, a dibenzofuranyl group, a dibenzothiophenyl group, a dibenzosilolyl group, or any combination thereof.

6. The light-emitting device of claim 1, wherein $R_5$ is a group represented by Formula 2.

7. The light-emitting device of claim 1, wherein $Ar_1$ and $Ar_2$ are each independently:

hydrogen, deuterium, —F, or a cyano group; or a cyclohexyl group, an adamantanyl group, a norbornanyl group, a phenyl group, a naphthyl group, a fluorenyl group, an anthracenyl group, a carbazolyl group, a dibenzofuranyl group, a dibenzothiophenyl group, or a dibenzosilolyl group, each unsubstituted or substituted with deuterium, —F, a cyano group, a $C_1$-$C_{20}$ alkyl group, a $C_1$-$C_{20}$ alkoxy group, a cyclohexyl group, an adamantanyl group, a norbornanyl group, a phenyl group, a naphthyl group, a fluorenyl group, an anthracenyl group, a carbazolyl group, a dibenzofuranyl group, a dibenzothiophenyl group, a dibenzosilolyl group, or any combination thereof.

8. The light-emitting device of claim 1, wherein a group represented by

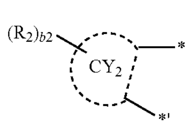

in Formula 1 is represented by one of Formulae CY2-1 to CY2-5:

CY2-1

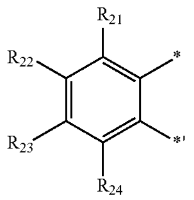

CY2-2

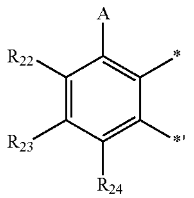

CY2-3

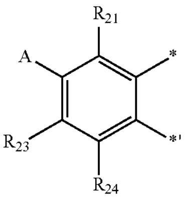

CY2-4

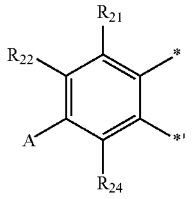

CY2-5

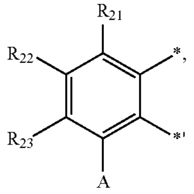

wherein, in Formulae CY2-1 to CY2-5,

A is a group represented by Formula 2, $R_{21}$ to $R_{24}$ are each independently the same as $R_2$ defined in connection with Formula 1, wherein each of $R_{21}$ to $R_{24}$ is not a group represented by Formula 2,

* indicates a binding site to ring $CY_3$ in Formula 1, and

*' indicates a binding site to ring $CY_1$ in Formula 1.

9. The light-emitting device of claim 1, wherein a group represented by

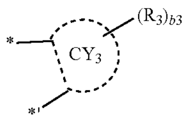

in Formula 1 is represented by one of Formulae CY3-1 to CY3-5:

CY3-1

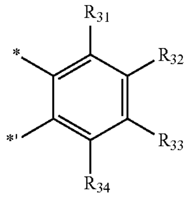

CY3-2

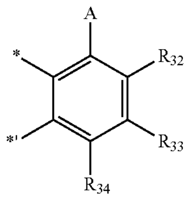

CY3-3

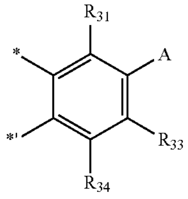

CY3-4

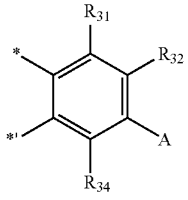

CY3-5

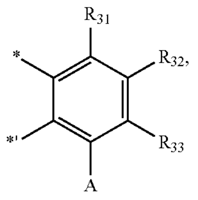

wherein, in Formulae CY3-1 to CY3-5,

A is a group represented by Formula 2, $R_{31}$ to $R_{34}$ are each independently the same as $R_3$ defined in connection with Formula 1, wherein each of $R_{31}$ to $R_{34}$ is not a group represented by Formula 2,

* indicates a binding site to ring $CY_2$ in Formula 1, and

*' indicates a binding site to ring $CY_1$ in Formula 1.

10. The light-emitting device of claim 1, wherein a group represented by

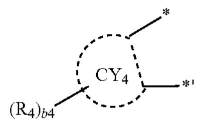

in Formula 1 is represented by one of Formulae CY4-1 to CY4-5:

CY4-1

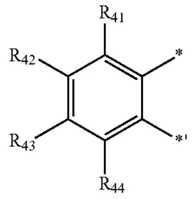

CY4-2

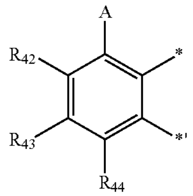

CY4-3

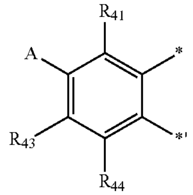

CY4-4

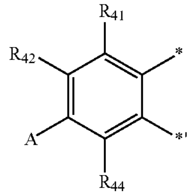

CY4-5

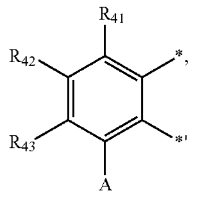

wherein, in Formulae CY4-1 to CY4-5,

A is a group represented by Formula 2, $R_{41}$ to $R_{44}$ are each independently the same as $R_4$ defined in connection with Formula 1, wherein each of $R_{41}$ to $R_{44}$ is not a group represented by Formula 2,

* indicates a binding site to ring $CY_1$ in Formula 1, and

*' indicates a binding site to ring $CY_5$ in Formula 1.

11. The light-emitting device of claim 1, wherein a group represented by

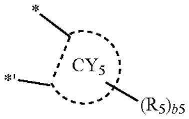

in Formula 1 is represented by one of Formulae CY5-1 to CY5-4:

CY5-1

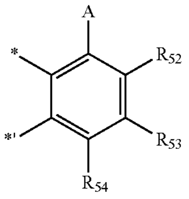

CY5-2

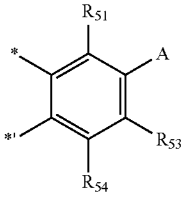

CY5-3

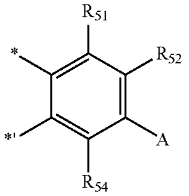

CY5-4

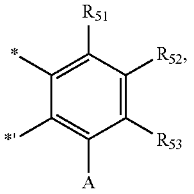

wherein, in Formulae CY5-1 to CY5-4,

A is a group represented by Formula 2, $R_{51}$ to $R_{54}$ are each independently the same as $R_5$ defined in connection with Formula 1, wherein each of $R_{51}$ to $R_{54}$ is not a group represented by Formula 2,

* indicates a binding site to ring $CY_1$ in Formula 1, and

*' indicates a binding site to ring $CY_4$ in Formula 1.

12. The light-emitting device of claim 1, wherein the heterocyclic compound represented by Formula 1 is selected from Compounds 1 to 147:

1

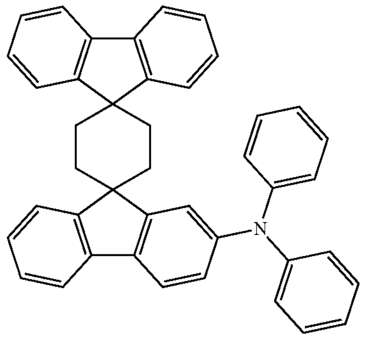

2

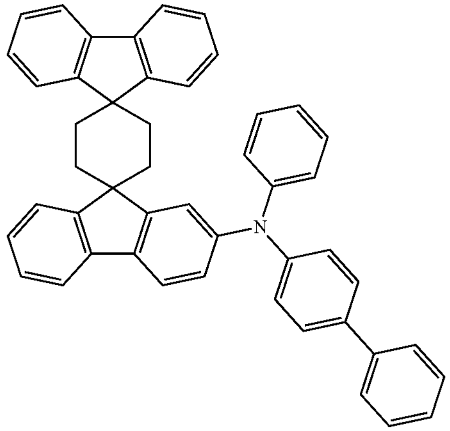

3

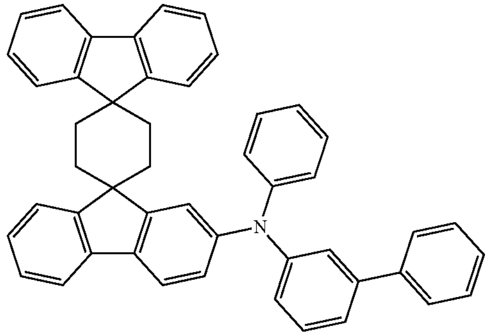

4

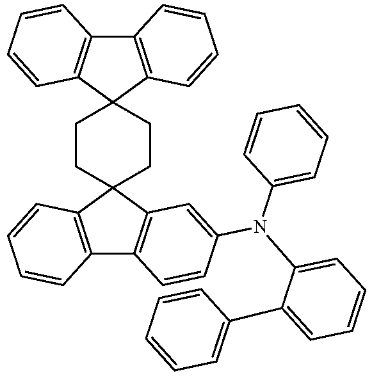

-continued
5
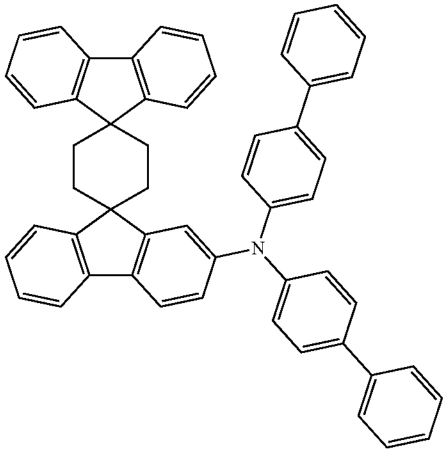
6
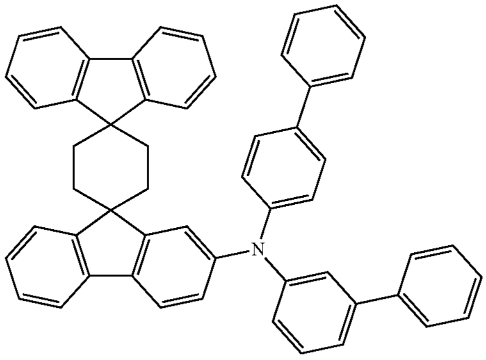
7
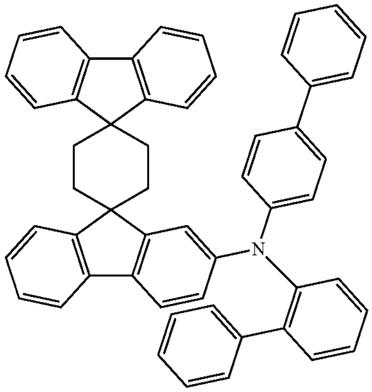
8
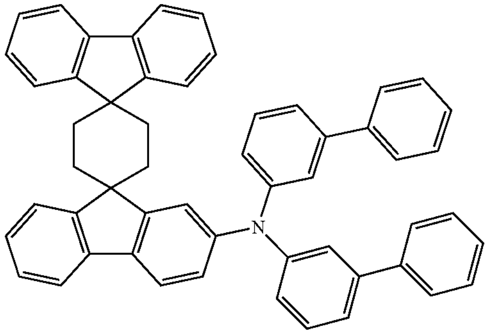
-continued
9
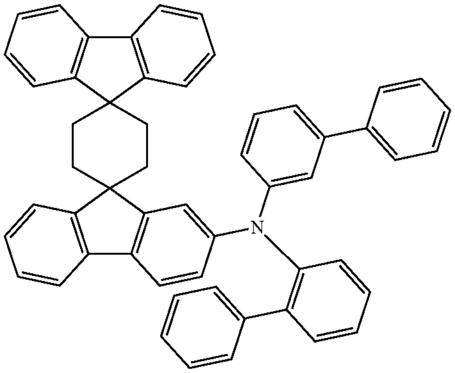
10
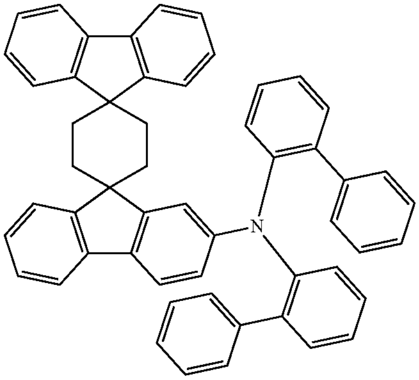
11
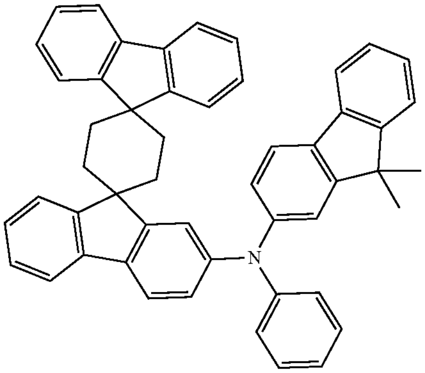
12
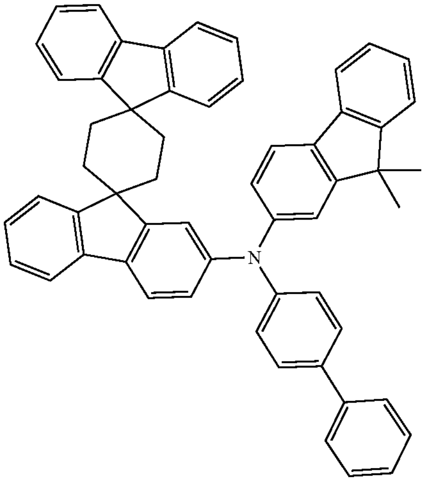

-continued
13
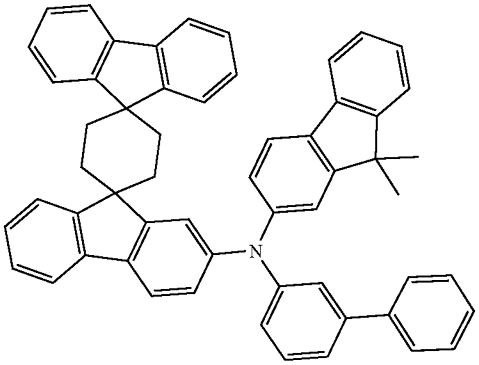
14
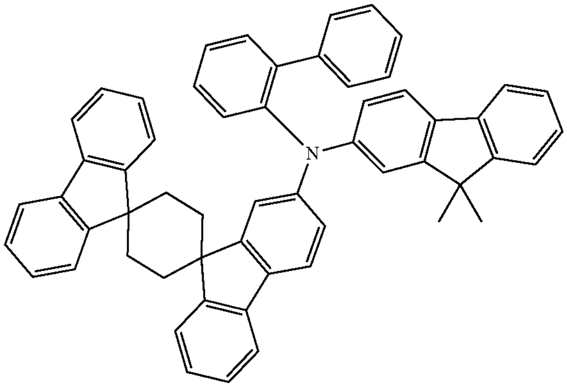
15
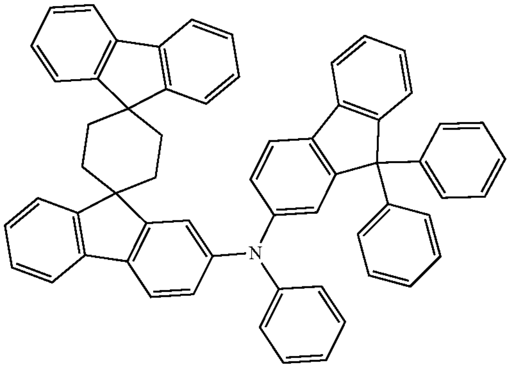
-continued
16
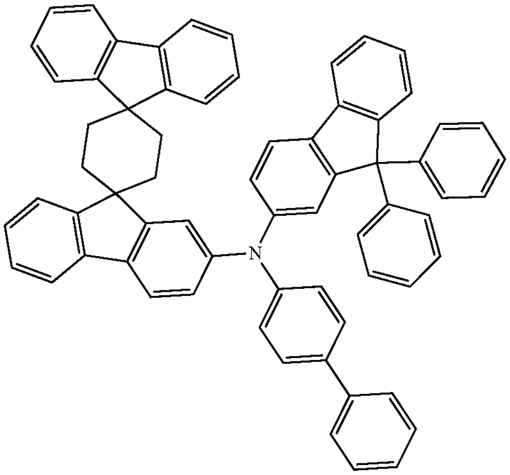
17
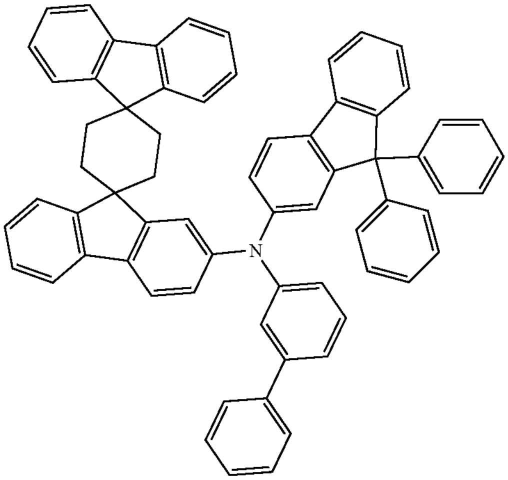
18
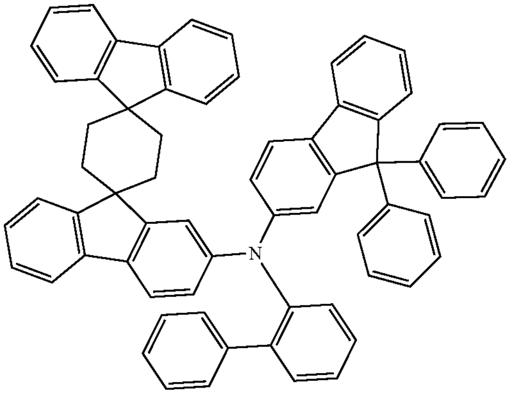

-continued
19
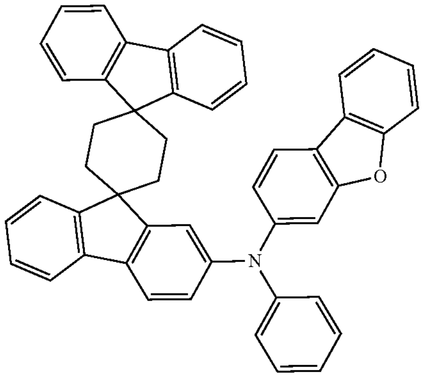
20
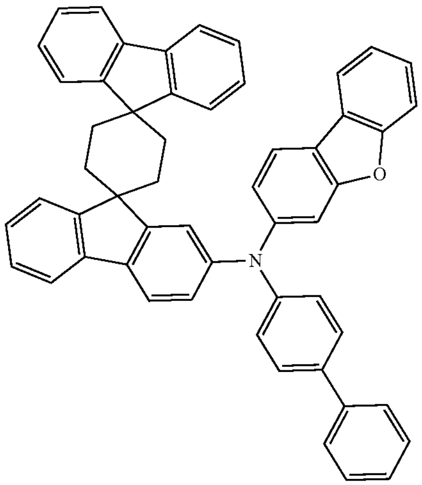
21
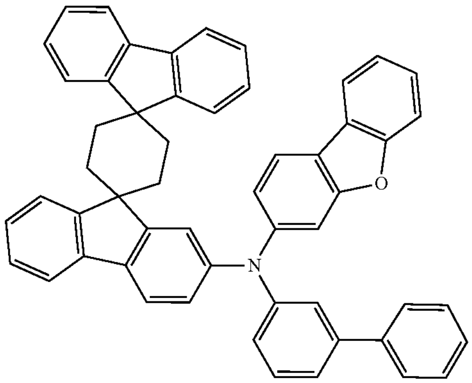
22
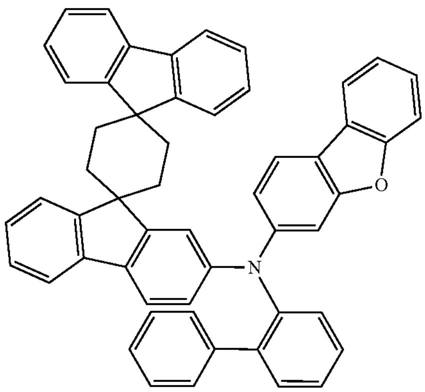
-continued
23
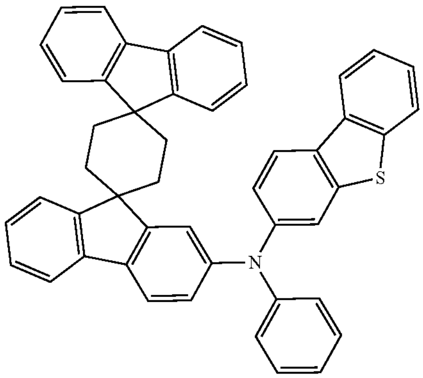
24
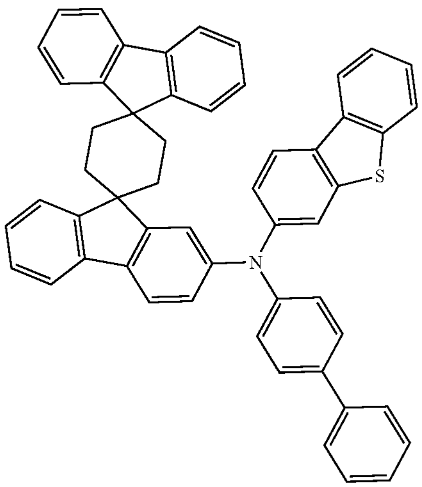
25
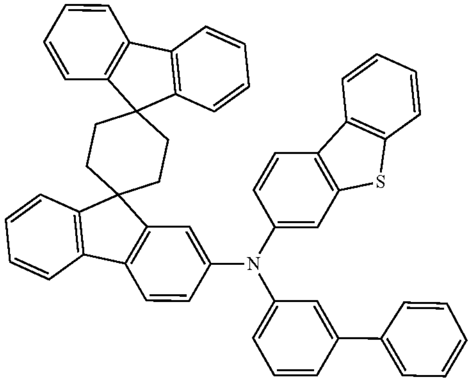
26
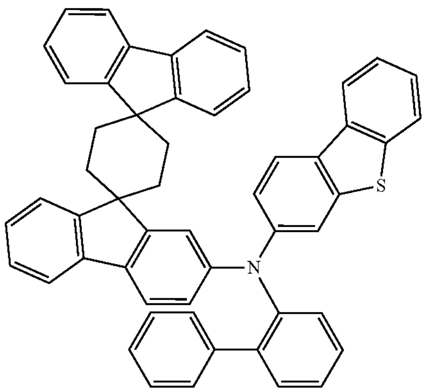

-continued
27
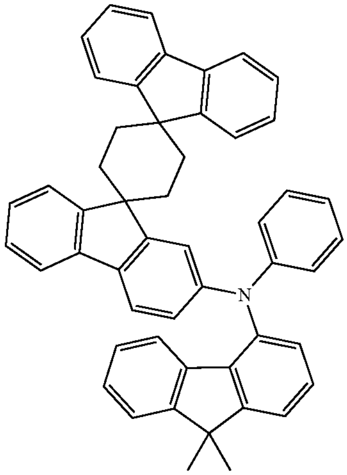
28
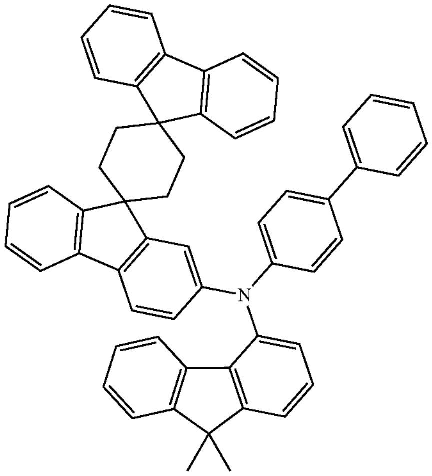
29
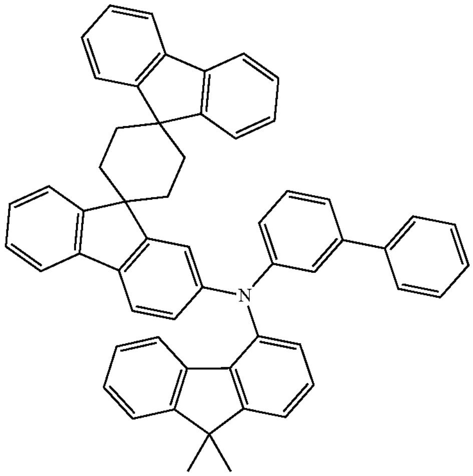
-continued
30
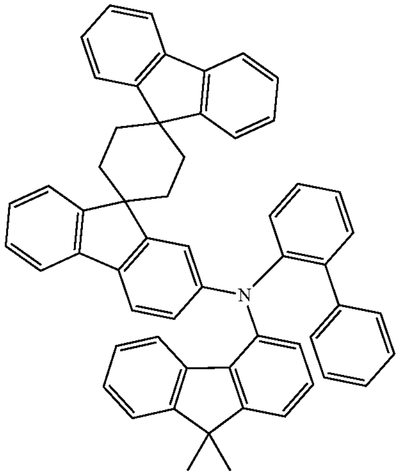
31
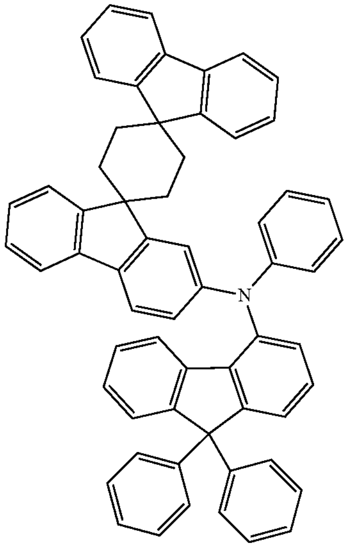
32
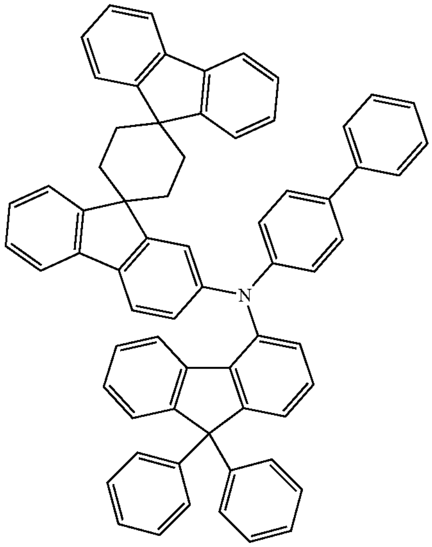

-continued
33
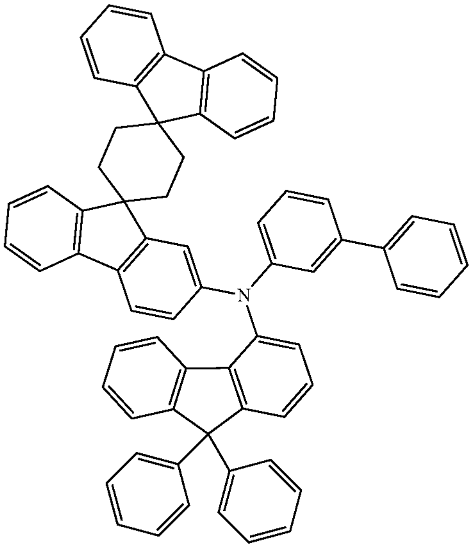
34
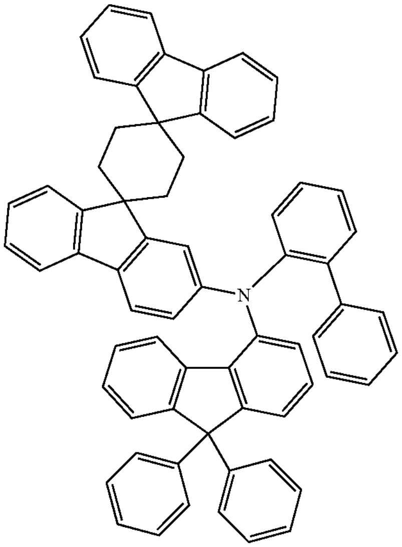
35
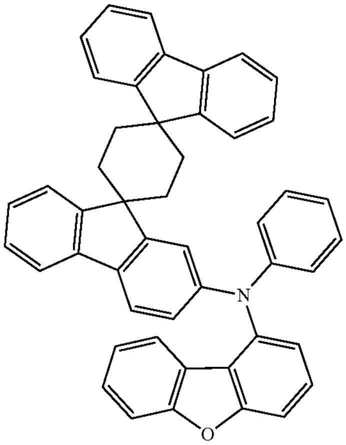
-continued
36
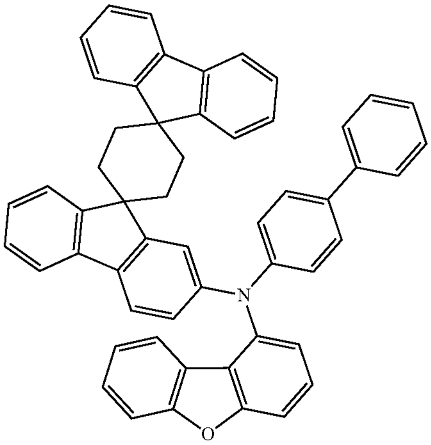
37
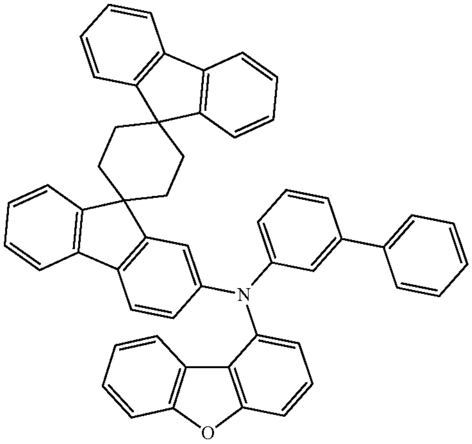
38
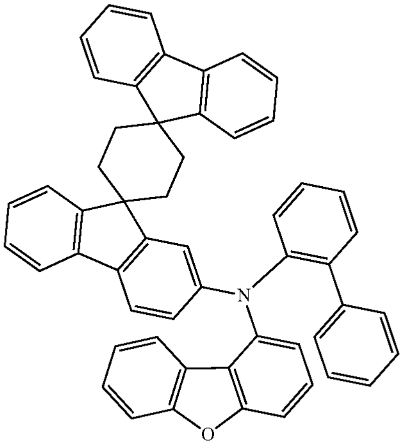

-continued
39
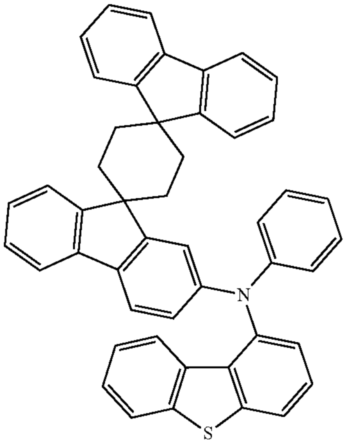
40
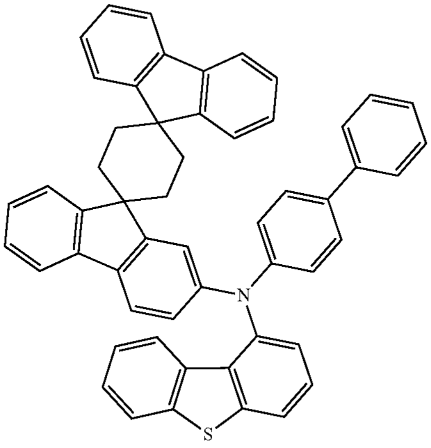
41
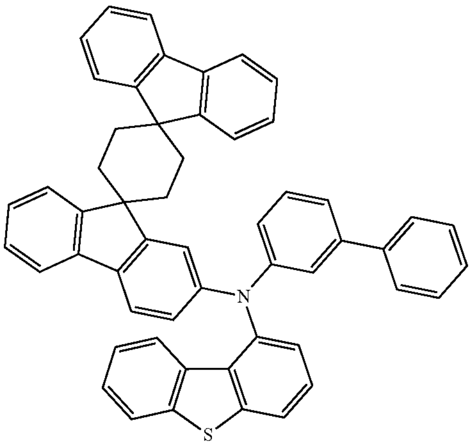
-continued
42
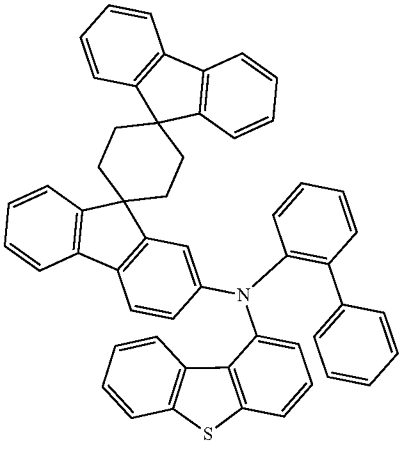
43
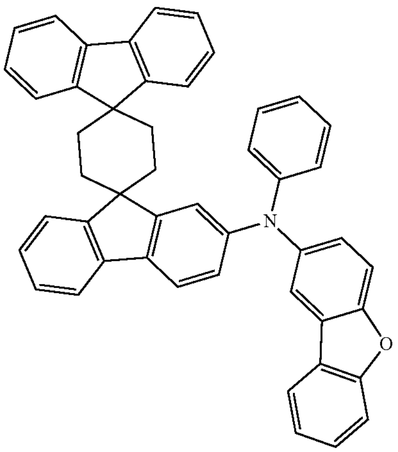
44
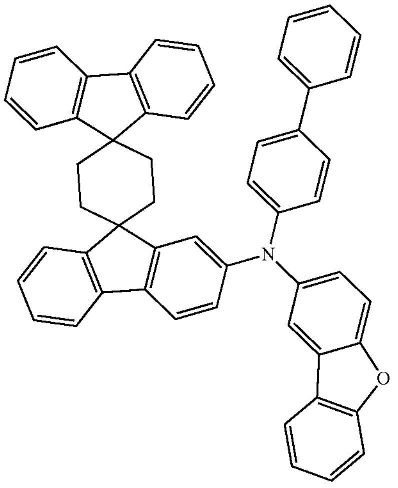

-continued
45
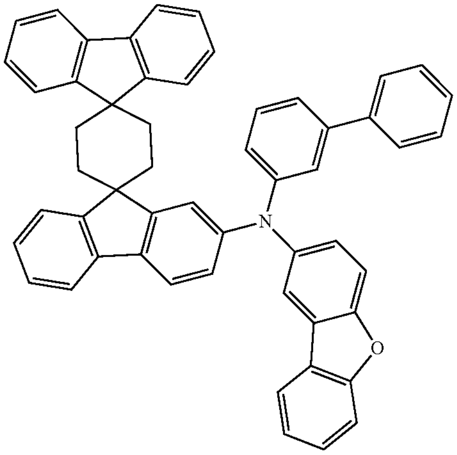
46
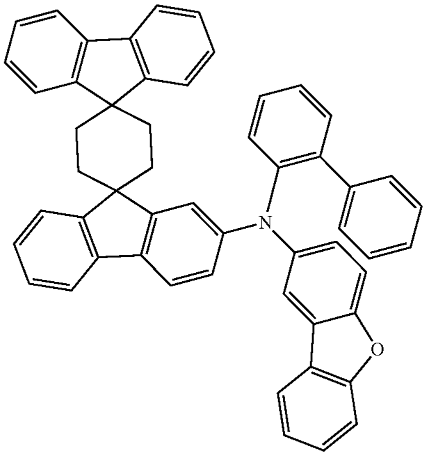
47
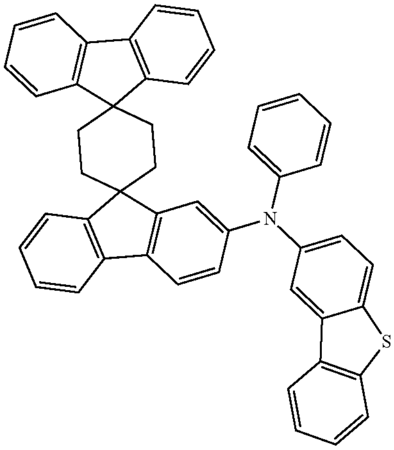
-continued
48
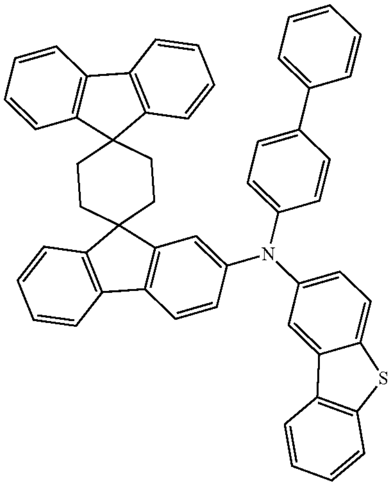
49
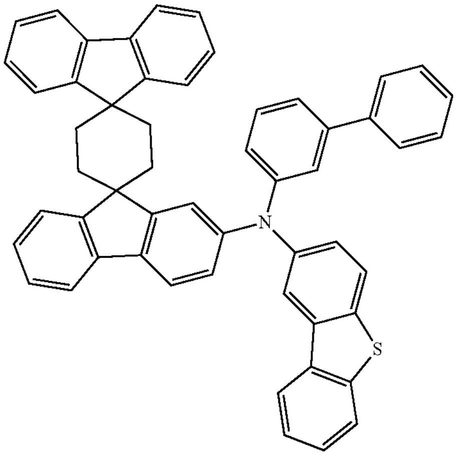
50
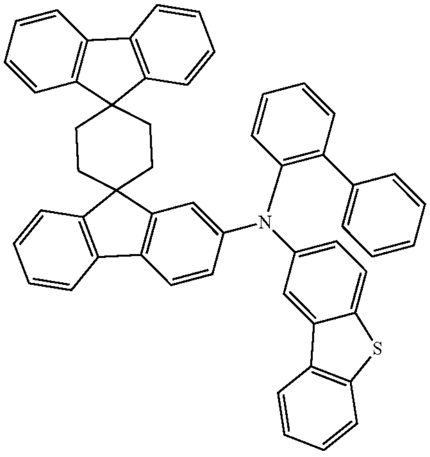

-continued
51
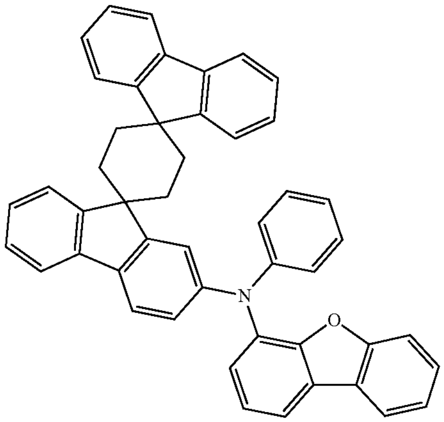
52
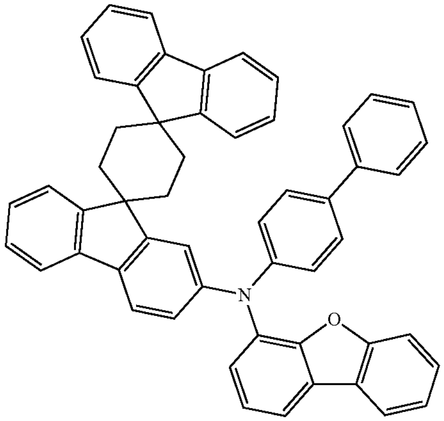
53
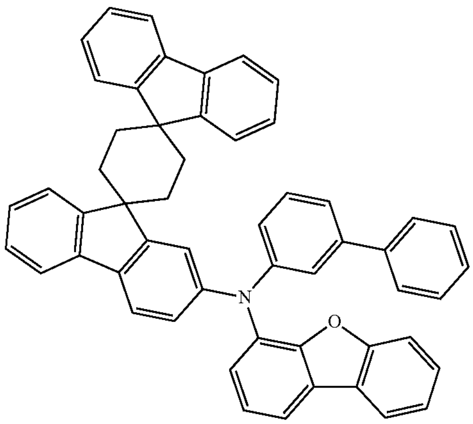
-continued
54
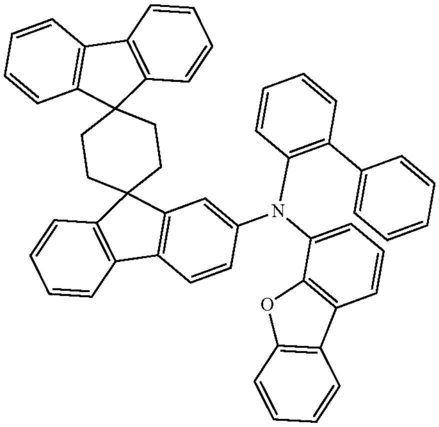
55
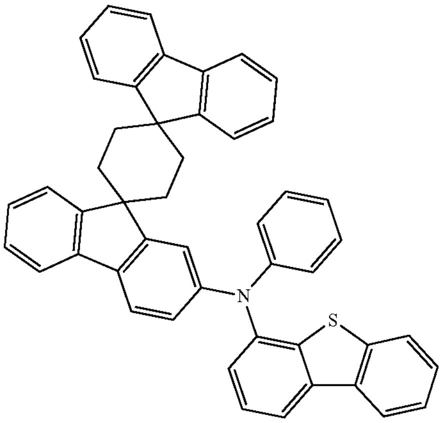
56
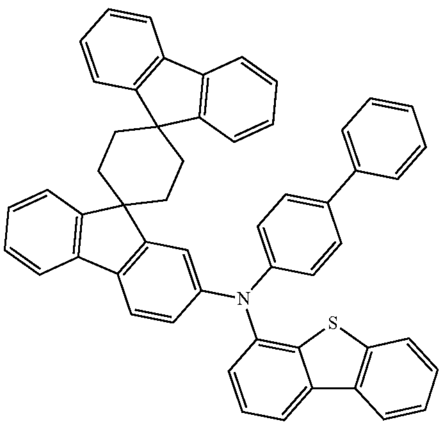

-continued
57
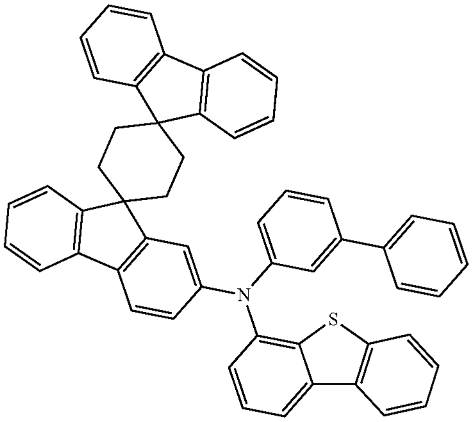
58
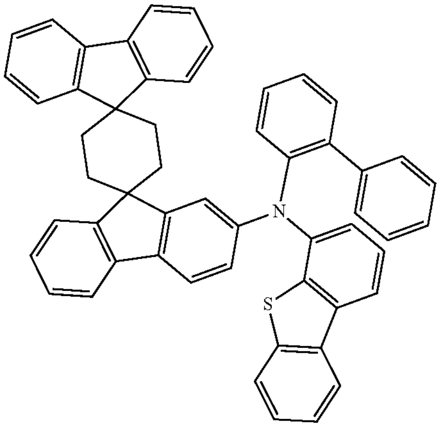
59
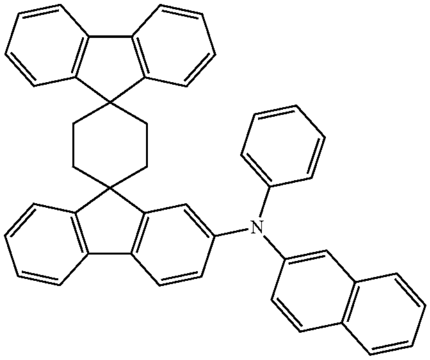
60
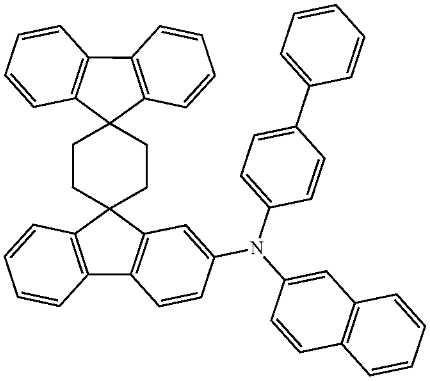
-continued
61
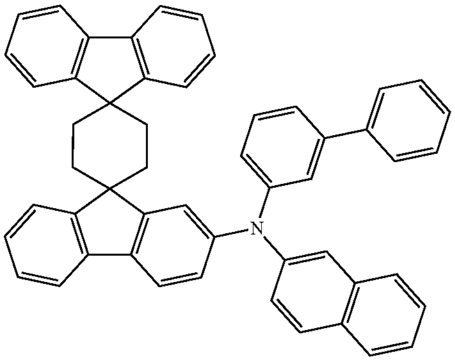
62
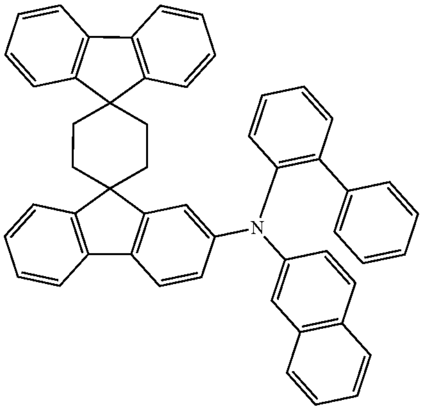
63
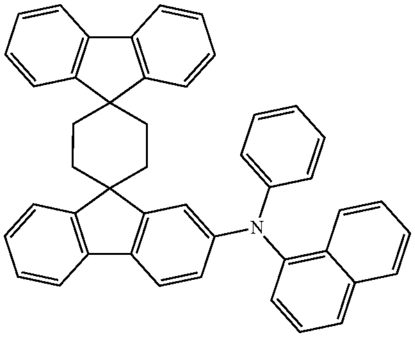
64
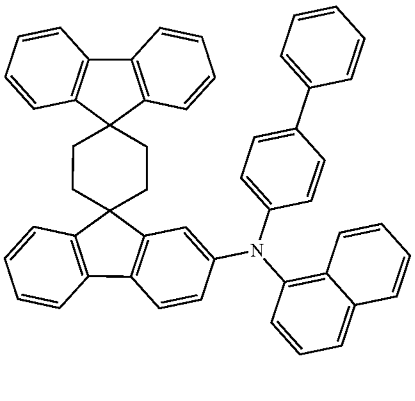

-continued
65
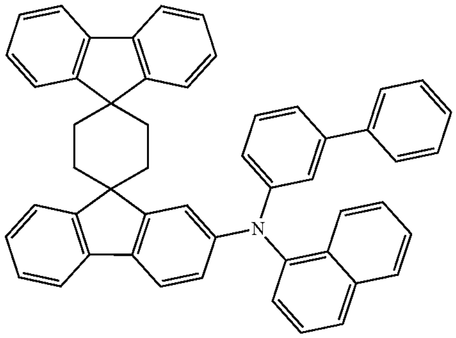
66
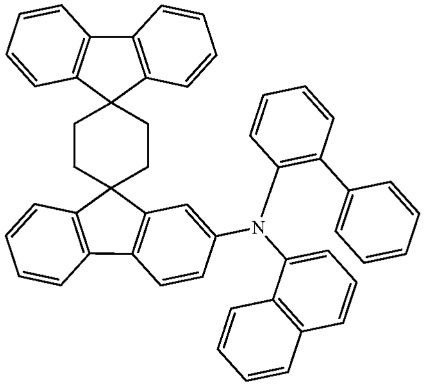
67
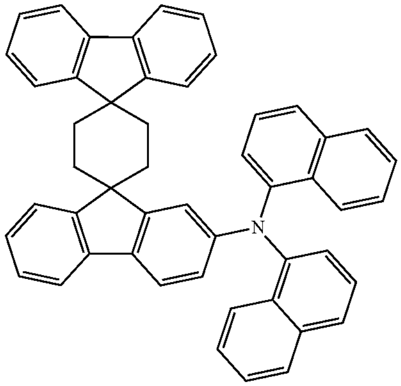
68
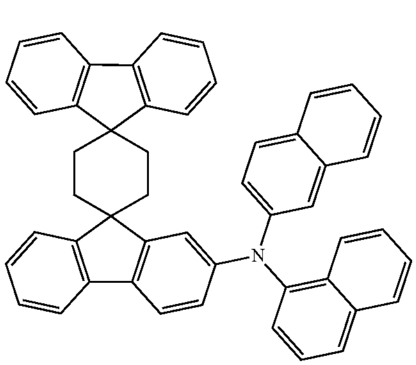
-continued
69
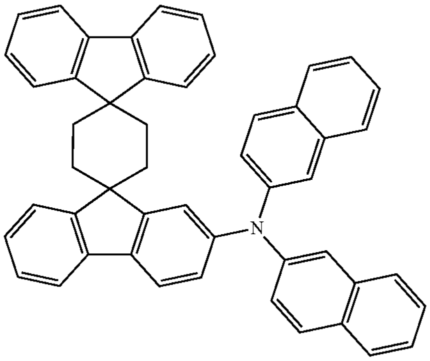
70
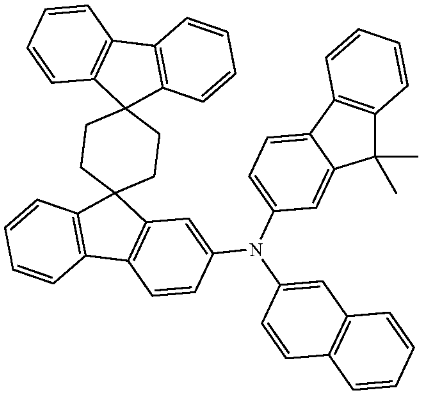
71
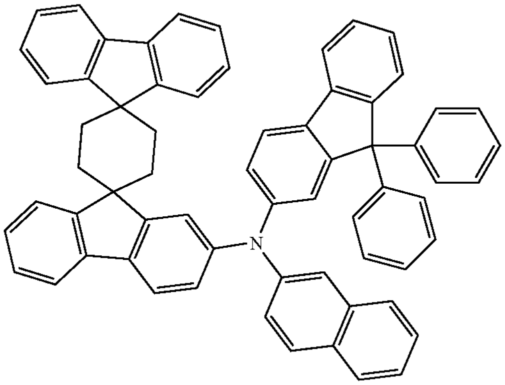
72
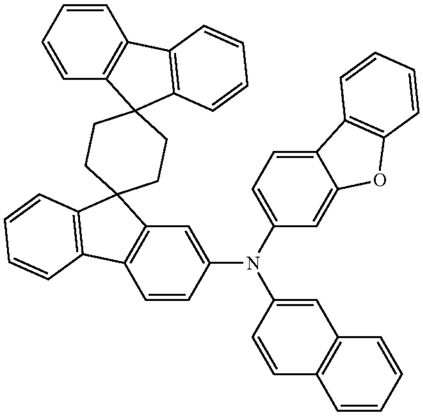

-continued
73
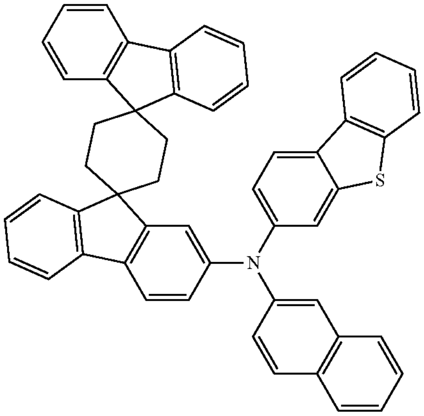
74
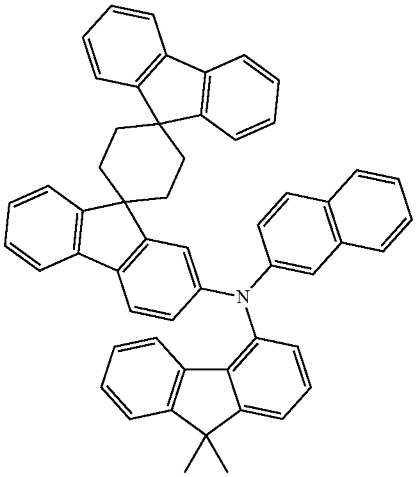
75
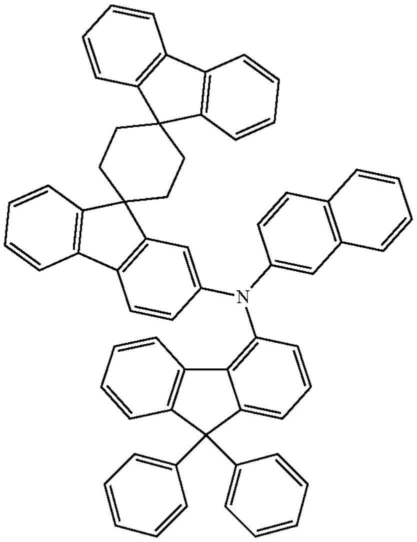
-continued
76
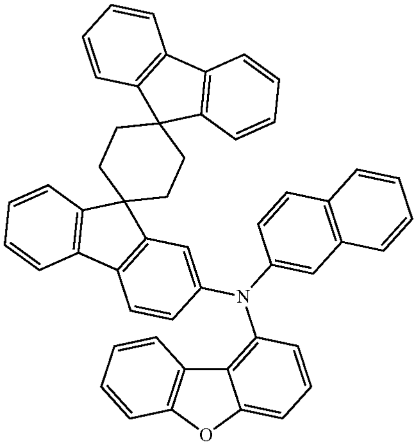
77
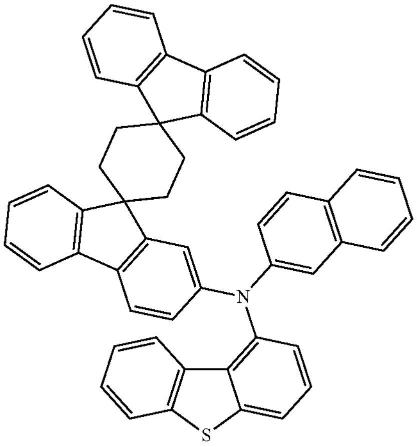
78
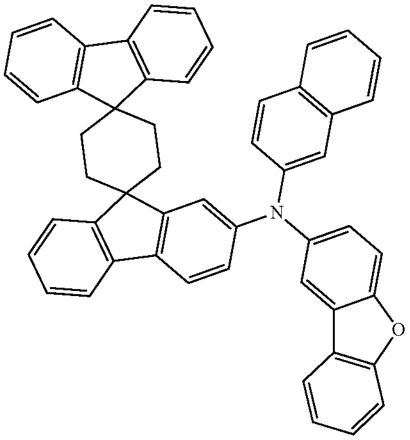

-continued
79
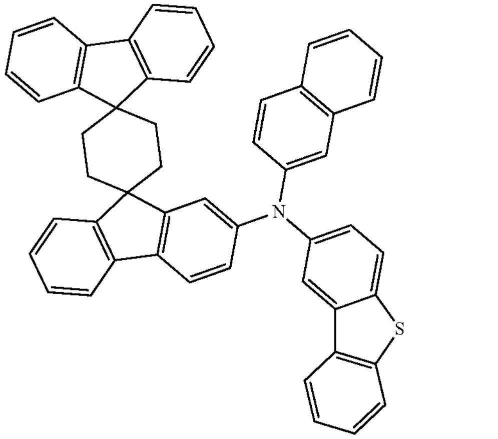
80
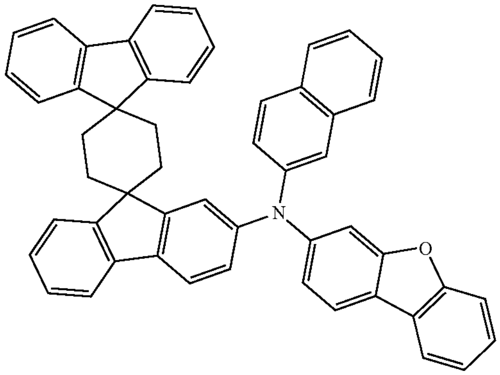
81
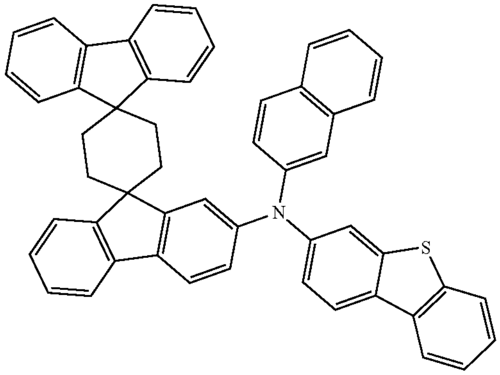
82
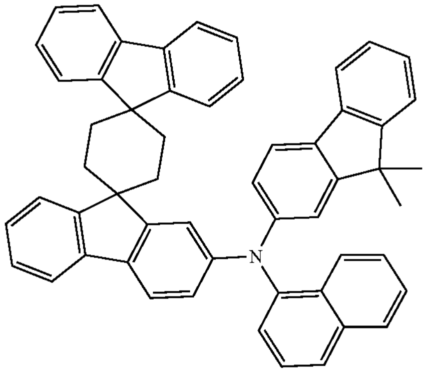
-continued
83
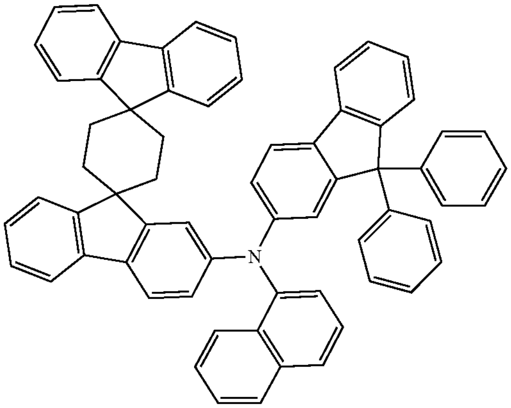
84
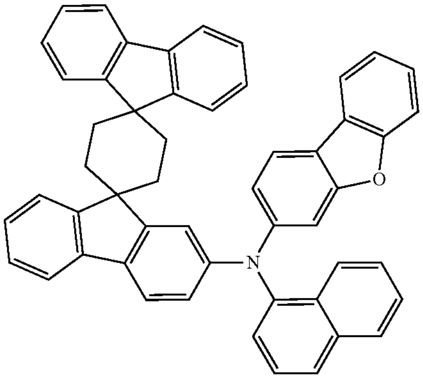
85
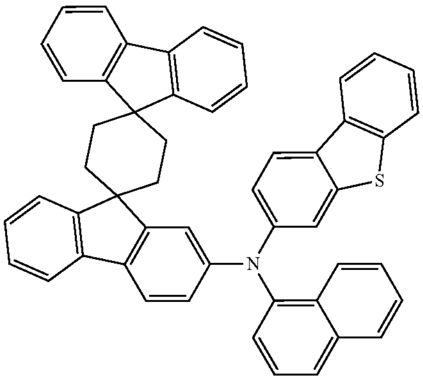

-continued
86
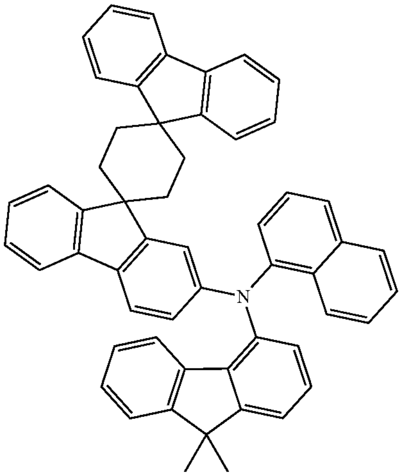
87
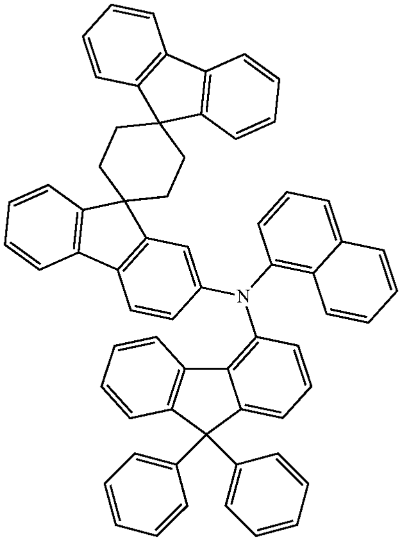
88
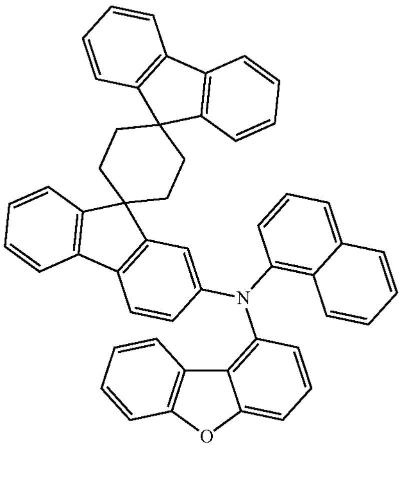
-continued
89
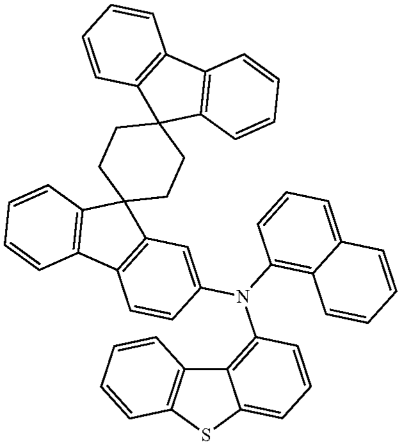
90
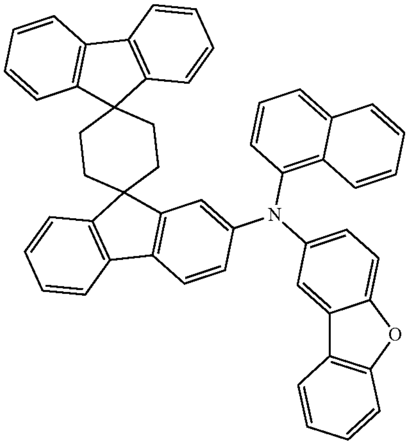
91
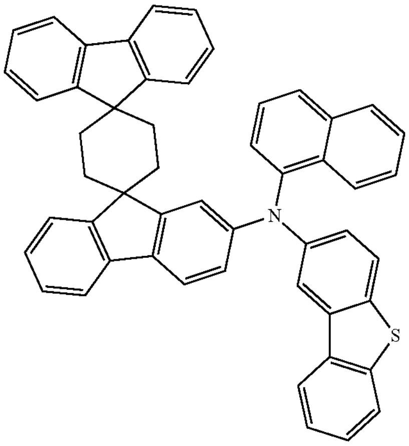

-continued
92
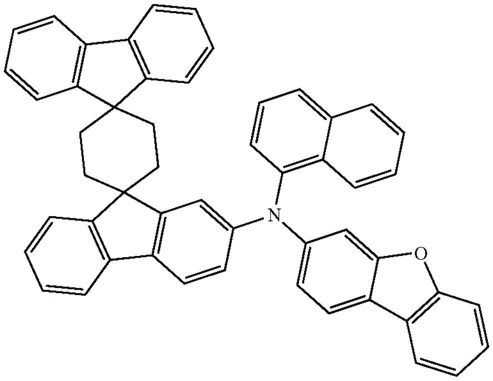
93
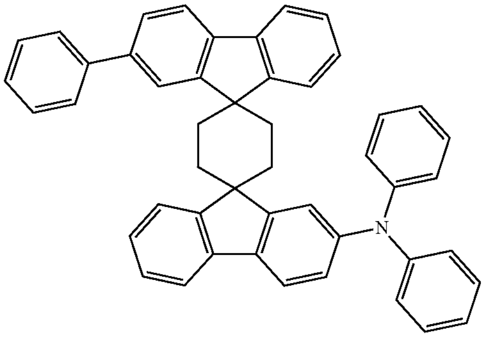
94
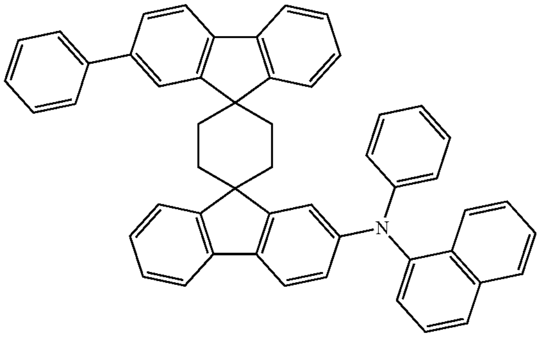
95
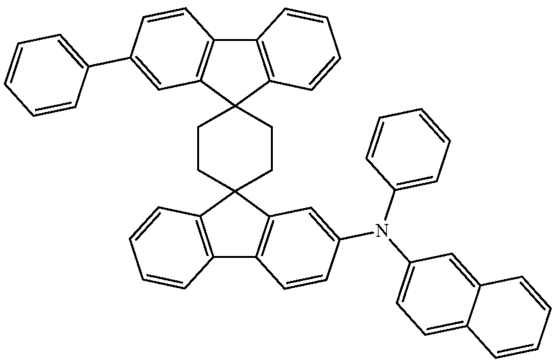
-continued
96
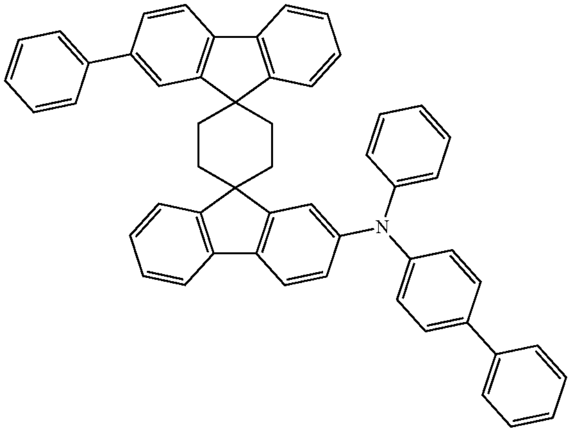
97
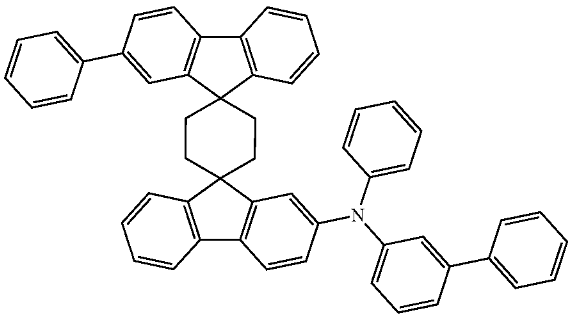
98
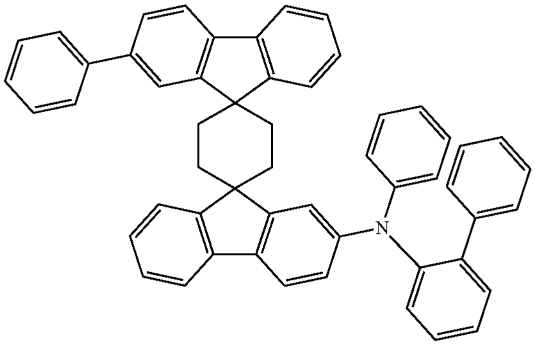
99
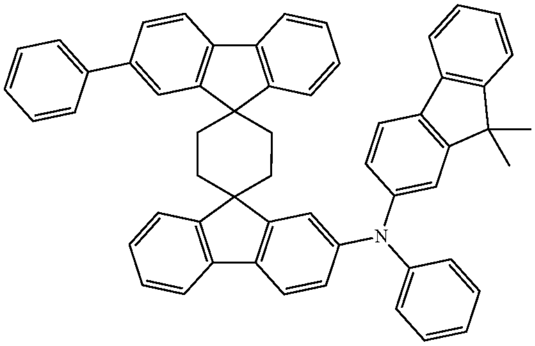

-continued
100
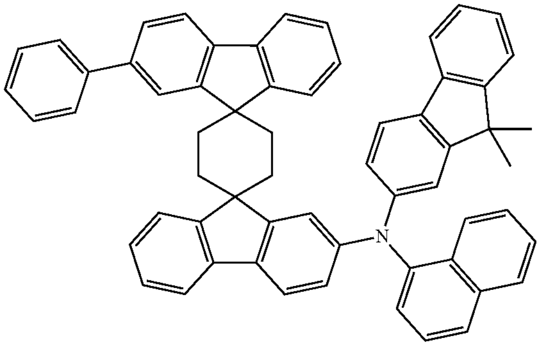
101
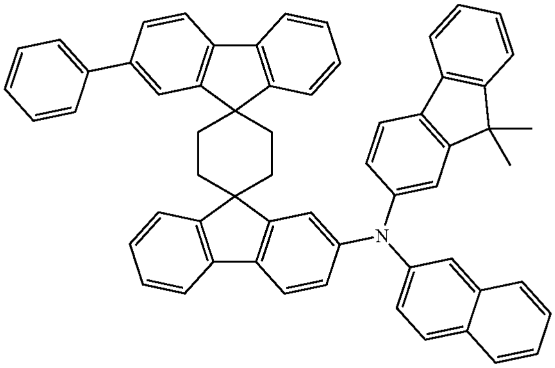
102
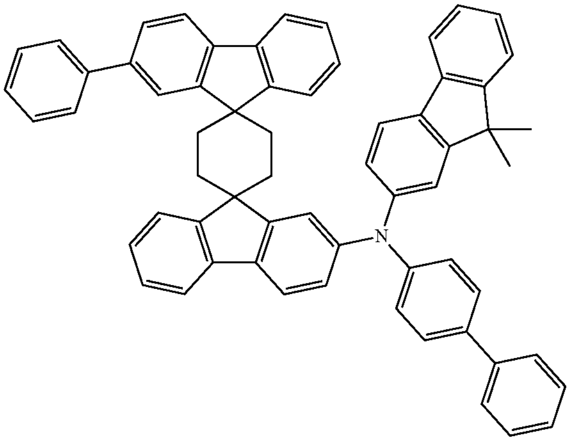
103
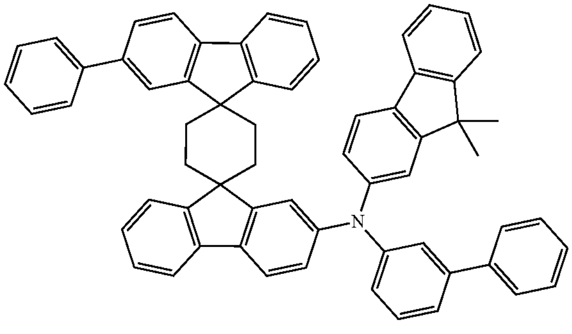
-continued
104
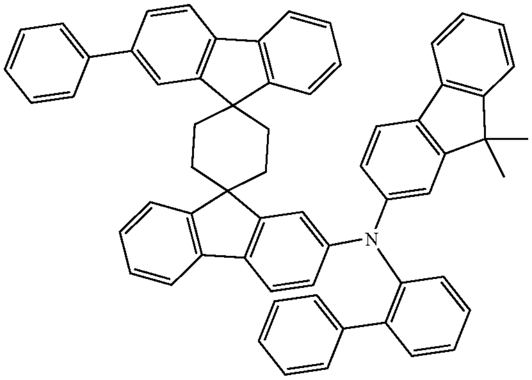
105
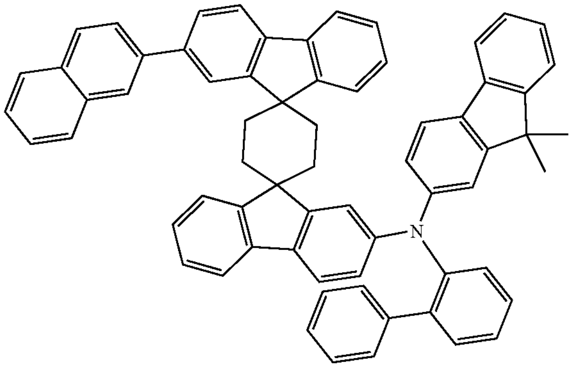
106
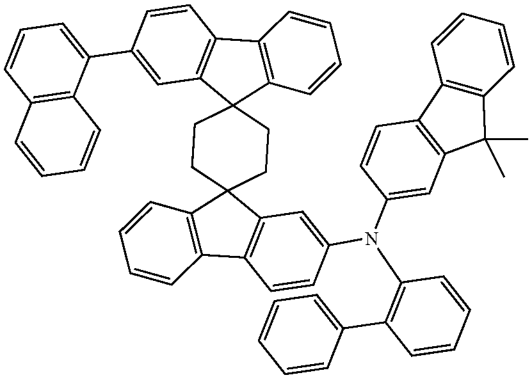

107
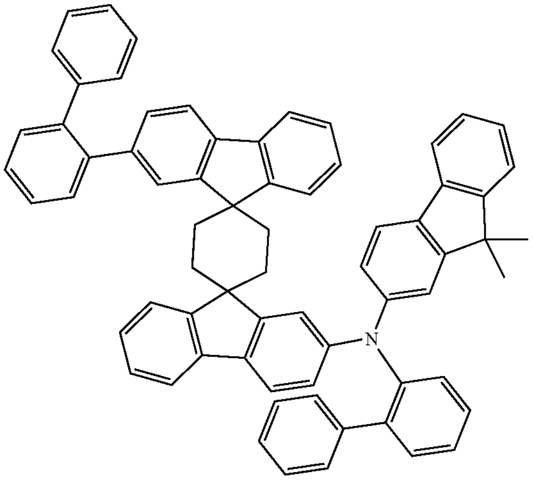
108
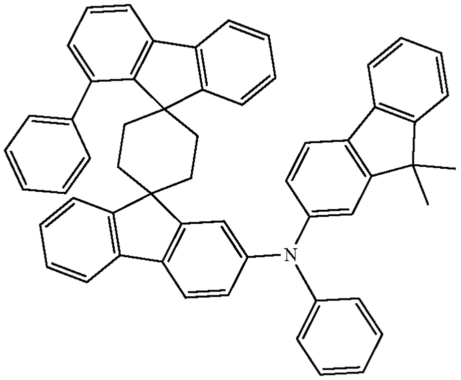
109
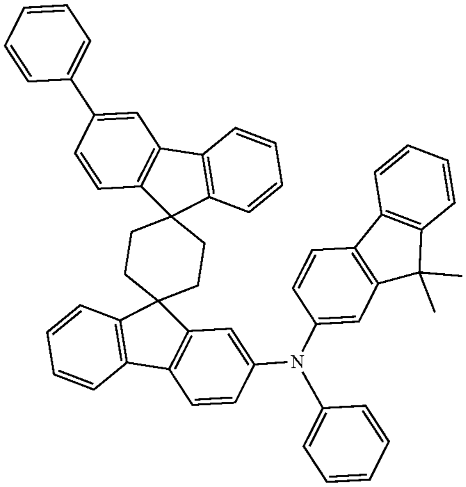
110
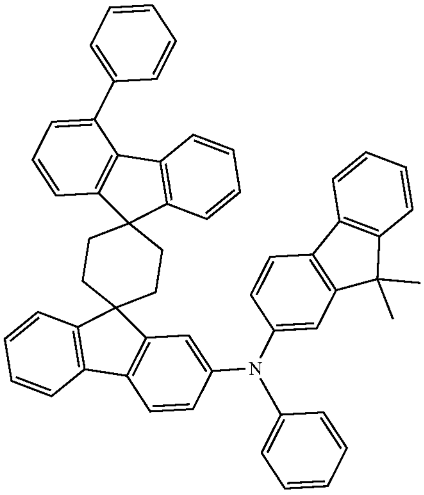
111
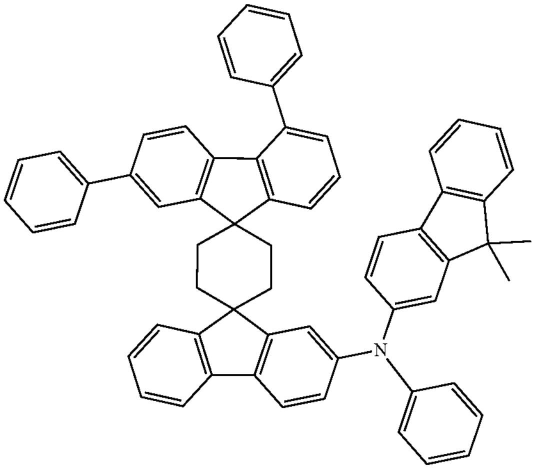
112
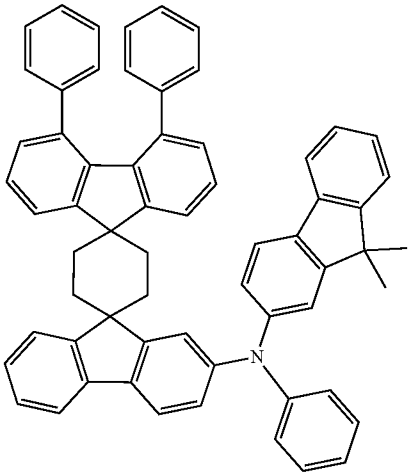

-continued
113
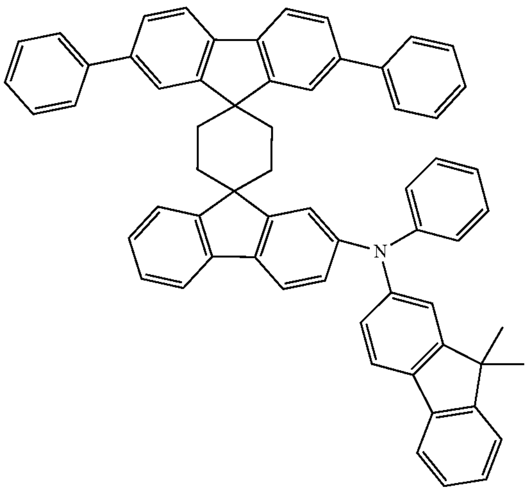
114
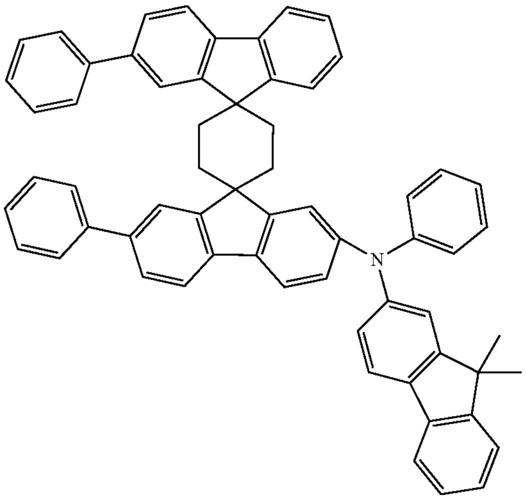
115
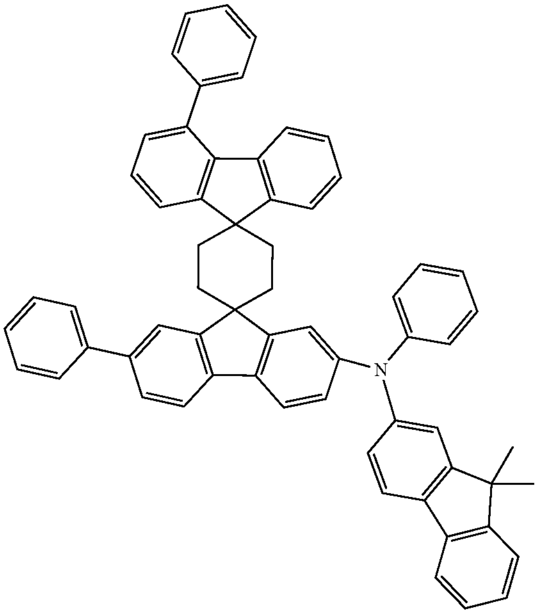
-continued
116
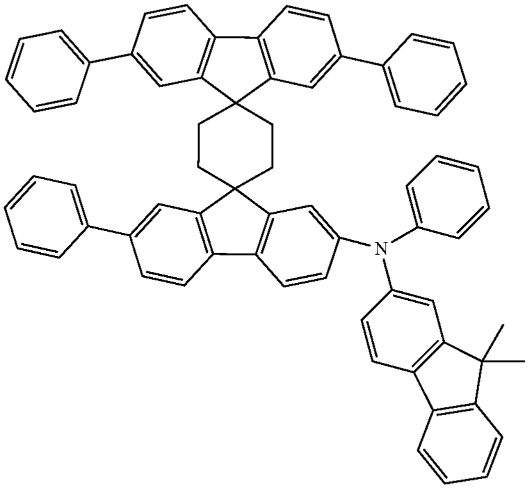
117
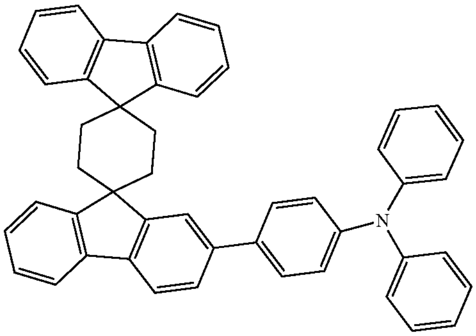
118
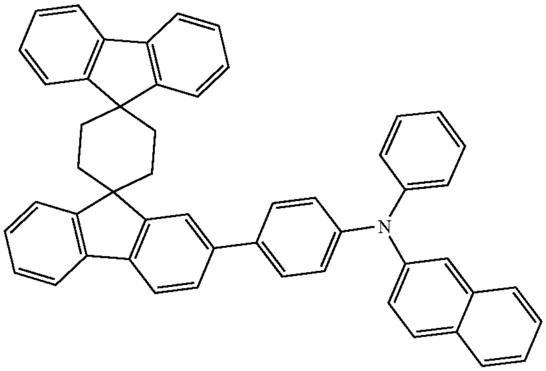
119
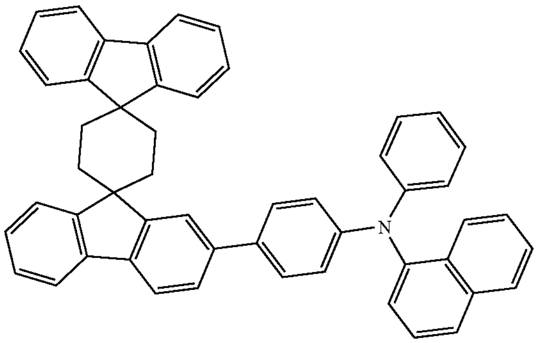

-continued
120
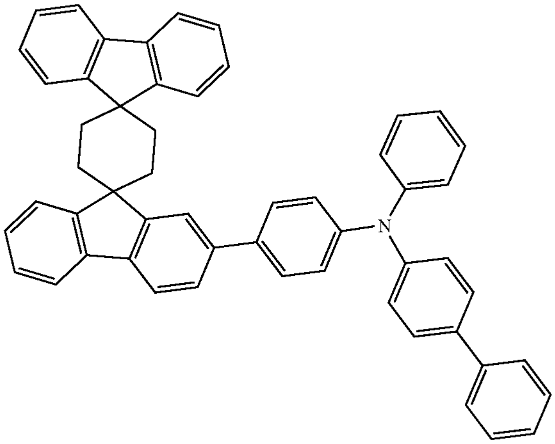
121
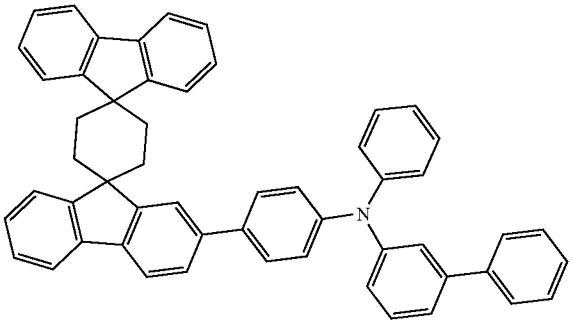
122
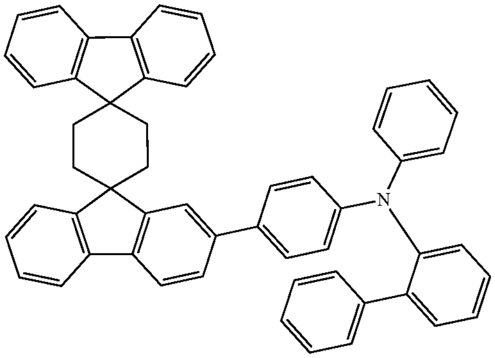
123
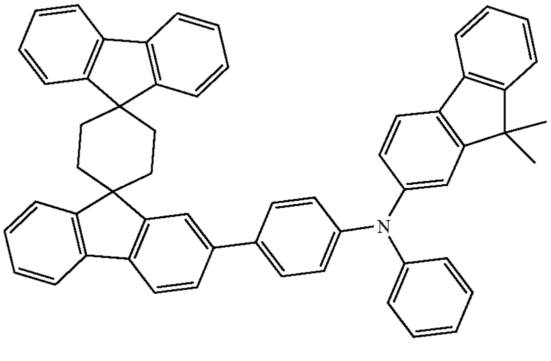
-continued
124
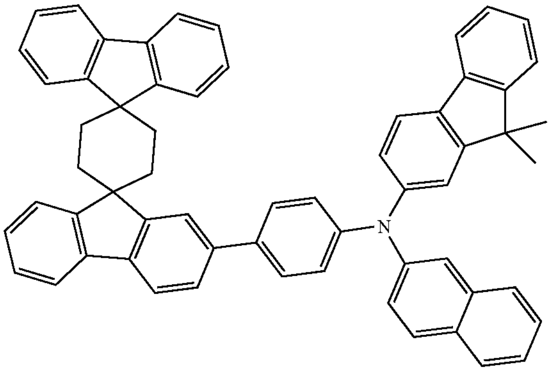
125
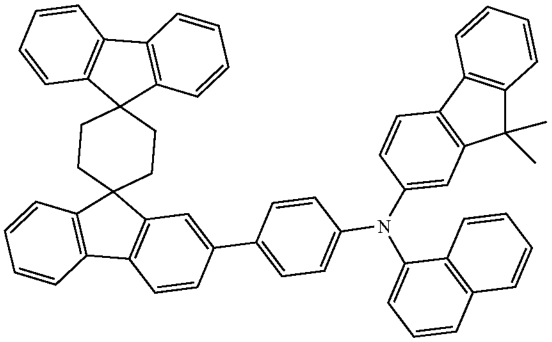
126
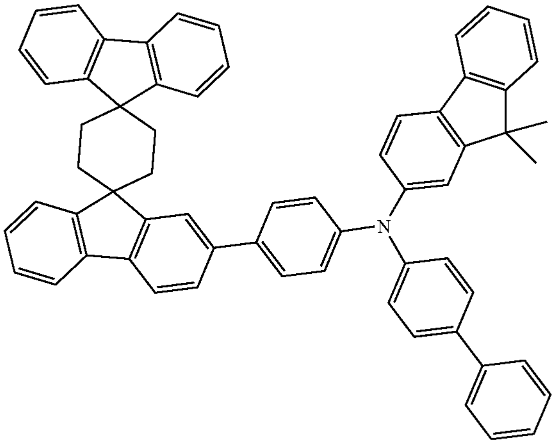
127
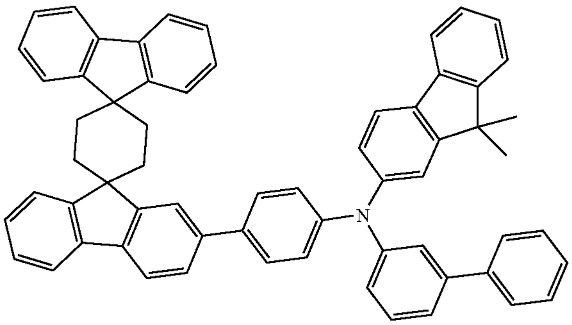

-continued
128
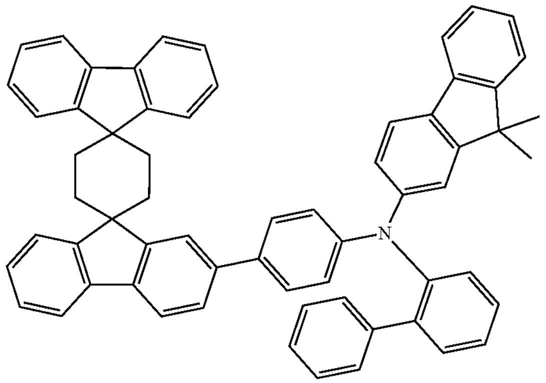
129
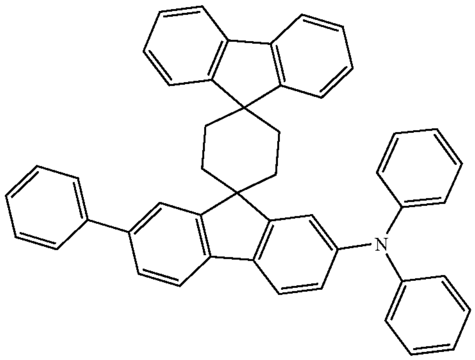
130
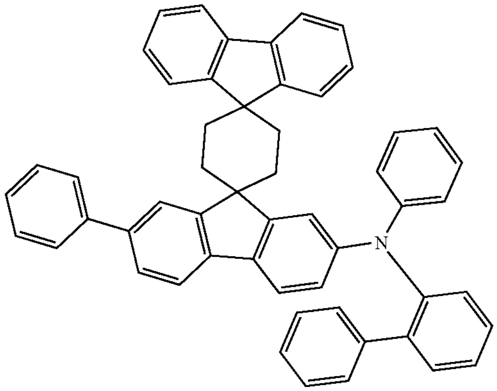
131
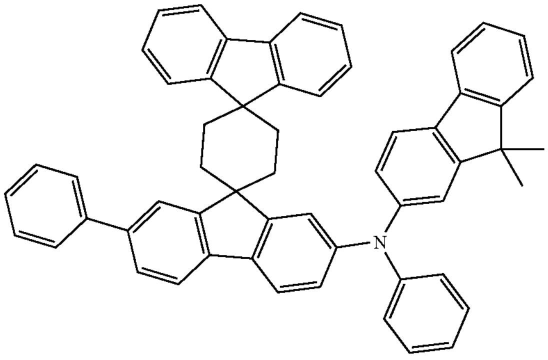
-continued
132
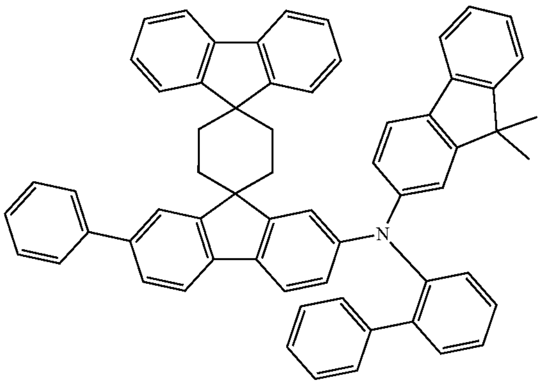
133
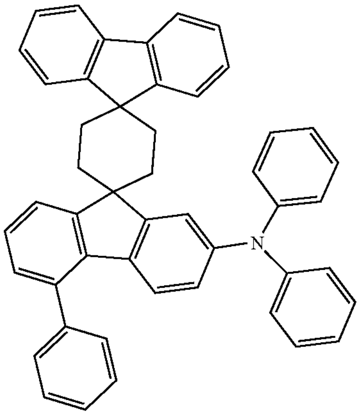
134
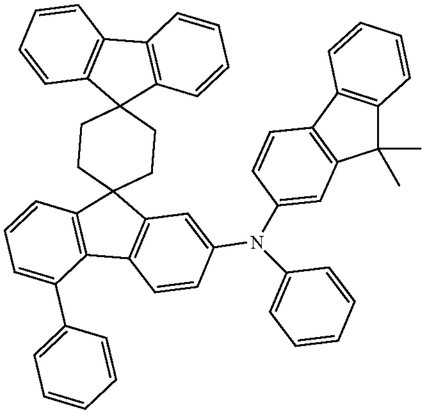
135
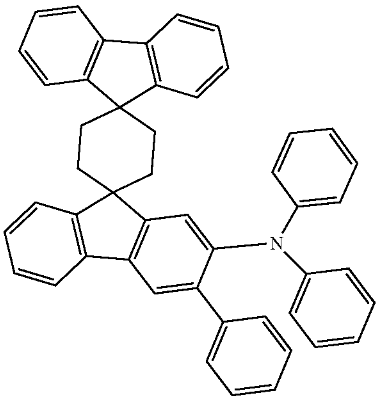

-continued
136
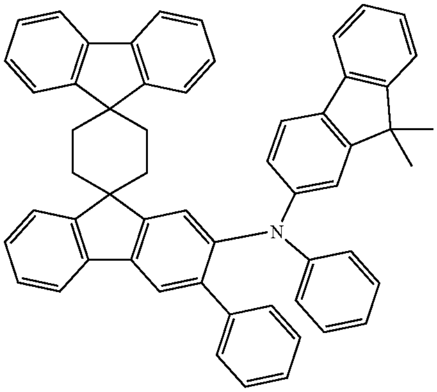
137
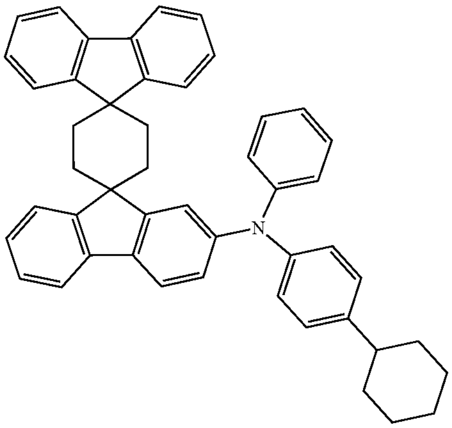
138
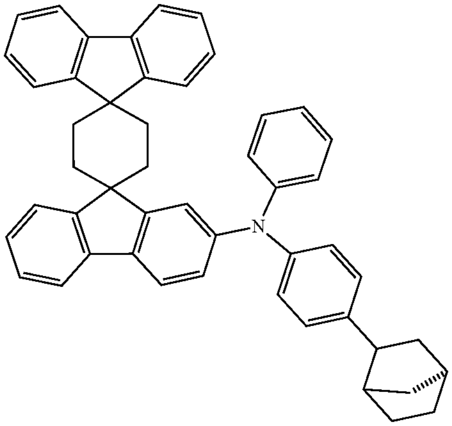
-continued
139
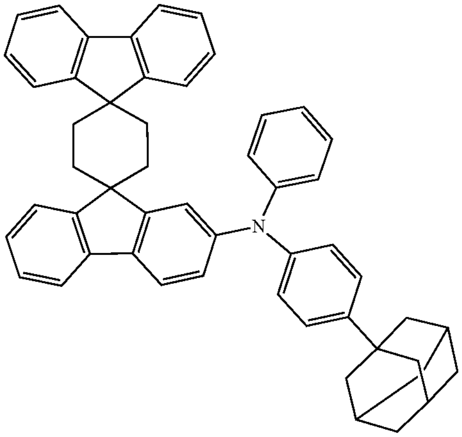
140
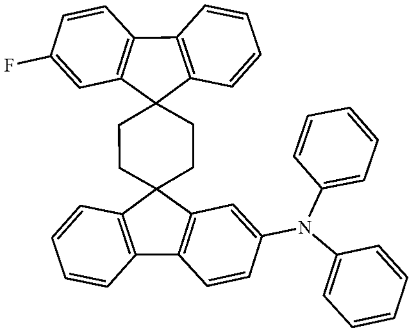
141
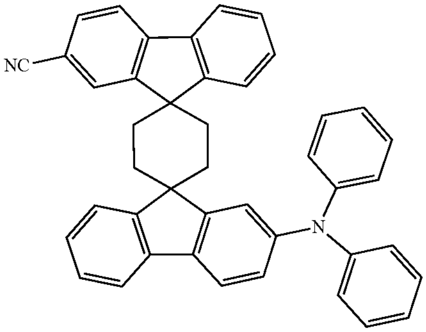
142
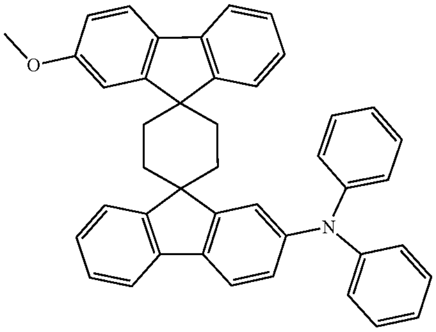

-continued

143

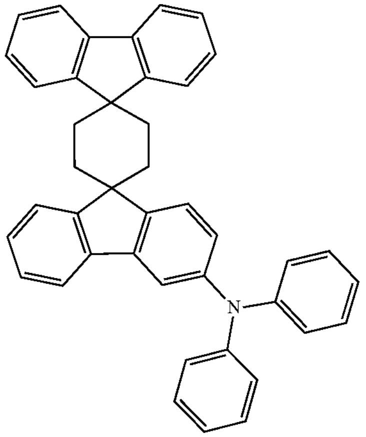

144

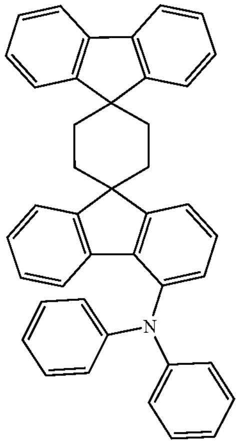

145

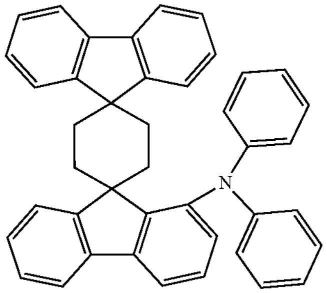

146

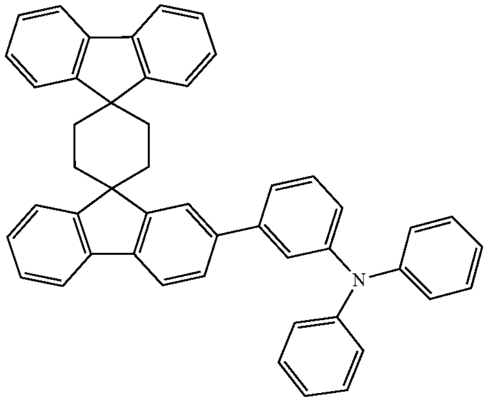

-continued

147

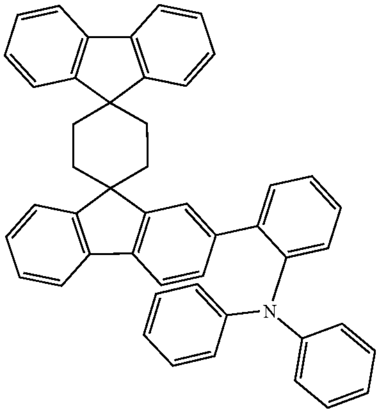

13. The light-emitting device of claim 1, wherein the interlayer further comprises a hole transport region between the first electrode and the emission layer and an electron transport region between the emission layer and the second electrode, the hole transport region comprises a hole injection layer, a hole transport layer, an emission auxiliary layer, an electron blocking layer, or any combination thereof, and the electron transport region comprises a buffer layer, a hole blocking layer, an electron control layer, an electron transport layer, an electron injection layer, or any combination thereof.

14. The light-emitting device of claim 13, wherein the hole transport region comprises the hole transport layer, and wherein the hole transport layer comprises the heterocyclic compound represented by Formula 1.

15. The light-emitting device of claim 14, wherein a refractive index of the hole transport layer is in a range of 1.65 to 1.8.

16. The light-emitting device of claim 1, wherein the emission layer is to emit blue light.

17. The light-emitting device of claim 1, further comprising a capping layer outside the first electrode or the second electrode, wherein the capping layer comprises the heterocyclic compound represented by Formula 1.

18. An electronic apparatus comprising the light-emitting device of claim 1.

19. The electronic apparatus of claim 18, further comprising a thin-film transistor, wherein the thin-film transistor comprises a source electrode and a drain electrode, and the first electrode of the light-emitting device is electrically connected to the source electrode or the drain electrode of the thin-film transistor.

20. The electronic apparatus of claim 18, further comprising a color filter, a quantum dot color-conversion layer, a touchscreen layer, a polarizing layer, or any combination thereof.

* * * * *